US009482947B2

(12) United States Patent
Yamaguchi et al.

(10) Patent No.: US 9,482,947 B2

(45) Date of Patent: Nov. 1, 2016

(54) PATTERN FORMING METHOD, ACTINIC RAY-SENSITIVE OR RADIATION-SENSITIVE RESIN COMPOSITION, RESIST FILM, MANUFACTURING METHOD OF ELECTRONIC DEVICE AND ELECTRONIC DEVICE

(71) Applicant: FUJIFILM Corporation, Tokyo (JP)

(72) Inventors: Shuhei Yamaguchi, Shizuoka (JP); Hidenori Takahashi, Shizuoka (JP); Michihiro Shirakawa, Shizuoka (JP); Shohei Kataoka, Shizuoka (JP); Shoichi Saitoh, Shizuoka (JP); Fumihiro Yoshino, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/035,139

(22) Filed: Sep. 24, 2013

(65) Prior Publication Data

US 2014/0045117 A1 Feb. 13, 2014

Related U.S. Application Data

(63) Continuation of application No. PCT/JP2012/057663, filed on Mar. 16, 2012.

(60) Provisional application No. 61/469,161, filed on Mar. 30, 2011.

(30) Foreign Application Priority Data

Mar. 30, 2011 (JP) ................................ 2011-075855

(51) Int. Cl.

| | |
|---|---|
| ***G03F 7/039*** | (2006.01) |
| ***G03F 7/32*** | (2006.01) |
| ***G03F 7/038*** | (2006.01) |
| ***C08F 20/28*** | (2006.01) |
| ***C08F 220/28*** | (2006.01) |
| ***G03F 7/004*** | (2006.01) |
| ***G03F 7/11*** | (2006.01) |
| ***G03F 7/20*** | (2006.01) |
| ***G03F 7/40*** | (2006.01) |

(52) U.S. Cl.

CPC ............. *G03F 7/0382* (2013.01); *C08F 20/28* (2013.01); *C08F 220/28* (2013.01); *G03F 7/0045* (2013.01); *G03F 7/0046* (2013.01); *G03F 7/0397* (2013.01); *G03F 7/11* (2013.01); *G03F 7/2041* (2013.01); *G03F 7/325* (2013.01); *G03F 7/405* (2013.01)

(58) Field of Classification Search

CPC .... G03F 7/039; G03F 7/0392; G03F 7/0397; G03F 7/32; G03F 7/325

USPC ............ 430/270.1, 326, 907, 910, 434, 435

See application file for complete search history.

(56) References Cited

U.S. PATENT DOCUMENTS

| | | | | |
|---|---|---|---|---|
| 7,605,089 | B2 * | 10/2009 | Furukawa et al. | 438/708 |
| 7,750,342 | B2 * | 7/2010 | Kim et al. | 257/40 |
| 2007/0178405 | A1 * | 8/2007 | Kanda et al. | 430/270.1 |
| 2008/0187860 | A1 | 8/2008 | Tsubaki et al. | |
| 2008/0305432 | A1 | 12/2008 | Kanna | |
| 2009/0017400 | A1 * | 1/2009 | Tarutani et al. | 430/322 |
| 2010/0143844 | A1 | 6/2010 | Takeshita et al. | |
| 2011/0311914 | A1 | 12/2011 | Kamimura et al. | |
| 2012/0058436 | A1 | 3/2012 | Tsubaki et al. | |
| 2012/0116038 | A1 | 5/2012 | Takeshita et al. | |
| 2012/0315449 | A1 | 12/2012 | Tsubaki et al. | |
| 2013/0034706 | A1 * | 2/2013 | Yamaguchi | 428/195.1 |
| 2013/0224661 | A1 | 8/2013 | Sakakibara et al. | |

(Continued)

FOREIGN PATENT DOCUMENTS

| | | |
|---|---|---|
| JP | 2000-026446 A | 1/2000 |
| JP | 2000-122295 A | 4/2000 |
| JP | 2001-240625 A | 9/2001 |

(Continued)

OTHER PUBLICATIONS

Machine translation of JP 2008-268744, published on Nov. 2008.*

(Continued)

*Primary Examiner* — Anca Eoff

(74) *Attorney, Agent, or Firm* — Sughrue Mion, PLLC

(57) ABSTRACT

A pattern forming method, includes: (i) a step of forming a film from an actinic ray-sensitive or radiation-sensitive resin composition containing (P) a resin having (a1) a repeating unit capable of decomposing by an action of an acid to produce a carboxyl group, represented by the following formula (I) as defined in the specification and (B) a compound capable of generating an acid upon irradiation with an actinic ray or radiation; (ii) a step of exposing the film; and (iii) a step of performing a development by using a developer containing an organic solvent to form a negative pattern.

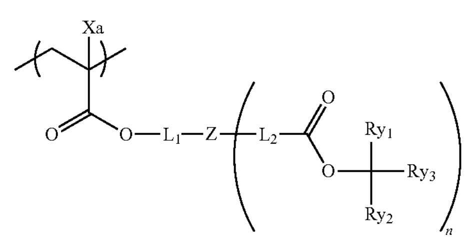

(I)

40 Claims, No Drawings

(56) References Cited

U.S. PATENT DOCUMENTS

| | | | | |
|---|---|---|---|---|
| 2014/0045117 | A1 | 2/2014 | Yamaguchi et al. | |
| 2014/0141360 | A1* | 5/2014 | Yamaguchi et al. ............ | 430/18 |

FOREIGN PATENT DOCUMENTS

| | | | | |
|---|---|---|---|---|
| JP | 2001-272784 | A | | 10/2001 |
| JP | 2002-338627 | A | | 11/2002 |
| JP | 3390702 | B2 | | 3/2003 |
| JP | 2004-271843 | A | | 9/2004 |
| JP | 2008-058538 | | * | 3/2008 |
| JP | 2008-058538 | A | | 3/2008 |
| JP | 2008-242271 | | | 10/2008 |
| JP | 2008-268743 | A | | 11/2008 |
| JP | 2008-268744 | | * | 11/2008 |
| JP | 2008-268744 | A | | 11/2008 |
| JP | 2008-292975 | A | | 12/2008 |
| JP | 2009-093011 | A | | 4/2009 |
| JP | 2010-113319 | A | | 5/2010 |
| JP | 2010-197619 | A | | 9/2010 |
| JP | 2010-224530 | A | | 10/2010 |
| JP | 2010-254639 | A | | 11/2010 |
| JP | 2010-256873 | A | | 11/2010 |
| JP | 2011-022560 | A | | 2/2011 |
| JP | 2011-022595 | A | | 2/2011 |
| JP | 2011-033841 | A | | 2/2011 |
| JP | 2012-032806 | A | | 2/2012 |
| JP | 2012-073565 | A | | 4/2012 |
| JP | 2012-208432 | A | | 10/2012 |
| WO | 2010/098493 | A1 | | 9/2010 |
| WO | WO 2010/147228 | | * | 12/2010 |
| WO | 2012/046607 | A1 | | 4/2012 |

OTHER PUBLICATIONS

Machine translation of JP 2010-256873, published on Nov. 11, 2010.*

Machine translation of JP 2008-058538, published on Mar. 13, 2008.*

Machine translation of JP 2008-268744, published on Nov. 6, 2008.*

Machine translation of JP 2009-093011, published on Apr. 30, 2009.*

Office Action dated Jun. 3, 2014, issued by the Japanese Patent Office in counterpart Japanese Application No. 2011-075855.

International Search Report for PCT/JP2012/057663 dated May 15, 2012 [PCT/ISA/210].

Written Opinion for PCT/JP2012/057663 dated May 15, 2012 [PCT/ISA/237].

Office Action dated Aug. 10, 2015 issued by Taiwanese Intellectual Property Office in counterpart Taiwanese Patent Application No. 101110492.

Office Action issued on May 11, 2016, by the Korean Intellectual Property Office in counterpart Korean Application No. 10-2013-7025754.

Office Action dated Feb. 9, 2016, from the Japanese Patent Office in counterpart Japanese Application No. 2015-035151.

* cited by examiner

PATTERN FORMING METHOD, ACTINIC RAY-SENSITIVE OR RADIATION-SENSITIVE RESIN COMPOSITION, RESIST FILM, MANUFACTURING METHOD OF ELECTRONIC DEVICE AND ELECTRONIC DEVICE

CROSS REFERENCE TO RELATED APPLICATION

This is a continuation of International Application No. PCT/JP2012/057663 filed on Mar. 16, 2012, and claims priority from Japanese Patent Application No. 2011-075855 and U.S. Provisional Application No. 61/469,161, the entire disclosures of which are incorporated herein by reference.

TECHNICAL FIELD

The present invention relates to a pattern forming method, an actinic ray-sensitive or radiation-sensitive resin composition used therefor, a resist film, a manufacturing method of an electronic device and an electronic device. More specifically, the present invention relates to a pattern forming method suitable for the process of producing a semiconductor such as IC or the production of a liquid crystal device or a circuit board such as thermal head and further for the lithography in other photo-fabrication processes, an actinic ray-sensitive or radiation-sensitive resin composition used for the pattern forming method, a resist film, a manufacturing method of an electronic device and an electronic device. In particular, the present invention relates to a pattern forming method suitable for exposure by an ArF exposure apparatus, an ArF immersion-type projection exposure apparatus or an EUV exposure apparatus each using a light source that emits far ultraviolet light at a wavelength of 300 nm or less, an actinic ray-sensitive or radiation-sensitive resin composition used for the pattern forming method, a resist film, a manufacturing method of an electronic device and an electronic device.

BACKGROUND ART

Since the advent of a resist for KrF excimer laser (248 nm), a pattern forming method utilizing chemical amplification is used so as to compensate for sensitivity reduction due to light absorption. For example, in the positive chemical amplification process, a photoacid generator contained in the exposed area is decomposed upon irradiation with light to generate an acid, an alkali-insoluble group contained in the photosensitive composition is, in the course of baking or the like after exposure (PEB: Post Exposure Bake), changed into an alkali-soluble group by the catalytic action of the generated acid and thereafter, development is performed using, for example, an alkali solution to remove the exposed area, whereby a desired pattern is obtained.

As for the alkali developer used in the method above, various alkali developers have been proposed. For example, an aqueous alkali developer of 2.38 mass % TMAH (an aqueous tetramethylammonium hydroxide solution) is being used as the alkali developer for general purposes.

In the positive chemical amplification process above, from the standpoint of, for example, enhancing dry etching resistance or enhancing pattern forming performance, attempts are made to let a group capable of decomposing by the action of an acid be provided in the polymer main chain through a polycyclic hydrocarbon group as a spacer (for example, Japanese Patent 3,390,702, JP-A-2008-58538 (the term "JP-A" as used herein means an "unexamined published Japanese patent application"), JP-A-2010-254639, JP-A-2010-256873 and JP-A-2000-122295).

With the miniaturization of a semiconductor device, the trend is moving toward a shorter wavelength of the exposure light source and a higher numerical aperture (higher NA) of the projection lens, and an exposure machine using an ArF excimer laser with a wavelength of 193 nm as a light source has been developed at present. As a technique to more increase the resolution, a method of filling a high refractive-index liquid (hereinafter, sometimes referred to as an "immersion liquid") between the projection lens and the sample (that is, immersion method) has been proposed. Furthermore, EUV lithography of performing exposure to ultraviolet light having a shorter wavelength (13.5 nm) has been also proposed.

However, it is actually very difficult to find out an appropriate combination of a resist composition, a developer, a rinsing solution and the like, which is necessary to form a pattern having overall good performance.

In recent years, development of a pattern forming method using an organic solvent-containing developer is also proceeding (see, for example, JP-A-2008-292975 and JP-A-2010-197619). For example, JP-A-2008-292975 discloses a pattern forming method including a step of coating a substrate with a resist composition capable of increasing the solubility for an alkali developer and decreasing the solubility for an organic solvent developer upon irradiation with an actinic ray or radiation, an exposure step, and a step of performing development by using an organic solvent developer. According to this method, a high-definition fine pattern can be stably formed.

However, in the above-described pattern forming method, further improvements are demanded on roughness performance, uniformity of local pattern dimension, exposure latitude and prevention of film loss at the development.

SUMMARY OF INVENTION

An object of the present invention is to provide a pattern forming method, ensuring that the roughness performance such as line width roughness, the uniformity of local pattern dimension and the exposure latitude are excellent and reduction in the film thickness, so-called film loss, in the pattern part formed by development can be suppressed, an actinic ray-sensitive or radiation-sensitive resin composition used therefor, a resist film, a manufacturing method of an electronic device and an electronic device.

The present invention includes the following configurations, and the above-described object of the present invention is attained by these configurations.

[1] A pattern forming method, comprising:

(i) a step of forming a film from an actinic ray-sensitive or radiation-sensitive resin composition containing (P) a resin having (a1) a repeating unit capable of decomposing by an action of an acid to produce a carboxyl group, represented by the following formula (I) and (B) a compound capable of generating an acid upon irradiation with an actinic ray or radiation;

(ii) a step of exposing the film; and (iii) a step of performing a development by using a developer containing an organic solvent to form a negative pattern:

(I)

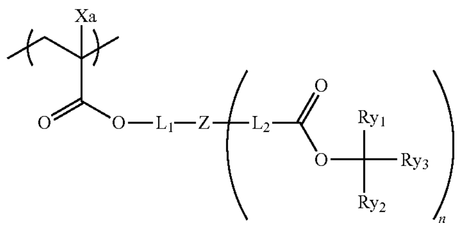

wherein Xa represents a hydrogen atom, an alkyl group, a cyano group or a halogen atom;

each of $Ry_1$ to $Ry_3$ independently represents an alkyl group or a cycloalkyl group, and two members out of $Ry_1$ to $Ry_3$ may combine to form a ring;

Z represents a (n+1)-valent linking group having a polycyclic hydrocarbon structure which may have a heteroatom as a ring member, provided that Z does not contain an ester bond as an atomic group constituting the polycyclic ring;

each of $L_1$ and $L_2$ independently represents a single bond or a divalent linking group;

n represents an integer of 1 to 3; and when n is 2 or 3, a plurality of $L_2$'s, a plurality of $Ry_1$'s, a plurality of $Ry_2$'s and a plurality of $Ry_3$'s may be the same as or different, respectively.

[2] The pattern forming method as described in [1] above, wherein in the repeating unit (a1), each of $Ry_1$ to $Ry_3$ is independently an alkyl group.

[3] The pattern forming method as described in [1] or [2] above, wherein the resin (P) further contains (a2) a repeating unit represented by the following formula (II):

(II)

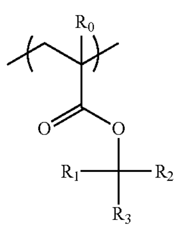

wherein $R_0$ represents a hydrogen atom, an alkyl group, a cyano group or a halogen atom; and each of $R_1$ to $R_3$ independently represents an alkyl group or a cycloalkyl group, and two members out of $R_1$ to $R_3$ may combine with each other to form a ring.

[4] The pattern forming method as described in [3] above, wherein in the repeating unit (a2), each of $R_1$ to $R_3$ is independently an alkyl group.

[5] The pattern forming method as described in any one of [1] to [4] above, wherein a content of the repeating unit (a1) is 60 mol % or more based on all repeating units in the resin (P).

[6] The pattern forming method as described in [3] or [4] above, wherein a total of a content of the repeating unit (a1) and a content of the repeating unit (a2) is 60 mol % or more based on all repeating units in the resin (P).

[7] The pattern forming method as described in any one of [1] to [6] above, wherein the compound (B) is a compound capable of generating an organic acid represented by the following formula (III) or (IV) upon irradiation with an actinic ray or radiation:

(III)

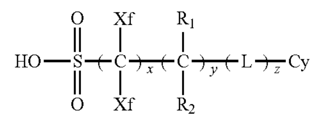

(IV)

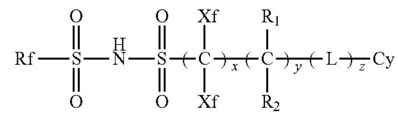

wherein each Xf independently represents a fluorine atom or an alkyl group substituted with at least one fluorine atom;

each of $R_1$ and $R_2$ independently represents a hydrogen atom, a fluorine atom or an alkyl group;

each L independently represents a divalent linking group;

Cy represents a cyclic organic group;

Rf represents a group containing a fluorine atom;

x represents an integer of 1 to 20;

y represents an integer of 0 to 10; and z represents an integer of 0 to 10.

[8] The pattern forming method as described in any one of [1] to [7] above, wherein the actinic ray-sensitive or radiation-sensitive resin composition further contains (C) a basic compound or ammonium salt compound whose basicity is reduced upon irradiation with an actinic ray or radiation.

[9] The pattern forming method as described in any one of [1] to [8] above, wherein the actinic ray-sensitive or radiation-sensitive resin composition further contains a hydrophobic resin having at least either a fluorine atom or a silicon atom.

[10] The pattern forming method as described in any one of [1] to [9] above, wherein the developer is a developer containing at least one kind of an organic solvent selected from the group consisting of a ketone-based solvent, an ester-based solvent, an alcohol-based solvent, an amide-based solvent and an ether-based solvent.

[11] The pattern forming method as described in any one of [1] to [10] above, further comprising:

(iv) a step of performing a rinsing by using a rinsing solution containing an organic solvent.

[12] The pattern forming method as described in any one of [1] to [11] above, wherein the exposure in the step (ii) is immersion exposure.

[13] An actinic ray-sensitive or radiation-sensitive resin composition, which is used for the pattern forming method as described in any one of [1] to [12] above.

[14] A resist film, which is formed from the actinic ray-sensitive or radiation-sensitive resin composition as described in [13] above.

[15] A manufacturing method of an electronic device, comprising:

the pattern forming method as described in any one of [1] to [12] above.

[16] An electronic device, which is manufactured by the manufacturing method of an electronic device as described in [15] above.

The present invention preferably further includes the following configurations.

[17] The pattern forming method as described in any one of [1] to [12] above, wherein in formula (I), each of $Ry_1$ to $Ry_a$ is independently a chain or branched alkyl group having a carbon number of 1 to 4.

[18] The pattern forming method as described in any one of [1] to [12] and [17] above, wherein in formula (I), Z is a norbornane ring group, an adamantane ring group, a bicyclooctane ring group or a tricyclo[5,2,1,$0^{2,6}$]decane ring group.

[19] The pattern forming method as described in any one of [1] to [12], [17] and [18] above, wherein in formula (II), each of $R_1$ to $R_3$ is independently a chain or branched alkyl group having a carbon number of 1 to 4.

[20] The pattern forming method as described in any one of [1] to [12] and [17] to [19] above, wherein the resin (P) contains a repeating unit having a lactone structure.

[21] The actinic ray-sensitive or radiation-sensitive resin composition as described in [13] above, which is a chemical amplification resist composition for organic solvent development.

DESCRIPTION OF EMBODIMENTS

The mode for carrying out the present invention is described below.

In the description of the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

In the description of the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam (EB). Also, in the present invention, the "light" means an actinic ray or radiation.

Furthermore, in the description of the present invention, unless otherwise indicated, the "exposure" includes not only exposure to a mercury lamp, a far ultraviolet ray typified by excimer laser, an extreme-ultraviolet ray, an X-ray, EUV light or the like but also lithography with a particle beam such as electron beam and ion beam.

The pattern forming method of the present invention comprises:

(i) a step of forming a film from an actinic ray-sensitive or radiation-sensitive resin composition containing (P) a resin having (a1) a repeating unit capable of decomposing by an action of an acid to produce a carboxyl group, represented by the following formula (I) and (B) a compound capable of generating an acid upon irradiation with an actinic ray or radiation, (ii) a step of exposing the film, and (iii) a step of performing a development by using a developer containing an organic solvent (hereafter also referred to as an organic solvent-containing developer) to form a negative pattern:

(I)

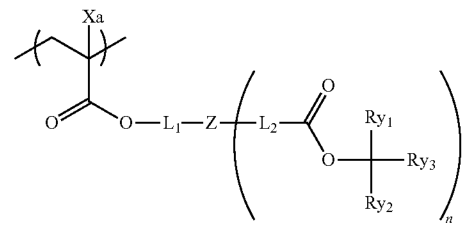

wherein Xa represents a hydrogen atom, an alkyl group, a cyano group or a halogen atom;

each of $Ry_1$ to $Ry_3$ independently represents an alkyl group or a cycloalkyl group, and two members out of $Ry_1$ to $Ry_3$ may combine to form a ring;

Z represents a (n+1)-valent linking group having a polycyclic hydrocarbon structure which may have a heteroatom as a ring member, provided that Z does not contain an ester bond as an atomic group constituting the polycyclic ring;

each of $L_1$ and $L_2$ independently represents a single bond or a divalent linking group;

n represents an integer of 1 to 3; and when n is 2 or 3, a plurality of $L_2$'s, a plurality of $Ry_1$'s, a plurality of $Ry_2$'s and a plurality of $Ry_3$'s may be the same as or different, respectively.

The reason why the pattern forming method of the present invention using (P) a resin having (a1) a repeating unit represented by formula (I) ensures that in the negative pattern formation by an organic solvent-containing developer, the roughness performance such as line width roughness, the uniformity of local pattern dimension and the exposure latitude are excellent and the film loss, so-called film loss, in the pattern part formed by development can be suppressed, is not clearly known but is presumed as follows.

In the case of performing development by using an organic solvent-containing developer, when the dissolution contrast in the resist film is low, the pattern at the boundary part is partially dissolved to impair the roughness performance such as line width roughness and the exposure latitude.

However, according to the present invention, it is considered that thanks to the presence of the group Z (linking group having a polycyclic hydrocarbon structure) in formula (I), the glass transition temperature (Tg) of the resin becomes high, as a result, the acid generated from the compound (B) upon irradiation with an actinic ray or radiation is kept from excessively diffusing into the unexposed area and the exposure latitude is enhanced.

Furthermore, the resin (P) having (a1) a repeating unit represented by formula (I) is a resin capable of generating a carboxyl group by the action of an acid to increase the polarity and decrease the solubility for an organic solvent-containing developer. That is, the repeating unit (a1) is a repeating unit for promoting reduction in the solubility for an organic solvent-containing developer while keeping the acid from excessive diffusion into the unexposed area.

In this way, the resist film obtained from the resin containing a repeating unit represented by formula (I) is presumed to have low solubility (dissolution rate) for an organic solvent-containing developer in the exposed area and high solubility (dissolution rate) for the developer in the unexposed area, leading to high dissolution contrast for the developer, and, as a result, be excellent in the uniformity of local pattern dimension as well as in the roughness performance.

Also, the elimination product resulting from decomposition of the acid-decomposable group contained in the repeating unit represented by formula (I) upon exposure tends to have a small molecular weight and therefore, the film loss in the pattern part formed by development is considered to be suppressed.

The pattern forming method of the present invention preferably further comprises (iv) a step of performing rinsing by using a rinsing solution containing an organic solvent (hereafter also referred to as an organic solvent-containing rinsing solution).

The rinsing solution is preferably a rinsing solution containing at least one kind of an organic solvent selected from the group consisting of a hydrocarbon-based solvent, a ketone-based solvent, an ester-based solvent, an alcohol-based solvent, an amide-based solvent and an ether-based solvent.

The pattern forming method of the present invention preferably comprises (v) a heating step after the exposure step (ii).

The resin (P) is also a resin capable of increasing the polarity by the action of an acid to increase the solubility for an alkali developer. Accordingly, the pattern forming method of the present invention may further include (vi) a step of performing development by using an alkali developer.

In the pattern forming method of the present invention, the exposure step (ii) may be performed a plurality of times.

In the pattern forming method of the present invention, the heating step (v) may be performed a plurality of times.

The resist film of the present invention is a film formed from the above-described actinic ray-sensitive or radiation-sensitive resin composition, and this is a film formed, for example, by applying the actinic ray-sensitive or radiation-sensitive resin composition on a base material.

The actinic ray-sensitive or radiation-sensitive resin composition which can be used in the present invention is described below.

The present invention also related to the actinic ray-sensitive or radiation-sensitive resin composition described below.

The actinic ray-sensitive or radiation-sensitive resin composition according to the present invention is used for negative development (development where the solubility for developer is decreased upon exposure, as a result, the exposed area remains as a pattern and the unexposed area is removed). That is, the actinic ray-sensitive or radiation-sensitive resin composition according to the present invention can be an actinic ray-sensitive or radiation-sensitive resin composition for organic solvent development, which is used for development using a developer containing an organic solvent. The term "for organic solvent development" as used herein means usage where the composition is subjected to at least a step of performing development by using a developer containing an organic solvent.

The actinic ray-sensitive or radiation-sensitive resin composition of the present invention is typically a resist composition and is preferably a negative resist composition (that is, a resist composition for organic solvent development), because particularly high effects can be obtained. The composition according to the present invention is typically a chemical amplification resist composition.

[1] (P) Resin Having (a1) a Repeating Unit Capable of Decomposing by the Action of an Acid to Produce a Carboxyl Group, Represented by the Following Formula (I)

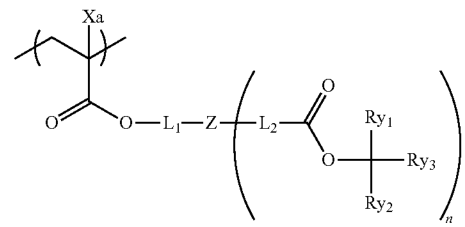

(I)

wherein Xa represents a hydrogen atom, an alkyl group, a cyano group or a halogen atom;

each of $Ry_1$ to $Ry_3$ independently represents an alkyl group or a cycloalkyl group, and two members out of $Ry_1$ to $Ry_3$ may combine to form a ring;

Z represents a (n+1)-valent linking group having a polycyclic hydrocarbon structure which may have a heteroatom as a ring member, provided that Z does not contain an ester bond as an atomic group constituting the polycyclic ring (in other words, Z does not contain a lactone ring as a ring constituting the polycyclic ring);

each of $L_1$ and $L_2$ independently represents a single bond or a divalent linking group;

n represents an integer of 1 to 3; and when n is 2 or 3, a plurality of $L_2$'s, a plurality of $Ry_1$ is, a plurality of $Ry_2$'s and a plurality of $Ry_3$'s may be the same as or different, respectively.

The alkyl group of Xa may have a substituent, and examples of the substituent include a hydroxyl group and a halogen atom (preferably, fluorine atom).

The alkyl group of Xa is preferably an alkyl group having a carbon number of 1 to 4, and examples thereof include a methyl group, an ethyl group, a propyl group, a hydroxymethyl group and a trifluoromethyl group, with a methyl group being preferred.

Xa is preferably a hydrogen atom or a methyl group.

The alkyl group of $Ry_1$ to $Ry_3$ may be chain or branched and is preferably an alkyl group having a carbon number of 1 to 4, such as methyl group, ethyl group, n-propyl group, isopropyl group, n-butyl group, isobutyl group and tert-butyl group.

The cycloalkyl group of $Ry_1$ to $Ry_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The ring formed by combining two members out of $Ry_1$ to $Ry_3$ is preferably a monocyclic hydrocarbon ring such as cyclopentane ring and cyclohexane ring, or a polycyclic hydrocarbon ring such as norbornane ring, tetracyclodecane ring, tetracyclododecane ring and adamantane ring, more preferably a monocyclic hydrocarbon ring having a carbon number of 5 to 6.

Each of $Ry_1$ to $Ry_3$ is independently preferably an alkyl group, more preferably a chain or branched alkyl group having a carbon number of 1 to 4. Also, the total of the carbon numbers of the chain or branched alkyl groups as $Ry_1$ to $Ry_3$ is preferably 5 or less.

Each of $Ry_1$ to $Ry_3$ may further have a substituent, and examples of the substituent include an alkyl group (having a carbon number of 1 to 4), a cycloalkyl group (having a carbon number of 3 to 8), a halogen atom, an alkoxy group (having a carbon number of 1 to 4), a carboxyl group and an alkoxycarbonyl group (having a carbon number of 2 to 6). The carbon number is preferably 8 or less. Above all, from the standpoint of more enhancing the dissolution contrast for an organic solvent-containing developer between before and after acid decomposition, the substituent is more preferably a group free from a heteroatom such as oxygen atom, nitrogen atom and sulfur atom (for example, more preferably not an alkyl group substituted with a hydroxyl group), still more preferably a group composed of only a hydrogen atom and a carbon atom, yet still more preferably a linear or branched alkyl group or a cycloalkyl group.

The linking group having a polycyclic hydrocarbon structure of Z includes a ring-assembly hydrocarbon ring group and a crosslinked cyclic hydrocarbon ring group, and these groups include a group obtained by removing arbitrary (n+1) hydrogen atoms from a ring-assembly hydrocarbon ring and a group obtained by removing arbitrary (n+1) hydrogen atoms from a crosslinked cyclic hydrocarbon ring, respectively.

Examples of the ring-assembly hydrocarbon ring group include a bicyclohexane ring group and a perhydronaphthalene ring group. Examples of the crosslinked cyclic hydrocarbon ring group include a bicyclic hydrocarbon ring group such as pinane ring group, bornane ring group, norpinane ring group, norbornane ring group and bicyclooctane ring group (e.g., bicyclo[2.2.2]octane ring group, bicyclo[3.2.1]octane ring group), a tricyclic hydrocarbon ring group such as homobledane ring group, adamantane ring group, tricyclo[5.2.1.$0^{2,6}$]decane ring group and tricyclo[4.3.1.$1^{2,5}$]undecane ring group and a tetracyclic hydrocarbon ring group such as tetracyclo[4.4.0.$1^{2,5}$.$1^{7,10}$]dodecane ring group and perhydro-1,4-methano-5,8-methanonaphthalene ring group. The crosslinked cyclic hydrocarbon ring group also includes a fused cyclic hydrocarbon ring group, for example, a fused ring group obtained by fusing a plurality of 5- to 8-membered cycloalkane ring groups, such as perhydronaphthalene (decalin) ring group, perhydroanthracene ring group, perhydrophenathrene ring group, perhydroacenaphthene ring group, perhydrofluorene ring group, perhydroindene ring group and perhydrophenalene ring group.

Preferred examples of the crosslinked cyclic hydrocarbon ring group include a norbornane ring group, an adamantane ring group, a bicyclooctane ring group and a tricycle[5,2,1,$0^{2,6}$]decane ring group. Of these crosslinked cyclic hydrocarbon ring groups, a norbornane ring group and an adamantane ring group are more preferred.

The linking group having a polycyclic hydrocarbon structure represented by Z may have a substituent. Examples of the substituent which may be substituted on Z include a substituent such as alkyl group, hydroxy group, cyano group, keto group (═O), acyloxy group, —COR, —COOR, —$CONR_2$, —$SO_2R$, —$SO_3R$ and —$SO_2NR_2$, wherein R represents a hydrogen atom, an alkyl group, a cycloalkyl group or an aryl group.

The alkyl group, alkylcarbonyl group, acyloxy group, —COR, —COOR, —$CONR_2$, —$SO_2R$, —$SO_3R$ and —$SO_2NR_2$ as the substituent which may be substituted on Z may further have a substituent, and this substituent includes a halogen atom (preferably, fluorine atom).

In the linking group having a polycyclic hydrocarbon structure represented by Z, the carbon constituting the polycyclic ring (the carbon contributing to ring formation) may be carbonyl carbon. Also, as described above, the polycyclic ring may have, as a ring member, a heteroatom such as oxygen atom and sulfur atom. However, as described above, Z does not contain an ester bond as an atomic group constituting the polycyclic ring.

Examples of the linking group represented by $L_1$ and $L_2$ include —COO—, —OCO—, —CONH—, —NHCO—, —CO—, —O—, —S—, —SO—, —$SO_2$—, an alkylene group (preferably having a carbon number of 1 to 6), a cycloalkylene group (preferably having a carbon number of 3 to 10), an alkenylene group (preferably having a carbon number of 2 to 6), and a linking group formed by combining a plurality of these members, and a linking group having a total carbon number of 12 or less is preferred.

$L_1$ is preferably a single bond, an alkylene group, —COO—, —COO—, —CONH—, —NHCO—, -alkylene group-COO—, -alkylene group-OCO—, -alkylene group-CONH—, -alkylene group-NHCO—, —CO—, —O—, —$SO_2$— or -alkylene group-O—, more preferably a single bond, an alkylene group, -alkylene group-COO— or -alkylene group-O—.

$L_2$ is preferably a single bond, an alkylene group, —COO—, —COO—, —CONH—, —NHCO—, —COO-alkylene group-, —OCO-alkylene group-, —CONH-alkylene group-, —NHCO-alkylene group-, —CO—, —O—, —$SO_2$—, —O-alkylene group-, or —O-cycloalkylene group-, more preferably a single bond, an alkylene group, —COO-alkylene group-, —O-alkylene group- or —O-cycloalkylene group-.

In the descriptions above, the bond "—" at the left end means to be bonded to the ester bond on the main chain side in $L_1$ and bonded to Z in $L_2$, and the bond "—" at the right end means to be bonded to Z in $L_1$ and bonded to the ester bond connected to the group represented by $(Ry_1)(Ry_2)(Ry_3)C$— in $L_2$.

Incidentally, $L_1$ and $L_2$ may be bonded to the same atom constituting the polycyclic ring in Z.

n is preferably 1 or 2, more preferably 1.

Specific examples of the repeating unit represented by formula (I) are illustrated below, but the present invention is not limited thereto. In specific examples, Xa represents a hydrogen atom, an alkyl group, a cyano group or a halogen atom.

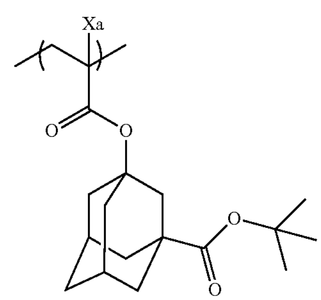

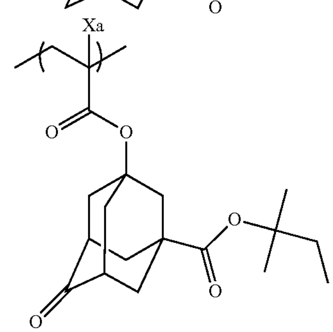

-continued
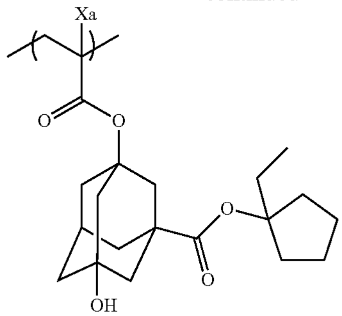
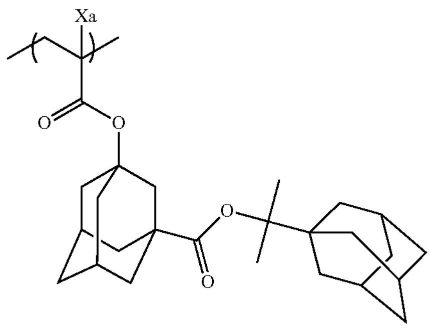
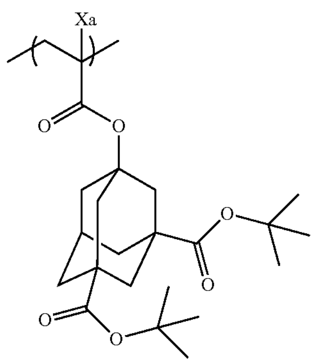
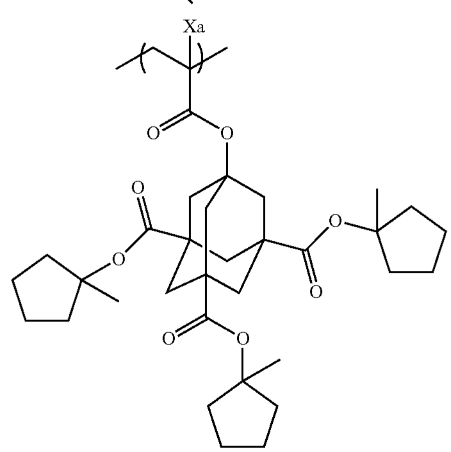
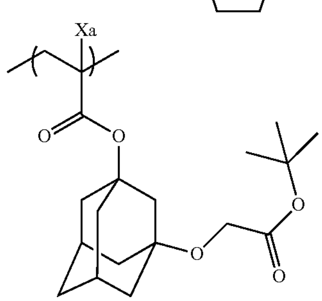
-continued
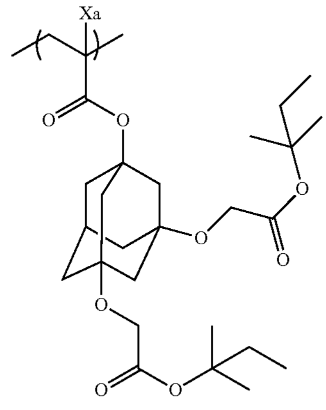
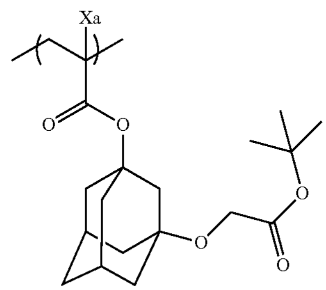
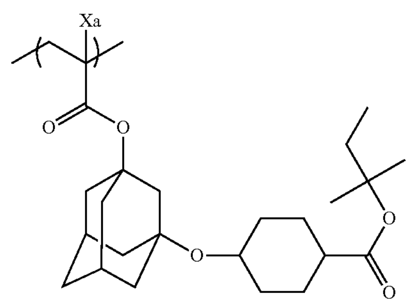
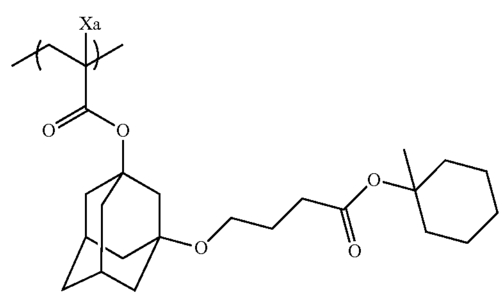
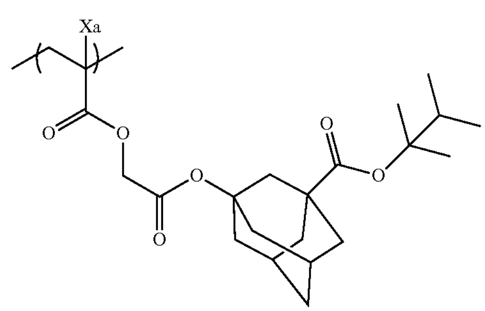

-continued
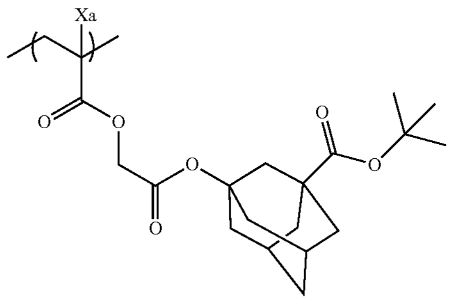
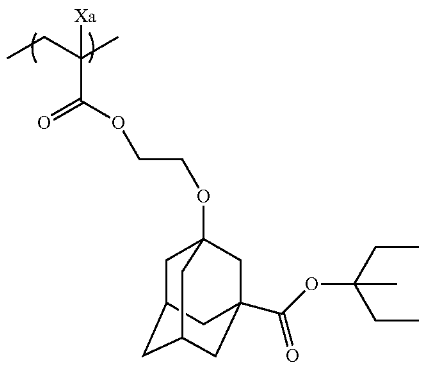
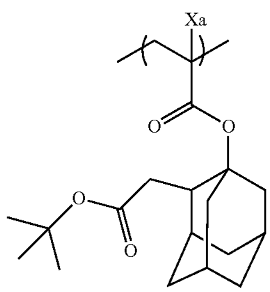
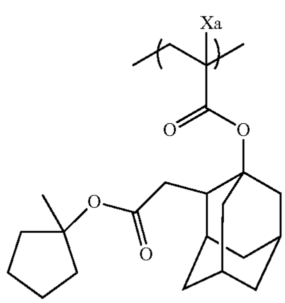
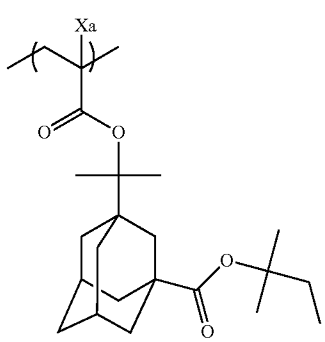
-continued
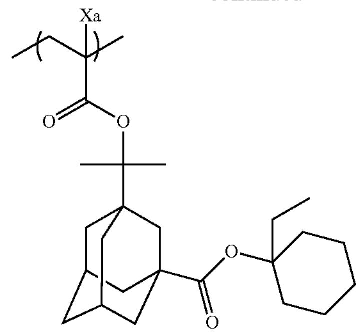
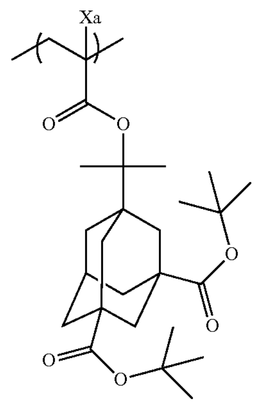
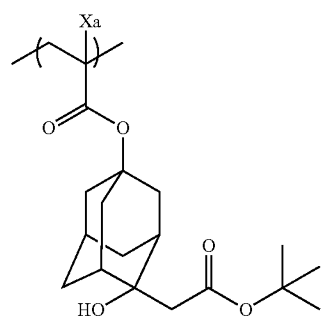
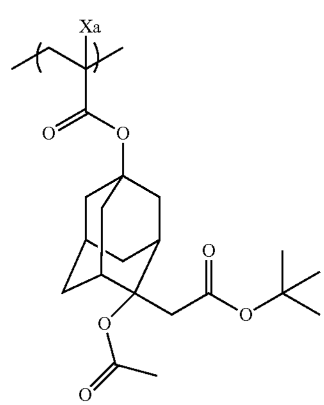

-continued
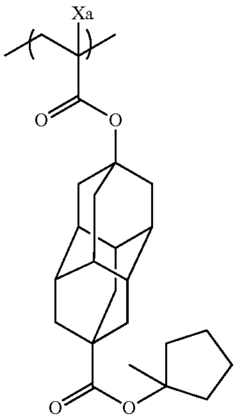
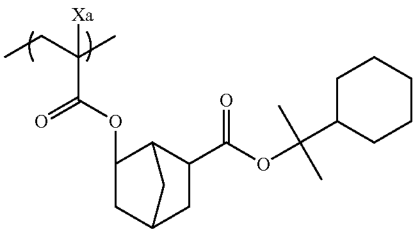
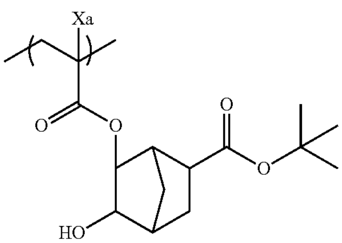
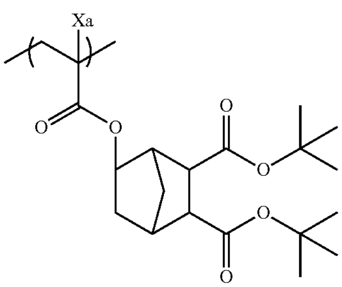
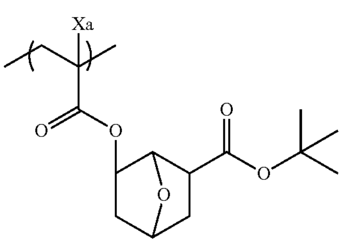
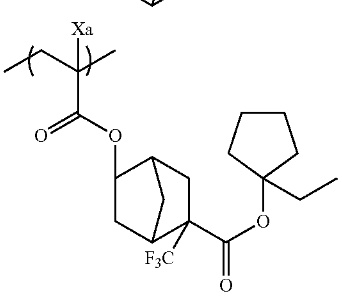
-continued
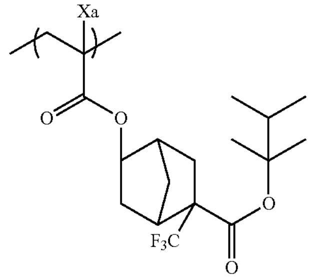
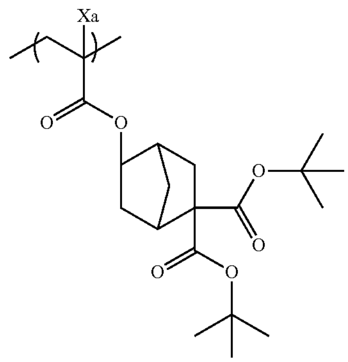
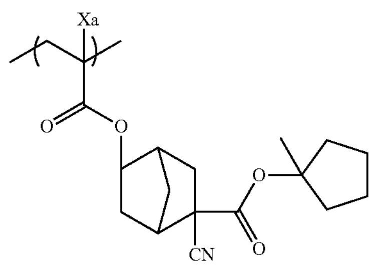
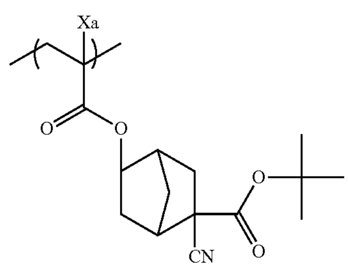
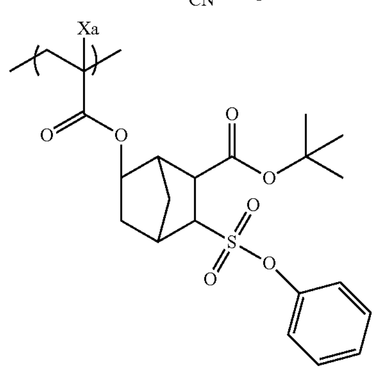

-continued

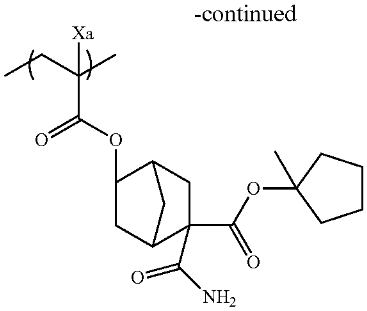

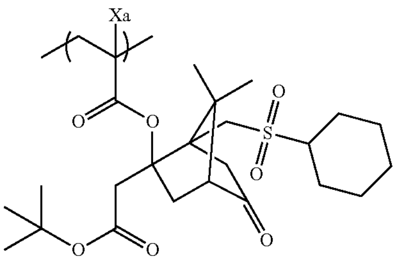

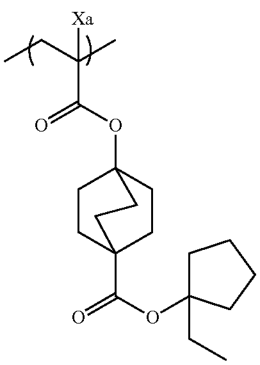

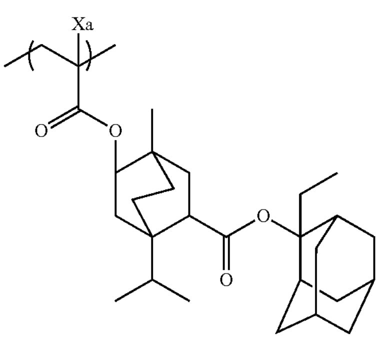

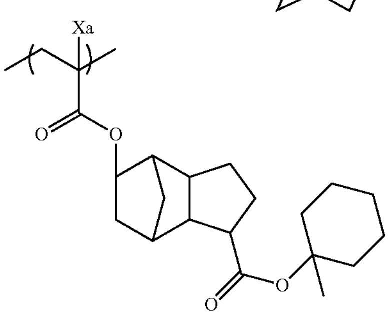

-continued

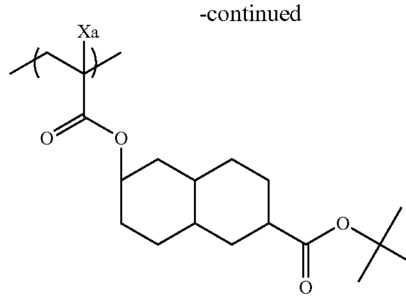

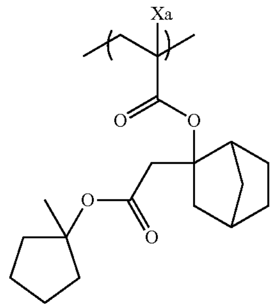

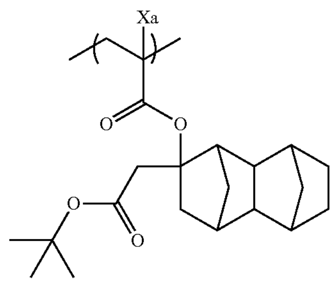

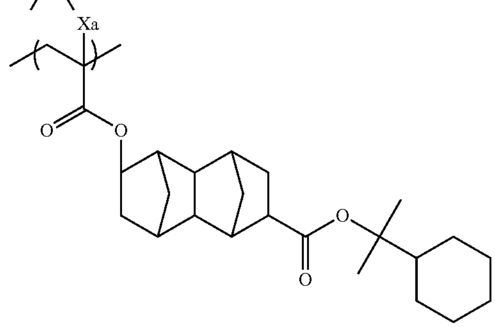

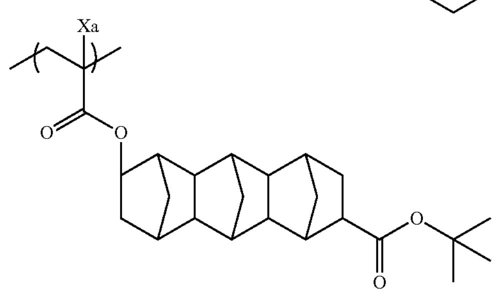

As for the repeating unit (a1) represented by formula (I), one kind may be used, or two or more kinds may be used.

The content of the repeating unit (a1) represented by formula (I) is preferably from 30 mol % or more, more preferably 45 mol % or more, still more preferably 60 mol % or more, based on all repeating units in the resin (P). Also, the content of the repeating unit (a1) is preferably 100 mol % or less, more preferably 90 mol % or less, still more preferably 80 mol % or less, based on all repeating units in the resin (P).

The resin (P) may further contain a repeating unit having a group capable of decomposing by the action of an acid to produce a polar group (hereinafter, sometimes referred to as an "acid-decomposable group"), other than the repeating unit (a1).

The polar group is not particularly limited as long as it is a group capable of being sparingly solubilized or insolubilized in an organic solvent-containing developer, but examples thereof include an acidic group (a group capable of dissociating in an aqueous 2.38 mass % tetramethylammonium hydroxide solution which has been conventionally used as the developer for a resist) such as a carboxyl group and a sulfonic acid group, and an alcoholic hydroxyl group.

The alcoholic hydroxyl group is a hydroxyl group bonded to a hydrocarbon group and indicates a hydroxyl group except for a hydroxyl group directly bonded on an aromatic ring (phenolic hydroxyl group), and the alcoholic hydroxyl group excludes an aliphatic alcohol substituted with an electron-withdrawing group such as fluorine atom at the α-position. The alcoholic hydroxyl group is preferably a hydroxyl group having a pKa of 12 to 20.

The group preferred as the acid-decomposable group is a group where a hydrogen atom of the group above is replaced by a group capable of leaving by the action of an acid.

Examples of the group capable of leaving by the action of an acid include —$C(R_{36})(R_{37})(R_{38})$, —$C(R_{36})(R_{37})(OR_{39})$ and —$C(R_{01})(R_{02})(OR_{39})$—

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

The alkyl group of $R_{36}$ to $R_{39}$, $R_{01}$ and $R_{02}$ is preferably an alkyl group having a carbon number of 1 to 8, and examples thereof include a methyl group, an ethyl group, a propyl group, an n-butyl group, a sec-butyl group, a hexyl group and an octyl group.

The cycloalkyl group of $R_{36}$ to $R_{39}$, $R_{01}$ and $R_{02}$ may be monocyclic or polycyclic. The monocyclic cycloalkyl group is preferably a cycloalkyl group having a carbon number of 3 to 8, and examples thereof include a cyclopropyl group, a cyclobutyl group, a cyclopentyl group, a cyclohexyl group, and a cyclooctyl group. The polycyclic cycloalkyl group is preferably a cycloalkyl group having a carbon number of 6 to 20, and examples thereof include an adamantyl group, a norbornyl group, an isoboronyl group, a camphanyl group, a dicyclopentyl group, an α-pinel group, a tricyclodecanyl group, a tetracyclododecyl group and an androstanyl group. Incidentally, at least one carbon atom in the cycloalkyl group may be replaced by a heteroatom such as oxygen atom.

The aryl group of $R_{36}$ to $R_{39}$, $R_{01}$ and $R_{02}$ is preferably an aryl group having a carbon number of 6 to 10, and examples thereof include a phenyl group, a naphthyl group, and an anthryl group.

The aralkyl group of $R_{36}$ to $R_{39}$, $R_{01}$ and $R_{02}$ is preferably an aralkyl group having a carbon number of 7 to 12, and examples thereof include a benzyl group, a phenethyl group and a naphthylmethyl group.

The alkenyl group of $R_{36}$ to $R_{39}$, $R_{01}$ and $R_{02}$ is preferably an alkenyl group having a carbon number of 2 to 8, and examples thereof include a vinyl group, an allyl group, a butenyl group and a cyclohexenyl group.

The ring formed by combining $R_{36}$ and $R_{37}$ is preferably a cycloalkyl group (monocyclic or polycyclic). The cycloalkyl group is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group, more preferably a monocyclic cycloalkyl group having a carbon number of 5 to 6, still more preferably a monocyclic cycloalkyl group having a carbon number of 5.

The resin (P) preferably further contains, as the repeating unit having an acid-decomposable group, a repeating unit represented by the following formula (II):

(II)

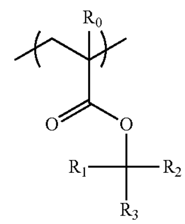

In the formula, $R_0$ represents a hydrogen atom, an alkyl group, a cyano group or a halogen atom. Specific examples and preferred examples of $R_0$ are the same as specific examples and preferred examples of Xa in formula (I).

Each of $R_1$ to $R_3$ independently represents an alkyl group (linear or branched) or a cycloalkyl group (monocyclic or polycyclic).

Two members out of $R_1$ to $R_3$ may combine to form a ring (monocyclic or polycyclic).

The alkyl group of $R_1$ to $R_3$ is preferably an alkyl group having a carbon number of 1 to 4, such as methyl group, ethyl group, n-propyl group, isopropyl group, n-butyl group, isobutyl group and tert-butyl group.

The cycloalkyl group of $R_1$ to $R_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The ring formed by combining two members out of $R_1$ to $R_3$ is preferably a monocyclic hydrocarbon ring such as cyclopentane ring and cyclohexane ring, or a polycyclic hydrocarbon ring such as norbornane ring, tetracyclodecane ring, tetracyclododecane ring and adamantane ring, more preferably a monocyclic hydrocarbon ring having a carbon number of 5 to 6.

Each of $R_1$ to $R_3$ is independently preferably an alkyl group, more preferably a linear or branched alkyl group having a carbon number of 1 to 4.

Each of these groups may further have a substituent, and specific examples and preferred examples of the further substituent are the same as specific examples and preferred examples of the substituent which may be further substituted on $Ry_1$ to $Ry_a$ in formula (I).

By containing two or more kinds of repeating units (a2) represented by formula (II) in the resin (P), the reactivity and/or developability can be finely adjusted and various performance can be easily optimized.

Specific preferred examples of the repeating unit having a group capable of decomposing by the action of an acid to produce a polar group, other than the repeating unit (a1), are illustrated below, but the present invention is not limited thereto.

In specific examples, each of Rx and $Xa_1$ represents a hydrogen atom, $CH_3$, $CF_3$ or $CH_2OH$, and each of Rxa and Rxb represents an alkyl group having a carbon number of 1 to 4. Z represents a substituent, and when a plurality of Z are present, each Z may be the same as or different from every other Z. p represents 0 or a positive integer. Specific examples and preferred examples of Z are the same as specific examples and preferred examples of the substituent which may be further substituted on $R_1$ to $R_3$.

1

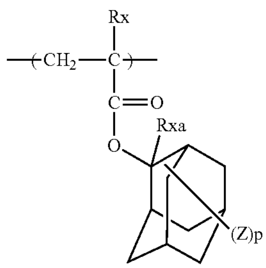

2

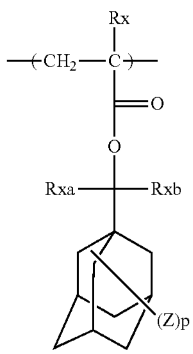

3

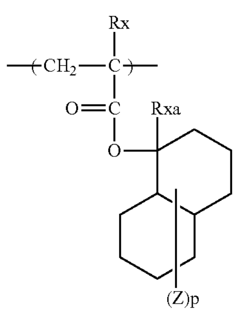

4

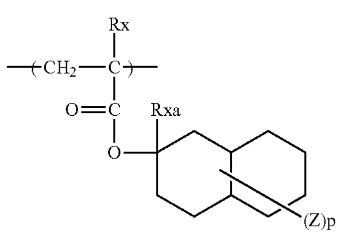

5

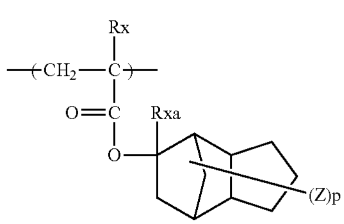

-continued

6

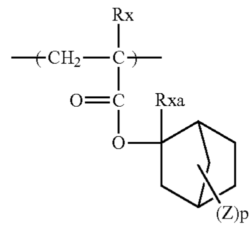

7

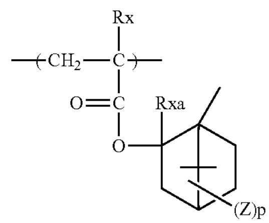

8

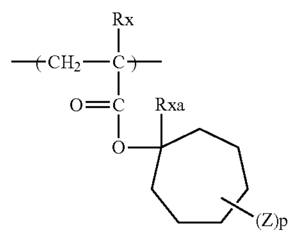

9

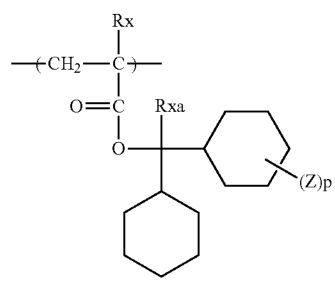

10

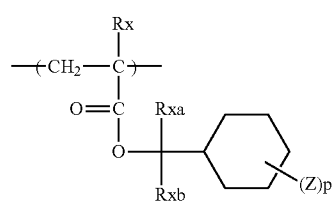

11

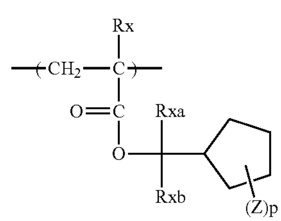

12

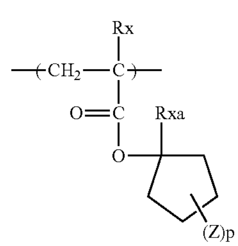

-continued
13
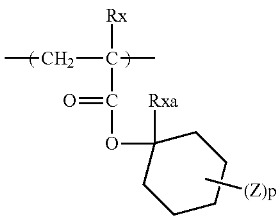
14
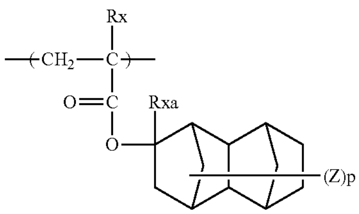
15
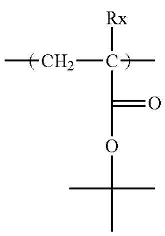
16
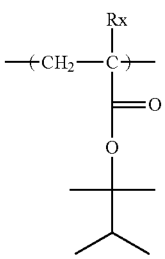
17
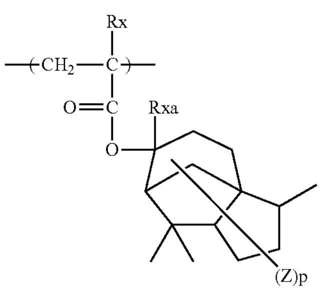
18
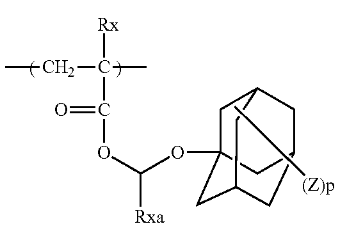
-continued
19
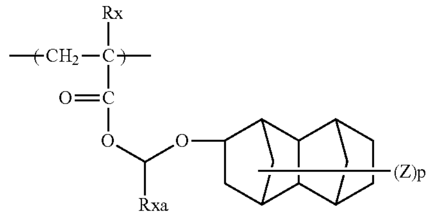
20
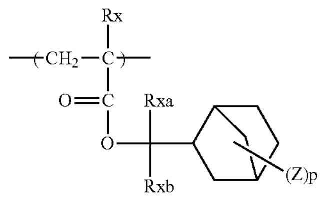
21
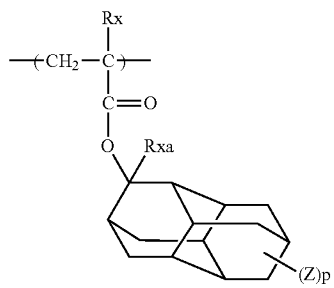
22
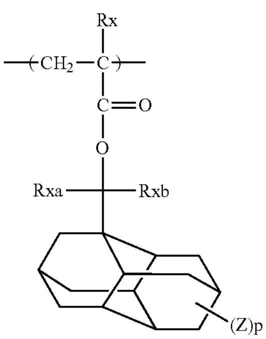
23
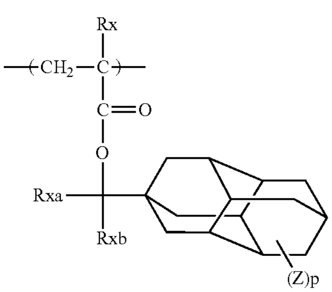
24
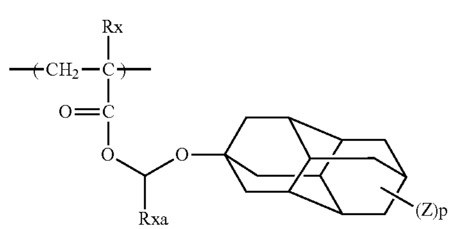

-continued
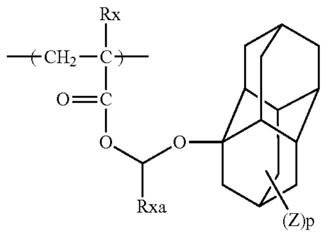
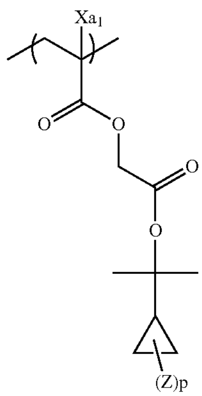
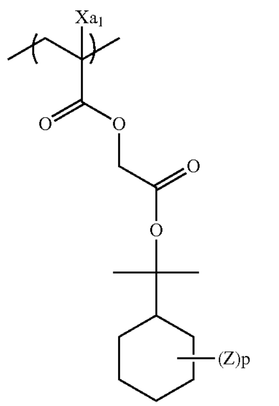
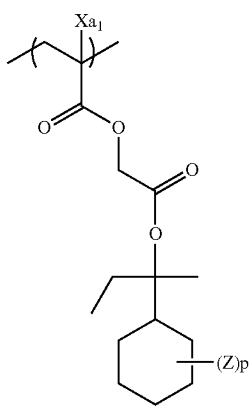
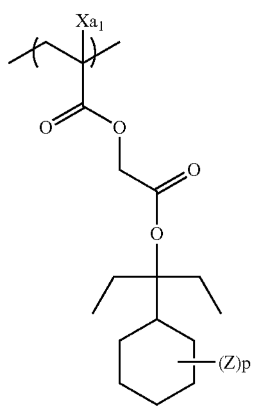
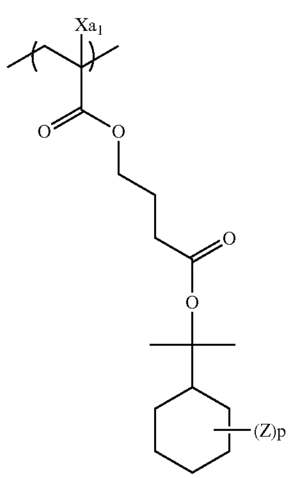
-continued
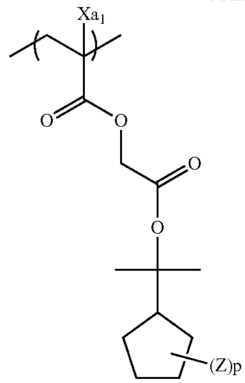
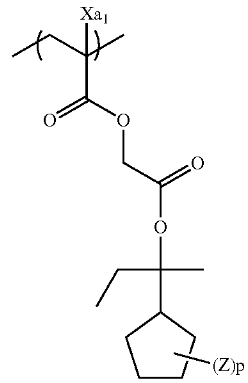
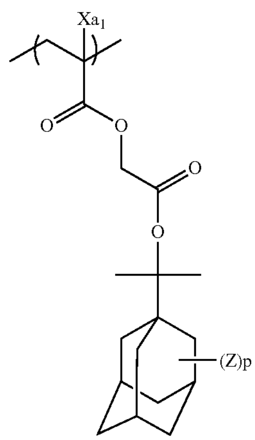
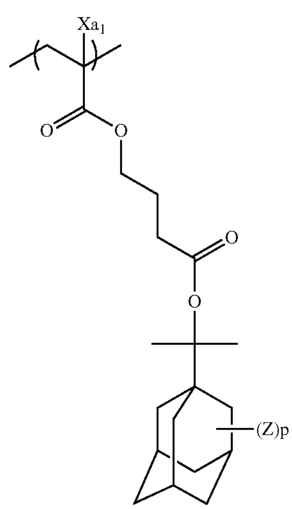

-continued
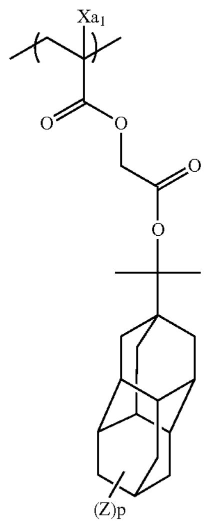
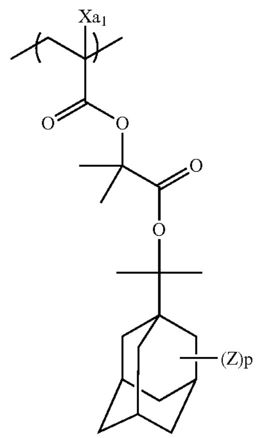
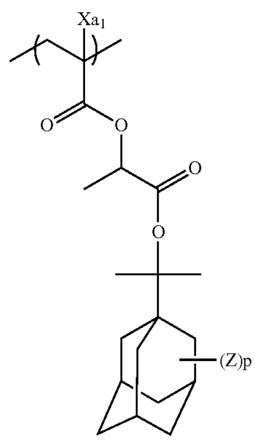
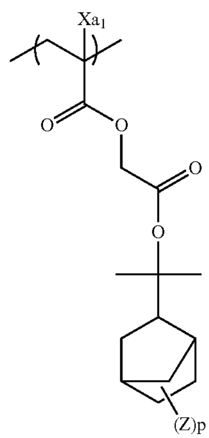
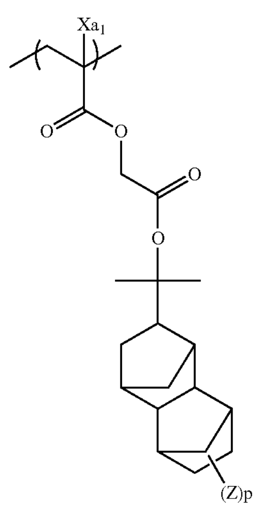
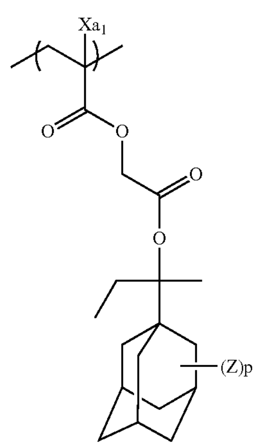
-continued
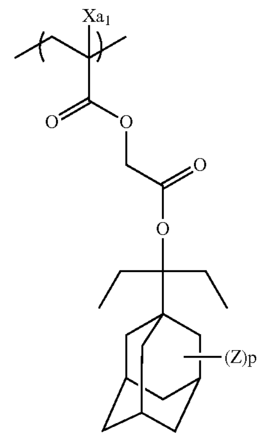
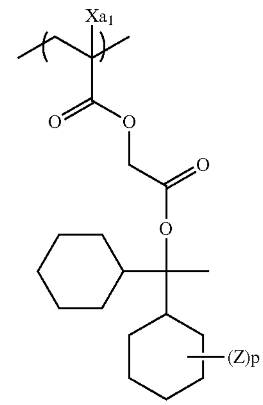
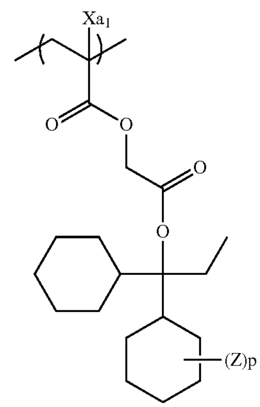
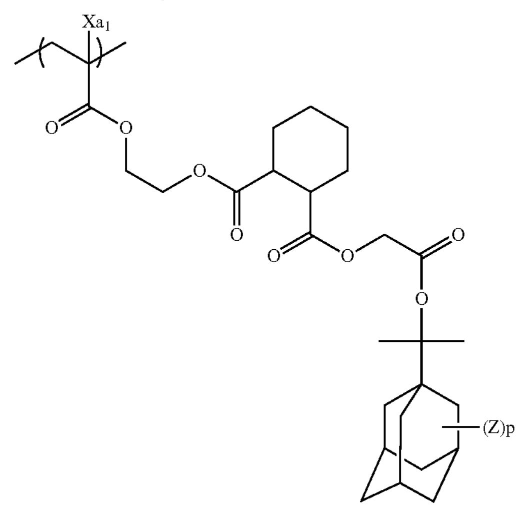
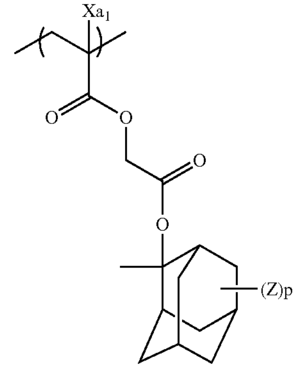

-continued
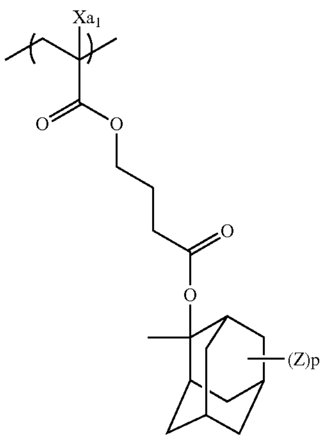
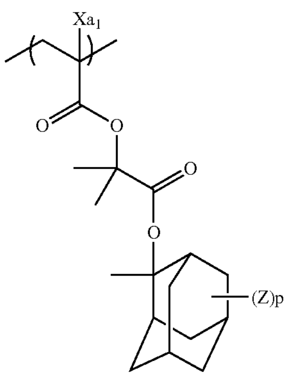
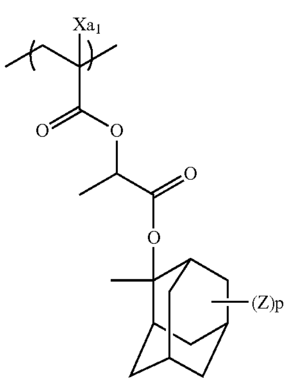
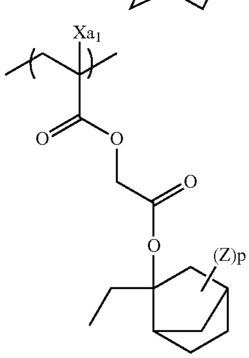
-continued
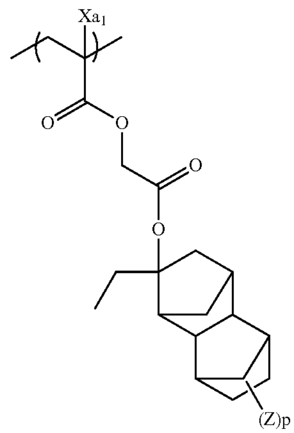
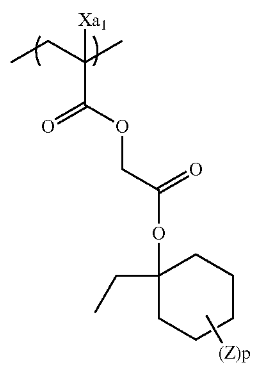
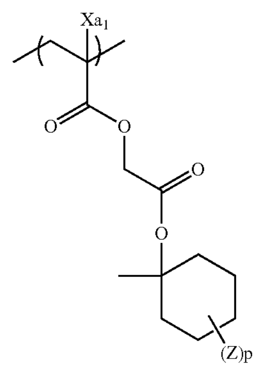
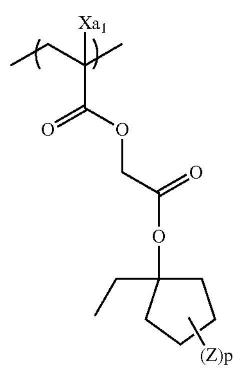
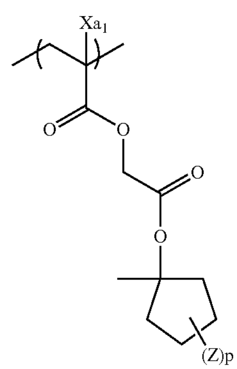
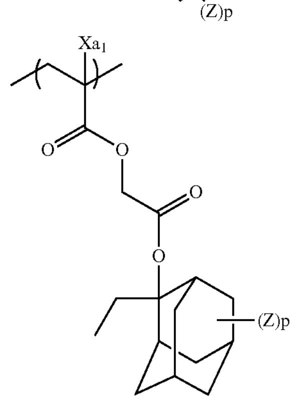

-continued

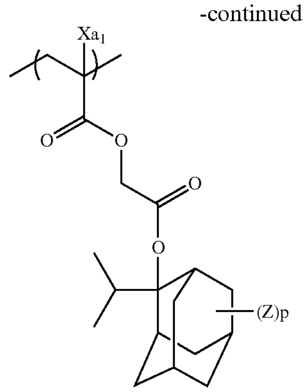

The repeating unit represented by formula (II) is preferably a repeating unit represented by any one of the following formulae (II-1), (II-2), (II-3) and (II-4). In specific examples, $Xa_1$ represents a hydrogen atom, $CH_3$, $CF_3$ or $CH_2OH$.

(2-1)

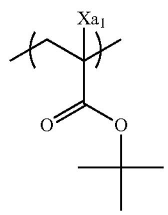

(2-2)

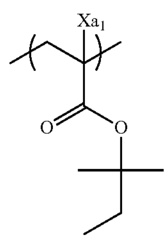

(2-3)

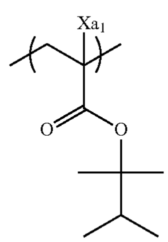

(2-4)

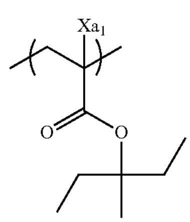

As the embodiment different from the repeating units illustrated above, repeating units capable of producing an alcoholic hydroxyl group, illustrated blow, are also a preferred embodiment.

In specific examples, $Xa_1$ represents a hydrogen atom, $CH_3$, $CF_3$ or $CH_2OH$.

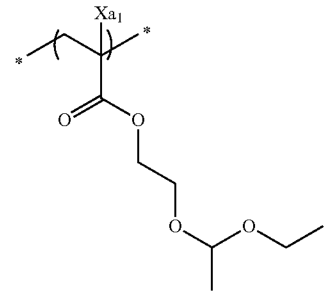

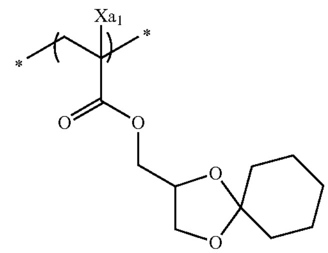

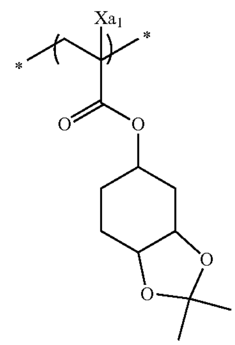

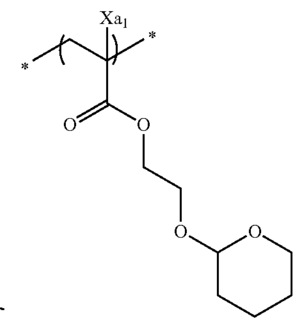

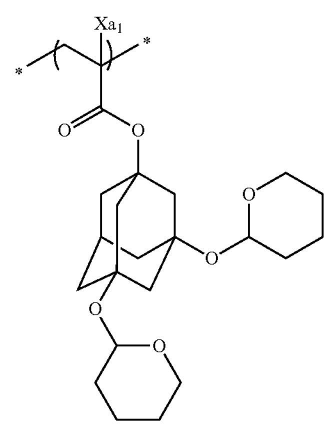

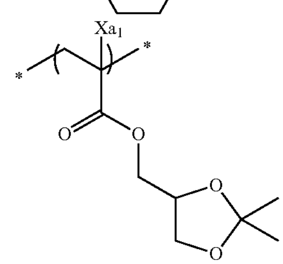

-continued
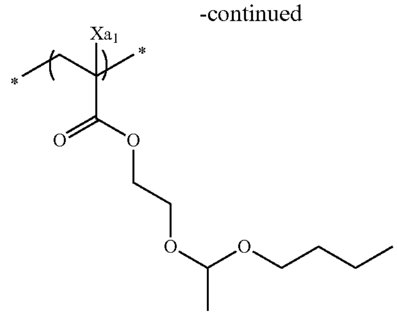
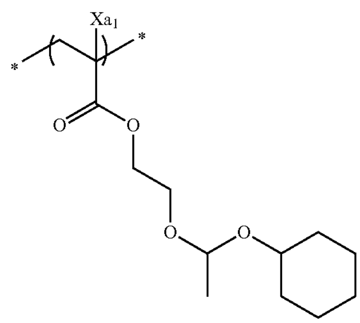
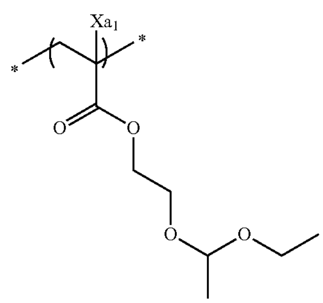
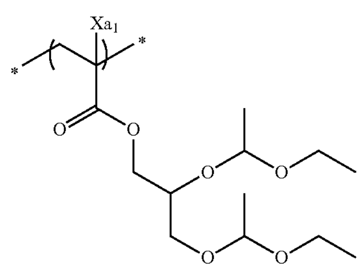
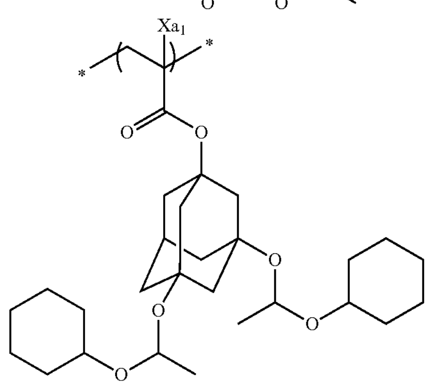
-continued
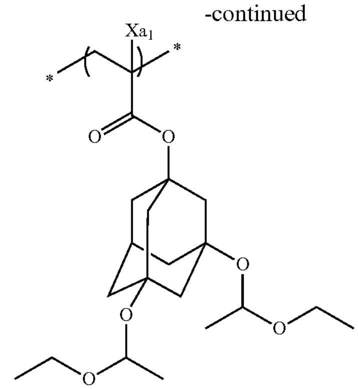
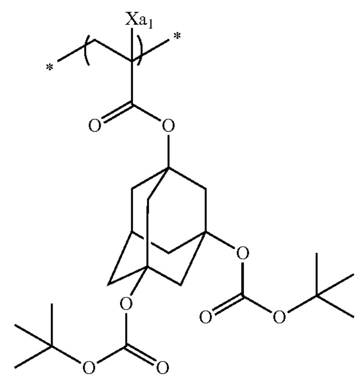
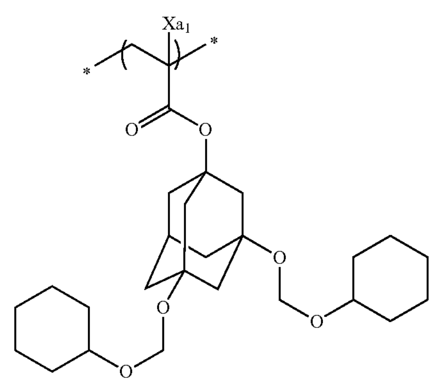
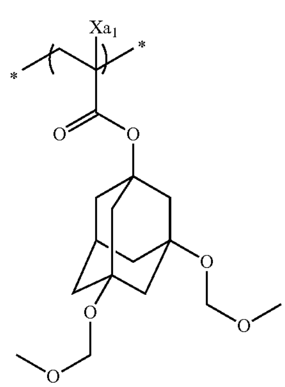

-continued

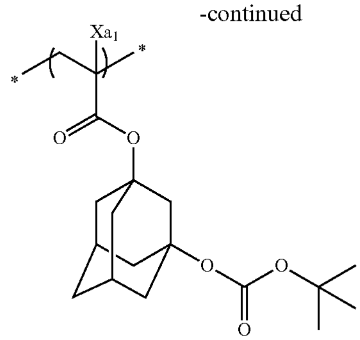

As for the repeating unit having a group capable of decomposing by the action of an acid to produce a polar group, other than the repeating unit (a1), one kind may be used, or two or more kinds may be used in combination.

The resin (P) may or may not contain a repeating unit having an acid-decomposable group capable of decomposing by the action of an acid to produce a polar group, other than the repeating unit (a1), but in the case of containing the repeating unit, the content thereof is preferably from 5 to 60 mol %, more preferably from 10 to 55 mol %.

The total content of the repeating units having an acid-decomposable group (that is, the repeating unit (a1) and the "repeating unit having an acid-decomposable group capable of decomposing by the action of an acid to produce a polar group, other than the repeating unit (a1)"), contained in the resin (P), is preferably from 20 to 100 mol %, more preferably from 40 to 100 mol %, still more preferably from 55 to 100 mol %, based on all repeating units in the resin.

Also, in the case where the resin (P) contains the repeating unit (a2), the sum of the content of the repeating unit (a1) and the content of the repeating unit (a2) is preferably 60 mol % or more based on all repeating units in the resin (P).

The resin (P) may contain a repeating unit having a lactone structure.

Any lactone structure may be used as long as it has a lactone structure, but a 5- to 7-membered ring lactone structure is preferred, and a 5- to 7-membered ring lactone structure to which another ring structure is fused to form a bicyclo or Spiro structure is preferred. It is more preferred to contain a repeating unit having a lactone structure represented by any one of the following formulae (LC1-1) to (LC1-17). The lactone structure may be bonded directly to the main chain. Among these lactone structures, (LC1-1), (LC1-4), (LC1-5), (LC1-6), (LC1-13), (LC1-14) and (LC1-17) are preferred, and the lactone structure of (LC1-4) is more preferred. By virtue of using such a specific lactone structure, LER and development defect are improved.

LC1-1

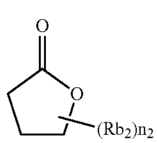

LC1-2

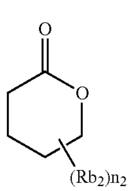

-continued

LC1-3

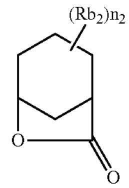

LC1-4

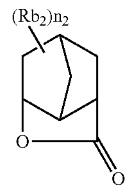

LC1-5

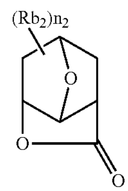

LC1-6

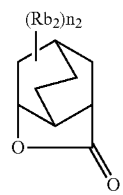

LC1-7

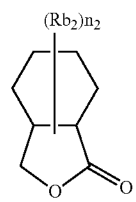

LC1-8

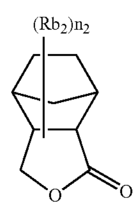

LC1-9

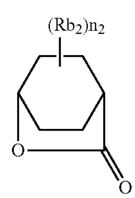

LC1-10

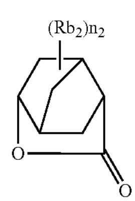

-continued

LC1-11

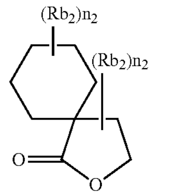

LC1-12

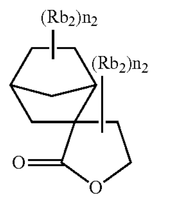

LC1-13

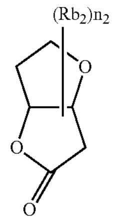

LC1-14

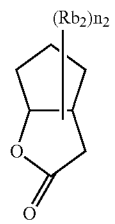

LC1-15

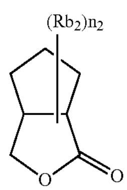

LC1-16

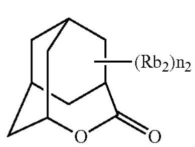

LC1-17

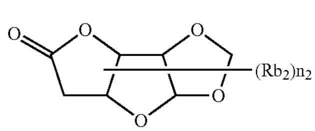

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. Among these, an alkyl group having a carbon number of 1 to 4, a cyano group and an acid-decomposable group are more preferred. $n_2$ represents an integer of 0 to 4. When $n_2$ is 2 or more, each substituent ($Rb_2$) may be the same as or different from every other substituents ($Rb_2$) and also, the plurality of substituents ($Rb_2$) may combine together to form a ring.

The repeating unit having a lactone group usually has an optical isomer, but any optical isomer may be used. One optical isomer may be used alone, or a mixture of a plurality of optical isomers may be used. In the case of mainly using one optical isomer, the optical purity (ee) thereof is preferably 90% or more, more preferably 95% or more.

The lactone structure-containing repeating unit is preferably a unit represented by the following formula (III):

(III)

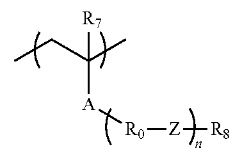

In formula (III), A represents an ester bond (a group represented by —COO—) or an amido bond (a group represented by —CONH—).

$R_0$ represents, when a plurality of $R_0$ are present, each independently represents, an alkylene group, a cycloalkylene group or a combination thereof.

Z represents, when a plurality of Z are present, each independently represents, a single bond, an ether bond, an ester bond, an amide bond, a urethane bond

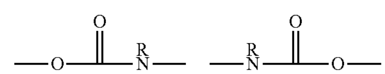

(a group represented by or or a urea bond

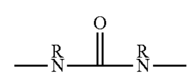

(a group represented by), wherein each R independently represents a hydrogen atom, an alkyl group, a cycloalkyl group or an aryl group.

$R_8$ represents a monovalent organic group having a lactone structure.

n is the repetition number of the structure represented by —$R_0$—Z— and represents an integer of 0 to 5, preferably 0 or 1, more preferably 0. When n is 0, —$R_0$—Z— is not present and results in a single bond.

$R_7$ represents a hydrogen atom, a halogen atom or an alkyl group.

The alkylene group and cycloalkylene group of $R_0$ may have a substituent.

Z is preferably an ether bond or an ester bond, more preferably an ester bond.

The alkyl group of $R_7$ is preferably an alkyl group having a carbon number of 1 to 4, more preferably a methyl group or an ethyl group, still more preferably a methyl group.

The alkylene group and cycloalkylene group in $R_0$ and the alkyl group in $R_7$ may be substituted, and examples of the substituent include a halogen atom such as fluorine atom, chlorine atom and bromine atom, a mercapto group, a hydroxyl group, an alkoxy group such as methoxy group, ethoxy group, isopropoxy group, tert-butoxy group and benzyloxy group, and an acyloxy group such as acetyloxy group and propionyloxy group.

$R_7$ is preferably a hydrogen atom, a methyl group, a trifluoromethyl group or a hydroxymethyl group.

The chain alkylene group in $R_0$ is preferably a chain alkylene group having a carbon number of 1 to 10, more preferably a carbon number of 1 to 5, and examples thereof include a methylene group, an ethylene group and a propylene group. The cycloalkylene group is preferably a cycloalkylene group having a carbon number of 3 to 20, and examples thereof include a cyclohexylene group, a cyclopentylene group, a norbornylene group and an adamantylene group. For bringing out the effects of the present invention, a chain alkylene group is more preferred, and a methylene group is still more preferred.

The lactone structure-containing monovalent organic group represented by $R_8$ is not limited as long as it has a lactone structure. Specific examples thereof include the lactone structures represented by formulae (LC1-1) to (LC1-17) and among these, the structure represented by (LC1-4) is preferred. Also, structures where $n_2$ in (LC1-1) to (LC1-17) is 2 or less are more preferred.

$R_8$ is preferably a monovalent organic group having an unsubstituted lactone structure, or a monovalent organic group having a lactone structure containing a methyl group, a cyano group or an alkoxycarbonyl group as the substituent, more preferably a monovalent organic group having a lactone structure containing a cyano group as the substituent (cyanolactone).

Specific examples of the repeating unit containing a group having a lactone structure are illustrated below, but the present invention is not limited thereto.

In specific examples, R represents a hydrogen atom, an alkyl group which may have a substituent or a halogen atom, preferably a hydrogen atom, a methyl group, a hydroxymethyl group or an acetyloxymethyl group.

(In the formulae, Rx represents H, $CH_3$, $CH_2OH$ or $CF_3$.)

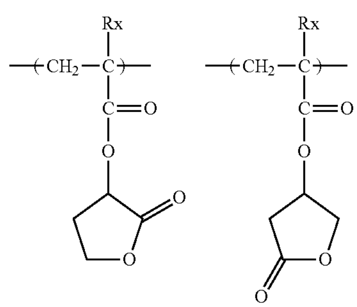

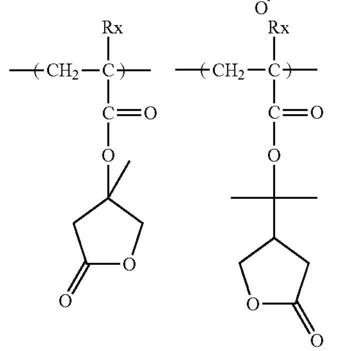

-continued

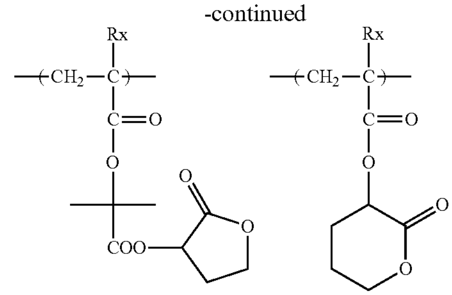

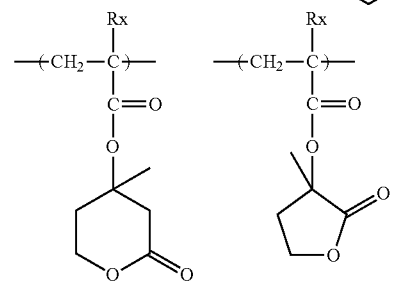

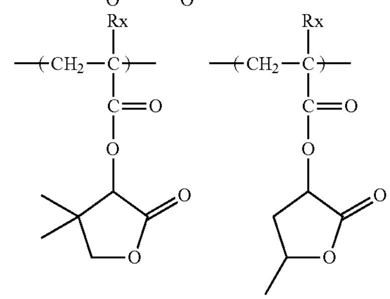

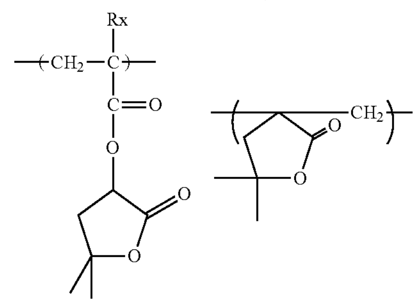

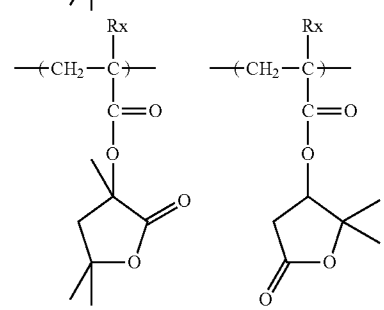

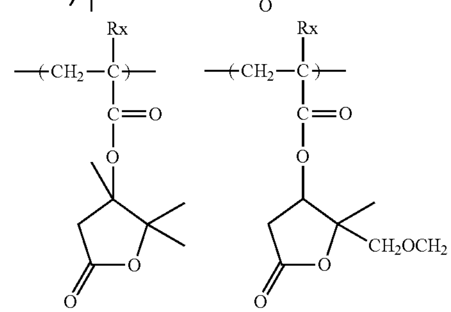

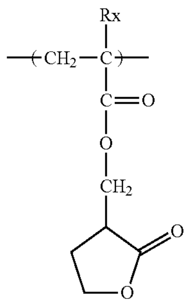
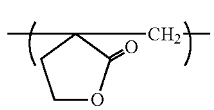
(In the formulae, Rx represents H, $CH_3$, $CH_2OH$ or $CF_3$.)
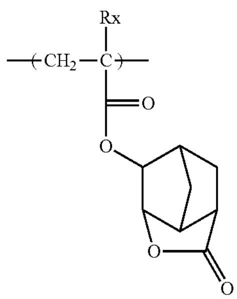
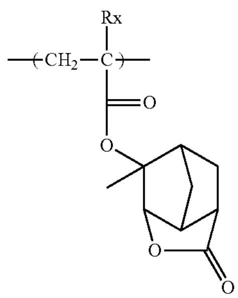
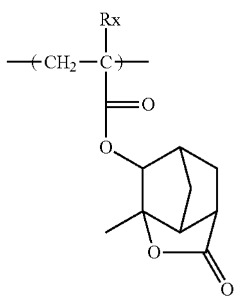
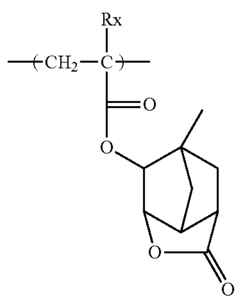
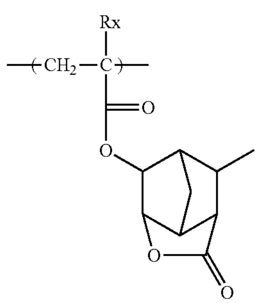
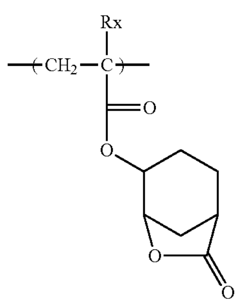
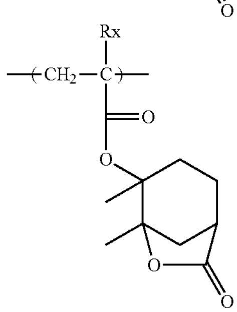
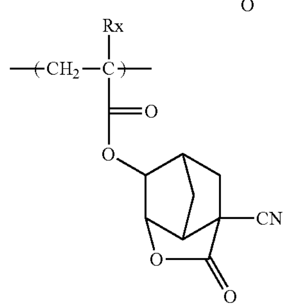
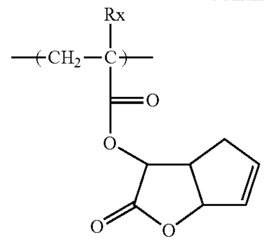
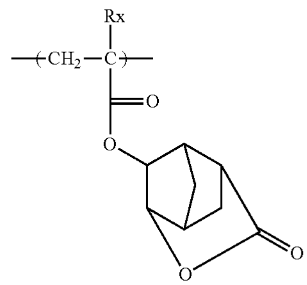
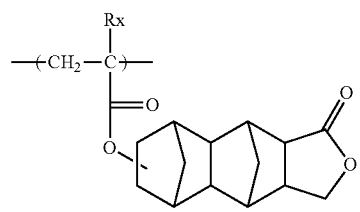
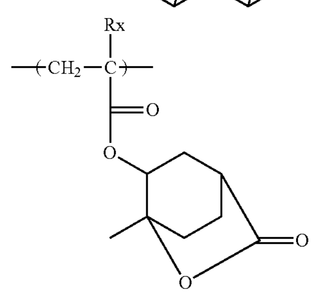
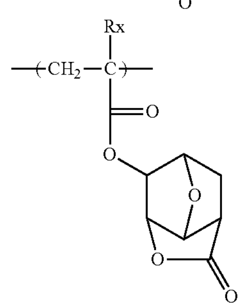
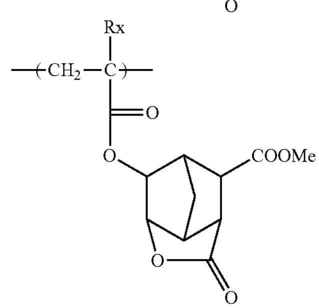

-continued
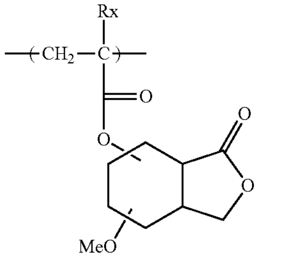
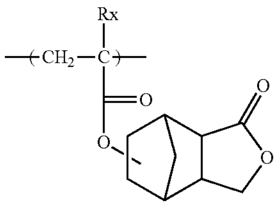
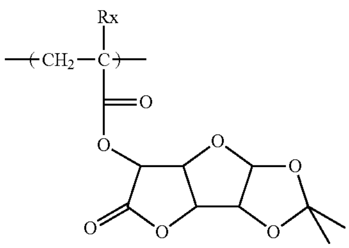
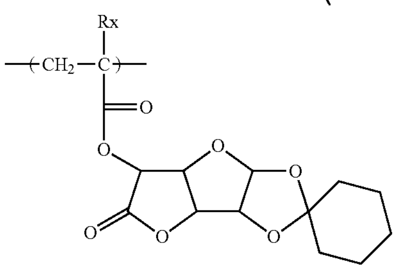
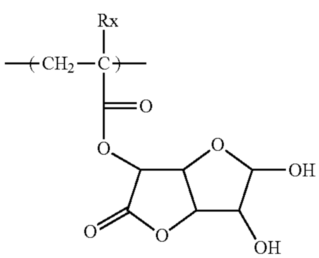
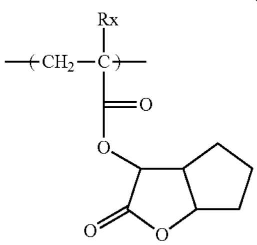
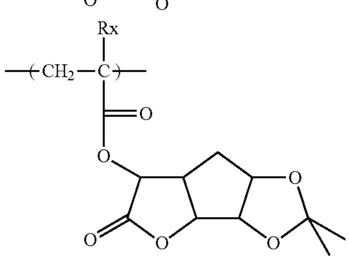
(In the formulae, Rx represents H, $CH_3$, $CH_2OH$ or $CF_3$.)
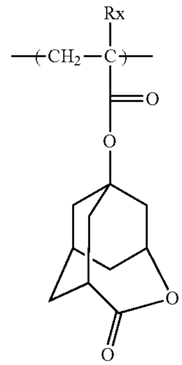
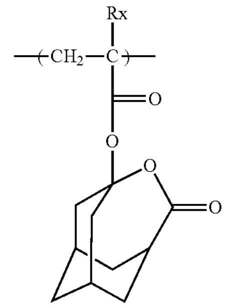
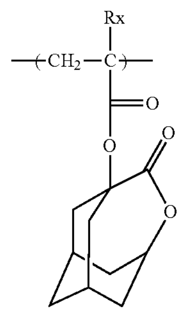
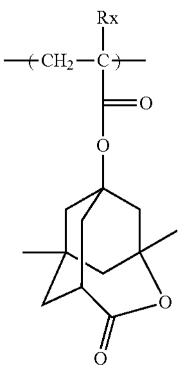
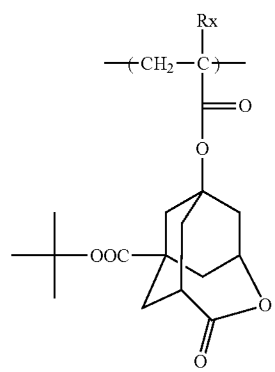
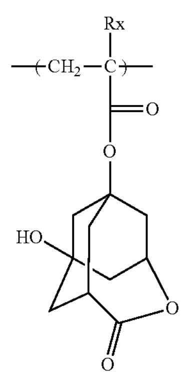
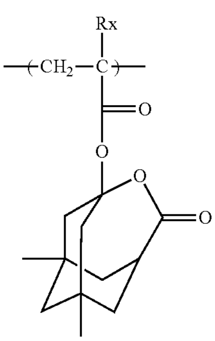

-continued
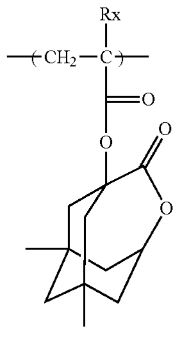
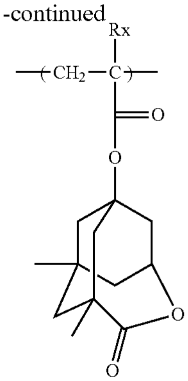
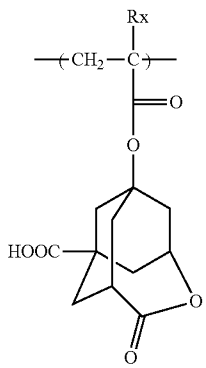
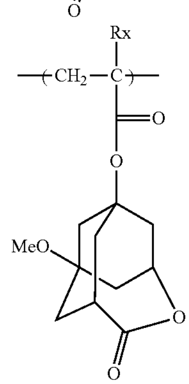
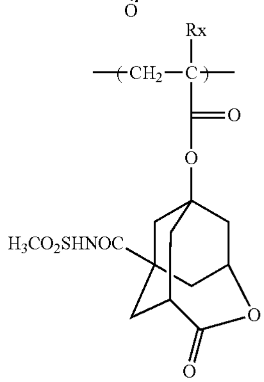
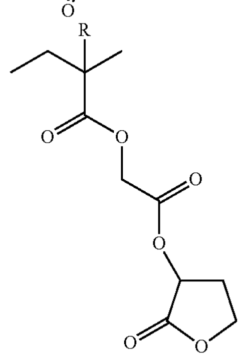
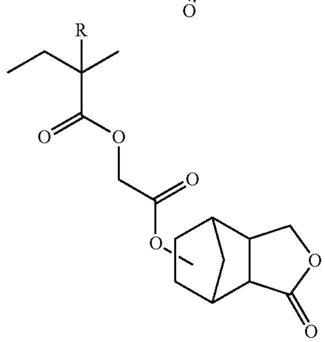
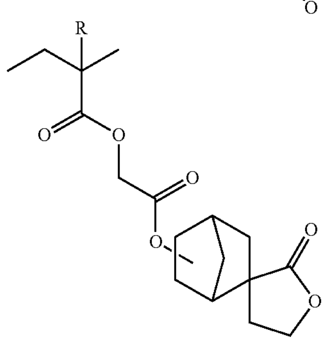
-continued
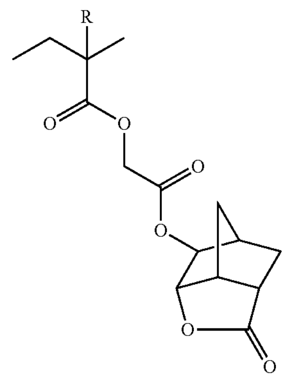
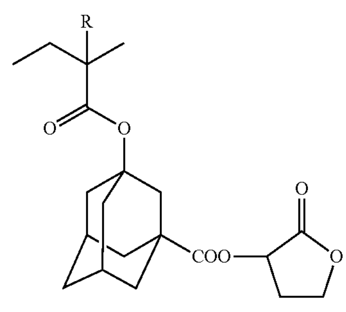
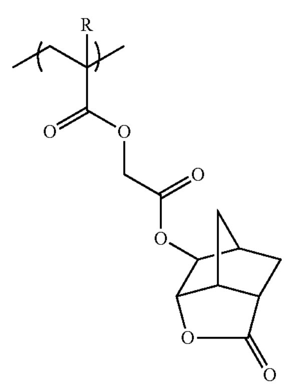
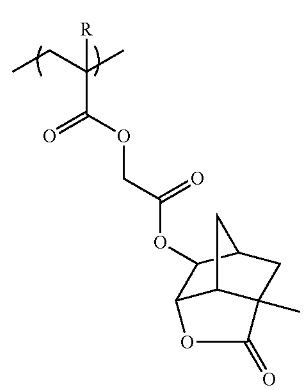

-continued
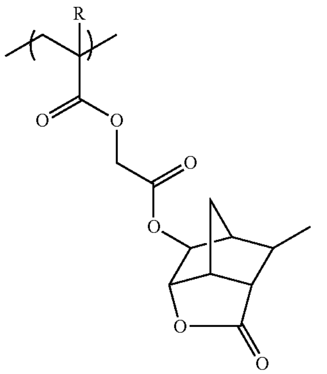
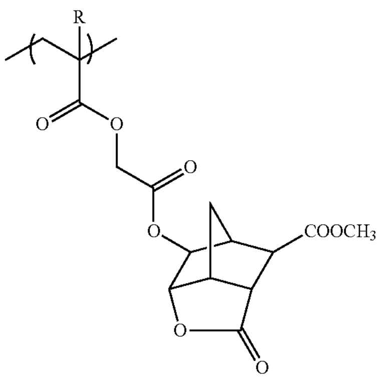
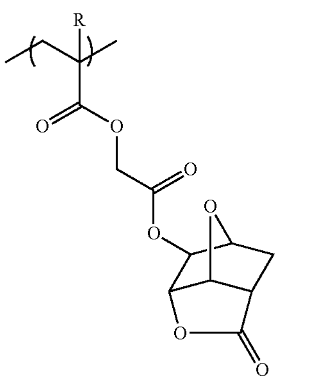
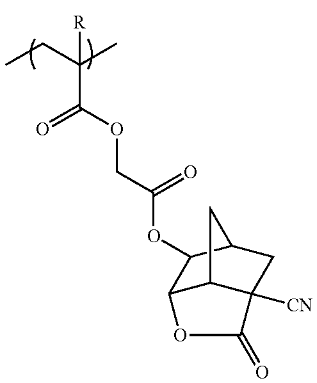
-continued
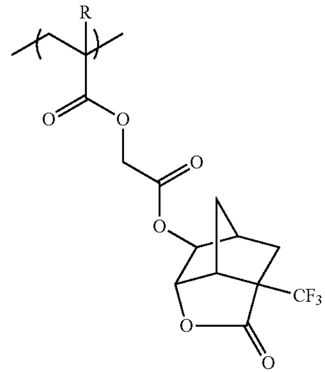
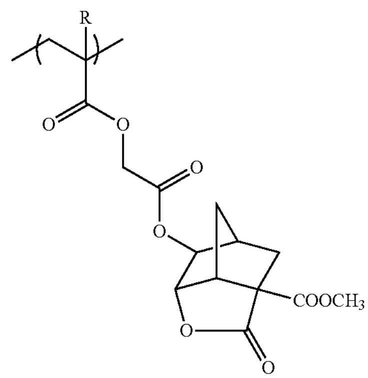
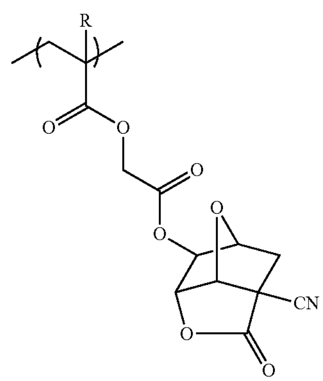
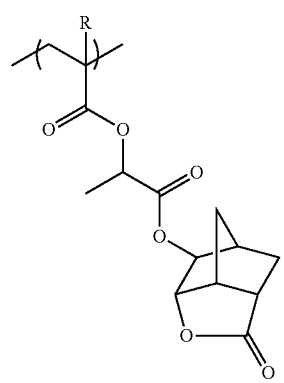

-continued
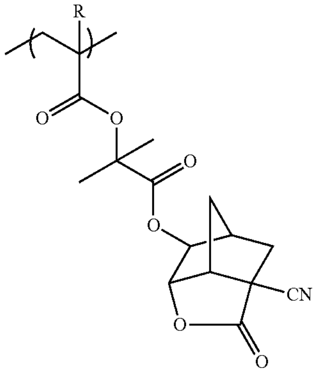
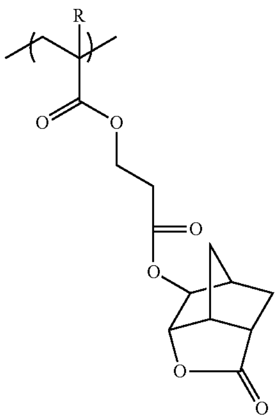
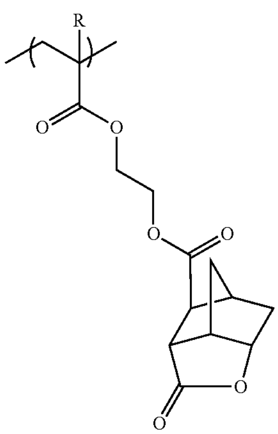
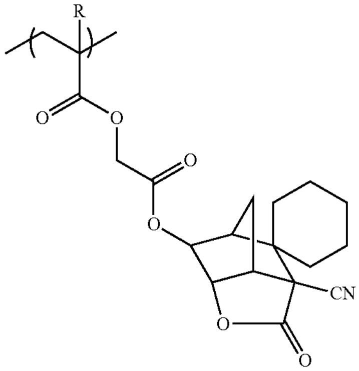
-continued
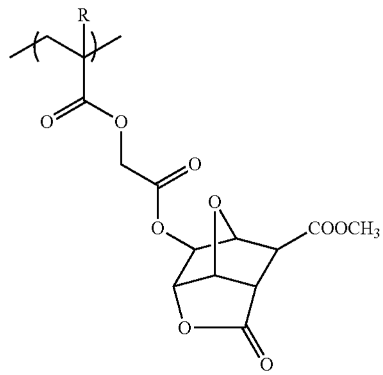
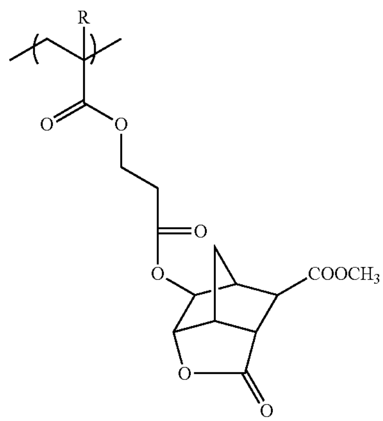
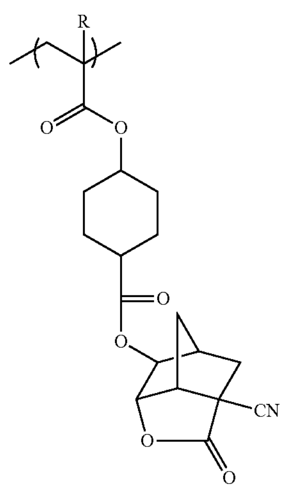
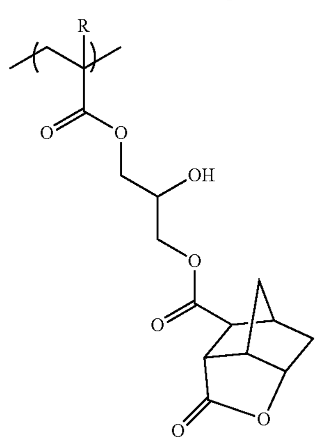

-continued
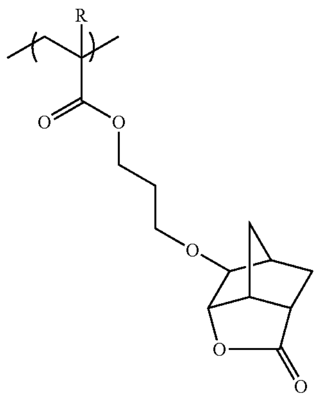
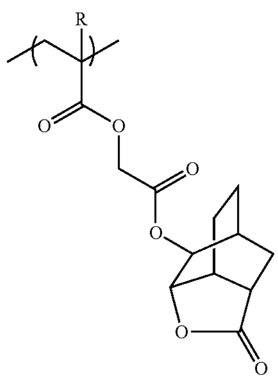
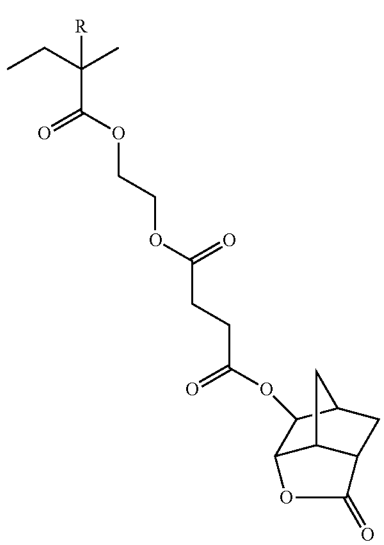
-continued
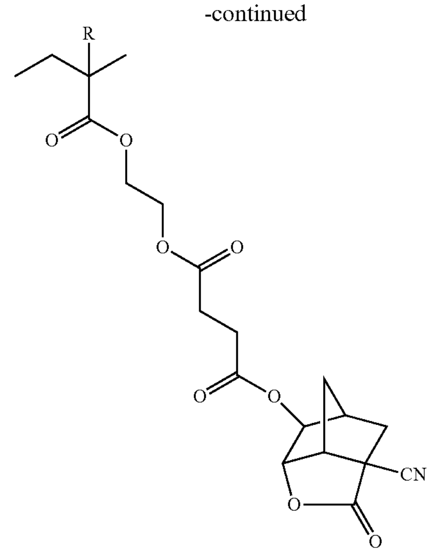
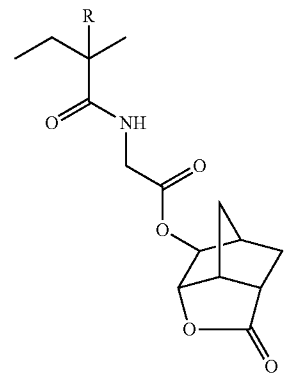
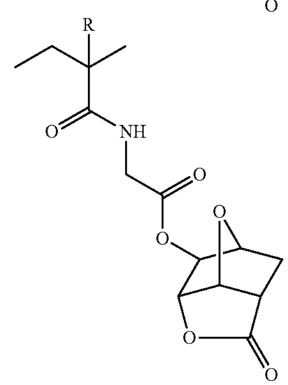
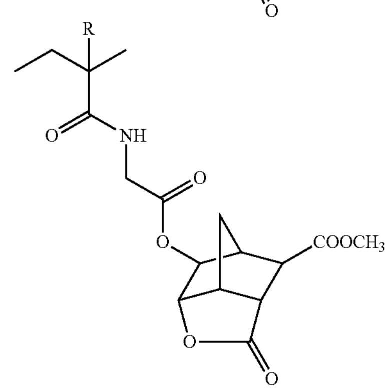
For increasing the effects of the present invention, it is also possible to use two or more kinds of lactone structure-containing repeating units in combination.

In the case where the resin (P) contains a repeating unit having a lactone structure, the content of the repeating unit having a lactone structure is preferably from 5 to 60 mol %, more preferably from 5 to 55 mol %, still more preferably from 10 to 50 mol %, based on all repeating units in the resin (P).

The resin (P) preferably contains a repeating unit having a hydroxyl group or a cyano group, other than the repeating unit represented by formula (III). Thanks to this repeating unit, adherence to substrate and affinity for developer are enhanced. The repeating unit having a hydroxyl group or a cyano group is preferably a repeating unit having an alicyclic hydrocarbon structure substituted with a hydroxyl group or a cyano group and preferably has no acid-decomposable group. The alicyclic hydrocarbon structure in the alicyclic hydrocarbon structure substituted with a hydroxyl group or a cyano group is preferably an adamantyl group, a diamantyl group or a norbornane group. The alicyclic hydrocarbon structure substituted with a hydroxyl group or a cyano group is preferably a partial structure represented by the following formulae (VIIa) to (VIId):

(VIIa)

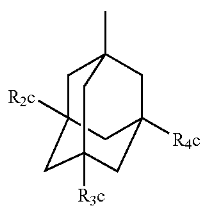

(VIIb)

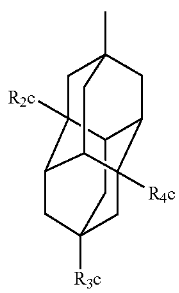

(VIIc)

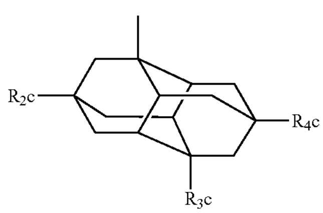

(VIId)

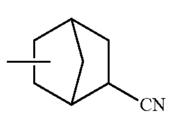

In formulae (VIIa) to (VIIe), each of $R_2c$ to $R_4c$ independently represents a hydrogen atom, a hydroxyl group or a cyano group, provided that at least one of $R_2c$ to $R_4c$ represents a hydroxyl group or a cyano group. A structure in which one or two members out of $R_2c$ to $R_4c$ are a hydroxyl group with the remaining being a hydrogen atom is preferred. In formula (VIIa), it is more preferred that two members out of $R_2c$ to $R_4c$ are a hydroxyl group and the remaining is a hydrogen atom.

The repeating unit having a partial structure represented by formulae (VIIa) to (VIId) includes repeating units represented by the following formulae (AIIa) to (AIId):

(AIIa)

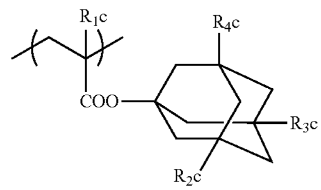

(AIIb)

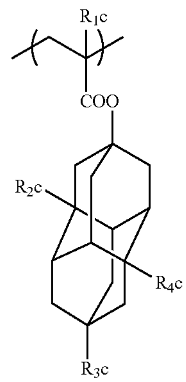

(AIIc)

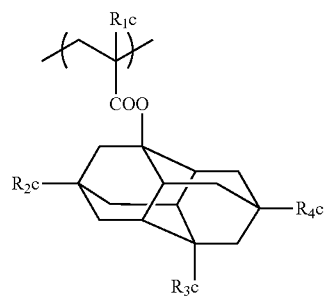

(AIId)

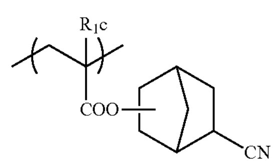

In formulae (AIIa) to (AIId), $R_1c$ represents a hydrogen atom, a methyl group, a trifluoromethyl group or a hydroxymethyl group.

$R_2c$ to $R_4c$ have the same meanings as $R_2c$ to $R_4c$ in formulae (VIIa) to (VIIc).

In the case where the resin (P) contains a repeating unit having a hydroxyl group or a cyano group, the content of the repeating unit having a hydroxyl group or a cyano group is preferably from 5 to 40 mol %, more preferably from 5 to 30 mol %, still more preferably from 10 to 30 mol %, based on all repeating units in the resin (P).

Specific examples of the repeating unit having a hydroxyl group or a cyano group are illustrated below, but the present invention is not limited thereto.

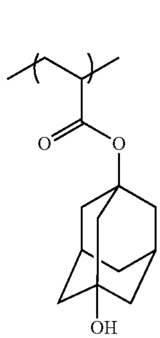
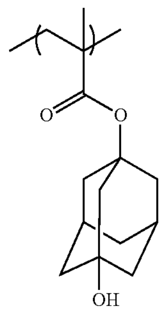
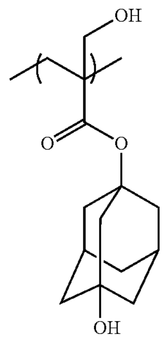
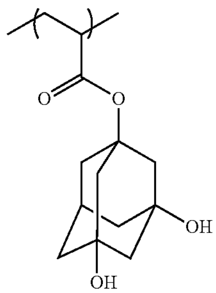
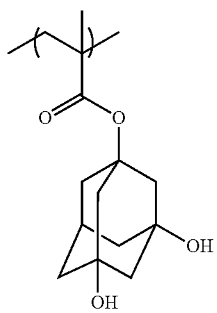
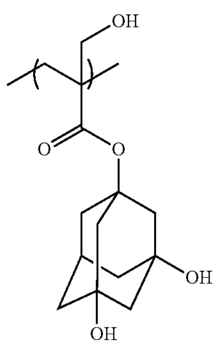
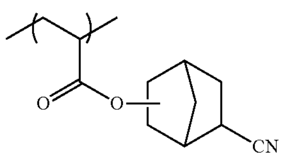
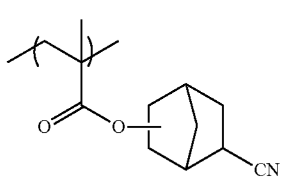
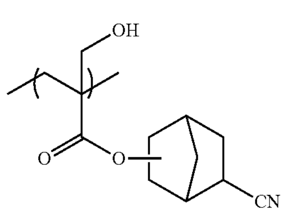
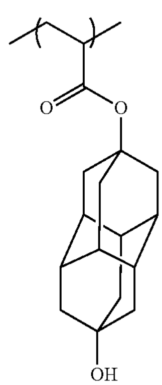

-continued

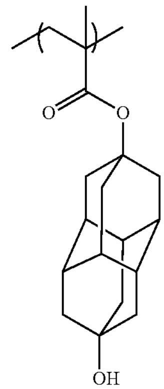
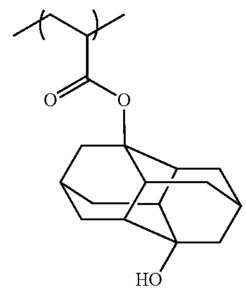
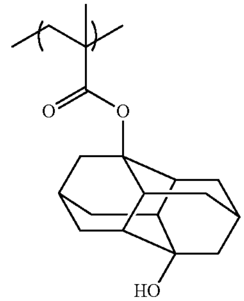

The resin (P) may contain a repeating unit having an acid group. The acid group includes a carboxyl group, a sulfonamide group, a sulfonylimide group, a bissulfonylimide group, and an aliphatic alcohol substituted with an electron-withdrawing group at the α-position (for example, a hexafluoroisopropanol group), and it is more preferred to contain a repeating unit having a carboxyl group. By virtue of containing a repeating unit having an acid group, the resolution increases in the usage of forming contact holes. As for the repeating unit having an acid group, a repeating unit where the acid group is directly bonded to the main chain of the resin, such as repeating unit by an acrylic acid or a methacrylic acid, a repeating unit where the acid group is bonded to the main chain of the resin through a linking group, and a repeating unit where the acid group is introduced into the terminal of the polymer chain by using an acid group-containing polymerization initiator or chain transfer agent at the polymerization, all are preferred. The linking group may have a monocyclic or polycyclic, cyclic hydrocarbon structure. A repeating unit by an acrylic acid or a methacrylic acid is more preferred.

The resin (P) may or may not contain a repeating unit having an acid group, but in the case of containing a repeating unit having an acid group, the content thereof is preferably 25 mol % or less, more preferably 20 mol % or less, based on all repeating units in the resin (P). In the case where the resin (P) contains a repeating unit having an acid group, the content of the acid group-containing repeating unit in the resin (P) is usually 1 mol % or more.

Specific examples of the repeating unit having an acid group are illustrated below, but the present invention is not limited thereto.

In specific examples, Rx represents H, $CH_3$, $CH_2OH$ or $CF_3$.

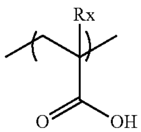
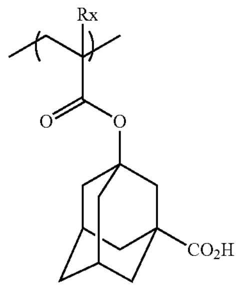
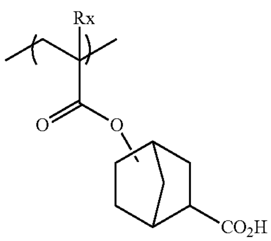
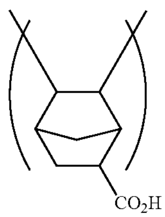
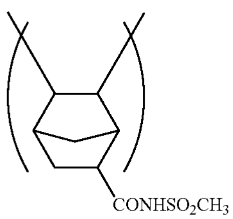
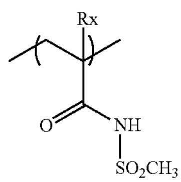
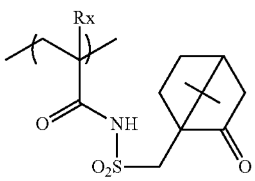
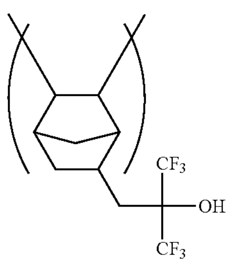
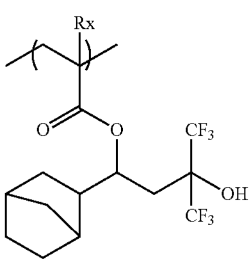
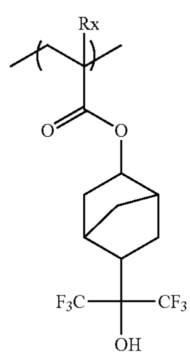
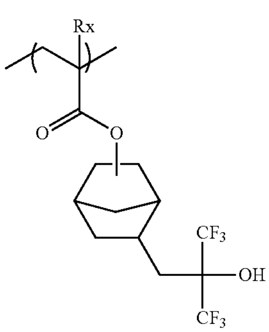

-continued

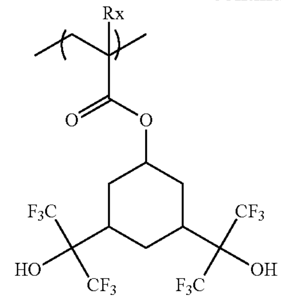

The resin (P) for use in the present invention may further contain a repeating unit having an alicyclic hydrocarbon structure free from a polar group (for example, the above-described acid group, a hydroxyl group or a cyano group) and not exhibiting acid decomposability. Thanks to this repeating unit, not only elution of low molecular components from the resist film into the immersion liquid at the immersion exposure can be reduced but also the solubility of the resin at the development using an organic solvent-containing developer can be appropriately adjusted. Such a repeating unit includes a repeating unit represented by formula (IV):

(IV)

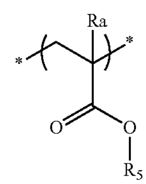

In formula (IV), $R_5$ represents a hydrocarbon group having at least one cyclic structure and having no polar group.

Ra represents a hydrogen atom, an alkyl group or a —$CH_2$—O—$Ra_2$ group, wherein $Ra_2$ represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring assembly hydrocarbon group and a crosslinked cyclic hydrocarbon group. Examples of the ring assembly hydrocarbon group include a bicyclohexyl group and a perhydronaphthalenyl group. Examples of the crosslinked cyclic hydrocarbon ring include a bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[5.2.1.$0^{2,6}$]decane ring and tricyclo[4.3.1.$1^{2,5}$]undecane ring, and a tetracyclic hydrocarbon ring such as tetracyclo[4.4.0.$1^{2,5}$.$1^{7,10}$]

dodecane ring and perhydro-1,4-methano-5,8-methanonaphthalene ring. The crosslinked cyclic hydrocarbon ring also includes a condensed cyclic hydrocarbon ring, for example, a condensed ring formed by fusing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon ring include a norbornyl group, an adamantyl group, a bicyclooctanyl group and a tricycle[5,2,1,$0^{2,6}$]decanyl group. Of these crosslinked cyclic hydrocarbon rings, a norbornyl group and an adamantyl group are more preferred.

These alicyclic hydrocarbon groups may have a substituent, and preferred examples of the substituent include a halogen atom, an alkyl group, a hydroxyl group with a hydrogen atom being substituted for, and an amino group with a hydrogen atom being substituted for. The halogen atom is preferably bromine atom, chlorine atom or fluorine atom, and the alkyl group is preferably methyl group, ethyl group, butyl group or tert-butyl group. This alkyl group may further have a substituent, and the substituent which may be further substituted on the alkyl group includes a halogen atom, an alkyl group, a hydroxyl group with a hydrogen atom being substituted for, and an amino group with a hydrogen atom being substituted for.

Examples of the substituent for hydrogen atom include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group includes, for example, an alkoxycarbonyl group having a carbon number of 1 to 4.

The resin (P) may or may not contain a repeating unit having a polar group-free alicyclic hydrocarbon structure and not exhibiting acid decomposability, but in the case of containing the repeating unit, the content thereof is preferably from 1 to 50 mol %, more preferably from 10 to 50 mol %, based on all repeating units in the resin (P).

Specific examples of the repeating unit having a polar group-free alicyclic hydrocarbon structure and not exhibiting acid decomposability are illustrated below, but the present invention is not limited thereto. In the formulae, Ra represents H, $CH_3$, $CH_2OH$ or $CF_3$.

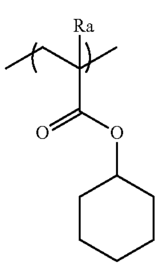

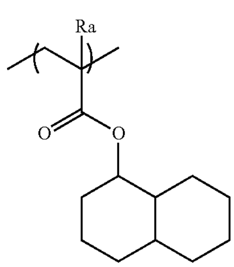

-continued

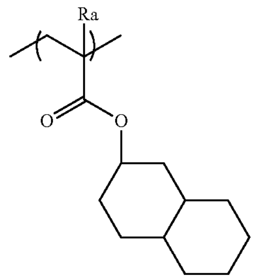

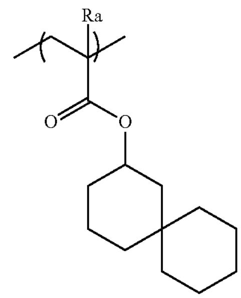

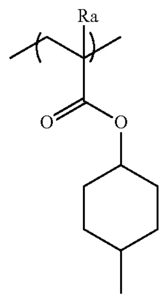

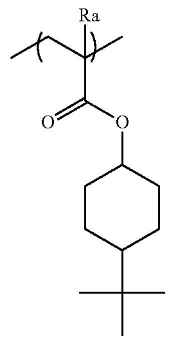

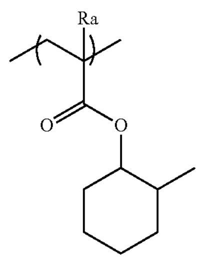

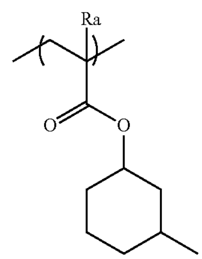

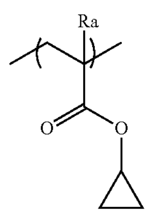

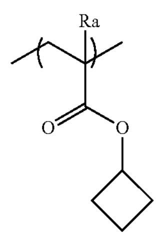

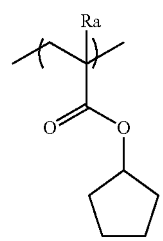

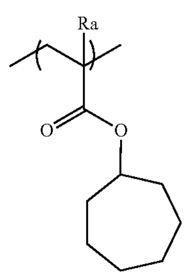

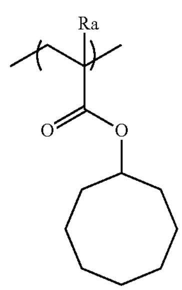

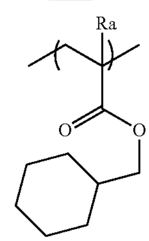

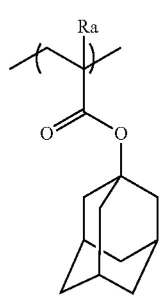

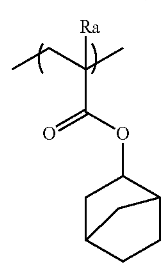

-continued

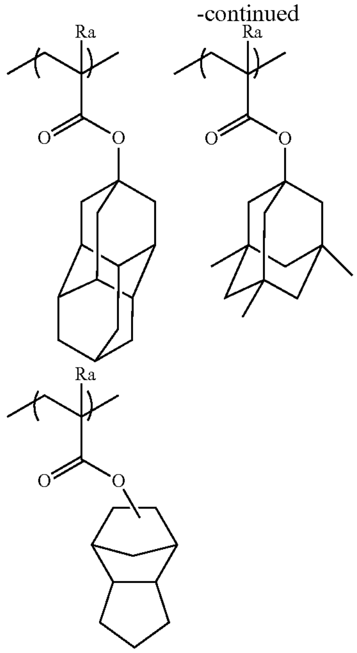

The resin (P) for use in the composition of the present invention may contain, in addition to the above-described repeating structural units, various repeating structural units for the purpose of controlling the dry etching resistance, suitability for standard developer, adherence to substrate, resist profile and properties generally required of an actinic ray-sensitive or radiation-sensitive resin composition, such as resolution, heat resistance and sensitivity.

Examples of such a repeating structural unit include, but are not limited to, repeating structural units corresponding to the monomers described below.

Thanks to such a repeating structural unit, the performance required of the resin for use in the composition relating to the present invention, particularly (1) solubility for coating solvent, (2) film-forming property (glass transition temperature), (3) alkali developability, (4) film loss (selection of hydrophilic, hydrophobic or alkali-soluble group), (5) adherence of unexposed area to substrate, (6) dry etching resistance, and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the resin (P) for use in the composition of the present invention, the molar ratio of respective repeating structural units contained is appropriately set to control dry etching resistance of the resist actinic ray-sensitive or radiation-sensitive resin composition, suitability for standard developer, adherence to substrate, resist profile and performances generally required of the actinic ray-sensitive or radiation-sensitive resin composition, such as resolution, heat resistance and sensitivity.

In the case where the composition of the present invention is used for ArF exposure, in view of transparency to ArF light, the resin (P) for use in the composition of the present invention preferably has substantially no aromatic ring (specifically, the ratio of an aromatic group-containing repeating unit in the resin is preferably 5 mol % or less, more preferably 3 mol % or less, and ideally 0 mol %, that is, the resin does not have an aromatic group), and the resin (P) preferably has a monocyclic or polycyclic alicyclic hydrocarbon structure.

Also, in the case where the composition of the present invention contains the later-described resin (E), the resin (P) preferably contains no fluorine atom and no silicon atom in view of compatibility with the resin (E).

The resin (P) for use in the composition of the present invention is preferably a resin where all repeating units are composed of a (meth)acrylate-based repeating unit. In this case, all repeating units may be a methacrylate-based repeating unit, all repeating units may be an acrylate-based repeating unit, or all repeating units may be composed of a methacrylate-based repeating unit and an acrylate-based repeating unit, but the proportion of the acrylate-based repeating unit is preferably 50 mol % or less based on all repeating units.

In the case of irradiating the composition of the present invention with KrF excimer laser light, electron beam, X-ray or high-energy beam at a wavelength of 50 nm or less (e.g., EUV), the resin (P) preferably further contains a hydroxystyrene-based repeating unit. It is more preferred to contain a hydroxystyrene-based repeating unit and an acid-decomposable repeating unit such as a hydroxystyrene-based repeating unit protected by an acid-decomposable group and tertiary alkyl(meth)acrylate.

Preferred examples of the hydroxystyrene-based repeating unit having an acid-decomposable group include repeating units composed of a tert-butoxycarbonyloxystyrene, a 1-alkoxyethoxystyrene and a tertiary alkyl(meth)acrylate. Repeating units composed of a 2-alkyl-2-adamantyl(meth)acrylate and a dialkyl(1-adamantyl)methyl(meth)acrylate are more preferred.

The resin (P) for use in the present invention can be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the photosensitive composition of the present invention. By the use of the same solvent, production of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction product is poured in a solvent, and the desired polymer is collected by a powder or solid recovery method or the like. The reaction concentration is from 5 to 50 mass %, preferably from 10 to 30 mass %, and the reaction temperature is usually from 10 to 150° C., preferably from 30 to 120° C., more preferably from 60 to 100° C. (In this specification, mass ratio is equal to weight ratio.)

After the completion of reaction, the reaction solution is allowed to cool to room temperature and purified. The purification may be performed by a normal method, for example, a liquid-liquid extraction method of applying water washing or combining it with an appropriate solvent to remove residual monomers or oligomer components; a purification method in a solution sate, such as ultrafiltration of removing by extraction only polymers having a molecular weight not more than a specific value; a reprecipitation method of adding dropwise the resin solution in a poor solvent to solidify the resin in the poor solvent and thereby remove residual monomers and the like; and a purification method in a solid state, such as washing of the resin slurry with a poor solvent after separation by filtration. For example, the resin is precipitated as a solid by contacting the reaction solution with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent for the polymer, and the solvent which can be used may be appropriately selected from, for example, a hydrocarbon, a halogenated hydrocarbon, a nitro compound, an ether, a ketone, an ester, a carbonate, an alcohol, a carboxylic acid, water, and a mixed solvent containing such a solvent, according to the kind of the polymer. Among these solvents, a solvent containing at least an alcohol (particularly, methanol or the like) or water is preferred as the precipitation or reprecipitation solvent.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably at a temperature of approximately from 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volumetric amount of less than 10 times (preferably 5 times or less) the resin solution A, to precipitate a resin solid (step d), and separating the precipitated resin (step e).

Also, for keeping the resin after preparation of the composition from aggregation or the like, as described, for example, in JP-A-2009-037108, a step of dissolving the synthesized resin in a solvent to make a solution, and heating the solution at approximately from 30 to 90° C. for approximately from 30 minutes to 4 hours may be added.

The weight average molecular weight of the resin (P) for use in the composition of the present invention is preferably from 1,000 to 200,000, more preferably from 2,000 to 20,000, still more preferably from 3,000 to 18,000, yet still more preferably from 3,000 to 10,000, in terms of polystyrene by the GPC method. When the weight average molecular weight is from 1,000 to 200,000, reduction in the heat resistance and dry etching resistance can be more avoided and at the same time, the film-forming property can be prevented from deterioration due to impaired developability or increased viscosity.

The polydispersity (molecular weight distribution) is usually from 1.0 to 3.0, preferably from 1.0 to 2.6, more preferably from 1.0 to 2.0, still more preferably from 1.4 to 2.0. As the molecular weight distribution is smaller, the resolution and resist profile are more excellent, the side wall of the resist pattern is smoother, and the roughness is more improved.

In the actinic ray-sensitive or radiation-sensitive resin composition of the present invention, the blending ratio of the resin (P) in the composition as a whole is preferably from 30 to 99 mass %, more preferably from 60 to 95 mass %, based on the entire solid content.

In the present invention, as for the resin (P), one kind may be used or a plurality of kinds may be used in combination.

[2] (A) Resin not Containing a Repeating Unit Represented by Formula (I)

The actinic ray-sensitive or radiation-sensitive resin composition of the present invention may contain (A) a resin not containing (a1) a repeating unit represented by formula (I).

The resin (A) is preferably a resin capable of increasing the polarity by the action of an acid to decrease the solubility for an organic solvent-containing developer and more specifically, preferably a resin containing the above-described "repeating unit having a group capable of decomposing by the action of an acid to produce a polar group, other than the repeating unit (a1)".

The content of the repeating unit having a group capable of decomposing by the action of an acid to produce a polar group, other than the repeating unit (a1), is preferably from 20 to 70 mol %, more preferably from 30 to 65 mol %, based on all repeating units in the resin (A).

The resin (A) may contain a repeating unit other than the repeating unit (a1), in addition to the "repeating unit having a group capable of decomposing by the action of an acid to produce a polar group, other than the repeating unit (a1)". Such a repeating unit includes those described as the repeating unit which may be contained in the resin (P). The preferred range of the content of such a repeating unit based on all repeating units in the resin (A) is the same as that described for the resin (P).

Furthermore, preferred ranges of various physical values (for example, the molecular weight and the polydispersity) of the resin (A) and the synthesis method of the resin (A) are also the same as those described for the resin (P).

The actinic ray-sensitive or radiation-sensitive resin composition of the present invention may or may not contain the resin (A), but in the case of containing the compound (A), the content thereof is preferably from 5 to 50 mass %, more preferably from 5 to 30 mass %, based on the entire solid content of the composition.

[3] (B) Compound Capable of Generating an Acid Upon Irradiation with an Actinic Ray or Radiation The composition of the present invention further contains (B) a compound capable of generating an acid upon irradiation with an actinic ray or radiation (hereinafter, sometimes referred to as an "acid generator"). The compound (B) capable of generating an acid upon irradiation with an actinic ray or radiation is preferably a compound capable of generating an organic acid upon irradiation with an actinic ray or radiation.

The acid generator which can be used may be appropriately selected from a photo-initiator for cationic photopolymerization, a photo-initiator for radical photopolymerization, a photo-decoloring agent for dyes, a photo-discoloring agent, a known compound capable of generating an acid upon irradiation with an actinic ray or radiation, which is used for microresist or the like, and a mixture thereof.

Examples thereof include a diazonium salt, a phosphonium salt, a sulfonium salt, an iodonium salt, imidosulfonate, oxime sulfonate, diazodisulfone, disulfone and o-nitrobenzyl sulfonate.

Out of the acid generators, preferred compounds include compounds represented by the following formulae (ZI), (ZII) and (ZIII):

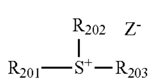

(ZI)

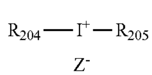

(ZII)

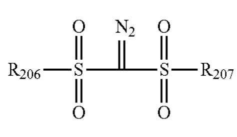

(ZIII)

In formula (ZI), each of $R_{201}$, $R_{202}$ and $R_{203}$ independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain therein an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

$Z^-$ represents a non-nucleophilic anion.

Examples of the non-nucleophilic anion as $Z^-$ include sulfonate anion, carboxylate anion, sulfonylimide anion, bis(alkylsulfonyl)imide anion and tris(alkylsulfonyl)methyl anion.

The non-nucleophilic anion is an anion having an extremely low ability of causing a nucleophilic reaction and this anion can suppress the decomposition with aging due to intramolecular nucleophilic reaction. Thanks to this anion, the aging stability of the resist composition is improved.

Examples of the sulfonate anion include an aliphatic sulfonate anion, an aromatic sulfonate anion and a camphorsulfonate anion.

Examples of the carboxylate anion include an aliphatic carboxylate anion, an aromatic carboxylate anion and an aralkylcarboxylate anion.

The aliphatic moiety in the aliphatic sulfonate anion and aliphatic carboxylate may be an alkyl group or a cycloalkyl group but is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a bornyl group.

The aromatic group in the aromatic sulfonate anion and aromatic carboxylate anion is preferably an aryl group having a carbon number of 6 to 14, and examples thereof include a phenyl group, a tolyl group and a naphthyl group.

The alkyl group, cycloalkyl group and aryl group in the aliphatic sulfonate anion and aromatic sulfonate anion may have a substituent. Examples of the substituent of the alkyl group, cycloalkyl group and aryl group in the aliphatic sulfonate anion and aromatic sulfonate anion include a nitro group, a halogen atom (e.g., fluorine atom, chlorine atom, bromine atom, iodine atom), a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 1 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). The aryl group and ring structure in each group may further have, as the substituent, an alkyl group (preferably having a carbon number of 1 to 15) or a cycloalkyl group (preferably having a carbon number of 3 to 15).

The aralkyl group in the aralkylcarboxylate anion is preferably an aralkyl group having a carbon number of 7 to 12, and examples thereof include a benzyl group, a phenethyl group, a naphthylmethyl group, a naphthylethyl group and a naphthylbutyl group.

The alkyl group, cycloalkyl group, aryl group and aralkyl group in the aliphatic carboxylate anion, aromatic carboxylate anion and aralkylcarboxylate anion may have a substituent. Examples of the substituent include the same halogen atom, alkyl group, cycloalkyl group, alkoxy group and alkylthio group as those in the aromatic sulfonate anion.

Examples of the sulfonylimide anion include saccharin anion.

The alkyl group in the bis(alkylsulfonyl)imide anion and tris(alkylsulfonyl)methide anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent of such an alkyl group include a halogen atom, a halogen atom-substituted alkyl group, an alkoxy group, an alkylthio group, an alkyloxysulfonyl group, an aryloxysulfonyl group and a cycloalkylaryloxysulfonyl group, with a fluorine atom-substituted alkyl group being preferred.

As other non-nucleophilic anions, for example, fluorinated phosphate (for example, $PF_6^-$), fluorinated boron (for example, $BF_4^-$) and fluorinated antimony (for example, $SbF_6$) and the like can be exemplified.

The non-nucleophilic anion of E is preferably an aliphatic sulfonate anion substituted with a fluorine atom at least at the α-position of sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion having a carbon number of 4 to 8 or a benzenesulfonate anion having a fluorine atom, still more preferably nonafluorobutanesulfonate anion, perfluorooctanesulfonate anion, pentafluorobenzenesulfonate anion or 3,5-bis(trifluoromethyl)benzenesulfonate anion.

The acid generator is preferably a compound capable of generating an acid represented by the following formula (III) or (IV) upon irradiation with an actinic ray or radiation. Thanks to the compound capable of generating an acid represented by formula (III) or (IV), the compound comes to have a cyclic organic group and therefore, the performance in terms of resolution and roughness can be more improved.

The non-nucleophilic anion may be an anion capable of producing an organic acid represented by the following formula (III) or (IV):

(III)

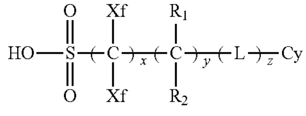

(IV)

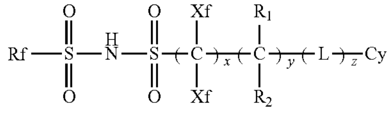

In the formula, each Xf independently represents a fluorine atom or an alkyl group substituted with at least one fluorine atom.

Each of $R_1$ and $R_2$ independently represents a hydrogen atom, a fluorine atom or an alkyl group.

Each L independently represents a divalent linking group.

Cy represents a cyclic organic group.

Rf represents a fluorine atom-containing group.

x represents an integer of 1 to 20.

y represents an integer of 0 to 10.

z represents an integer of 0 to 10.

Xf represents a fluorine atom or an alkyl group substituted with at least one fluorine atom. The carbon number of the alkyl group is preferably from 1 to 10, more preferably from 1 to 4. Also, the alkyl group substituted with at least one fluorine atom is preferably a perfluoroalkyl group.

Xf is preferably a fluorine atom or a perfluoroalkyl group having a carbon number of 1 to 4. Specific examples of Xf include a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$. Among these, a fluorine atom and $CF_3$ are preferred. In particular, it is preferred that both Xf are a fluorine atom.

Each of $R_1$ and $R_2$ independently represents a hydrogen atom, a fluorine atom or an alkyl group. The alkyl group may have a substituent (preferably fluorine atom) and is preferably an alkyl group having a carbon number of 1 to 4, more preferably a perfluoroalkyl group having a carbon number of 1 to 4. Specific examples of the alkyl group having a substituent of $R_1$ and $R_2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with $CF_3$ being preferred.

L represents a divalent linking group. Examples of the divalent linking group include —COO—, —COO—, —CONH—, —NHCO—, —CO—, —O—, —S—, —SO—, —$SO_2$—, an alkylene group (preferably having a carbon number of 1 to 6), a cycloalkylene group (preferably having a carbon number of 3 to 10), an alkenylene group (preferably having a carbon number of 2 to 6), and a divalent linking group formed by combining a plurality of these members. Among these, —COO—, —OCO—, —CONH—, —NHCO—, —CO—, —O—, —$SO_2$—, —COO-alkylene group-, —OCO-alkylene group-, —CONH-alkylene group- and —NHCO-alkylene group- are preferred, and —COO—, —OCO—, —CONH—, —$SO_2$—, —COO-alkylene group- and —OCO-alkylene group- are more preferred, Cy represents a cyclic organic group. Examples of the cyclic organic group include an alicyclic group, an aryl group and a heterocyclic group The alicyclic group may be monocyclic or polycyclic. The monocyclic alicyclic group includes, for example, a monocyclic cycloalkyl group such as cyclopentyl group, cylohexyl group and cyclooctyl group. The polycyclic alicyclic group includes, for example, a polycyclic cycloalkyl group such as norbornyl group, tricyclodecanyl group, tetracyclodecanyl group, tetracyclododecanyl group and adamantyl group. Above all, an alicyclic group having a bulky structure with a carbon number of 7 or more, such as norbornyl group, tricyclodecanyl group, tetracyclodecanyl group, tetracyclododecanyl group and adamantyl group, is preferred from the standpoint of restraining diffusion in film during a PEB (post-exposure baking) step and improving MEEF (Mask Error Enhancement Factor).

The aryl group may be monocyclic or polycyclic. Examples of the aryl group include a phenyl group, a naphthyl group, a phenanthryl group and an anthryl group. Among these, a naphthyl group is preferred because of its relatively low light absorbance at 193 nm.

The heterocyclic group may be monocyclic or polycyclic, but a polycyclic heterocyclic group can more suppress the diffusion of an acid. The heterocyclic group may have aromaticity or may not have aromaticity. Examples of the heterocyclic ring having aromaticity include a furan ring, a thiophene ring, a benzofuran ring, a benzothiophene ring, a dibenzofuran ring, a dibenzothiophene ring and a pyridine ring. Examples of the heterocyclic ring not having aromaticity include a tetrahydropyran ring, a lactone ring and a decahydroisoquinoline ring. The heterocyclic ring in the heterocyclic group is preferably a furan ring, a thiophene ring, a pyridine ring or a decahydroisoquinoline ring. Examples of the lactone ring include lactone structures exemplified in the resin (A) above.

The above-described cyclic organic group may have a substituent, and examples of the substituent include an alkyl group (may be linear or branched, preferably having a carbon number of 1 to 12), a cycloalkyl group (may be monocyclic, polycyclic or spirocyclic, preferably having a carbon number of 3 to 20), an aryl group (preferably having a carbon number of 6 to 14), a hydroxy group, an alkoxy group, an ester group, an amide group, a urethane group, a ureido group, a thioether group, a sulfonamido group and a sulfonic acid ester group. Incidentally, the carbon constituting the cyclic organic group (the carbon contributing to ring formation) may be carbonyl carbon.

x is preferably from 1 to 8, more preferably from 1 to 4, still more preferably 1. y is preferably from 0 to 4, more preferably 0. z is preferably from 0 to 8, more preferably from 0 to 4.

The fluorine atom-containing group represented by Rf includes, for example, an alkyl group having at least one fluorine atom, a cycloalkyl group having at least one fluorine atom, and an aryl group having at least one fluorine atom The alkyl group, cycloalkyl group and aryl group may be substituted with a fluorine atom or may be substituted with another fluorine atom-containing substituent. In the case where Rf is a cycloalkyl group having at least one fluorine atom or an aryl group having at least one fluorine atom, the another fluorine-containing substituent includes, for example, an alkyl group substituted with at last one fluorine atom.

Also, the alkyl group, cycloalkyl group and aryl group may be further substituted with a fluorine atom-free substituent. Examples of this substituent include those not containing a fluorine atom out of those described above for Cy.

Examples of the alkyl group having at least one fluorine atom represented by Rf are the same as those described above as the alkyl group substituted with at least one fluorine atom represented by Xf. Examples of the cycloalkyl group having at least one fluorine atom represented by Rf include a perfluorocyclopentyl group and a perfluorocyclohexyl group. Examples of the aryl group having at least one fluorine atom represented by Rf include a perfluorophenyl group.

The organic group represented by $R_{201}$, $R_{202}$ and $R_{203}$ include, for example, corresponding groups in the later-described compounds (ZI-1), (ZI-2), (ZI-3) and (ZI-4).

The compound may be a compound having a plurality of structures represented by formula (ZI). For example, the compound may be a compound having a structure where at least one of $R_{201}$ to $R_{203}$ in a compound represented by formula (ZI) is bonded to at least one of $R_{201}$ to $R_{203}$ in another compound represented by formula (ZI) through a single bond or a linking group.

Compounds (ZI-1), (ZI-2), (ZI-3) and (ZI-4) described below are more preferred as the component (ZI).

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group, with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the heterocyclic structure include a pyrrole residue, a furan residue, a thiophene residue, an indole residue, a benzofuran residue and a benzothiophene residue. In the case where the arylsulfonium compound has two or more aryl groups, these two or more aryl groups may be the same or different.

The alkyl or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $R_{203}$ may have, as the substituent, an alkyl group (for example, having a carbon number of 1 to 15), a cycloalkyl group (for example, having a carbon number of 3 to 15), an aryl group (for example, having a carbon number of 6 to 14), an alkoxy group (for example, having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4 or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted on the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C═O at the 2-position of the above-described alkyl group.

The 2-oxocycloalkyl group is preferably a group having >C═O at the 2-position of the above-described cycloalkyl group.

The alkoxy group in the alkoxycarbonylmethyl group is preferably an alkoxy group having a carbon number of 1 to 5 (e.g., methoxy, ethoxy, propoxy, butoxy, pentoxy).

$R_{201}$ to $R_{203}$ may be further substituted with a halogen atom, an alkoxy group (for example, having a carbon number of 1 to 5), a hydroxyl group, a cyano group or a nitro group.

The compound (ZI-3) is described below.

The compound (ZI-3) is a compound represented by the following formula (ZI-3), and this is a compound having a phenacylsulfonium salt structure.

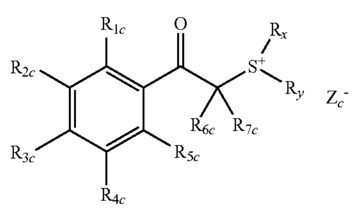

(ZI-3)

In formula (ZI-3), each of $R_{1c}$ to $R_{5c}$ independently represents a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group or an arylthio group.

Each of $R_{6c}$ and $R_{7c}$ independently represents a hydrogen atom, an alkyl group, a cycloalkyl group, a halogen atom, a cyano group or an aryl group.

Each of $R_x$ and $R_y$ independently represents an alkyl group, a cycloalkyl group, a 2-oxoalkyl group, a 2-oxocycloalkyl group, an alkoxycarbonylalkyl group, an allyl group or a vinyl group.

Any two or more members out of $R_{1c}$ to $R_{5c}$, a pair of $R_{5c}$ and $R_{6c}$, a pair of $R_{6c}$ and $R_{7c}$, a pair of $R_{5c}$ and $R_x$, or a pair of $R_x$ and $R_y$ may combine together to form a ring structure. This ring structure may contain an oxygen atom, a sulfur atom, a ketone group, an ester bond or an amide bond.

The ring structure above includes an aromatic or non-aromatic hydrocarbon ring, an aromatic or non-aromatic heterocyclic ring, and a polycyclic condensed ring formed by combining two or more of these rings. The ring structure includes a 3- to 10-membered ring and is preferably a 4- to 8-membered ring, more preferably a 5- or 6-membered ring.

Examples of the group formed by combining any two or more members of $R_{1c}$ to $R_{5c}$, a pair of $R_{6c}$ and $R_{7c}$, or a pair of $R_x$ and $R_y$ include a butylene group and a pentylene group.

The group formed by combining a pair of $R_{5c}$ and $R_{6c}$ or a pair of $R_{5c}$ and $R_x$ is preferably a single bond or an alkylene group, and examples of the alkylene group include a methylene group and an ethylene group.

$Zc^-$ represents a non-nucleophilic anion, and examples thereof are the same as those of the non-nucleophilic anion of $Z^-$ in formula (ZI).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl). The cycloalkyl group includes, for example, a cycloalkyl group having a carbon number of 3 to 10 (e.g., cyclopentyl, cyclohexyl).

The aryl group as $R_{1c}$ to $R_{5c}$ is preferably an aryl group having a carbon number of 5 to 15, and examples thereof include a phenyl group and a naphthyl group.

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy), or a cyclic alkoxy group having a carbon number of 3 to 10 (e.g., cyclopentyloxy, cyclohexyloxy).

Specific examples of the alkoxy group in the alkoxycarbonyl group as $R_{1c}$ to $R_{5c}$ are the same as specific examples of the alkoxy group of $R_{1c}$ to $R_{5c}$.

Specific examples of the alkyl group in the alkylcarbonyloxy group and alkylthio group as $R_{1c}$ to $R_{5c}$ are the same as specific examples of the alkyl group of $R_{1c}$ to $R_{5c}$.

Specific examples of the cycloalkyl group in the cycloalkylcarbonyloxy group as $R_{1c}$ to $R_{5c}$ are the same as specific examples of the cycloalkyl group of $R_{1c}$, to $R_{5c}$.

Specific examples of the aryl group in the aryloxy group and arylthio group as $R_{1c}$ to $R_{5c}$ are the same as specific examples of the aryl group of $R_{1c}$ to $R_{5c}$.

A compound where any one of $R_{1c}$ to $R_{5c}$ is a linear or branched alkyl group, a cycloalkyl group, or a linear, branched or cyclic alkoxy group is preferred, and a compound where the sum of carbon numbers of $R_{1c}$ to $R_{5c}$ is from 2 to 15 is more preferred. Thanks to such a compound, the solvent solubility is more enhanced and production of particles during storage can be suppressed.

The ring structure which may be formed by combining any two or more members of $R_{1c}$ to $R_{5c}$ with each other is preferably a 5- or 6-membered ring, more preferably a 6-membered ring (such as phenyl ring).

The ring structure which may be formed by combining $R_{5c}$ and $R_{6c}$ with each other includes a 4-membered or greater membered ring (preferably a 5- or 6-membered ring) formed together with the carbonyl carbon atom and carbon atom in formula (I) by combining $R_{5c}$ and $R_{6c}$ with each other to constitute a single bond or an alkylene group (such as methylene group or ethylene group).

The aryl group as $R_{6c}$ and $R_{7c}$ is preferably an aryl group having a carbon number of 5 to 15, and examples thereof include a phenyl group and a naphthyl group.

An embodiment where $R_{6c}$ and $R_{7c}$ both are an alkyl group is preferred, an embodiment where each of $R_{6c}$ and $R_{1c}$ is a linear or branched alkyl group having a carbon number of 1 to 4 is more preferred, and an embodiment where both are a methyl group is still more preferred.

In the case where $R_{6c}$ and $R_{7c}$ are combined to form a ring, the group formed by combining $R_6$, and $R_{7c}$ is preferably an alkylene group having a carbon number of 2 to 10, and examples thereof include an ethylene group, a propylene group, a butylene group, a pentylene group and a hexylene group. Also, the ring formed by combining $R_{6c}$ and $R_{7c}$ may contain a heteroatom such as oxygen atom in the ring.

Examples of the alkyl group and cycloalkyl group as $R_x$ and $R_y$ are the same as those of the alkyl group and cycloalkyl group in $R_{1c}$ to $R_{7c}$.

Examples of the 2-oxoalkyl group and 2-oxocycloalkyl group as $R_x$ and $R_y$ include a group having >C═O at the 2-position of the alkyl group or cycloalkyl group as $R_{1c}$ to $R_{7c}$.

Examples of the alkoxy group in the alkoxycarbonylalkyl group as $R_x$ and $R_y$ are the same as those of the alkoxy group in $R_{1c}$ to $R_{5c}$. The alkyl group is, for example, an alkyl group having a carbon number of 1 to 12, preferably a linear alkyl group having a carbon number of 1 to 5 (e.g., methyl, ethyl).

The allyl group as $R_x$ and $R_y$ is not particularly limited but is preferably an unsubstituted allyl group or an allyl group substituted with a monocyclic or polycyclic cycloalkyl group (preferably a cycloalkyl group having a carbon number of 3 to 10).

The vinyl group as $R_x$ and $R_y$ is not particularly limited but is preferably an unsubstituted vinyl group or a vinyl group substituted with a monocyclic or polycyclic cycloalkyl group (preferably a cycloalkyl group having a carbon number of 3 to 10).

The ring structure which may be formed by combining $R_{5c}$ and $R_x$ with each other includes a 5-membered or greater membered ring (preferably a 5-membered ring) formed together with the sulfur atom and carbonyl carbon atom in formula (I) by combining $R_{5c}$ and $R_x$ with each other to constitute a single bond or an alkylene group (such as methylene group or ethylene group).

The ring structure which may be formed by combining $R_x$ and $R_y$ with each other includes a 5- or 6-membered ring, preferably a 5-membered ring (that is, tetrahydrothiophene ring), formed together with the sulfur atom in formula (ZI-3) by divalent $R_x$ and $R_y$ (e.g., methylene, ethylene, propylene).

Each of $R_x$ and $R_y$ is preferably an alkyl or cycloalkyl group having a carbon number of 4 or more, more preferably 6 or more, still more preferably 8 or more.

Each of $R_{1c}$ to $R_{7c}$, $R_x$ and $R_y$ may further have a substituent, and examples of such a substituent include a halogen atom (e.g., fluorine), a hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkoxycarbonyl group, an aryloxycarbonyl group, an alkoxycarbonyloxy group and an aryloxycarbonyloxy group.

In formula (ZI-3), it is more preferred that each of $R_{1c}$, $R_{2c}$, $R_{4c}$ and $R_{5c}$ independently represents a hydrogen atom and $R_{1c}$ represents a group except for a hydrogen atom, that is, represents an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group or an arylthio group.

Specific examples of the cation in the compound represented by formula (ZI-2) or (ZI-3) for use in the present invention are illustrated below.

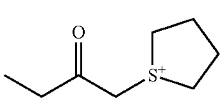

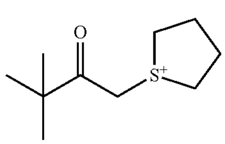

-continued

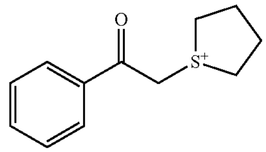

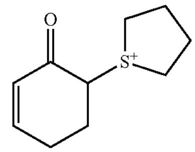

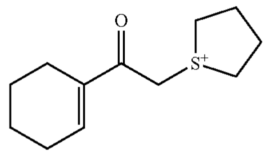

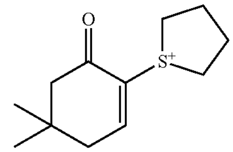

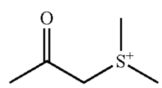

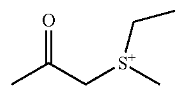

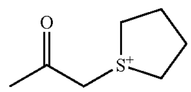

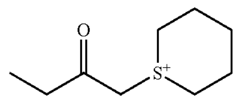

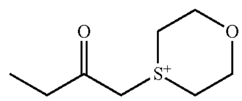

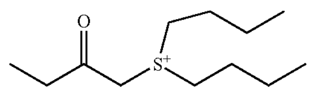

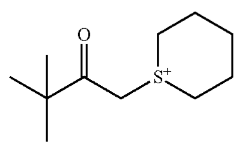

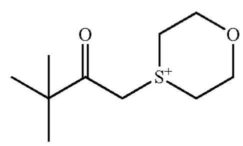

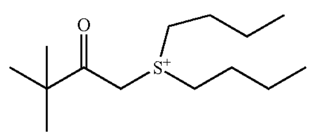

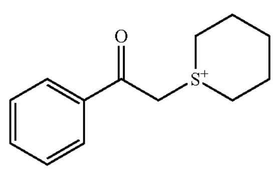

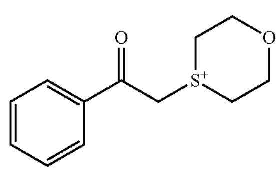

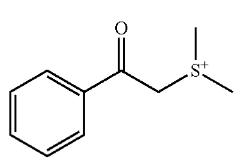

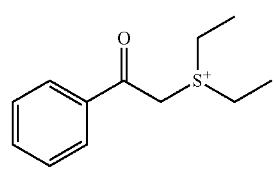

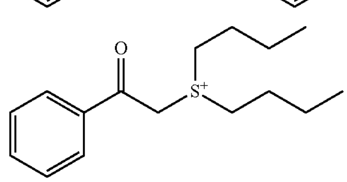

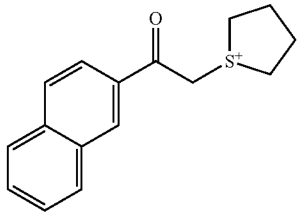
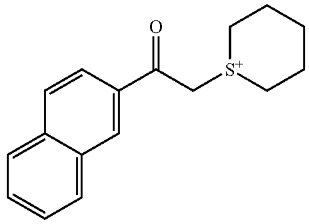
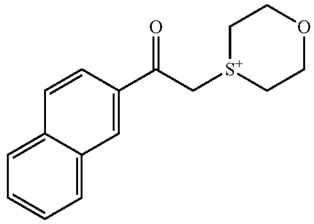
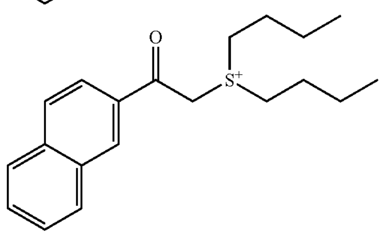
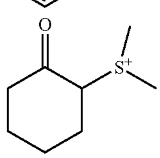
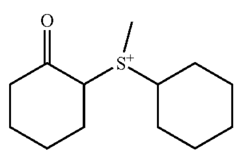
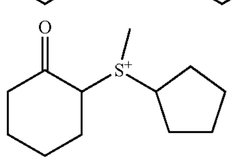
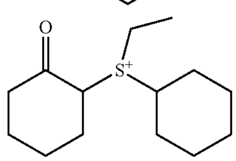
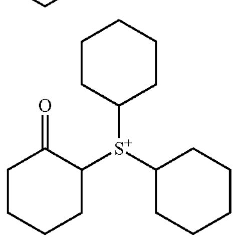
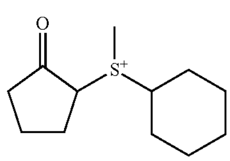
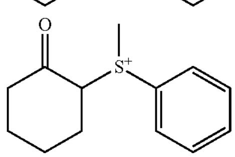
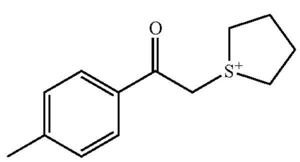
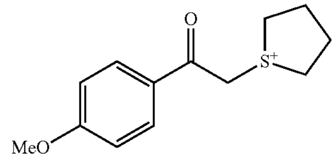
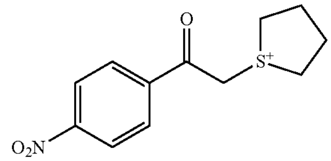
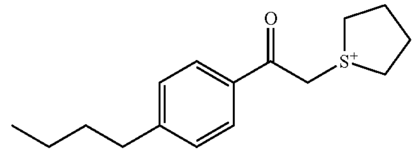
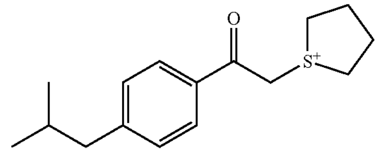
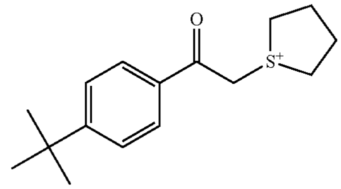
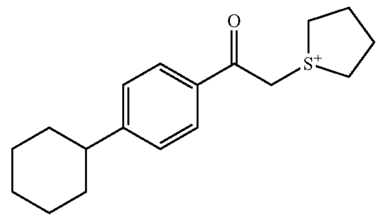
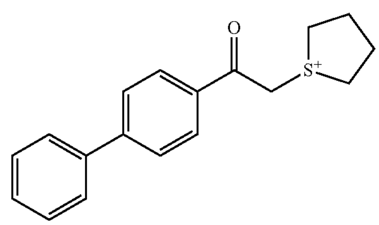
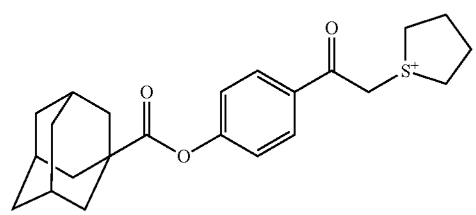
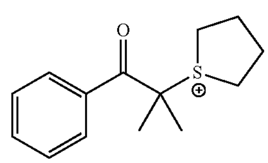

-continued
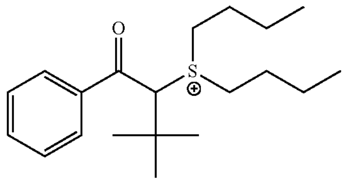
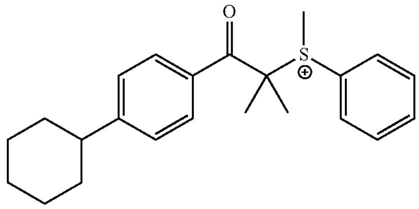
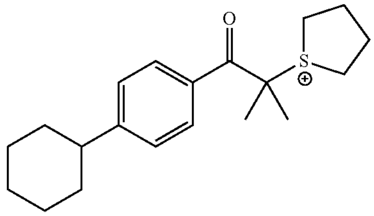
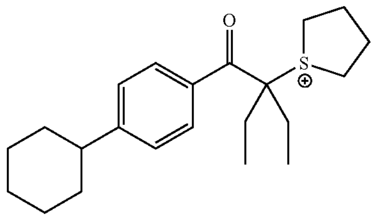
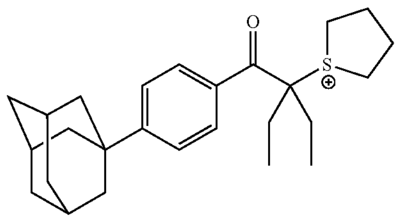
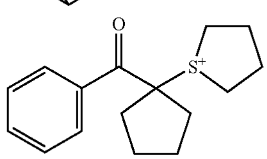
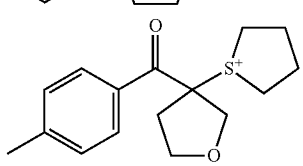
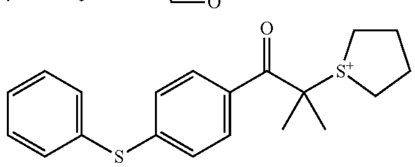
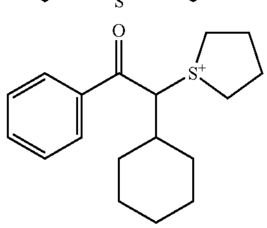
-continued
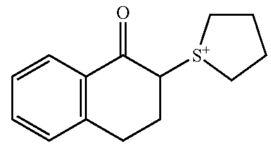
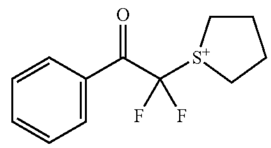
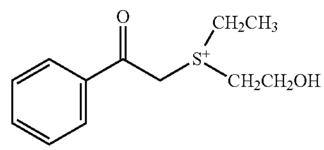
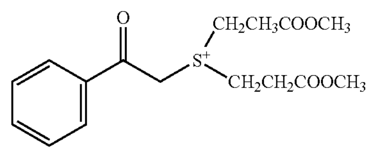
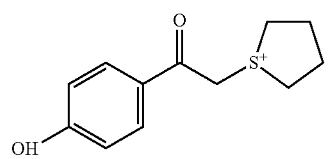
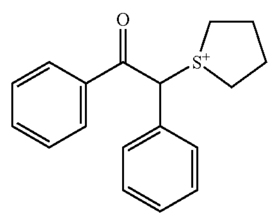
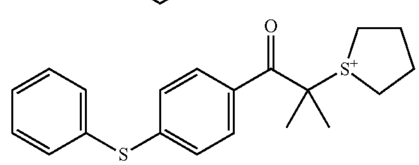
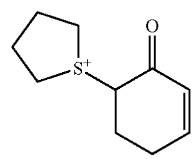
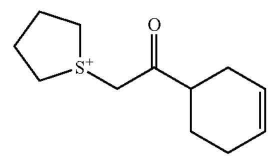
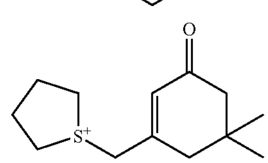
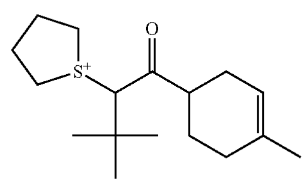

-continued

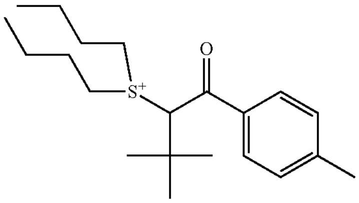

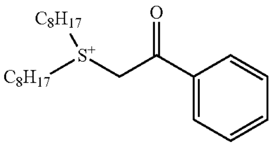

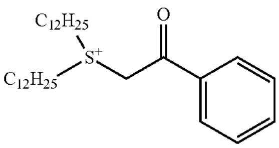

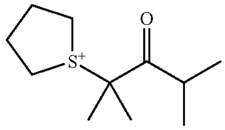

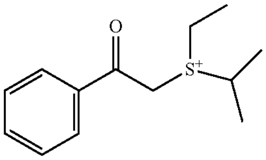

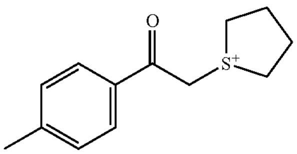

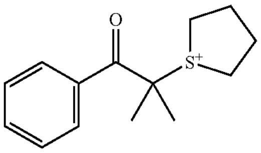

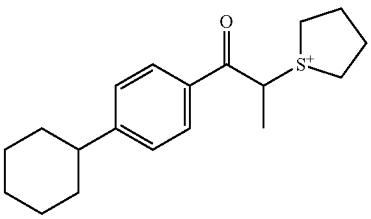

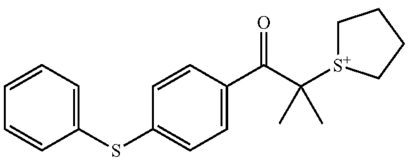

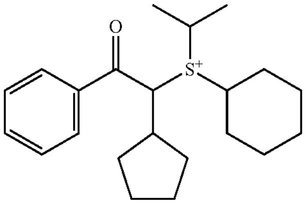

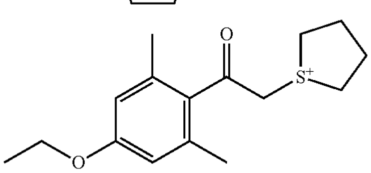

-continued

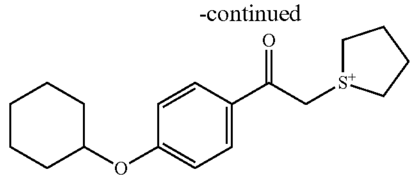

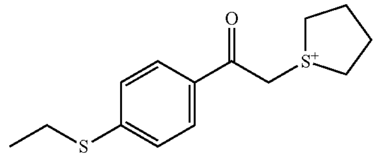

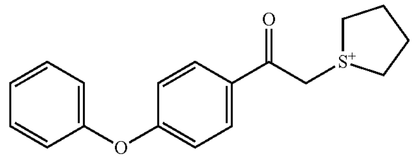

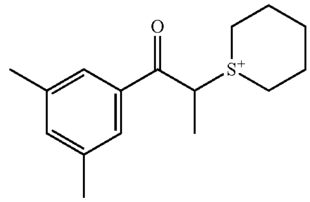

The compound (ZI-4) is described below.

The compound (ZI-4) is a compound represented by the following formula (ZI-4):

(Z1-4)

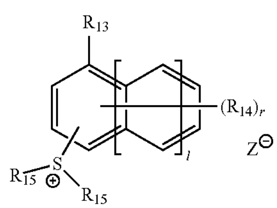

In formula (ZI-4), $R_{13}$ represents a hydrogen atom, a fluorine atom, a hydroxyl group, an alkyl group, a cycloalkyl group, an alkoxy group, an alkoxycarbonyl group or a group having a cycloalkyl group. These groups may have a substituent.

$R_{14}$ represents, when a plurality of $R_{14}$ are present, each independently represents, a hydroxyl group, an alkyl group, a cycloalkyl group, an alkoxy group, an alkoxycarbonyl group, an alkylcarbonyl group, an alkylsulfonyl group, a cycloalkylsulfonyl group or a group having a cycloalkyl group. These groups may have a substituent.

Each $R_{15}$ independently represents an alkyl group, a cycloalkyl group or a naphthyl group. Two $R_{15}$ may combine with each other to form a ring. These groups may have a substituent.

1 represents an integer of 0 to 2.

r represents an integer of 0 to 8.

$Z^-$ represents a non-nucleophilic anion, and examples thereof are the same as those of the nucleophilic anion of $Z^-$ in formula (ZI).

In formula (ZI-4), the alkyl group of $R_{13}$, $R_{14}$ and $R_{15}$ is a linear or branched alkyl group preferably having a carbon number of 1 to 10, and preferred examples thereof include a methyl group, an ethyl group, an n-butyl group and a tert-butyl group.

The cycloalkyl group of $R_{13}$, $R_{14}$ and $R_{15}$ includes a monocyclic or polycyclic cycloalkyl group (preferably a cycloalkyl group having a carbon number of 3 to 20), and cyclopropyl, cyclopentyl, cyclohexyl, cycloheptyl and cyclooctyl are preferred.

The alkoxy group of $R_{13}$ and $R_{14}$ is a linear or branched alkoxy group preferably having a carbon number of 1 to 10, and preferred examples thereof include a methoxy group, an ethoxy group, an n-propoxy group and an n-butoxy group.

The alkoxycarbonyl group of $R_{13}$ and $R_{14}$ is a linear or branched alkoxycarbonyl group preferably having a carbon number of 2 to 11, and preferred examples thereof include a methoxycarbonyl group, an ethoxycarbonyl group and an n-butoxycarbonyl group.

The group having a cycloalkyl group of $R_{13}$ and $R_{14}$ includes a monocyclic or polycyclic cycloalkyl group (preferably a cycloalkyl group having a carbon number of 3 to 20), and examples thereof include a monocyclic or polycyclic cycloalkyloxy group and an alkoxy group having a monocyclic or polycyclic cycloalkyl group. These groups may further have a substituent.

The monocyclic or polycyclic cycloalkyloxy group of $R_{13}$ and $R_{14}$ preferably has a total carbon number of 7 or more, more preferably a total carbon number of 7 to 15, and preferably has a monocyclic cycloalkyl group. The monocyclic cycloalkyloxy group having a total carbon number of 7 or more indicates a monocyclic cycloalkyloxy group where a cycloalkyloxy group such as cyclopropyloxy group, cyclobutyloxy group, cyclopentyloxy group, cyclohexyloxy group, cycloheptyloxy group, cyclooctyloxy group and cyclododecanyloxy group arbitrarily has a substituent such as alkyl group (e.g., methyl group, ethyl group, propyl group, butyl group, pentyl group, hexyl group, heptyl group, octyl group, dodecyl group, 2-ethylhexyl group, isopropyl group, sec-butyl group, tert-butyl group, isoamyl group), hydroxyl group, halogen atom (e.g., fluorine, chlorine, bromine, iodine), nitro group, cyano group, amido group, sulfonamido group, alkoxy group (e.g., methoxy group, ethoxy group, hydroxyethoxy group, propoxy group, hydroxypropoxy group, butoxy group), alkoxycarbonyl group (e.g., methoxycarbonyl group, ethoxycarbonyl group), acyl group (e.g., formyl group, acetyl group, benzoyl group), acyloxy group (e.g., acetoxy group, butyryloxy group) and carboxy group and where the total carbon number inclusive of the carbon number of an arbitrary substituent on the cycloalkyl group is 7 or more.

Examples of the polycyclic cycloalkyloxy group having a total carbon number of 7 or more include a norbornyloxy group, a tricyclodecanyloxy group, a tetracyclodecanyloxy group and an adamantyloxy group.

The alkoxy group having a monocyclic or polycyclic cycloalkyl group of $R_{13}$ and $R_{14}$ preferably has a total carbon number of 7 or more, more preferably a total carbon number of 7 to 15, and is preferably an alkoxy group having a monocyclic cycloalkyl group. The alkoxy group having a total carbon number of 7 or more and having a monocyclic cycloalkyl group indicates an alkoxy group where the above-described monocyclic cycloalkyl group which may have a substituent is substituted on an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, tert-butoxy and isoamyloxy and where the total carbon number inclusive of the carbon number of the substituent is 7 or more. Examples thereof include a cyclohexylmethoxy group, a cyclopentylethoxy group and a cyclohexylethoxy group, with a cyclohexylmethoxy group being preferred.

Examples of the alkoxy group having a total carbon number of 7 or more and having a polycyclic cycloalkyl group include a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group and an adamantylethoxy group, with a norbornylmethoxy group and a norbornylethoxy group being preferred.

Specific examples of the alkyl group in the alkylcarbonyl group of $R_{14}$ are the same as those of the alkyl group of $R_{13}$ to $R_{15}$.

The alkylsulfonyl or cycloalkylsulfonyl group of $R_{14}$ is a linear, branched or cyclic alkylsulfonyl group preferably having a carbon number of 1 to 10, and preferred examples thereof include a methanesulfonyl group, an ethanesulfonyl group, an n-propanesulfonyl group, an n-butanesulfonyl group, a cyclopentanesulfonyl group and a cyclohexanesulfonyl group.

Examples of the substituent which may be substituted on each of the groups above include a halogen atom (e.g., fluorine atom), a hydroxyl group, a carboxyl group, a cyano group, a nitro group, an alkoxy group, an alkoxyalkyl group, an alkoxycarbonyl group and an alkoxycarbonyloxy group.

Examples of the alkoxy group include a linear, branched or cyclic alkoxy group having a carbon number of 1 to 20, such as methoxy group, ethoxy group, n-propoxy group, i-propoxy group, n-butoxy group, 2-methylpropoxy group, 1-methylpropoxy group, tert-butoxy group, cyclopentyloxy group and cyclohexyloxy group.

Examples of the alkoxyalkyl group include a linear, branched or cyclic alkoxyalkyl group having a carbon number of 2 to 21, such as methoxymethyl group, ethoxymethyl group, 1-methoxyethyl group, 2-methoxyethyl group, 1-ethoxyethyl group and 2-ethoxyethyl group.

Examples of the alkoxycarbonyl group include a linear, branched or cyclic alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, tert-butoxycarbonyl group, cyclopentyloxycarbonyl group and cyclohexyloxycarbonyl group.

Examples of the alkoxycarbonyloxy group include a linear, branched or cyclic alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group, tert-butoxycarbonyloxy group, cyclopentyloxycarbonyloxy group and cyclohexyloxycarbonyloxy group.

The ring structure which may be formed by combining two $R_{15}$ with each other includes a 5- or 6-membered ring, preferably a 5-membered ring (that is, tetrahydrothiophene ring), formed together with the sulfur atom in formula (ZI-4) by two $R_{15}$ and may be fused with an aryl group or a cycloalkyl group. The divalent $R_{15}$ may have a substituent, and examples of the substituent include a hydroxyl group, a carboxyl group, a cyano group, a nitro group, an alkyl group, a cycloalkyl group, an alkoxy group, an alkoxyalkyl group, an alkoxycarbonyl group and an alkoxycarbonyloxy group. As for the substituent on the ring structure, a plurality of substituents may be present, and they may combine with each other to form a ring (an aromatic or non-aromatic hydrocarbon ring, an aromatic or non-aromatic heterocyclic ring, or a polycyclic condensed ring formed by combining two or more of these rings).

In formula (ZI-4), $R_{15}$ is preferably, for example, a methyl group, an ethyl group, a naphthyl group, or a divalent group capable of forming a tetrahydrothiophene ring structure together with the sulfur atom when two $R_{15}$ are combined.

The substituent which may be substituted on $R_{13}$ and $R_{14}$ is preferably a hydroxyl group, an alkoxy group, an alkoxy-carbonyl group or a halogen atom (particularly fluorine atom).

1 is preferably 0 or 1, more preferably 1.

r is preferably from 0 to 2.

Specific examples of the cation in the compound represented by formula (ZI-4) for use in the present invention are illustrated below.

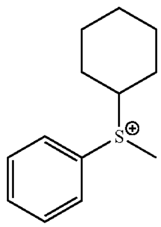

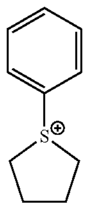

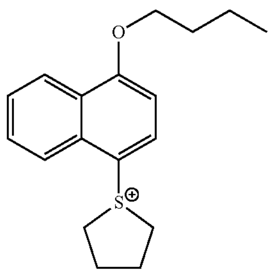

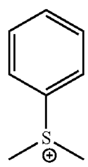

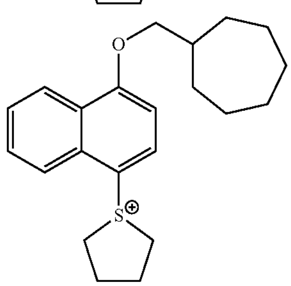

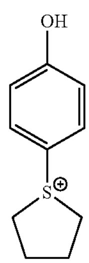

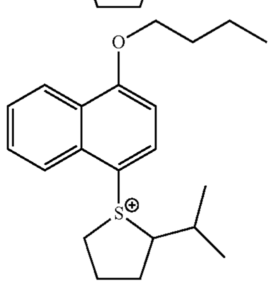

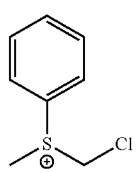

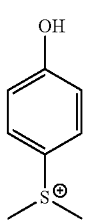

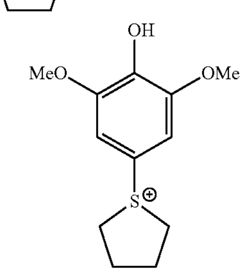

-continued

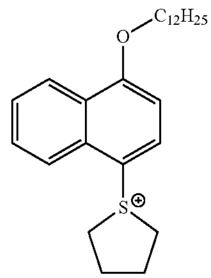

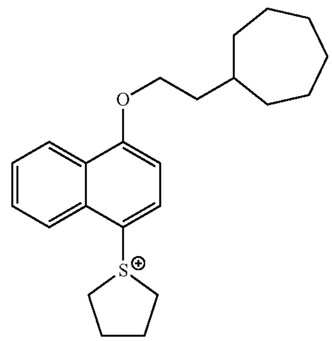

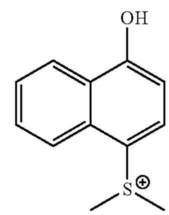

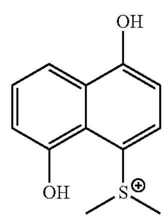

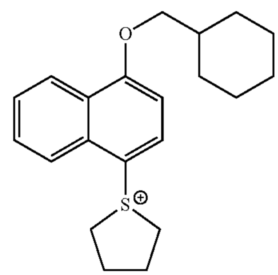

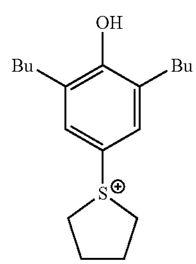

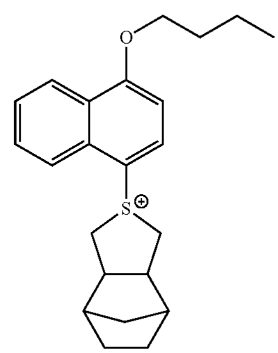

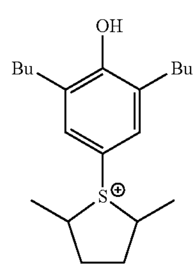

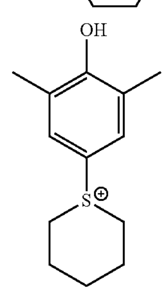

-continued
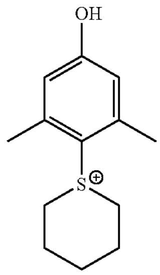
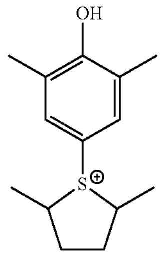
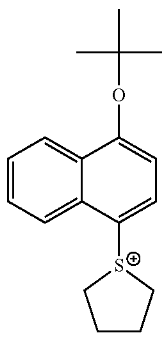
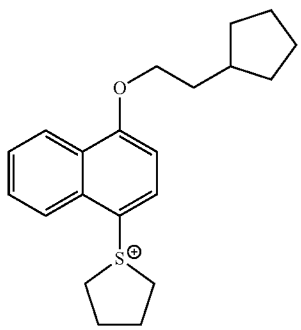
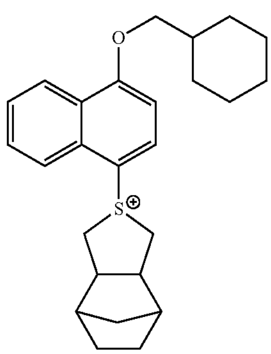
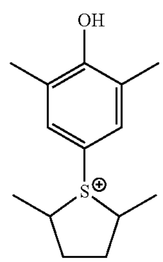
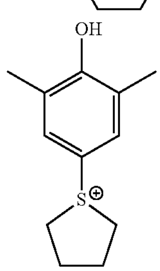
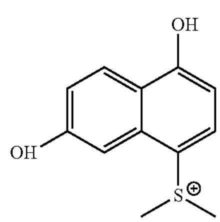
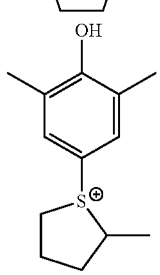
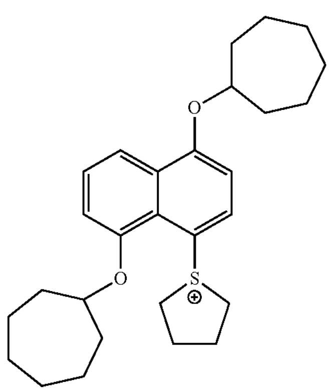
-continued
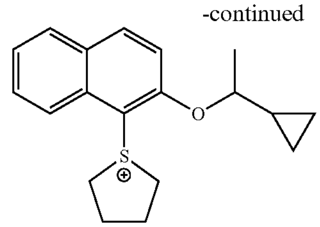
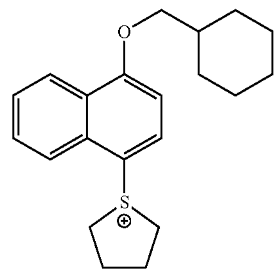
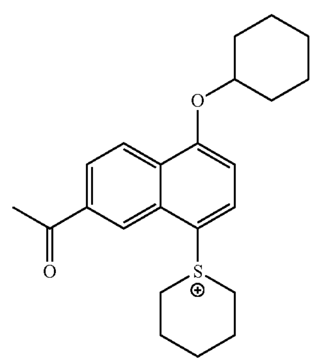
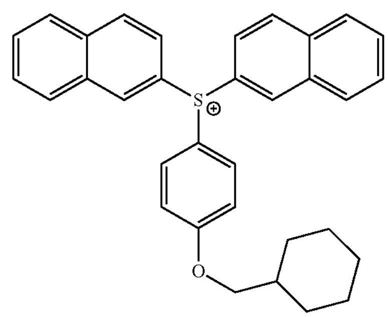
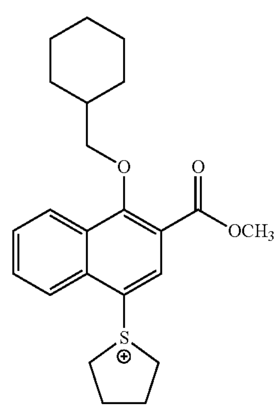
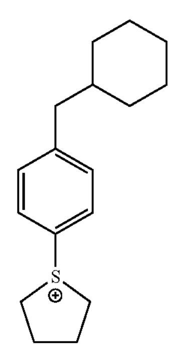

-continued
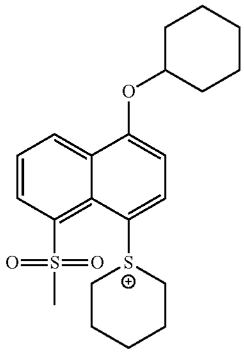
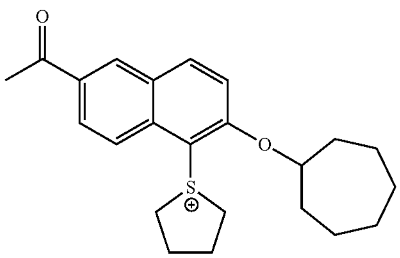
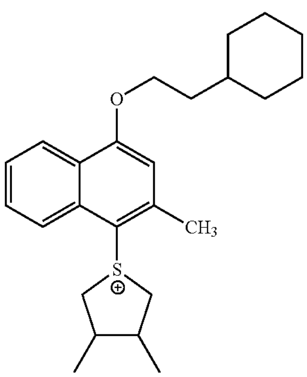
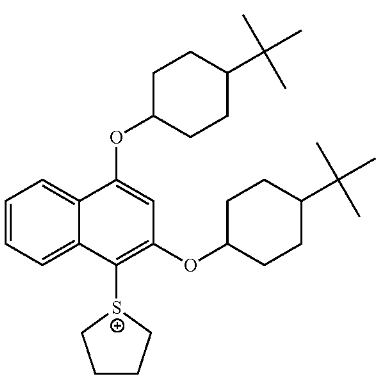
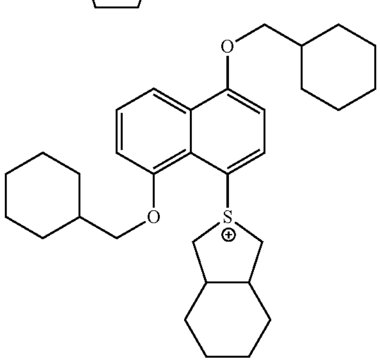
-continued
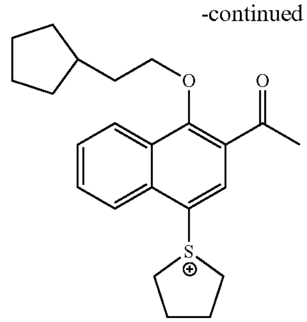
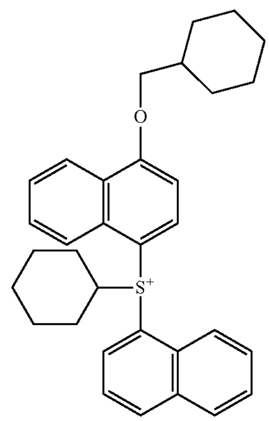
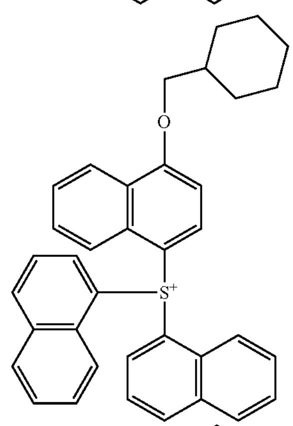
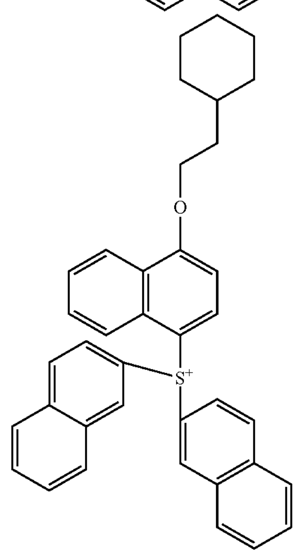

-continued

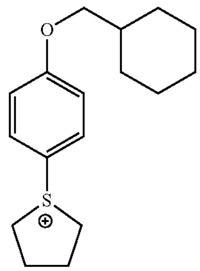

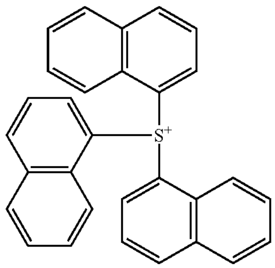

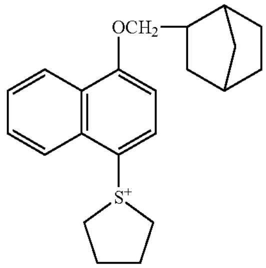

Formulae (ZII) and (ZIII) are described below.

In formulae (ZII) and (ZIII), each of $R_{204}$ to $R_{207}$ independently represents an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ to $R_{207}$ may be an aryl group having a heterocyclic structure containing an oxygen atom, a nitrogen atom, a sulfur atom or the like. Examples of the framework of the aryl group having a heterocyclic structure include pyrrole, furan, thiophene, indole, benzofuran and benzothiophene.

The alkyl or cycloalkyl group in $R_{204}$ to $R_{207}$ is preferably a linear or branched alkyl group having a carbon number of 1 to 10 (e.g., methyl group, ethyl group, propyl group, butyl group, pentyl group) or a cycloalkyl group having a carbon number of 3 to 10 (e.g., cyclopentyl group, cyclohexyl group, norbornyl group).

The aryl group, alkyl group and cycloalkyl group of $R_{204}$ to $R_{207}$ may have a substituent. Examples of the substituent which may be substituted on the aryl group, alkyl group and cycloalkyl group of $R_{204}$ to $R_{207}$ include an alkyl group (for example, having a carbon number of 1 to 15), a cycloalkyl group (for example, having a carbon number of 3 to 15), an aryl group (for example, having a carbon number of 6 to 15), an alkoxy group (for example, having a carbon number of 1 to 15), a halogen atom, a hydroxyl group and a phenylthio group.

$Z^-$ represents a non-nucleophilic anion, and examples thereof are the same as those of the non-nucleophilic anion of $Z^-$ in formula (ZI).

Other examples of the acid generator include compounds represented by the following formulae (ZIV), (ZV) and (ZVI):

$$Ar_3—SO_2SO_2—Ar_4 \quad (ZIV)$$

(ZV)

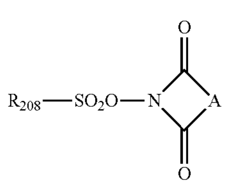

-continued (ZVI)

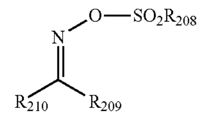

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Specific examples of the aryl group of $Ar_3$, $Ar_4$, $R_{208}$, $R_{209}$ and $R_{210}$ are the same as specific examples of the aryl group as $R_{201}$, $R_{202}$ and $R_{203}$ in formula (ZI-1).

Specific examples of the alkyl group and cycloalkyl group of $R_{208}$, $F_{209}$ and $R_{210}$ are the same as specific examples of the alkyl group and cycloalkyl group of $R_{201}$, $F_{202}$ and $R_{203}$ in formula (ZI-2).

The alkylene group of A includes an alkylene group having a carbon number of 1 to 12 (e.g., methylene group, ethylene group, propylene group, isopropylene group, butylene group, isobutylene group); the alkenylene group of A includes an alkenylene group having a carbon number of 2 to 12 (e.g., ethynylene group, propenylene group, butenylene group); and the arylene group of A includes an arylene group having a carbon number of 6 to 10 (e.g., phenylene group, tolylene group, naphthylene group).

Among the acid generators, more preferred are the compounds represented by formulae (ZI) to (ZIII).

Also, the acid generator is preferably a compound that generates an acid having one sulfonic acid group or imide group, more preferably a compound that generates a monovalent perfluoroalkanesulfonic acid, a compound that generates an aromatic sulfonic acid substituted with a monovalent fluorine atom or a fluorine atom-containing group, or a compound that generates an imide acid substituted with a monovalent fluorine atom or a fluorine atom-containing group, still more preferably a sulfonium salt of fluoro-substituted alkanesulfonic acid, fluorine-substituted benzenesulfonic acid, fluorine-substituted imide acid or fluorine-substituted methide acid. In particular, the acid generator which can be used is preferably a compound that generates a fluoro-substituted alkanesulfonic acid, a fluoro-substituted benzenesulfonic acid or a fluoro-substituted imide acid, where pKa of the acid generated is −1 or less, and in this case, the sensitivity is enhanced.

Among the acid generators, particularly preferred examples are illustrated below.

(z1)

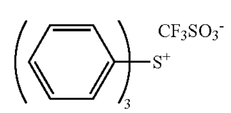

(z2)

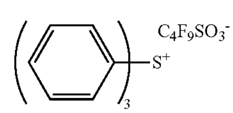

(z3)

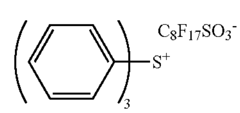

-continued
(z4)
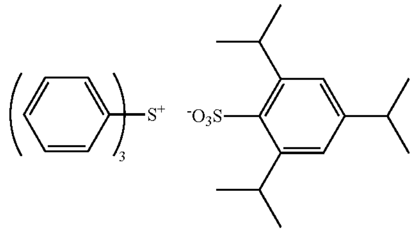
(z5)
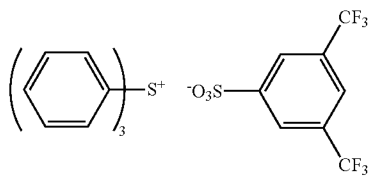
(z6)
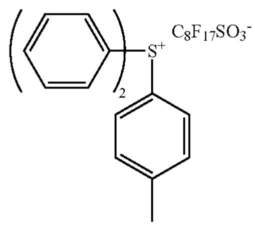
(z7)
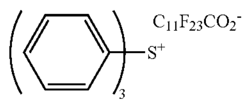
(z8)
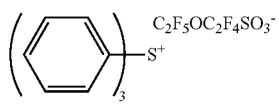
(z9)
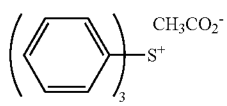
(z10)
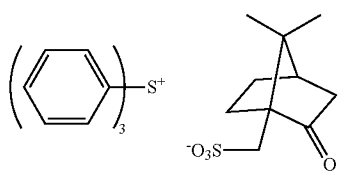
(z11)
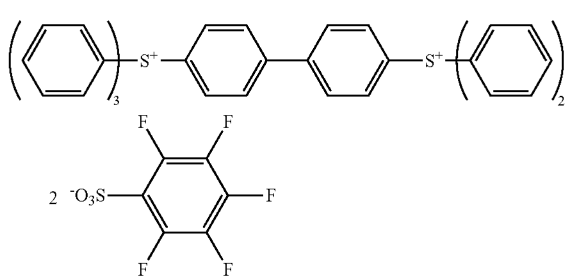
(z12)
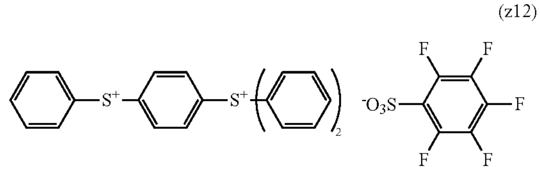
-continued
(z13)
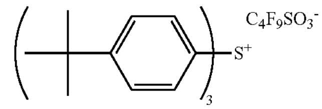
(z14)
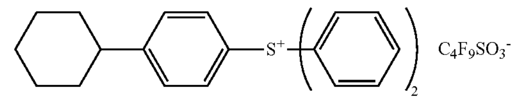
(z15)
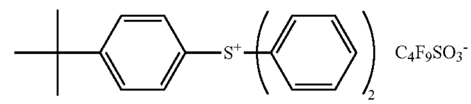
(z16)
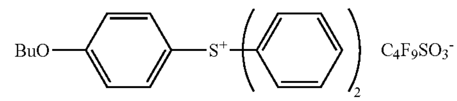
(z17)
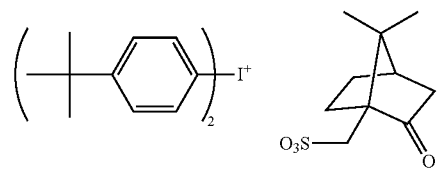
(z18)
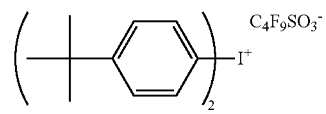
(z19)
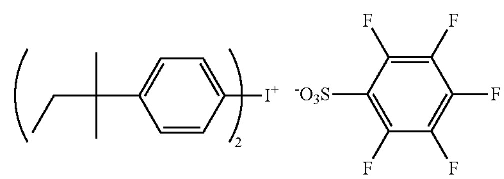
(z20)
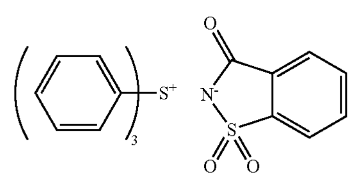
(z21)
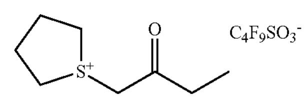
(z22)
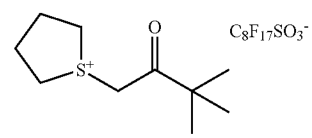
(z23)
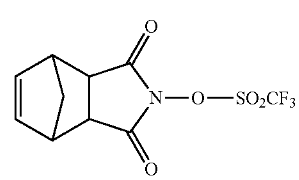

-continued
(z24)
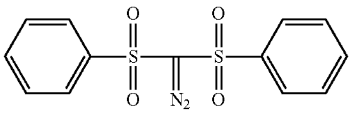
(z25)
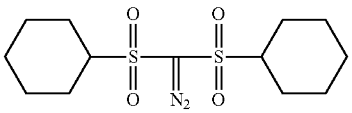
(z26)
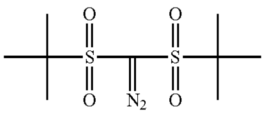
(z27)
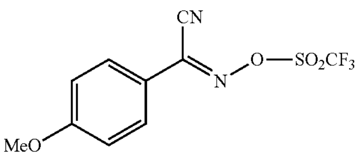
(z28)
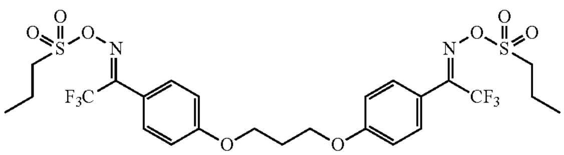
(z29)
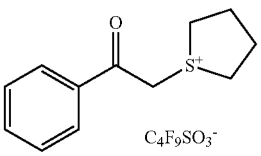
(z30)
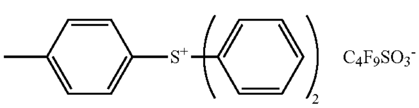
(z31)
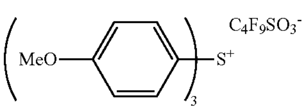
(z32)
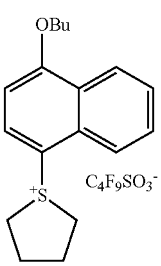
(z33)
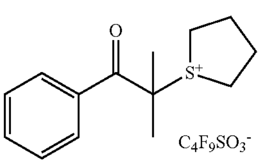
-continued
(z34)
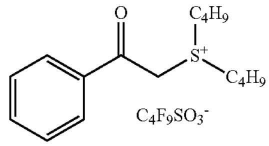
(z35)
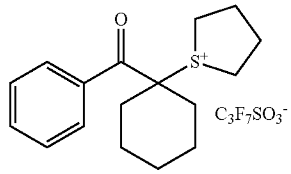
(z36)
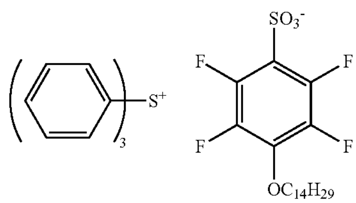
(z37)
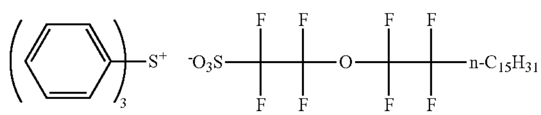
(z38)
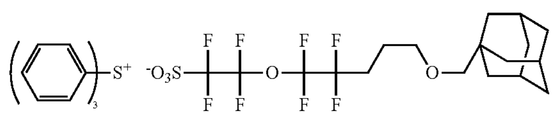
(z39)
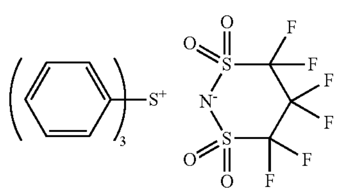
(z40)
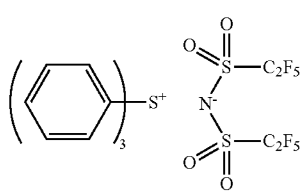
(z41)
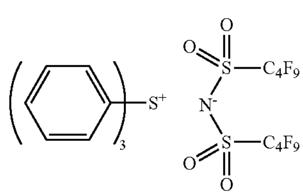
(z42)
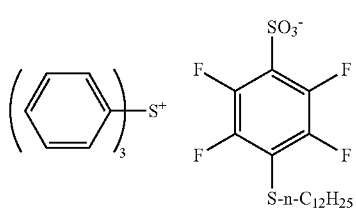

-continued
(z43)
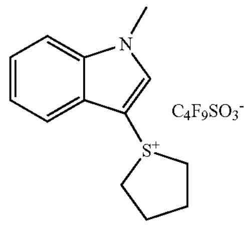
(z44)
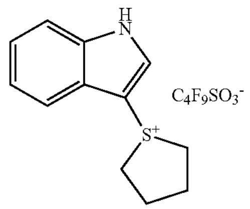
(z45)
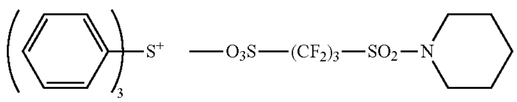
(z46)
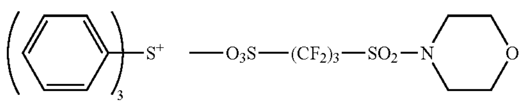
(z47)
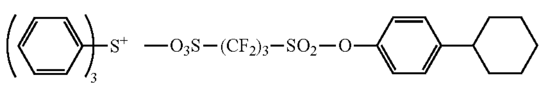
(z48)
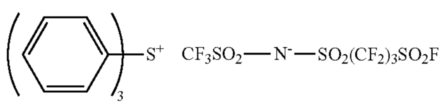
(z49)
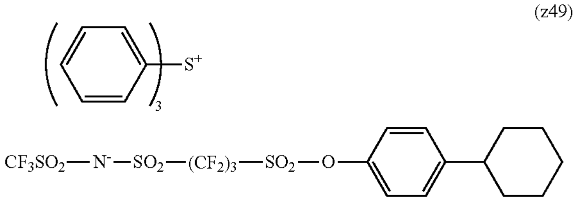
(z50)
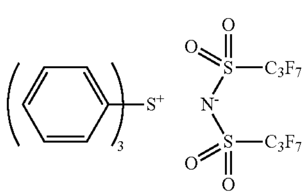
(z51)
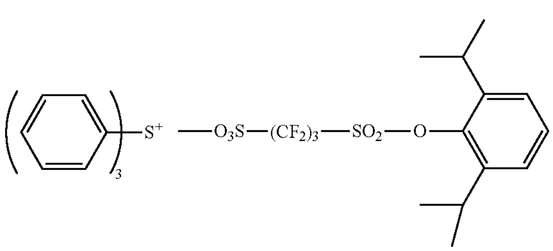
-continued
(z52)
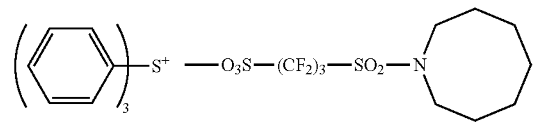
(z53)
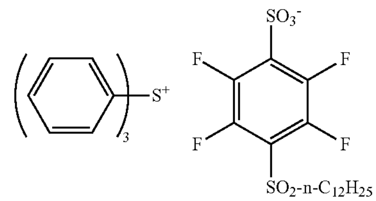
(z54)
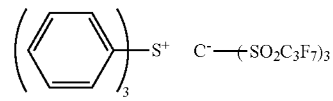
(z55)
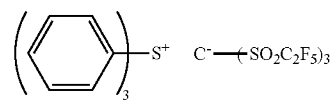
(z56)
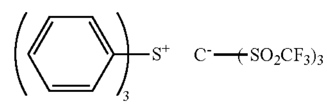
(z57)
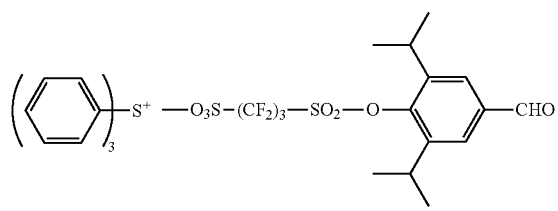
(z58)
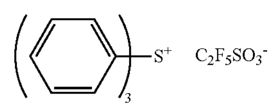
(z59)
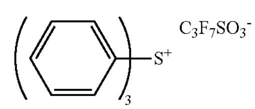
(z60)
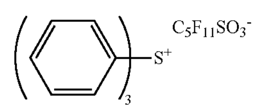
(z61)
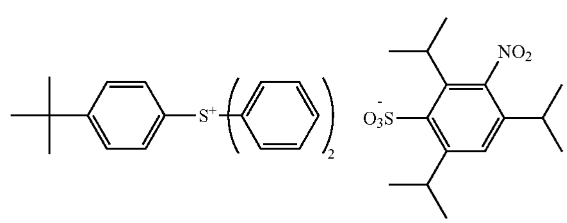

-continued
(z62)
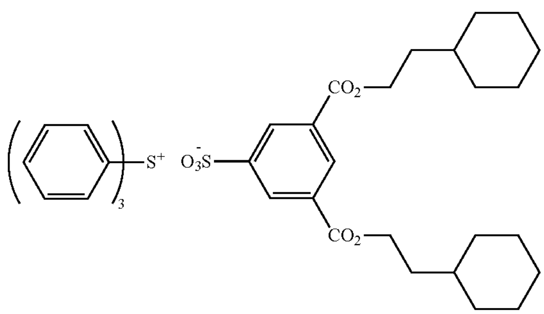
(z63)
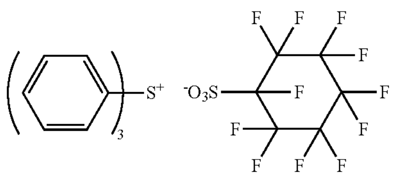
(z64)
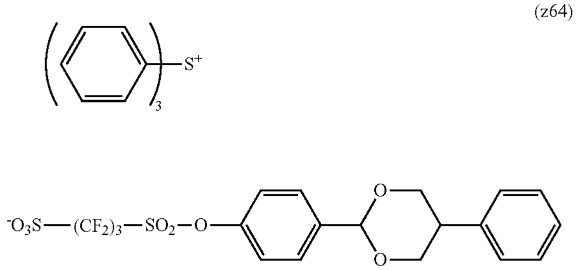
(z65)
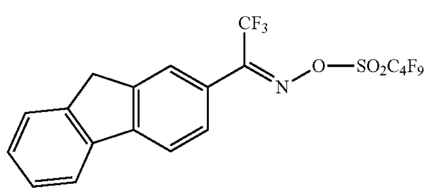
(z66)
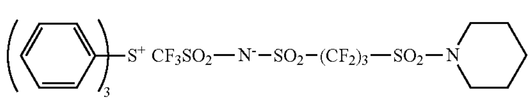
(z67)
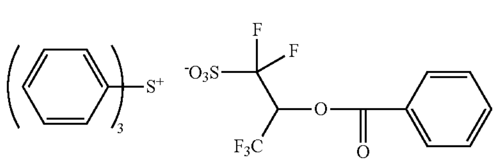
(z68)
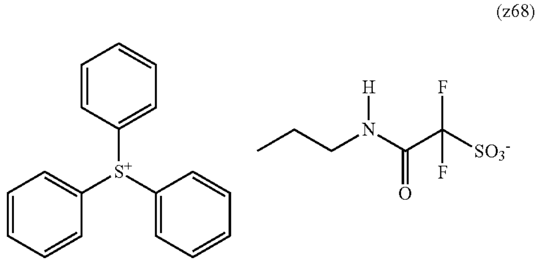
-continued
(z69)
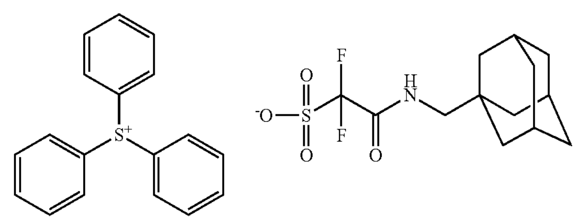
(z70)
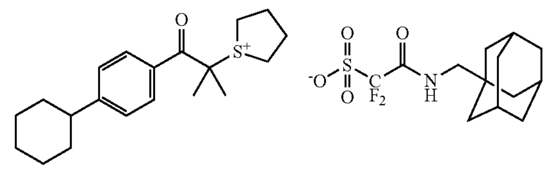
(z71)
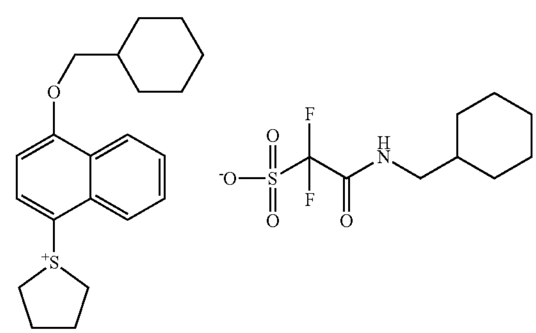
(z72)
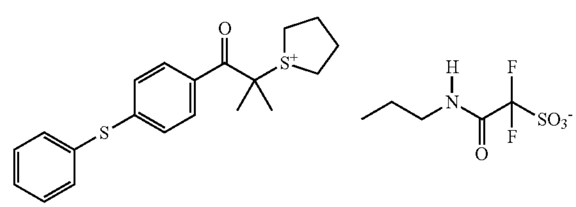
(z73)
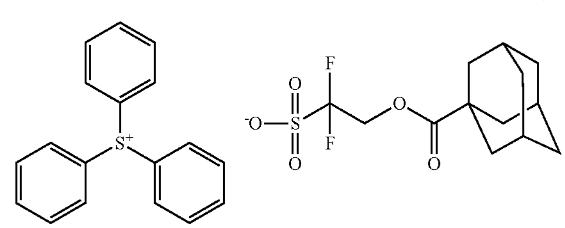
(z74)
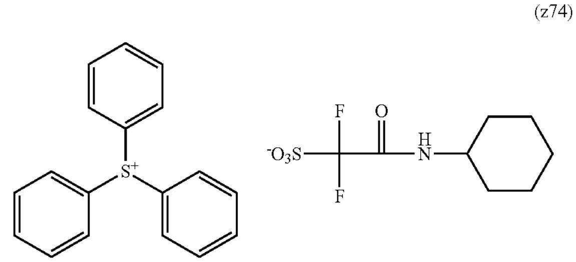

(z75)
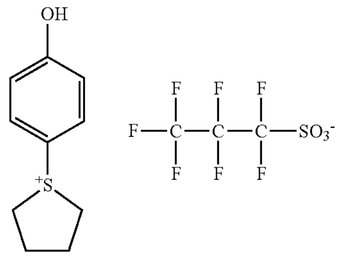
(z76)
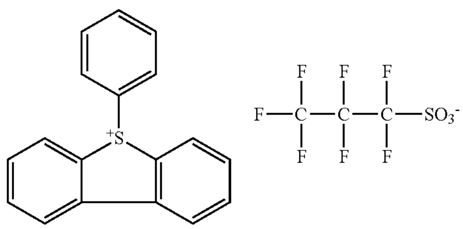
(z77)
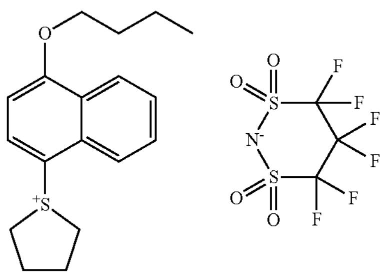
(z78)
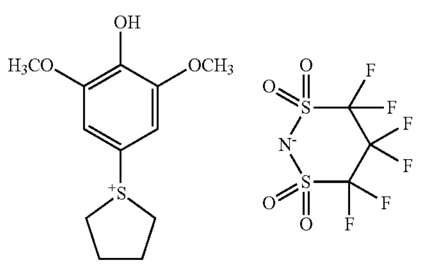
(z79)
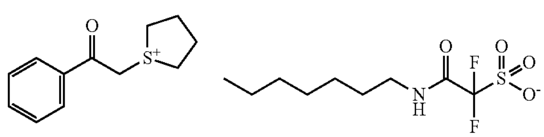
(z80)
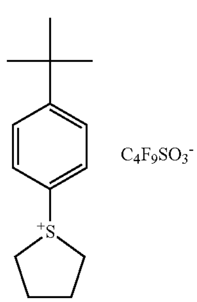
(z81)
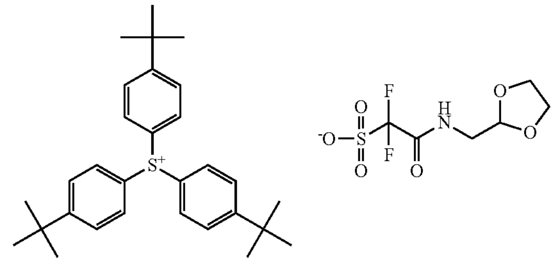
(z82)
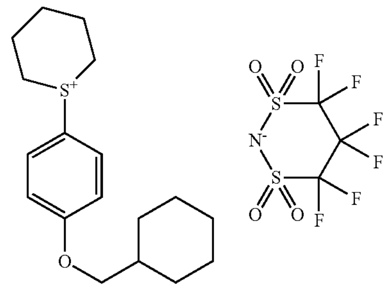
(z83)
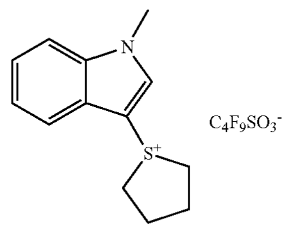
(z84)
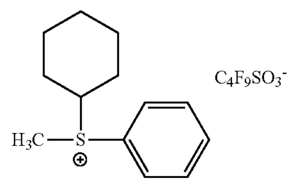
(z85)
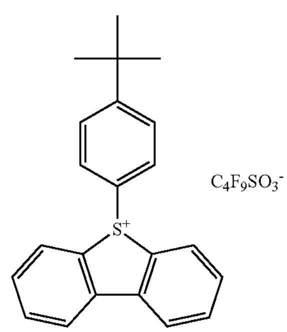
(z86)
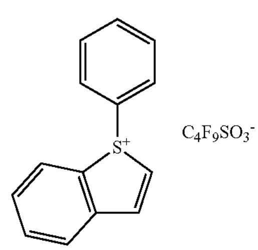

-continued
(z87)
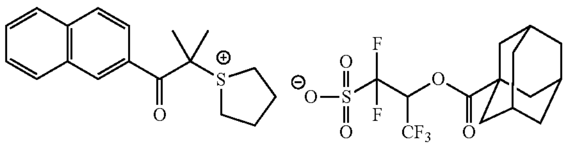
(z88)
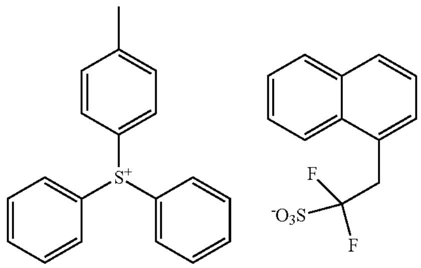
(z89)
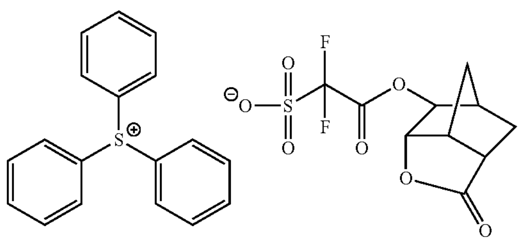
(z90)
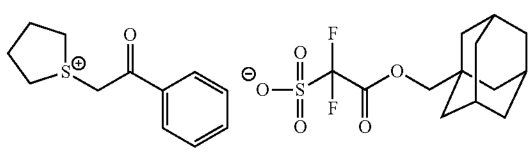
(z91)
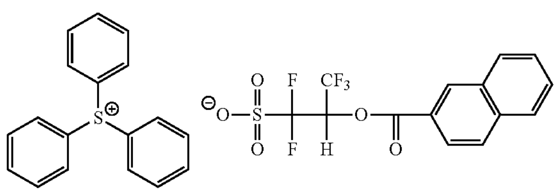
(z92)
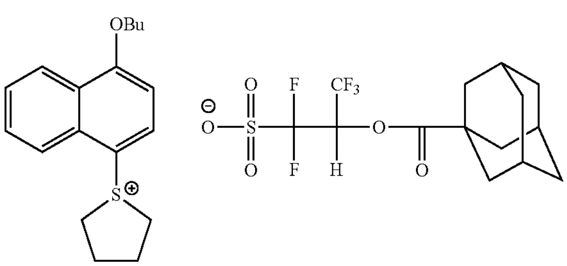
(z93)
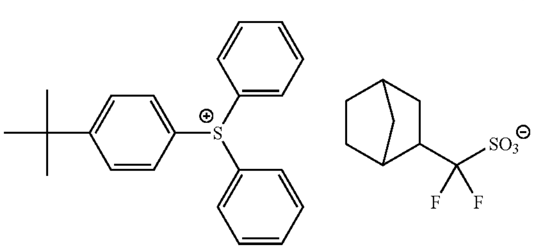
-continued
(z94)
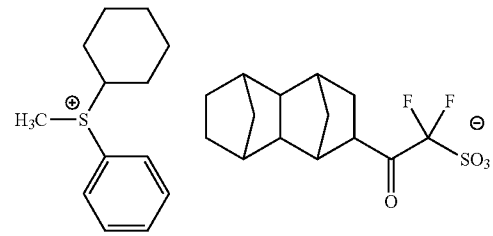
(z95)
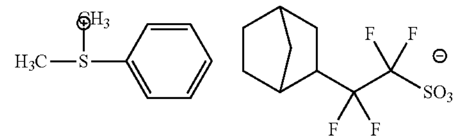
(z96)
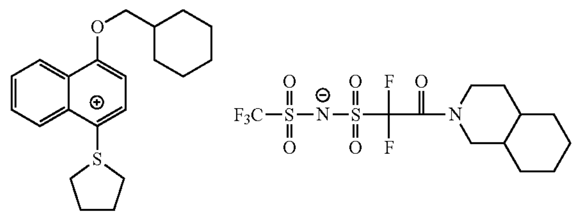
(z97)
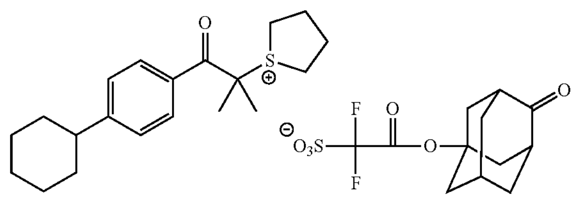
(z98)
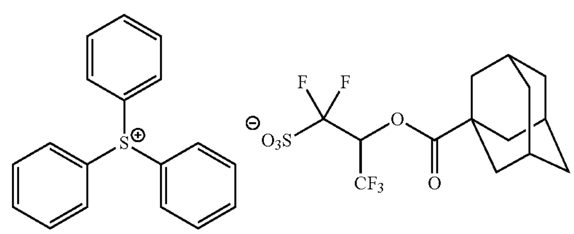
(z99)
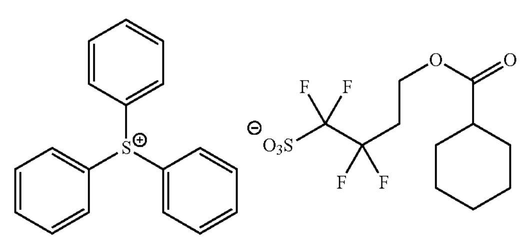
(z100)
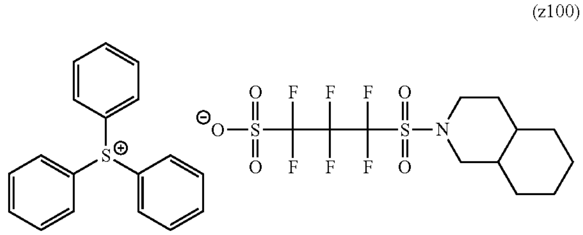

-continued (z101)

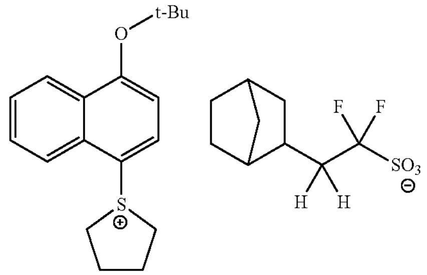

(z102)

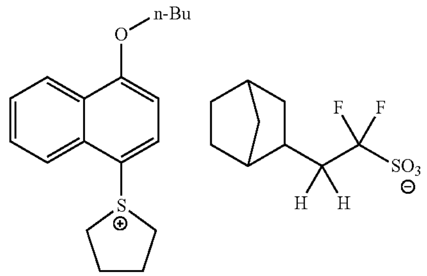

The acid generator can be synthesized by a known method, for example, can be synthesized in accordance with the method described in JP-A-2007-161707.

As for the acid generator, one kind may be used alone, or two or more kinds may be used in combination.

The content of the compound capable of generating an acid upon irradiation with an actinic ray or radiation in the composition is preferably from 0.1 to 30 mass %, more preferably from 0.5 to 25 mass %, still more preferably from 3 to 20 mass %, yet still more preferably from 3 to 15 mass %, based on the entire solid content of the actinic ray-sensitive or radiation-sensitive resin composition.

In the case where the acid generator is a compound represented by formula (ZI-3) or (ZI-4), the content thereof is preferably from 5 to 35 mass %, more preferably from 8 to 30 mass %, still more preferably from 9 to 30 mass %, yet still more preferably from 9 to 25 mass %, based on the entire solid content of the composition.

[4-1] (C) Basic Compound or Ammonium Salt Compound Whose Basicity Decreases Upon Irradiation with an Actinic Ray or Radiation The actinic ray-sensitive or radiation-sensitive resin composition for use in the present invention preferably contains a basic compound or ammonium salt compound whose basicity decreases upon irradiation with an actinic ray or radiation (hereinafter, sometimes referred to as a "compound (C)").

The compound (C) is preferably (C-1) a compound having a basic functional group or an ammonium group and a group capable of generating an acidic functional group upon irradiation with an actinic ray or radiation. That is, the compound (C) is preferably a basic compound having a basic functional group and a group capable of generating an acidic functional group upon irradiation with an actinic ray or radiation, or an ammonium salt compound having an ammonium group and a group capable of generating an acidic functional group upon irradiation with an actinic ray or radiation.

The compound which is generated due to decomposition of the compound (C) or (C-1) upon irradiation with an actinic ray or radiation and decreased in the basicity includes compounds represented by the following formulae (PA-I), (PA-II) or (PA-III), and from the standpoint that excellent effects can be attained in a high level in terms of all of LWR, uniformity of local pattern dimension and DOF, compounds represented by formulae (PA-II) and (PA-III) are preferred.

The compound represented by formula (PA-I) is described below.

$$Q\text{-}A_1\text{-}(X)_n\text{—}B\text{—}R \qquad \text{(PA-I)}$$

In formula (PA-I), $A_1$ represents a single bond or a divalent linking group.

Q represents —$SO_3H$ or —$CO_2H$. Q corresponds to an acidic functional group that is generated upon irradiation with an actinic ray or radiation.

X represents —$SO_2$— or —CO—.

n represents 0 or 1.

B represents a single bond, an oxygen atom or —N(Rx)-.

Rx represents a hydrogen atom or a monovalent organic group.

R represents a monovalent organic group having a basic functional group, or a monovalent organic group having an ammonium group.

The divalent linking group of $A_1$ is preferably a divalent linking group having a carbon number of 2 to 12, and examples thereof include an alkylene group and a phenylene group. An alkylene group having at least one fluorine atom is more preferred, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of the hydrogen atom is replaced by a fluorine atom, more preferably an alkylene group where the carbon atom bonded to the Q site has a fluorine atom, still more preferably a perfluoroalkylene group, yet still more preferably perfluoroethylene group, perfluoropropylene group or perfluorobutylene group.

The monovalent organic group in Rx is preferably a monovalent organic group having a carbon number of 4 to 30, and examples thereof include an alkyl group, a cycloalkyl group, an aryl group, an aralkyl group and an alkenyl group.

The alkyl group in Rx may have a substituent and is preferably a linear or branched alkyl group having a carbon number of 1 to 20, and the alkyl chain may contain an oxygen atom, a sulfur atom or a nitrogen atom.

Incidentally, the alkyl group having a substituent particularly includes a group where a cycloalkyl group is substituted on a linear or branched alkyl group (for example, an adamantylmethyl group, an adamantylethyl group, a cyclohexylethyl group and a camphor residue).

The cycloalkyl group in Rx may have a substituent and is preferably a cycloalkyl group having a carbon number of 3 to 20, and the cycloalkyl group may contain an oxygen atom in the ring.

The aryl group in Rx may have a substituent and is preferably an aryl group having a carbon number of 6 to 14.

The aralkyl group in Rx may have a substituent and is preferably an aralkyl group having a carbon number of 7 to 20.

The alkenyl group in Rx may have a substituent and includes, for example, a group having a double bond at an arbitrary position of the alkyl group described as Rx.

Preferred examples of the partial structure of the basic functional group include a crown ether structure, a primary to tertiary amine structure, and a nitrogen-containing heterocyclic structure (e.g., pyridine, imidazole, pyrazine).

Preferred examples of the partial structure of the ammonium group include a primary to tertiary ammonium structure, a pyridinium structure, an imidazolinium structure and a pyrazinium structure.

The basic functional group is preferably a functional group having a nitrogen atom, more preferably a structure having a primary to tertiary amino group or a nitrogen-containing heterocyclic structure. In these structures, from the standpoint of enhancing the basicity, it is preferred that all atoms adjacent to nitrogen atom contained in the structure are a carbon atom or a hydrogen atom. Also, in view of enhancing the basicity, an electron-withdrawing functional group (such as carbonyl group, sulfonyl group, cyano group and halogen atom) is preferably not bonded directly to the nitrogen atom.

The monovalent organic group in the monovalent organic group (group R) containing such a structure is preferably an organic group having a carbon number of 4 to 30, and examples thereof include an alkyl group, a cycloalkyl group, an aryl group, an aralkyl group and an alkenyl group. Each of these groups may have a substituent.

The alkyl group, cycloalkyl group, aryl group, aralkyl group and alkenyl group in the basic functional group- or ammonium group-containing alkyl, cycloalkyl, aryl, aralkyl and alkenyl groups of R are the same as the alkyl group, cycloalkyl group, aryl group, aralkyl group and alkenyl group described for Rx.

Examples of the substituent which may be substituted on each of the groups above include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 20). The cyclic structure in the aryl group, cycloalkyl group and the like may further have an alkyl group (preferably having a carbon number of 1 to 20) as the substituent. The aminoacyl group may further have one or two alkyl groups (preferably having a carbon number of 1 to 20) as the substituent.

In the case where B is —N(Rx)-, R and Rx preferably combine together to form a ring. By virtue of forming a ring structure, the stability is enhanced and the composition using this compound is also enhanced in the storage stability. The number of carbons constituting the ring is preferably from 4 to 20, and the ring may be monocyclic or polycyclic and may contain an oxygen atom, a sulfur atom or a nitrogen atom.

Examples of the monocyclic structure include a 4- to 8-membered ring containing a nitrogen atom. Examples of the polycyclic structure include a structure composed of a combination of two monocyclic structures or three or more monocyclic structures. The monocyclic structure and polycyclic structure may have a substituent, and preferred examples of the substituent include a halogen atom, a hydroxyl group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 15), an acyloxy group (preferably having a carbon number of 2 to 15), an alkoxycarbonyl group (preferably having a carbon number of 2 to 15), and an aminoacyl group (preferably having a carbon number of 2 to 20). The cyclic structure in the aryl group, cycloalkyl group and the like may further have an alkyl group (preferably having a carbon number of 1 to 15) as the substituent. The aminoacyl group may have one or two alkyl groups (preferably having a carbon number of 1 to 15) as the substituent.

Out of the compounds represented by formula (PA-I), a compound where the Q site is a sulfonic acid can be synthesized using a general sulfonamidation reaction. For example, this compound can be obtained by a method of selectively reacting one sulfonyl halide moiety of a bis-sulfonyl halide compound with an amine compound to form a sulfonamide bond and then hydrolyzing the other sulfonyl halide moiety, or a method of ring-opening a cyclic sulfonic anhydride through reaction with an amine compound.

The compound represented by formula (PA-II) is described below.

$$Q_1\text{-}X_1\text{—NH—}X_2\text{-}Q_2 \quad \text{(PA-II)}$$

In formula (PA-II), each of $Q_1$ and $Q_2$ independently represents a monovalent organic group, provided that either one of $Q_1$ and $Q_2$ has a basic functional group. It is also possible that $Q_1$ and $Q_2$ combine together to form a ring and the ring formed has a basic functional group.

Each of $X_1$ and $X_2$ independently represents —CO— or —$SO_2$—.

Here, —NH— corresponds to the acidic functional group generated upon irradiation with an actinic ray or radiation.

The monovalent organic group as $Q_1$ and $Q_2$ in formula (PA-II) is preferably a monovalent organic group having a carbon number of 1 to 40, and examples thereof include an alkyl group, a cycloalkyl group, an aryl group, an aralkyl group and an alkenyl group.

The alkyl group in $Q_1$ and $Q_2$ may have a substituent and is preferably a linear or branched alkyl group having a carbon number of 1 to 30, and the alkyl chain may contain an oxygen atom, a sulfur atom or a nitrogen atom.

The cycloalkyl group in $Q_1$ and $Q_2$ may have a substituent and is preferably a cycloalkyl group having a carbon number of 3 to 20, and the ring may contain an oxygen atom or a nitrogen atom.

The aryl group in $Q_1$ and $Q_2$ may have a substituent and is preferably an aryl group having a carbon number of 6 to 14.

The aralkyl group in $Q_1$ and $Q_2$ may have a substituent and is preferably an aralkyl group having a carbon number of 7 to 20.

The alkenyl group in $Q_1$ and $Q_2$ may have a substituent and includes a group having a double bond at an arbitrary position of the alkyl group above.

Examples of the substituent which may be substituted on each of these groups include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 10). The cyclic structure in the aryl group, cycloalkyl group and the like may further have an alkyl group (preferably having a carbon number of 1 to 10) as the substituent. The aminoacyl group may further have an alkyl group (preferably having a carbon number of 1 to 10) as the substituent. The alkyl group having a substituent includes, for example, a perfluoroalkyl group such as perfluoromethyl group, perfluoroethyl group, perfluoropropyl group and perfluorobutyl group.

Preferred partial structures of the basic functional group possessed by at least either $Q_1$ or $Q_2$ are the same as those of the basic functional group in R of formula (PA-I).

The structure where $Q_1$ and $Q_2$ combine together to form a ring and the ring formed has a basic functional group includes, for example, a structure where the organic groups of $Q_1$ and $Q_2$ are bonded further through an alkylene group, an oxy group, an imino group or the like.

In formula (PA-II), at least either one of $X_1$ and $X_2$ is preferably —$SO_2$—.

The compound represented by formula (PA-III) is described below.

$$Q_1\text{-}X_1\text{—NH—}X_2\text{-}A_2\text{-}(X_3)_m\text{—B-}Q_3 \qquad \text{(PA-III)}$$

In formula (PA-III), each of $Q_1$ and $Q_3$ independently represents a monovalent organic group, provided that either one of $Q_1$ and $Q_3$ has a basic functional group. It is also possible that $Q_1$ and $Q_3$ combine together to form a ring and the ring formed has a basic functional group.

Each of $X_1$, $X_2$ and $X_3$ independently represents —CO— or —$SO_2$—.

$A_2$ represents a divalent linking group.

B represents a single bond, an oxygen atom or —N(Qx)-.

Qx represents a hydrogen atom or a monovalent organic group.

In the case where B is —N(Qx)-, Q3 and Qx may combine together to form a ring.

m represents 0 or 1.

Here, —NH— corresponds to the acidic functional group generated upon irradiation with an actinic ray or radiation.

$Q_1$ has the same meaning as $Q_1$ in formula (PA-II).

Examples of the organic group of $Q_3$ are the same as those of the organic group of $Q_1$ and $Q_2$ in formula (PA-II).

Examples of the structure where $Q_1$ and $Q_3$ combine to form a ring and the ring formed has a basic functional group includes, for example, a structure where the organic groups of $Q_1$ and $Q_3$ are bonded further through an alkylene group, an oxy group, an imino group or the like.

The divalent linking group in $A_2$ is preferably a divalent linking group having a carbon number of 1 to 8 and containing a fluorine atom, and examples thereof include a fluorine atom-containing alkylene group having a carbon number of 1 to 8 and a fluorine atom-containing phenylene group. A fluorine atom-containing alkylene group is more preferred, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of the hydrogen atom is replaced by a fluorine atom, more preferably a perfluoroalkylene group, still more preferably a perfluoroethylene group having a carbon number of 2 to 4.

The monovalent organic group in Qx is preferably an organic group having a carbon number of 4 to 30, and examples thereof include an alkyl group, a cycloalkyl group, an aryl group, an aralkyl group and an alkenyl group. Examples of the alkyl group, cycloalkyl group, aryl group, aralkyl group and alkenyl group are the same as those for Rx in formula (PA-I).

In formula (PA-III), each of $X_1$, $X_2$ and $X_3$ is preferably —$SO_2$—.

The compound (C) is preferably a sulfonium salt compound of the compound represented by formula (PA-I), (PA-II) or (PA-III), or an iodonium salt compound of the compound represented by formula (PA-I), (PA-II) or (PA-III), more preferably a compound represented by the following formula (PA1) or (PA2):

(PA1)

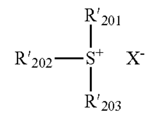

(PA2)

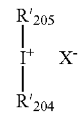

In formula (PA1), each of $R'_{201}$, $R'_{202}$ and $R'_{203}$ independently represents an organic group, and specific examples thereof are the same as those for $R_{201}$, $R_{202}$ and $R_{203}$ of formula ZI in the component (B).

$X^-$ represents a sulfonate or carboxylate anion resulting from elimination of a hydrogen atom in the —$SO_3H$ moiety or —COOH moiety of the compound represented by formula (PA-I), or an anion resulting from elimination of a hydrogen atom in the —NH— moiety of the compound represented by formula (PA-II) or (PA-III).

In formula (PA2), each of $R'_{204}$ and $R'_{205}$ independently represents an aryl group, an alkyl group or a cycloalkyl group, and specific examples thereof are the same as those for $R_{204}$ and $R_{205}$ of formula ZII in the component (B).

$X^-$ represents a sulfonate or carboxylate anion resulting from elimination of a hydrogen atom in the —$SO_3H$ moiety or —COOH moiety of the compound represented by formula (PA-I), or an anion resulting from elimination of a hydrogen atom in the —NH— moiety of the compound represented by formula (PA-II) or (PA-III).

The compound (C) decomposes upon irradiation with an actinic ray or radiation to generate, for example, a compound represented by formula (PA-I), (PA-II) or (PA-III).

The compound represented by formula (PA-I) is a compound having a sulfonic or carboxylic acid group together with a basic functional group or an ammonium group and thereby being reduced in or deprived of the basicity or changed from basic to acidic as compared with the compound (C).

The compound represented by formula (PA-II) or (PA-III) is a compound having an organic sulfonylimino or organic carbonylimino group together with a basic functional group and thereby being reduced in or deprived of the basicity or changed from basic to acidic as compared with the compound (C).

In the present invention, the expression "reduced in the basicity upon irradiation with an actinic ray or radiation" means that the acceptor property for a proton (an acid generated upon irradiation with an actinic ray or radiation) of the compound (C) is decreased by the irradiation with an actinic ray or radiation. The expression "the acceptor property is decreased" means that when an equilibrium reaction of producing a noncovalent bond complex as a proton adduct from a basic functional group-containing compound and a proton takes place or when an equilibrium reaction of letting the counter cation of the ammonium group-containing compound be exchanged with a proton takes place, the equilibrium constant in the chemical equilibrium decreases.

In this way, the compound (C) whose basicity decreases upon irradiation with an actinic ray or radiation is contained in the resist film, so that in the unexposed area, the acceptor property of the compound (C) can be sufficiently brought out and an unintended reaction between an acid diffused from the exposed area or the like and the resin (P) can be inhibited, whereas in the exposed area, the acceptor property of the compound (C) decreases and the intended reaction of an acid with the resin (P) unfailingly occurs. Such an operation mechanism is considered to contribute to obtaining a pattern excellent in terms of line width variation (LWR), uniformity of local pattern dimension, focus latitude (DOF) and pattern profile.

Incidentally, the basicity can be confirmed by measuring the pH, or a calculated value can be computed using a commercially available software.

Specific examples of the compound (C) capable of generating a compound represented by formula (PA-I) upon irradiation with an actinic ray or radiation are illustrated below, but the present invention is not limited thereto.

(PA-1)

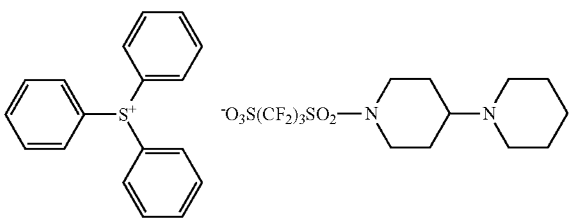

(PA-2)

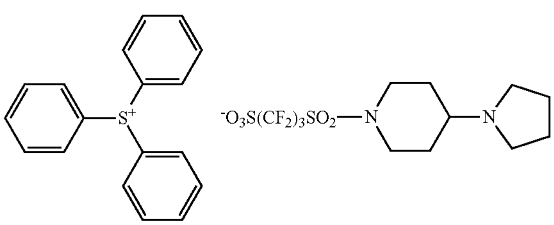

(PA-3)

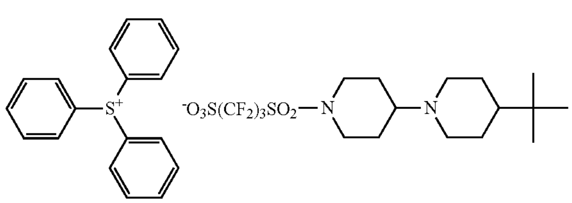

(PA-4)

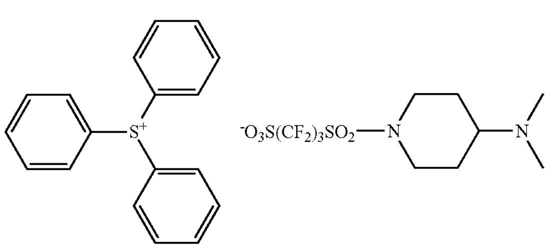

-continued (PA-5)

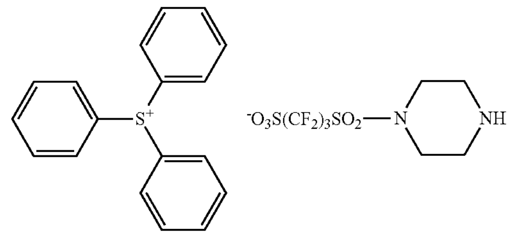

(PA-6)

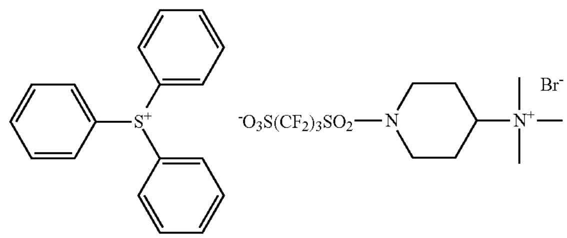

(PA-7)

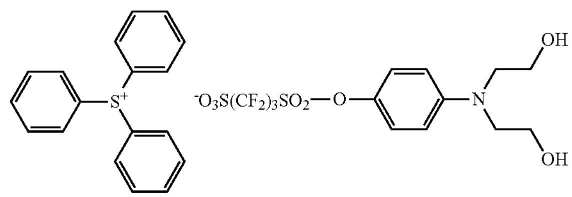

(PA-8)

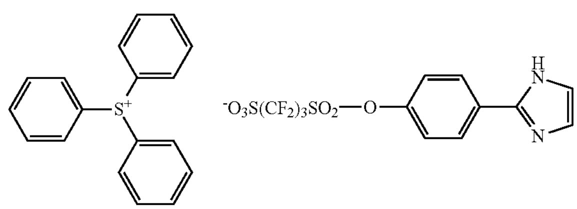

(PA-9)

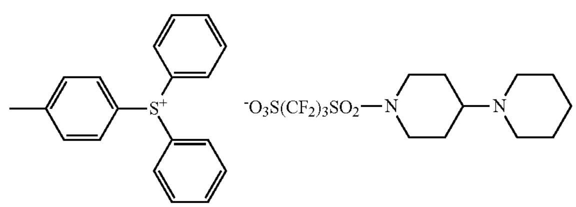

(PA-10)

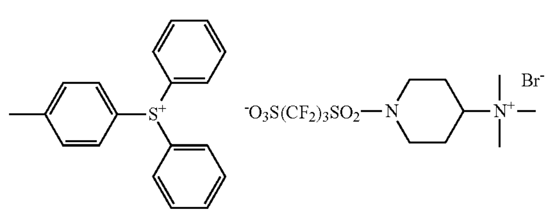

(PA-11)

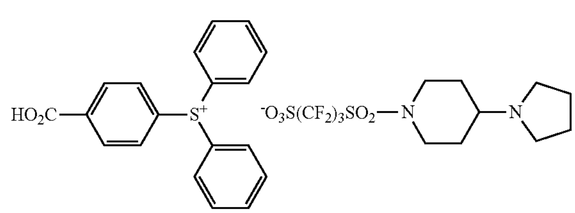

-continued
(PA-12)
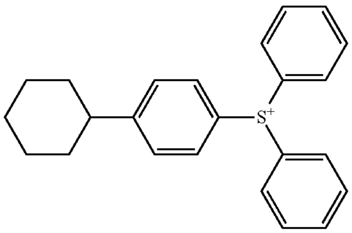
(PA-13)
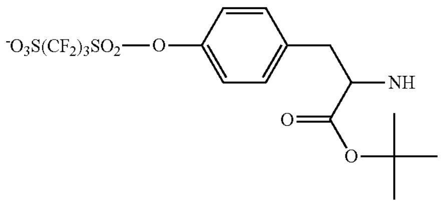
(PA-14)
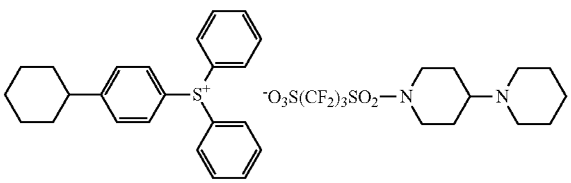
(PA-15)
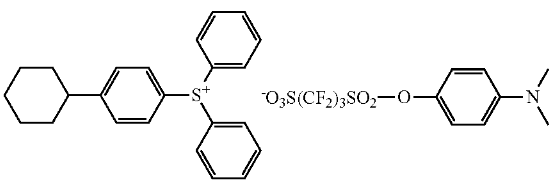
(PA-16)
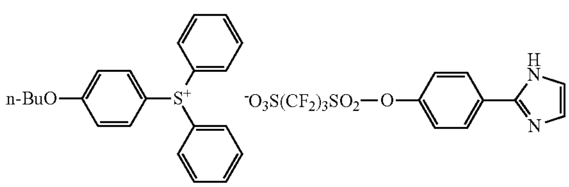
(PA-17)
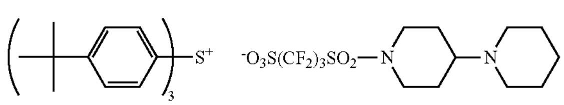
(PA-18)
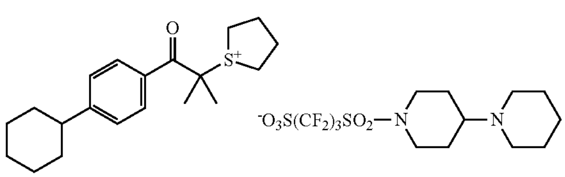
(PA-19)
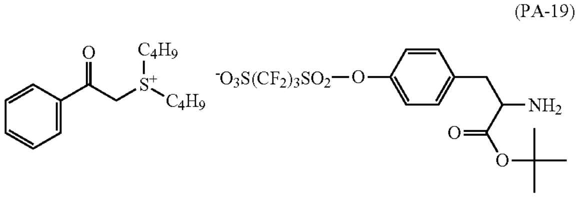
-continued
(PA-20)
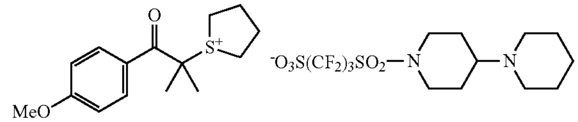
(PA-21)
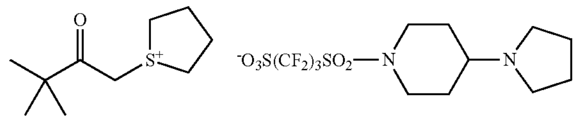
(PA-22)
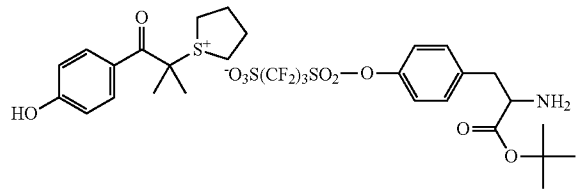
(PA-23)
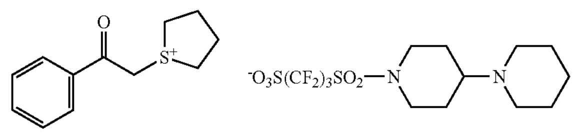
(PA-24)
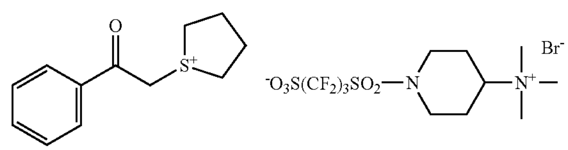
(PA-25)
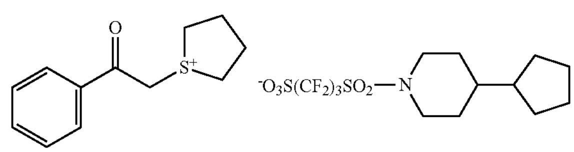
(PA-24)
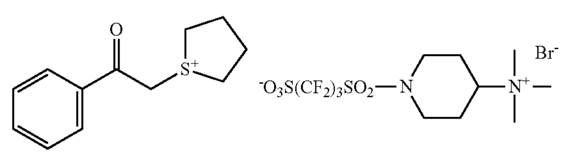
(PA-25)
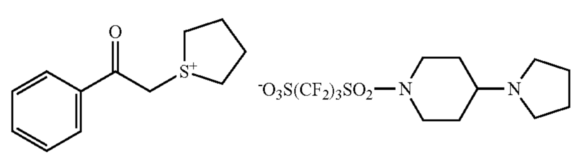
(PA-26)
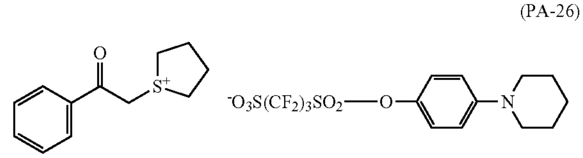

-continued
(PA-27)
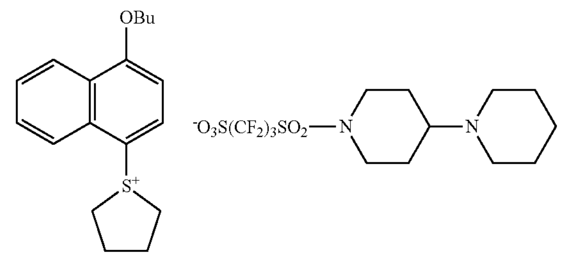
(PA-28)
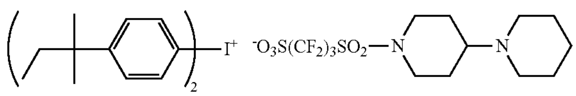
(PA-29)
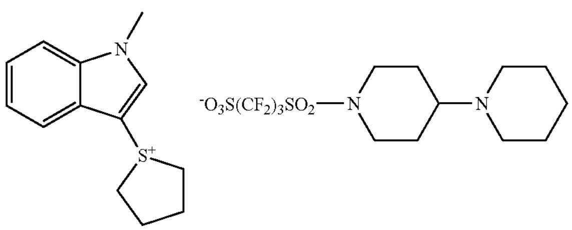
(PA-30)
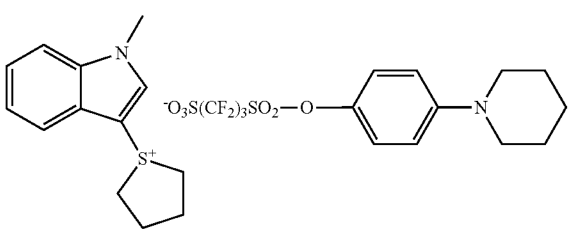
(PA-31)
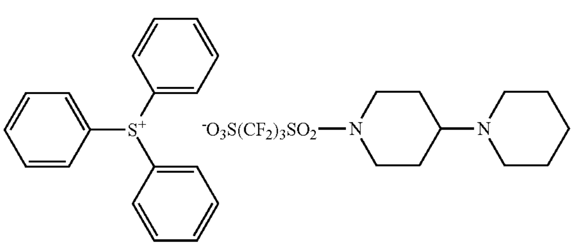
(PA-32)
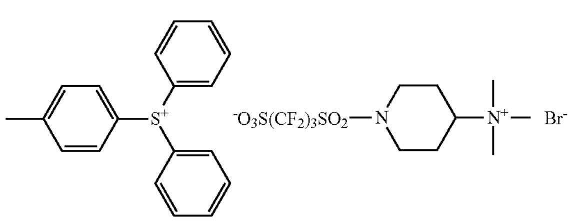
-continued
(PA-33)
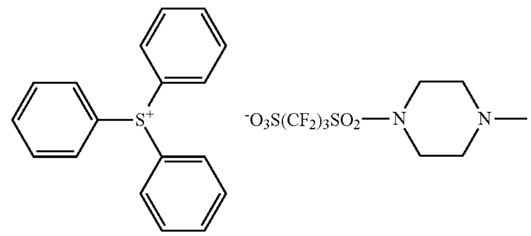
(PA-34)
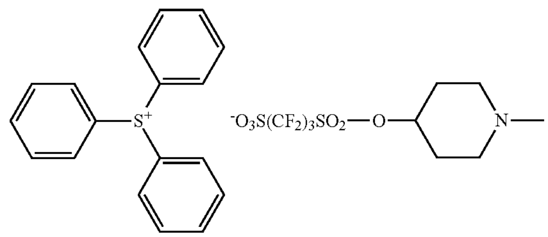
(PA-35)
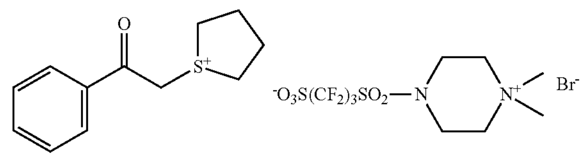
(PA-36)
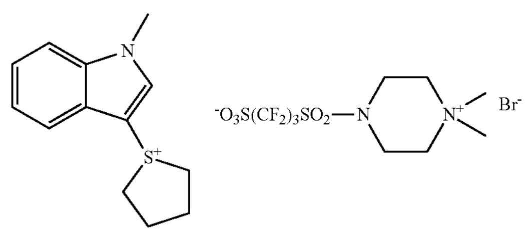
(PA-37)
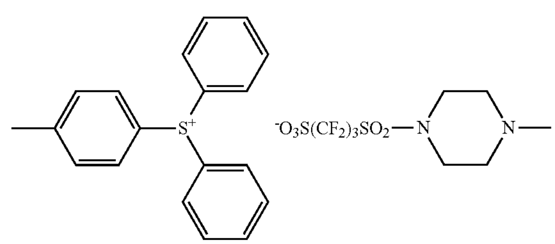
(PA-38)
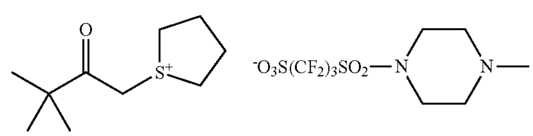
(PA-39)
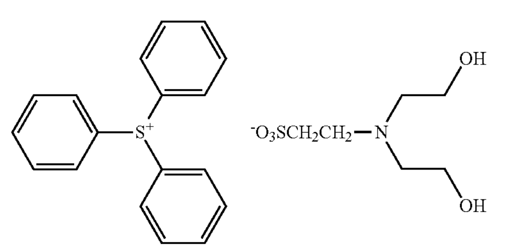

-continued
(PA-40)
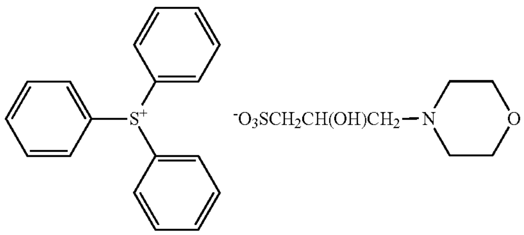
(PA-41)
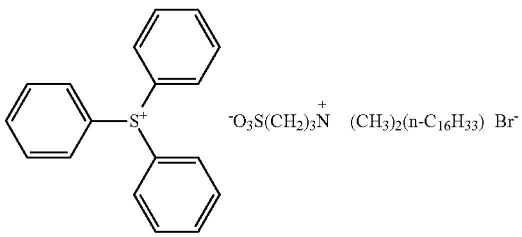
(PA-42)
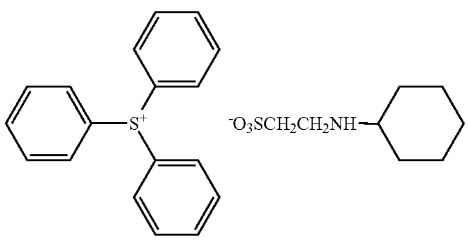
(PA-43)
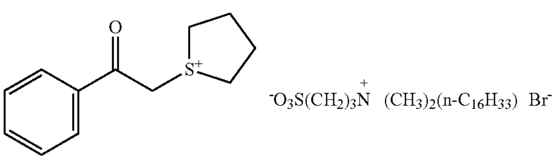
(PA-44)
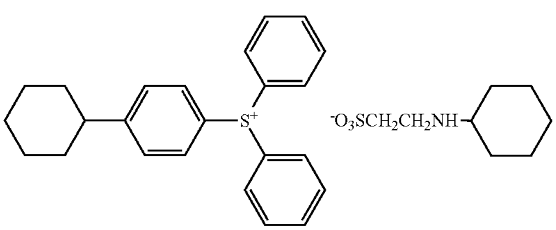
(PA-45)
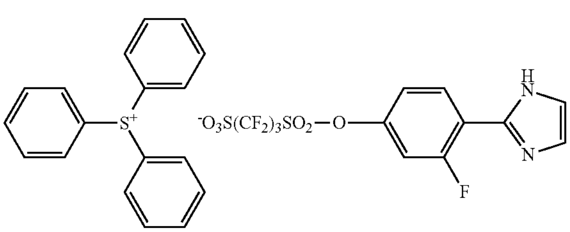
-continued
(PA-46)
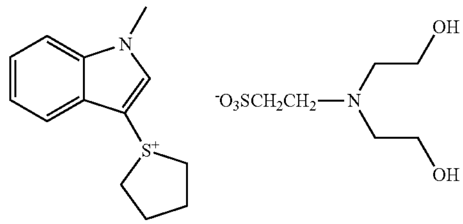
(PA-47)
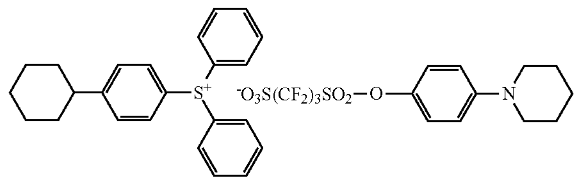
(PA-48)
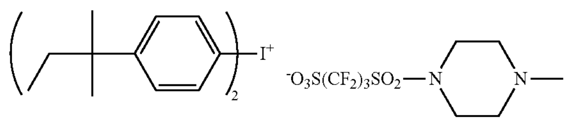
(PA-49)
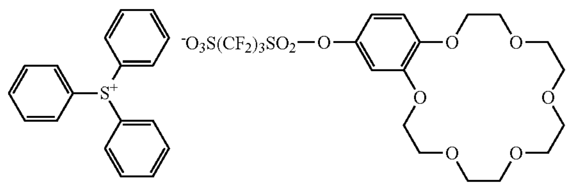
(PA-50)
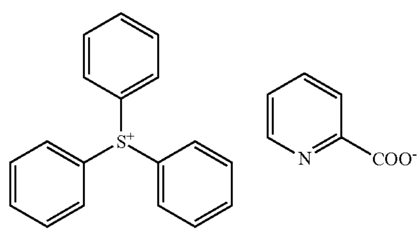
(PA-51)
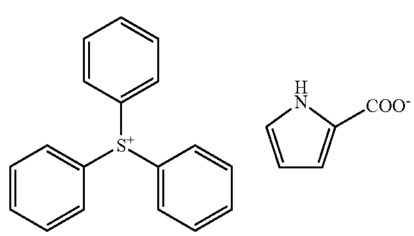
(PA-52)
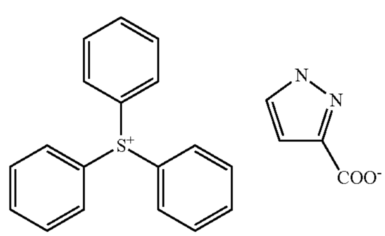

-continued (PA-53)

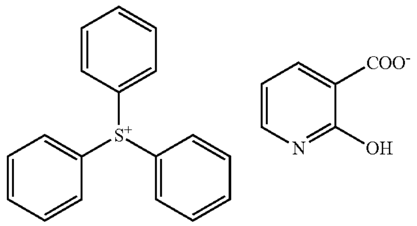

(PA-54)

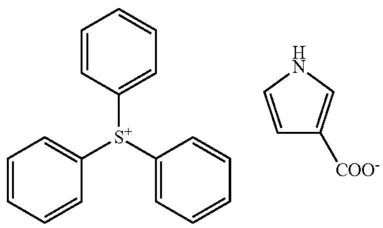

(PA-55)

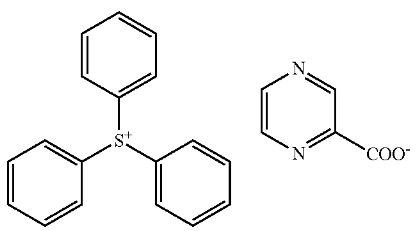

(PA-56)

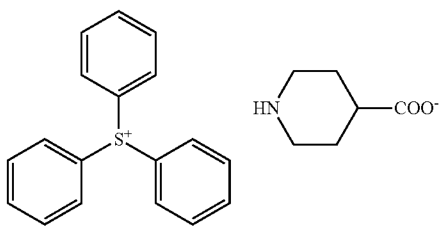

(PA-57)

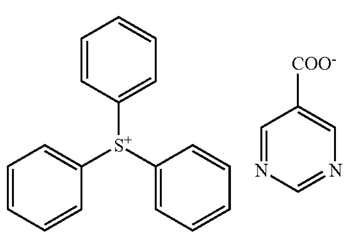

(PA-58)

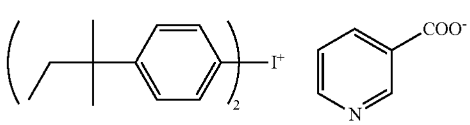

(PA-59)

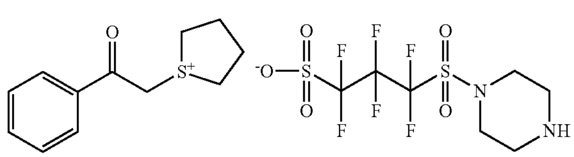

-continued (PA-60)

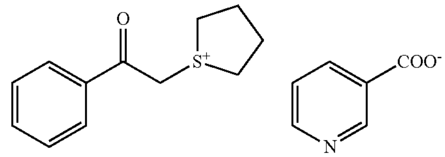

These compounds can be easily synthesized from a compound represented by formula (PA-I) or a lithium, sodium or potassium salt thereof and a hydroxide, bromide, chloride or the like of iodonium or sulfonium, by utilizing the salt exchange method described in JP-T-11-501909 (the term "JP-T" as used herein means a "published Japanese translation of a PCT patent application") or JP-A-2003-246786. The synthesis may also be performed in accordance with the synthesis method described in JP-A-7-333851.

Specific examples of the compound (C) capable of generating a compound represented by formula (PA-II) or (PA-III) upon irradiation with an actinic ray or radiation are illustrated below, but the present invention is not limited thereto.

(PA-61)

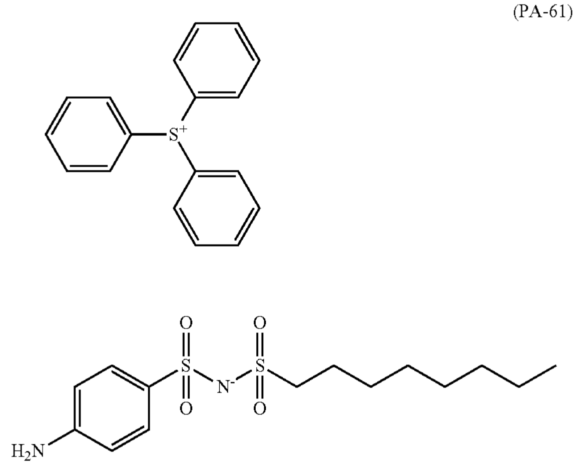

(PA-62)

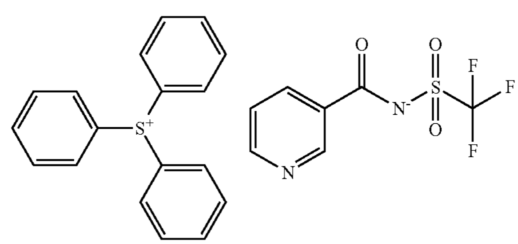

(PA-63)

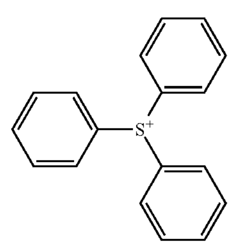

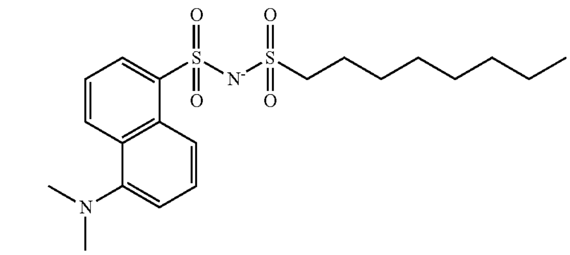
(PA-64)
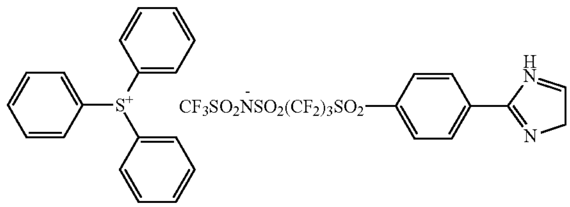
(PA-65)
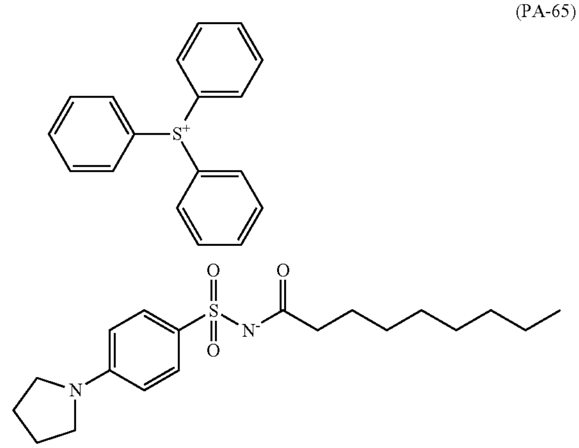
(PA-66)
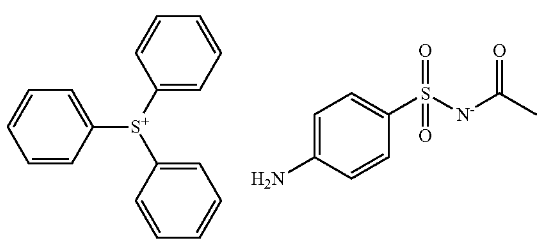
(PA-67)
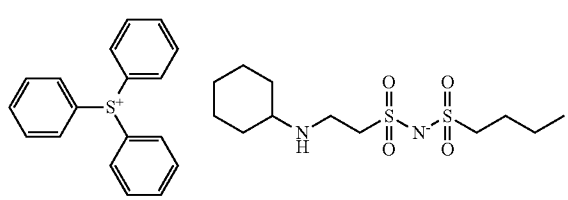
(PA-68)
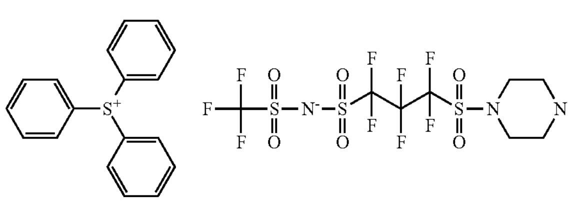
(PA-69)
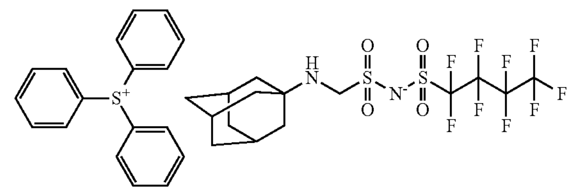
(PA-70)
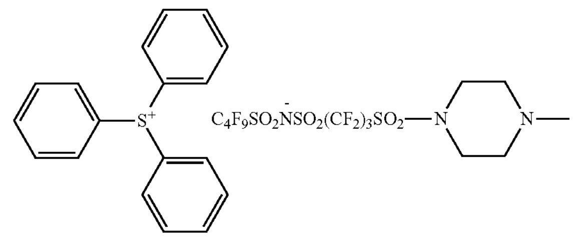
(PA-71)
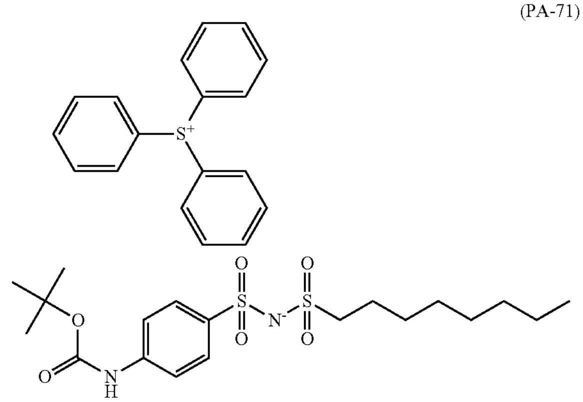
(PA-72)
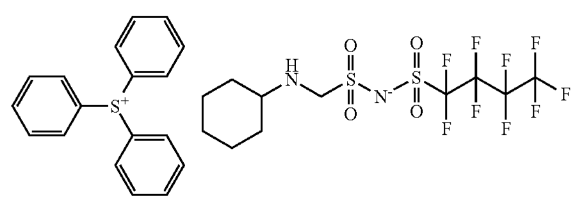
(PA-73)
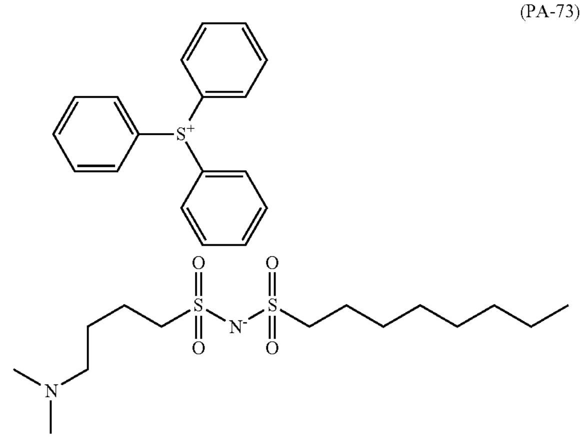

-continued
(PA-74)
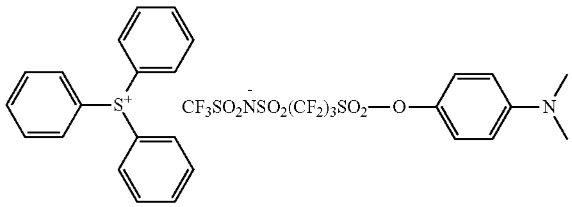
(PA-75)
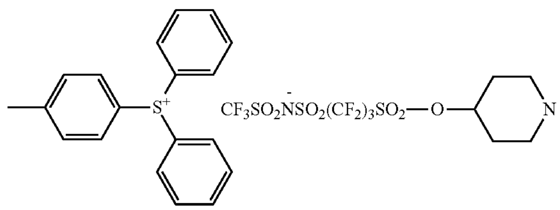
(PA-76)
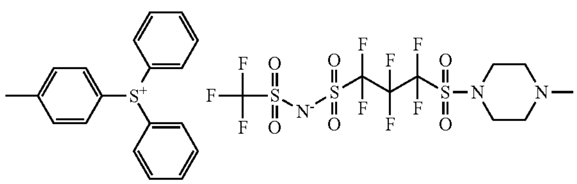
(PA-77)
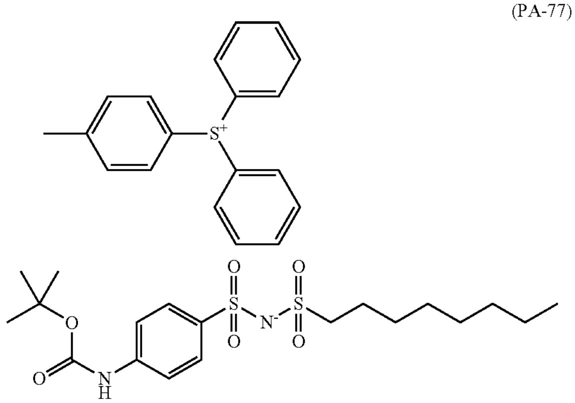
(PA-78)
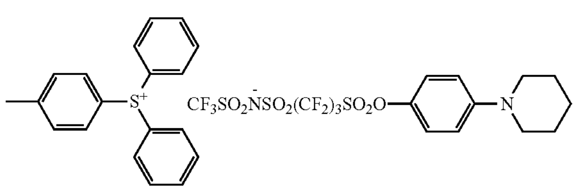
(PA-79)
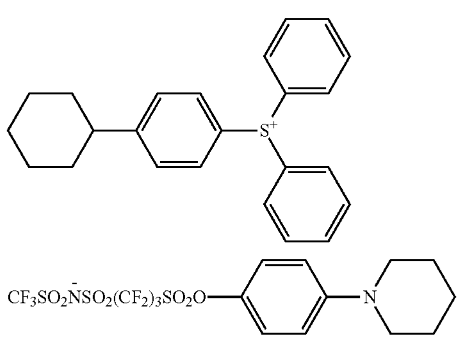
-continued
(PA-80)
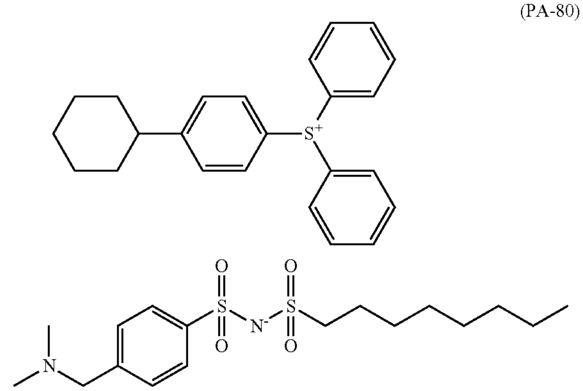
(PA-81)
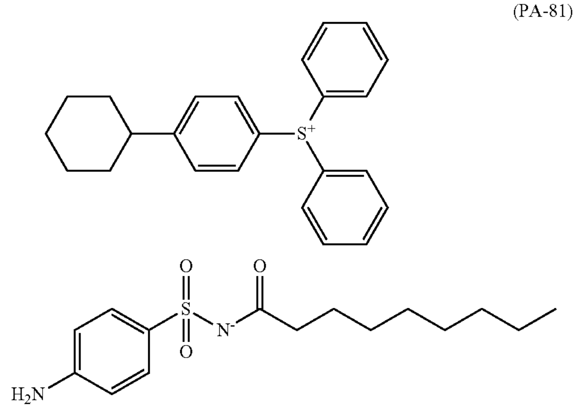
(PA-82)
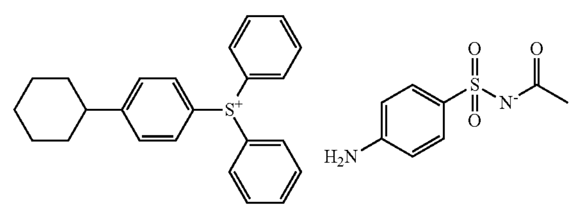
(PA-83)
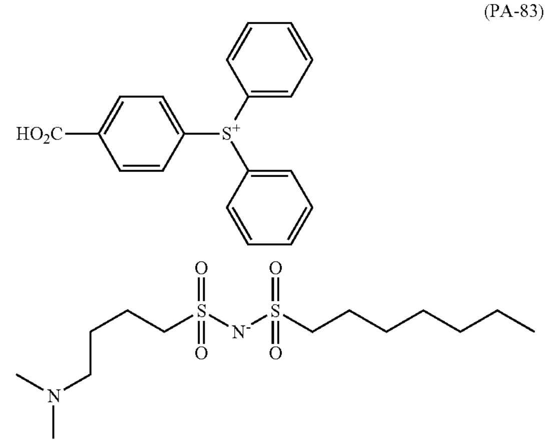
(PA-84)
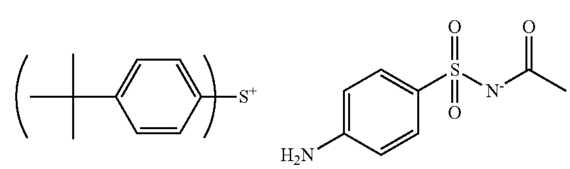

-continued
(PA-85)
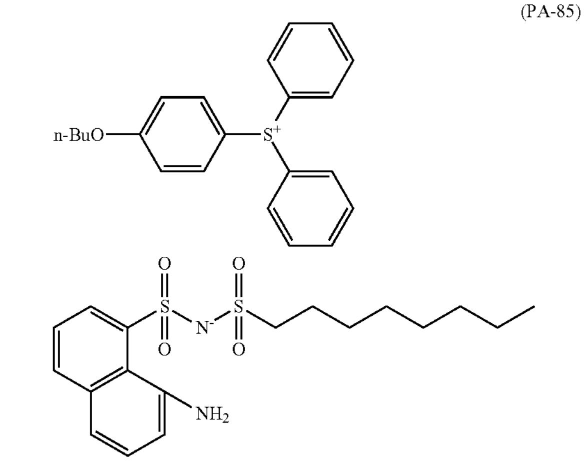
(PA-86)
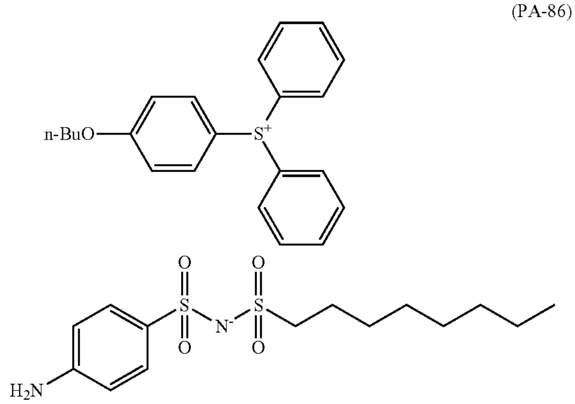
(PA-87)
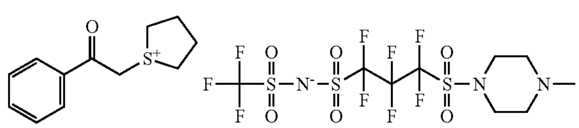
(PA-88)
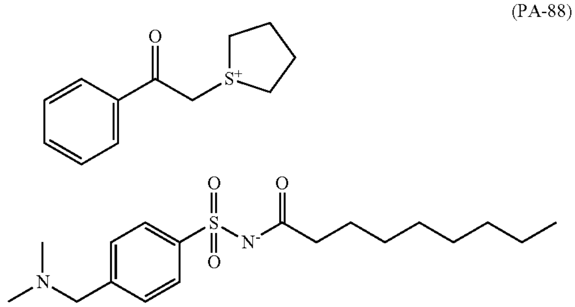
(PA-89)
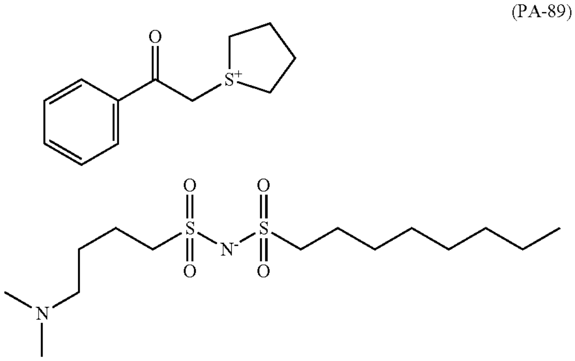
-continued
(PA-90)
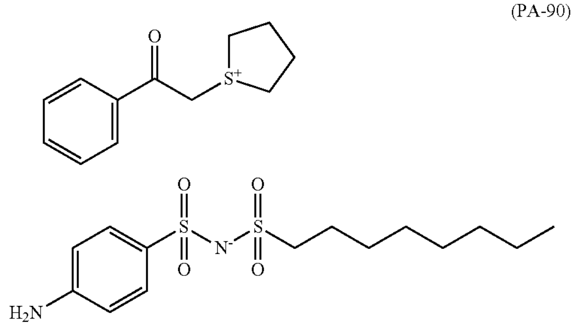
(PA-91)
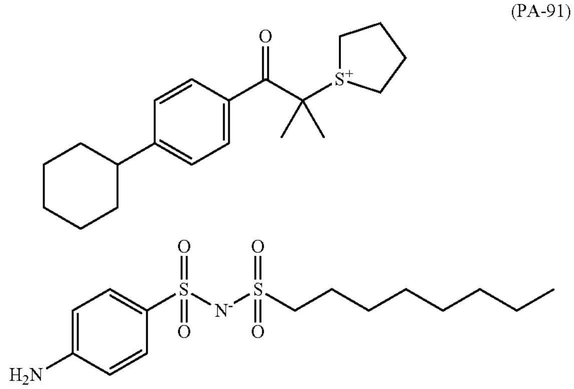
(PA-92)
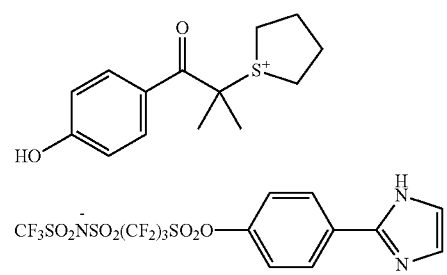
(PA-93)
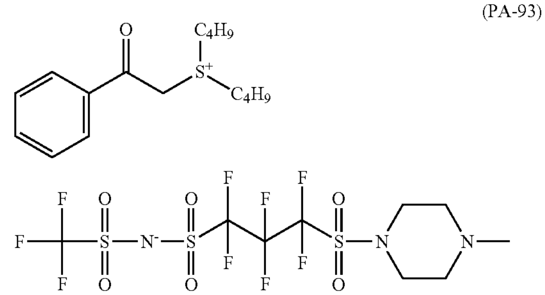
(PA-94)
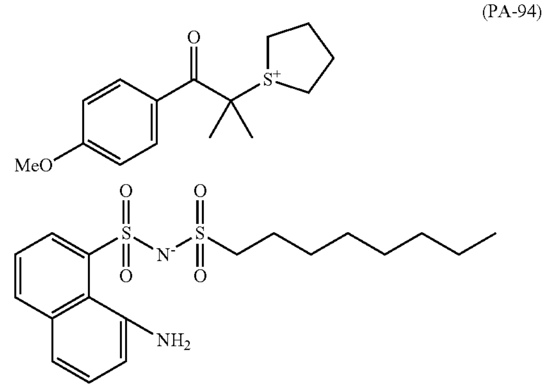

-continued
(PA-95)
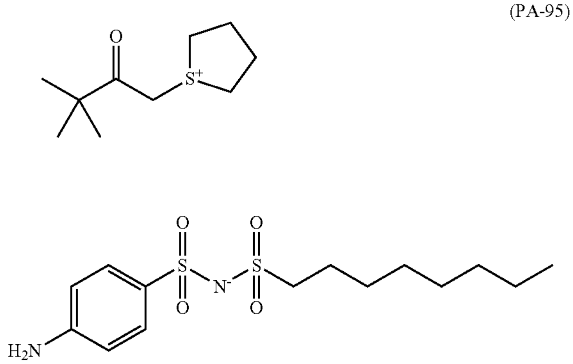
(PA-96)
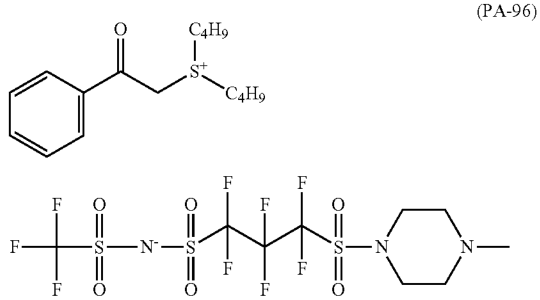
(PA-97)
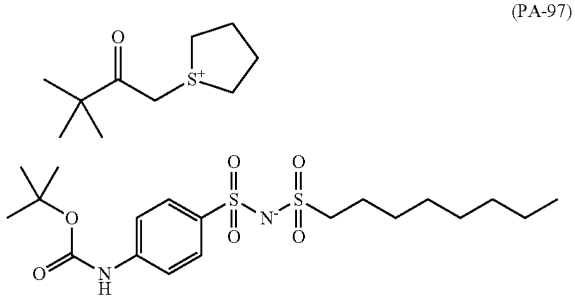
(PA-98)
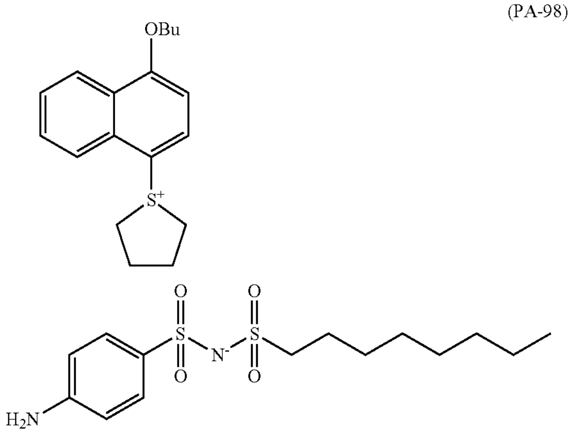
(PA-99)
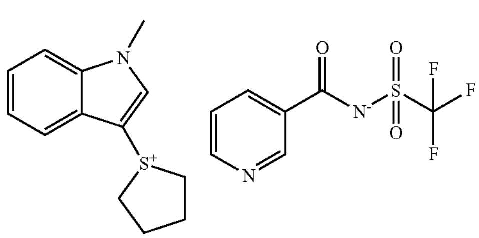
-continued
(PA-100)
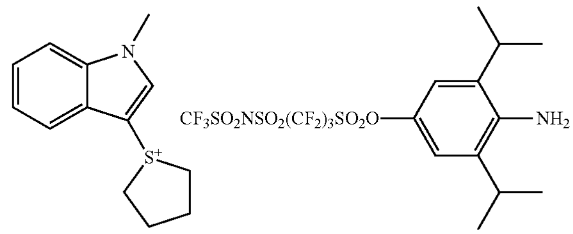
(PA-101)
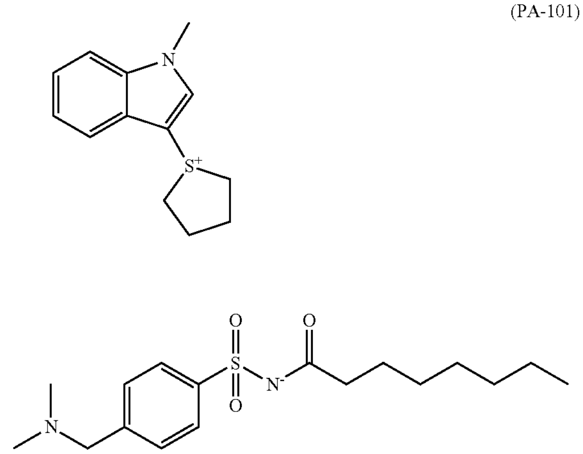
(PA-102)
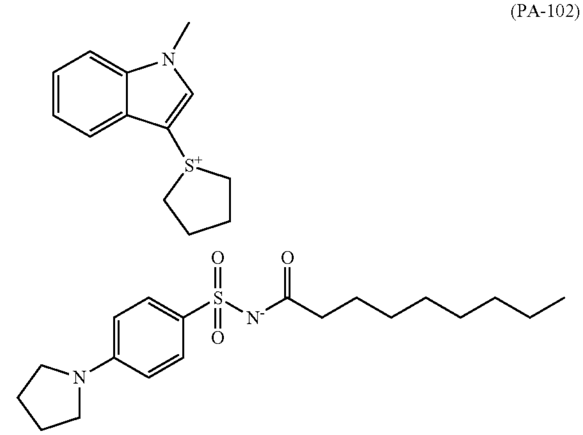
(PA-103)
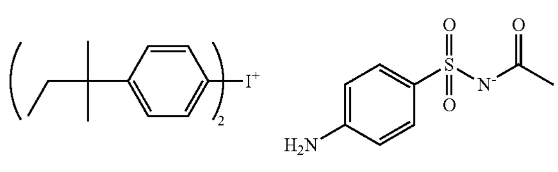
(PA-104)
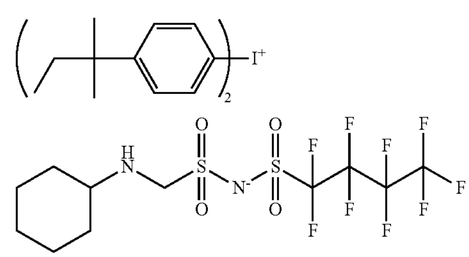

-continued
(PA-105)
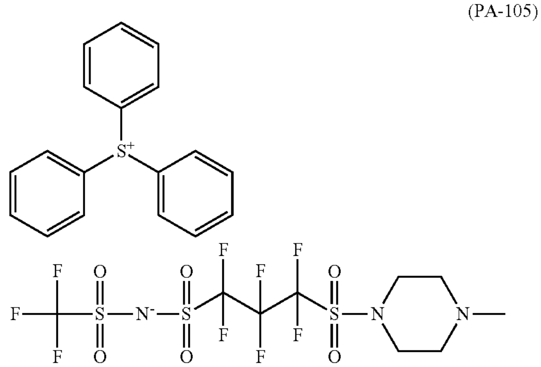
(PA-106)
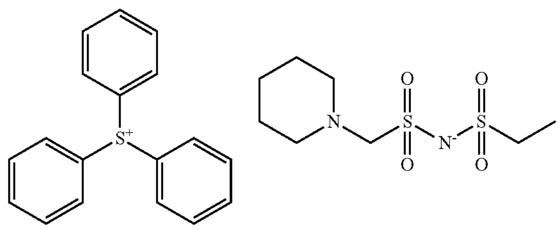
(PA-107)
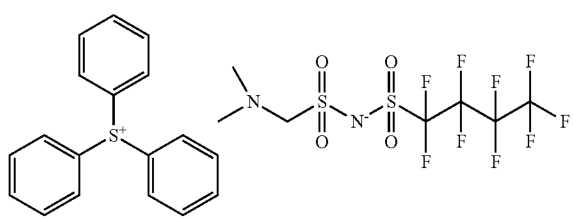
(PA-108)
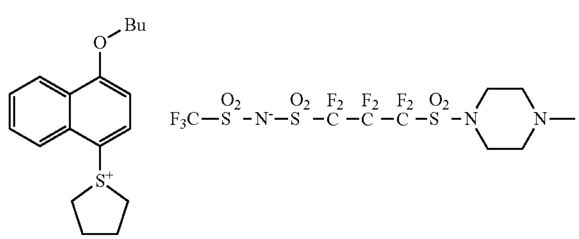
(PA-109)
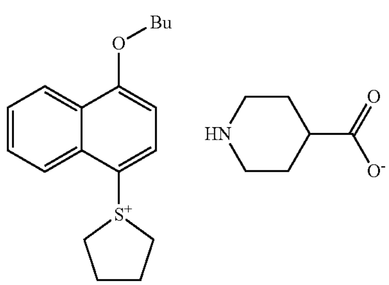
(PA-110)
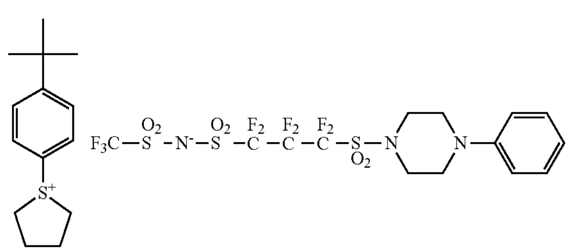
-continued
(PA-111)
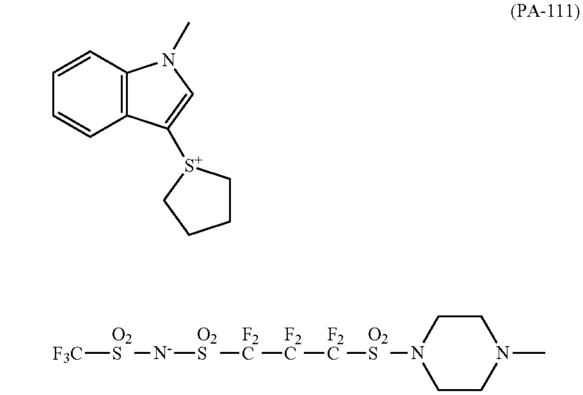
(PA-112)
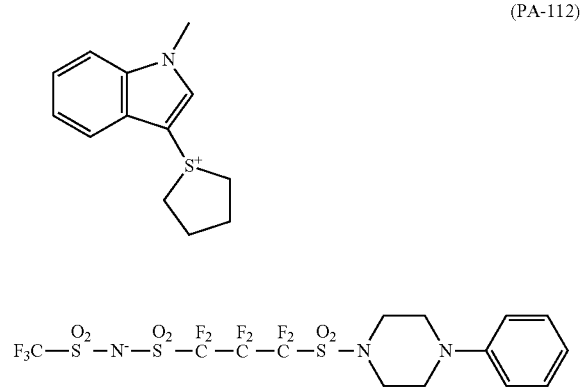
(PA-113)
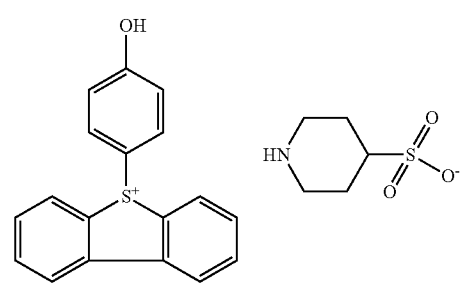
(PA-114)
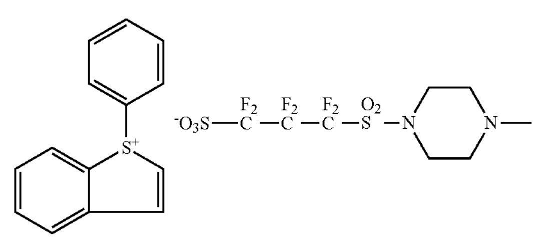
(PA-115)
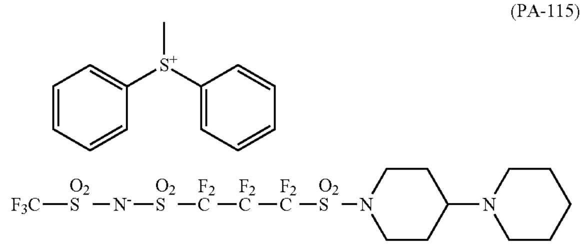

-continued
(PA-116)
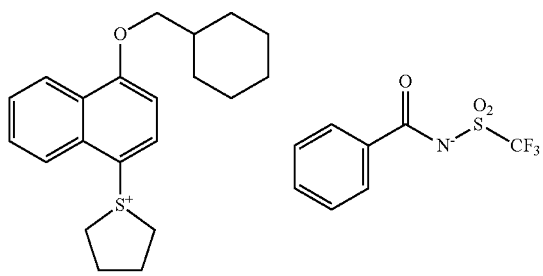
(PA-117)
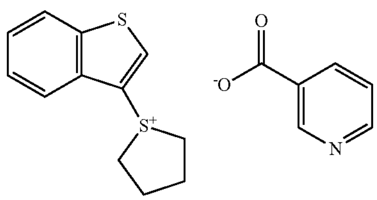
(PA-118)
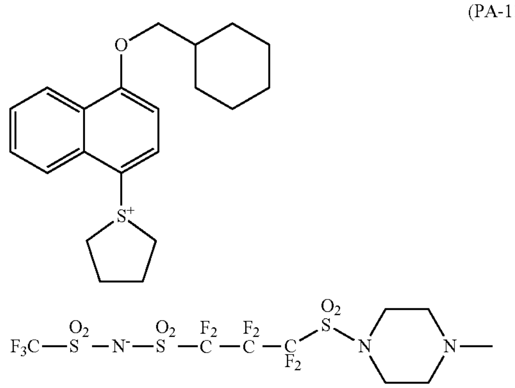
(PA-119)
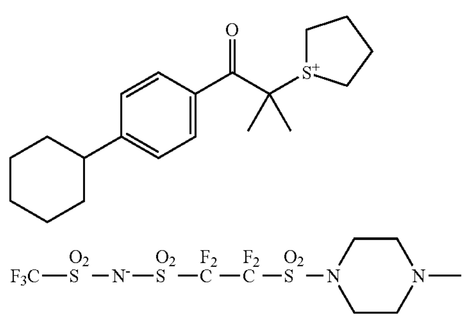
(PA-120)
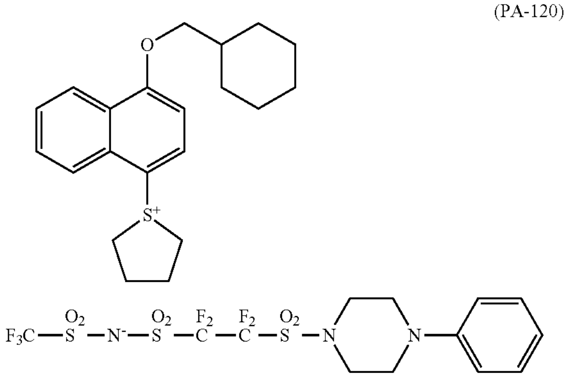
-continued
(PA-121)
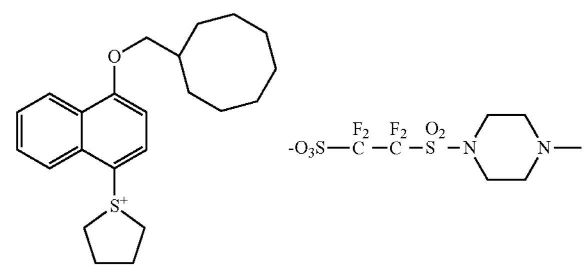
(PA-122)
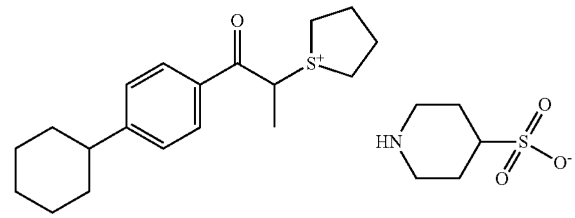
(PA-123)
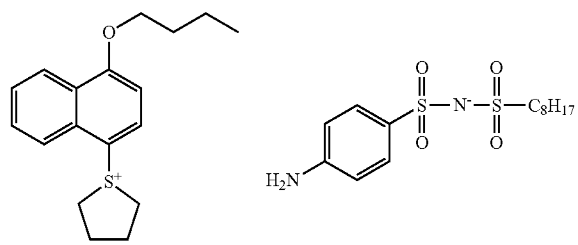
(PA-124)
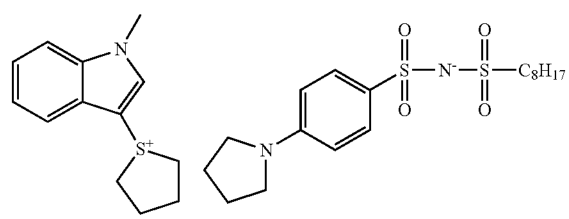
(PA-125)
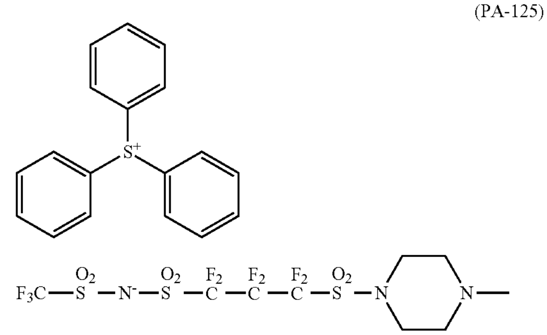
(PA-126)
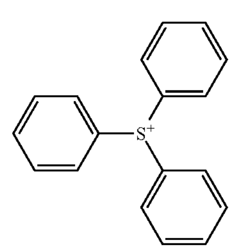

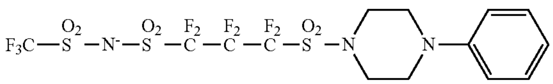
(PA-127)
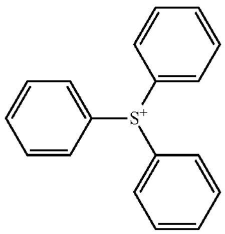
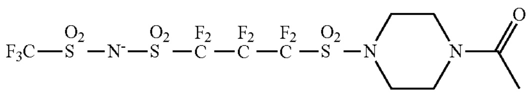
(PA-128)
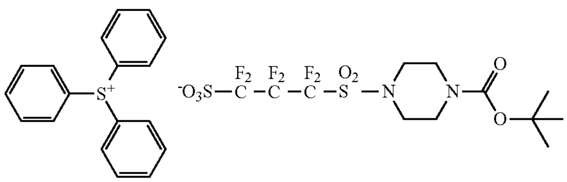
(PA-129)
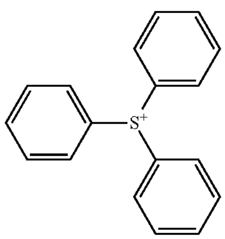
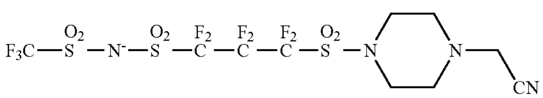
(PA-130)
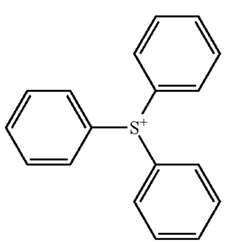
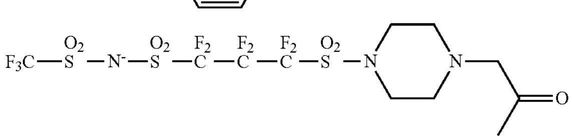
(PA-131)
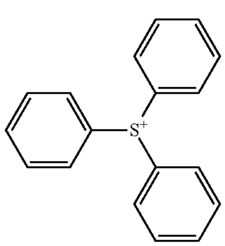
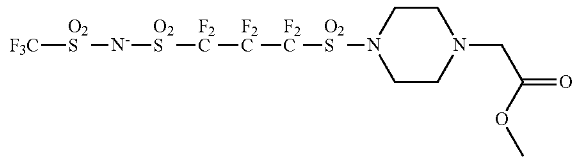
(PA-132)
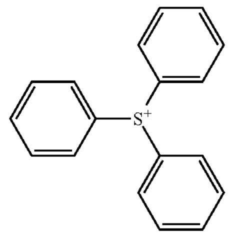
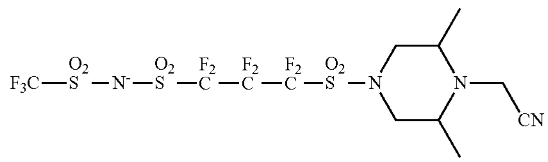
(PA-133)
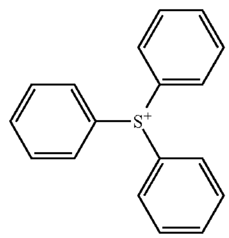
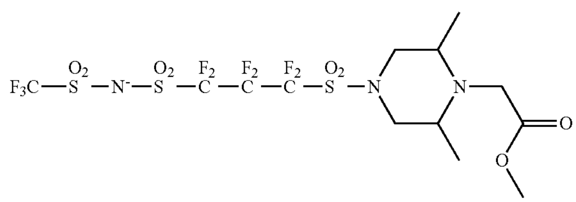
(PA-134)
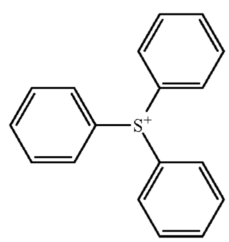
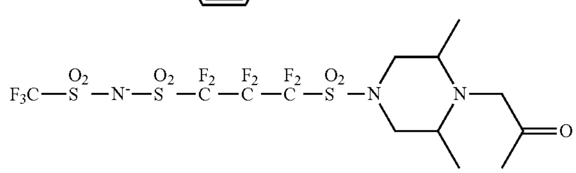
(PA-135)
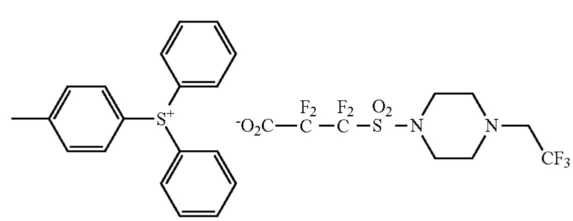

-continued
(PA-136)
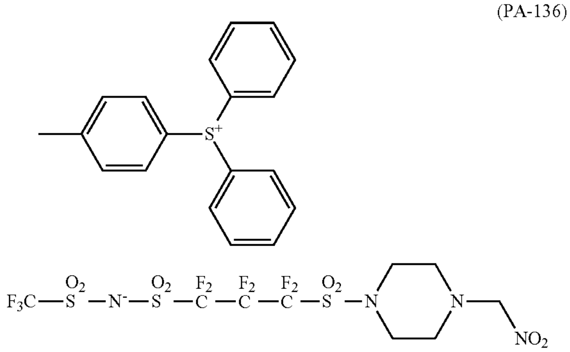
(PA-137)
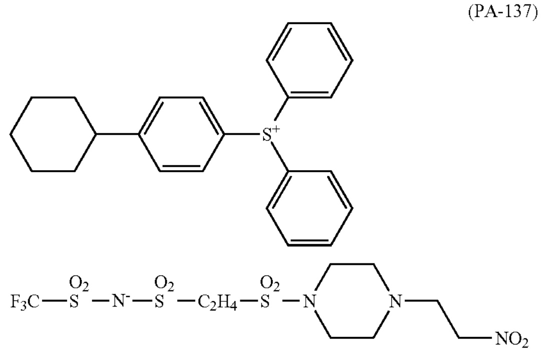
(PA-138)
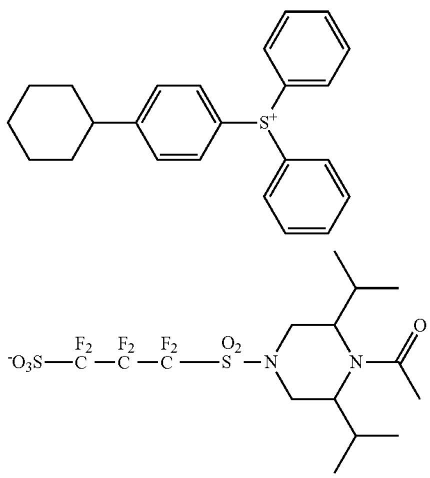
(PA-139)
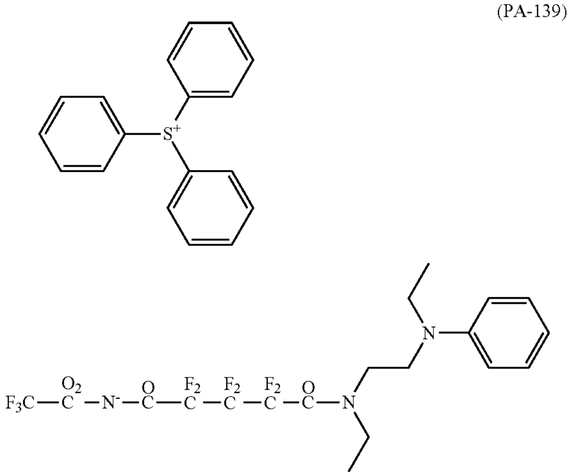
-continued
(PA-140)
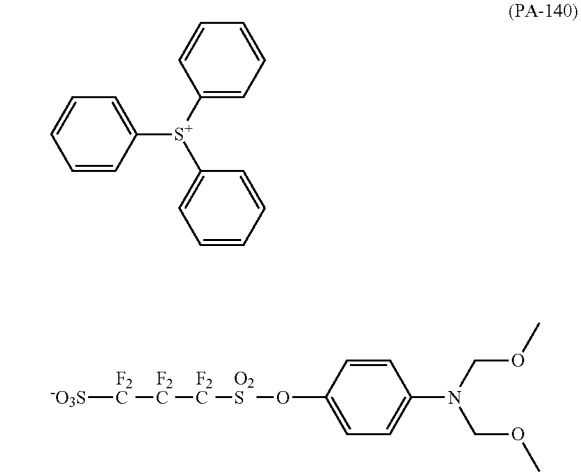
(PA-141)
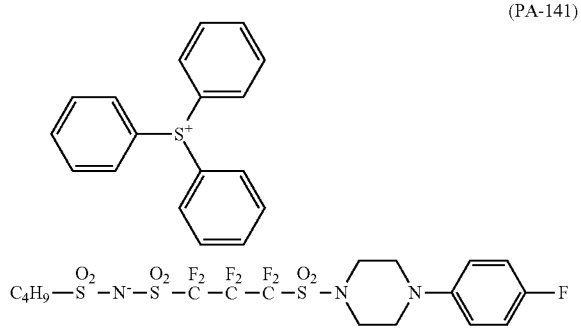
(PA-142)
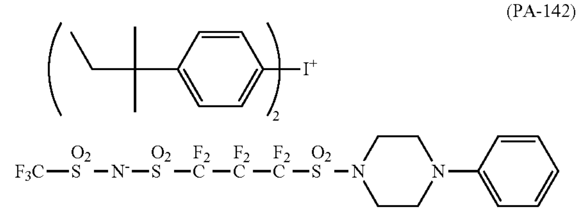
(PA-143)
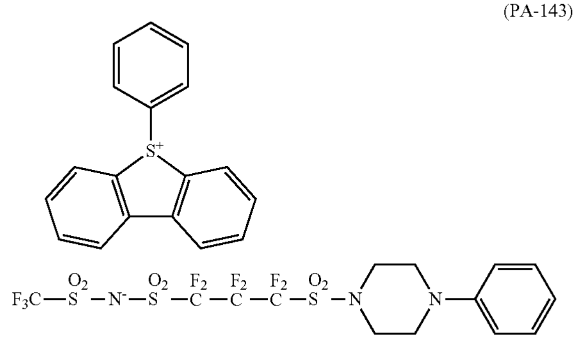
(PA-144)
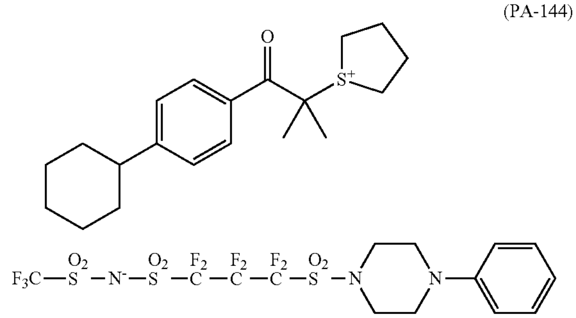

-continued (PA-145)

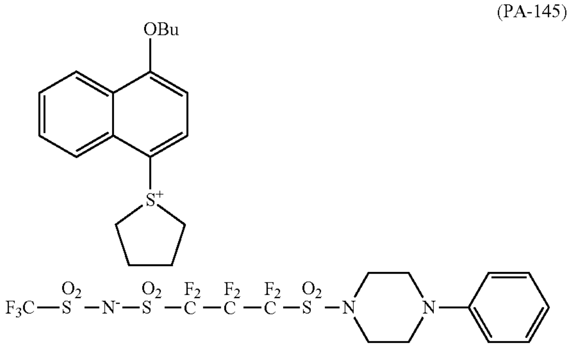

(PA-146)

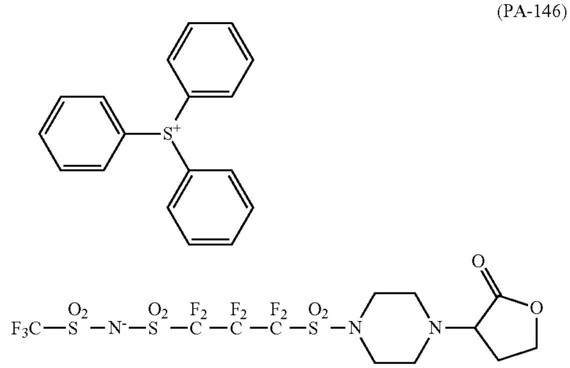

(PA-147)

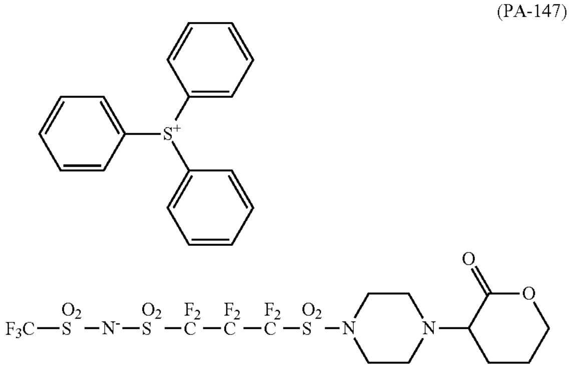

(PA-148)

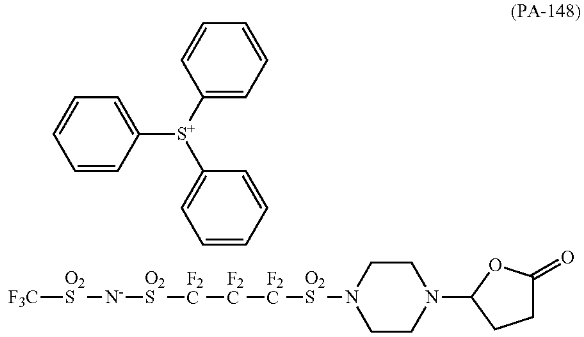

These compounds can be easily synthesized using a general sulfonic acid esterification reaction or sulfonamidation reaction. For example, the compound may be obtained by a method of selectively reacting one sulfonyl halide moiety of a bis-sulfonyl halide compound with an amine, alcohol or the like containing a partial structure represented by formula (PA-II) or (PA-III) to form a sulfonamide bond or a sulfonic acid ester bond and then hydrolyzing the other sulfonyl halide moiety, or a method of ring-opening a cyclic sulfonic anhydride by an amine or alcohol containing a partial structure represented by formula (PA-II). The amine or alcohol containing a partial structure represented by formula (PA-II) or (PA-III) can be synthesized by reacting an amine or an alcohol with an anhydride (e.g., $(R'O_2C)_2O$, $(R'SO_2)_2O$) or an acid chloride compound (e.g., $R'O_2CCl$, $R'SO_2Cl$) (R' is, for example, a methyl group, an n-octyl group or a trifluoromethyl group) under basic conditions. In particular, the synthesis may be performed in accordance with synthesis examples and the like in JP-A-2006-330098.

The molecular weight of the compound (C) is preferably from 500 to 1,000.

The actinic ray-sensitive or radiation-sensitive resin composition for use in the present invention may or may not contain the compound (C), but in the case of containing the compound (C), the content thereof is preferably from 0.1 to 20 mass %, more preferably from 0.1 to 10 mass %, based on the solid content of the actinic ray-sensitive or radiation-sensitive resin composition.

[4-2] Basic Compound (C')

The actinic ray-sensitive or radiation-sensitive resin composition for use in the present invention may contain a basic compound (C') so as to reduce the change in performance with aging from exposure to heating.

Preferred basic compounds include compounds having a structure represented by the following formulae (A) to (E):

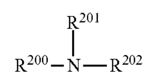

(A)

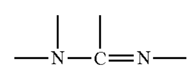

(B)

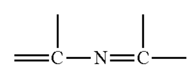

(C)

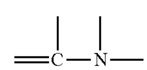

(D)

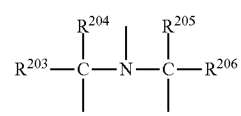

(E)

In formulae (A) to (E), each of $R^{200}$, $R^{201}$ and $R^{202}$, which may be the same or different, represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine together to form a ring. Each of $R^{203}$, $R^{204}$, $R^{205}$ and $R^{206}$, which may be the same or different, represents an alkyl group having a carbon number of 1 to 20.

As for the alkyl group, the alkyl group having a substituent is preferably an aminoalkyl group having a carbon number of 1 to 20, a hydroxyalkyl group having a carbon number of 1 to 20 or a cyanoalkyl group having a carbon number of 1 to 20.

The alkyl group in formulae (A) to (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2] octane, 1,5-diazabicyclo[4,3,0] non-5-ene and 1,8-diazabicyclo[5,4,0]undec-7-ene. Examples of the compound having an onium hydroxide structure include a triarylsulfonium hydroxide, a phenacylsulfonium hydroxide and a sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. The compound having an onium carboxylate structure is a compound where the anion moiety of the compound having an onium hydroxide structure becomes a carboxylate, and examples thereof include an acetate, an adamantane-1-carboxylate and a perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline and N,N-dihexylaniline. Examples of the alkylamine derivative having a hydroxyl group and/or an ether bond include ethanolamine, diethanolamine, triethanolamine and tris(methoxyethoxyethyl)amine. Examples of the aniline derivative having a hydroxyl group and/or an ether bond include N,N-bis(hydroxyethyl)aniline.

Other preferred basic compounds include a phenoxy group-containing amine compound, a phenoxy group-containing ammonium salt compound, a sulfonic acid ester group-containing amine compound and a sulfonic acid ester group-containing ammonium salt compound.

In the phenoxy group-containing amine compound, phenoxy group-containing ammonium salt compound, sulfonic acid ester group-containing amine compound and sulfonic acid ester group-containing ammonium salt compound, at least one alkyl group is preferably bonded to the nitrogen atom and also, the alkyl chain preferably contains an oxygen atom therein to form an oxyalkylene group. The number of oxyalkylene groups in the molecule is 1 or more, preferably from 3 to 9, more preferably from 4 to 6. Among oxyalkylene groups, those having a structure of $—CH_2CH_2O—$, $—CH(CH_3)CH_2O—$ or $—CH_2CH_2CH_2O—$ are preferred.

Specific examples of the phenoxy group-containing amine compound, phenoxy group-containing ammonium salt compound, sulfonic acid ester group-containing amine compound and sulfonic acid ester group-containing ammonium salt compound include, but are not limited to, Compounds (C1-1) to (C3-3) illustrated in paragraph [0066] of U.S. Patent Application Publication 2007/0224539.

A nitrogen-containing organic compound having a group capable of leaving by the action of an acid may also be used as a kind of the basic compound. Examples of this compound include a compound represented by the following formula (F). Incidentally, the compound represented by the following formula (F) exhibits an effective basicity in the system as a result of elimination of the group capable of leaving by the action of an acid.

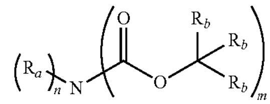

(F)

In formula (F), each Ra independently represents a hydrogen atom, an alkyl group, a cycloalkyl group, an aryl group or an aralkyl group. Also, when n=2, two Ra may be the same or different, and two Ra may combine with each other to form a divalent heterocyclic hydrocarbon group (preferably having a carbon number of 20 or less) or a derivative thereof.

Each Rb independently represents a hydrogen atom, an alkyl group, a cycloalkyl group, an aryl group or an aralkyl group, provided that in —C(Rb)(Rb)(Rb), when one or more Rb are a hydrogen atom, at least one of remaining Rb is a cyclopropyl group or a 1-alkoxyalkyl group.

At least two Rb may combine to form an alicyclic hydrocarbon group, an aromatic hydrocarbon group, a heterocyclic hydrocarbon group or a derivative thereof.

n represents an integer of 0 to 2, m represents an integer of 1 to 3, and n+m=3.

In formula (F), each of the alkyl group, cycloalkyl group, aryl group and aralkyl group represented by Ra and Rb may be substituted with a functional group such as hydroxyl group, cyano group, amino group, pyrrolidino group, piperidino group, morpholino group and oxo group, an alkoxy group, or a halogen atom.

Examples of the alkyl group, cycloalkyl group, aryl group and aralkyl group (each of these alkyl, cycloalkyl, aryl and aralkyl groups may be substituted with the above-described functional group, an alkoxy group or a halogen atom) of R include:

a group derived from a linear or branched alkane such as methane, ethane, propane, butane, pentane, hexane, heptane, octane, nonane, decane, undecane and dodecane, or a group where the group derived from such an alkane is substituted with one or more kinds of or one or more groups of cycloalkyl groups such as cyclobutyl group, cyclopentyl group and cyclohexyl group;

a group derived from a cycloalkane such as cyclobutane, cyclopentane, cyclohexane, cycloheptane, cyclooctane, norbornane, adamantane and noradamantane, or a group where the group derived from such a cycloalkane is substituted with one or more kinds of or one or more groups of linear or branched alkyl groups such as methyl group, ethyl group, n-propyl group, i-propyl group, n-butyl group, 2-methylpropyl group, 1-methylpropyl group and tert-butyl group;

a group derived from an aromatic compound such as benzene, naphthalene and anthracene, or a group where the group derived from such an aromatic compound is substituted with one or more kinds of or one or more groups of linear or branched alkyl groups such as methyl group, ethyl group, n-propyl group, i-propyl group, n-butyl group, 2-methylpropyl group, 1-methylpropyl group and tert-butyl group;

a group derived from a heterocyclic compound such as pyrrolidine, piperidine, morpholine, tetrahydrofuran, tetrahydropyran, indole, indoline, quinoline, perhydroquinoline, indazole and benzimidazole, or a group where the group derived from such a heterocyclic compound is substituted with one or more kinds of or one or more groups of linear or branched alkyl groups or aromatic compound-derived groups; a group where the group derived from a linear or branched alkane or the group derived from a cycloalkane is substituted with one or more kinds of or one or more groups of aromatic compound-derived groups such as phenyl group, naphthyl group and anthracenyl group; and a group where the substituent above is substituted with a functional group such as hydroxyl group, cyano group, amino group, pyrrolidino group, piperidino group, morpholino group and oxo group.

Examples of the divalent heterocyclic hydrocarbon group (preferably having a carbon number of 1 to 20) formed by combining Ra with each other or a derivative thereof include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0] dec-5-ene, indole, indoline, 1,2,3,4-tetrahydroquinoxaline, perhydroquinoline and 1,5,9-triazacyclododecane, and a group where the group derived from such a heterocyclic compound is substituted with one or more kinds of or one or more groups of linear or branched alkane-derived groups, cycloalkane-derived groups, aromatic compound-derived groups, heterocyclic compound-derived groups and functional groups such as hydroxyl group, cyano group, amino group, pyrrolidino group, piperidino group, morpholino group and oxo group.

Specific examples of compounds represented by formula (F) are shown below.

(D-1)

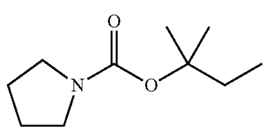

(D-2)

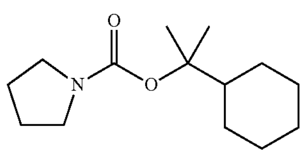

(D-3)

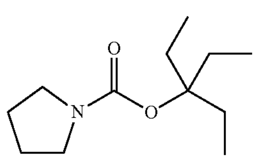

(D-4)

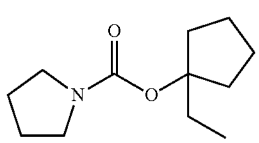

(D-5)

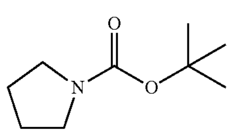

-continued (D-6)

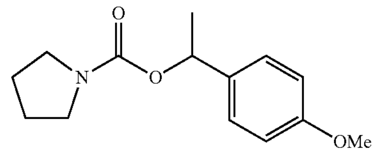

(D-7)

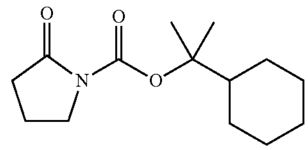

(D-8)

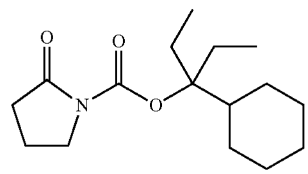

(D-9)

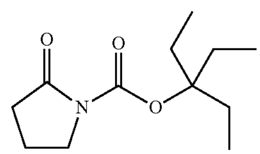

(D-10)

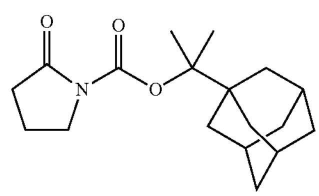

(D-11)

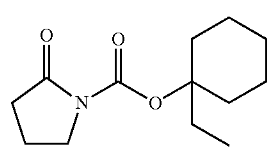

(D-12)

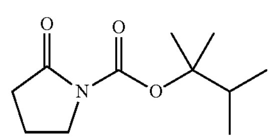

(D-13)

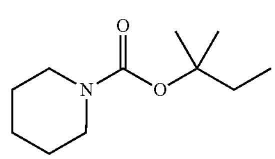

(D-14)

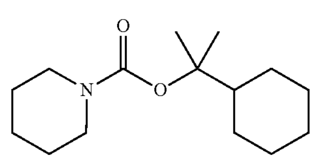

-continued
(D-15)
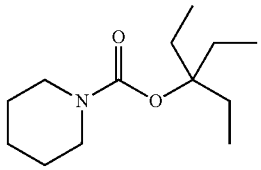
(D-16)
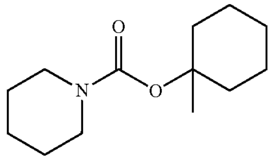
(D-17)
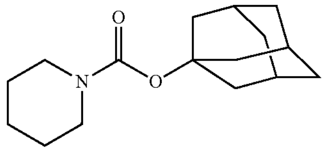
(D-18)
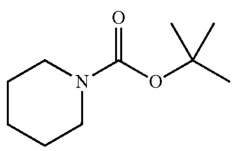
(D-19)
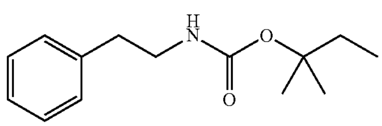
(D-20)
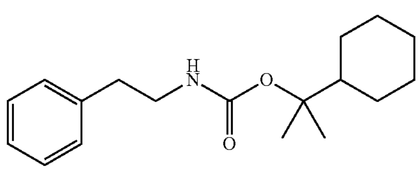
(D-21)
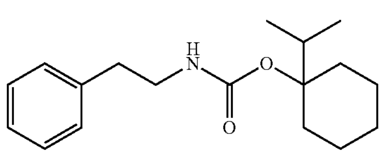
(D-22)
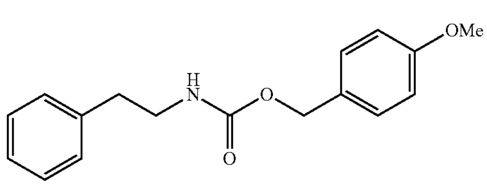
(D-23)
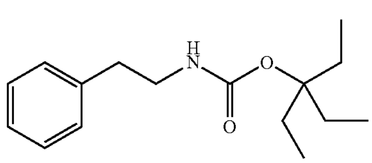
-continued
(D-24)
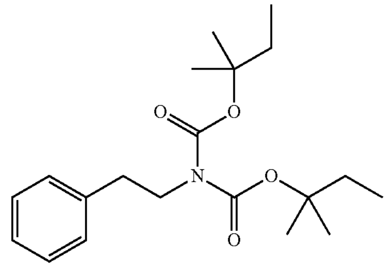
(D-25)
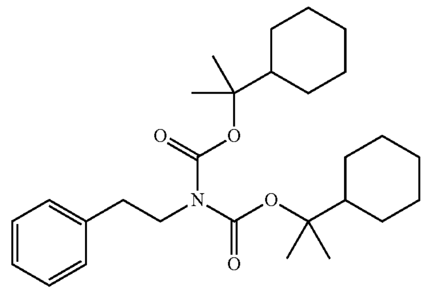
(D-26)
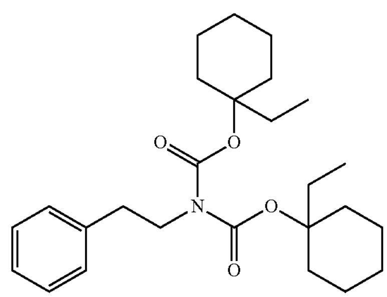
(D-27)
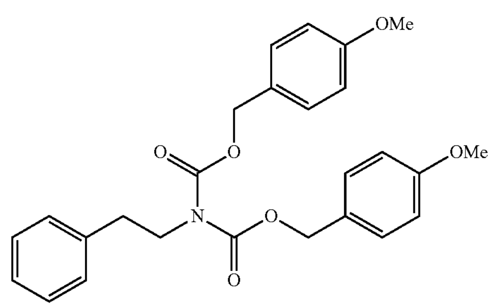
(D-28)
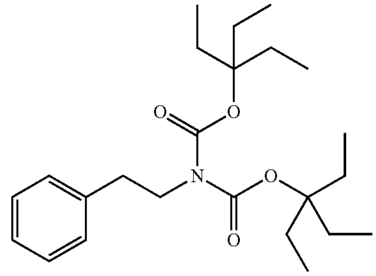

-continued
(D-29)
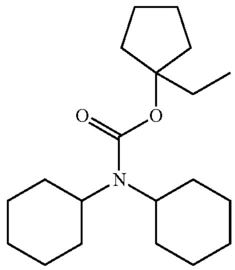
(D-30)
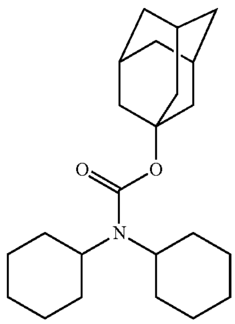
(D-31)
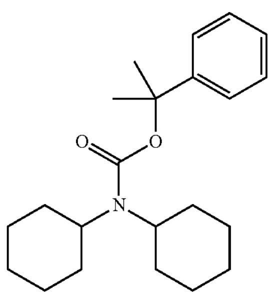
(D-32)
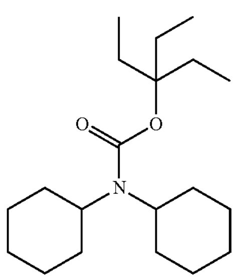
(D-33)
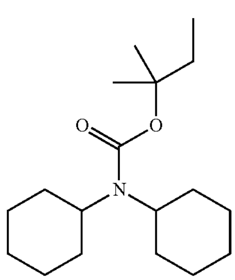
-continued
(D-34)
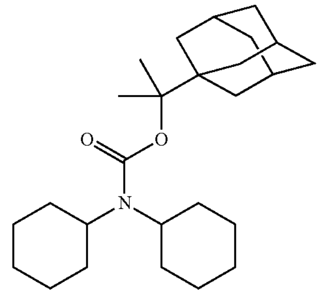
(D-35)
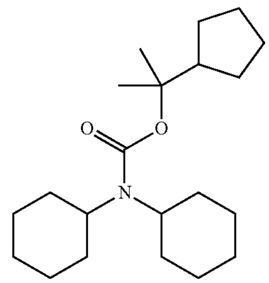
(D-36)
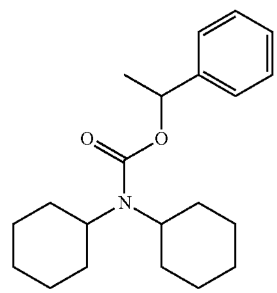
(D-37)
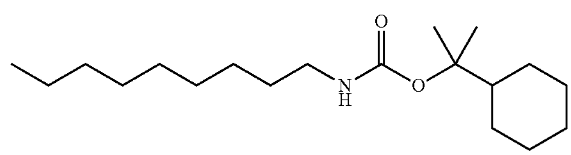
(D-38)
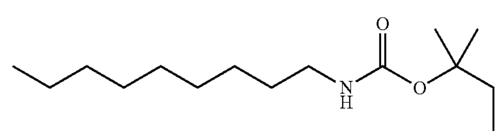
(D-39)
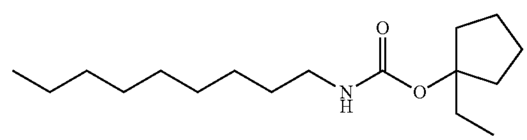
(D-40)
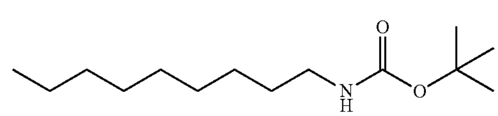

-continued
(D-41)
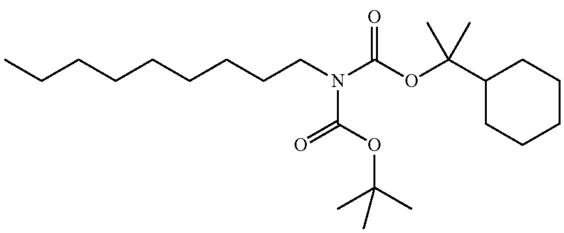
(D-42)
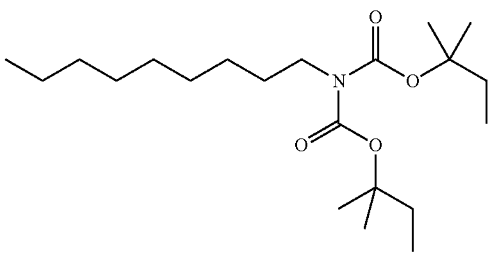
(D-43)
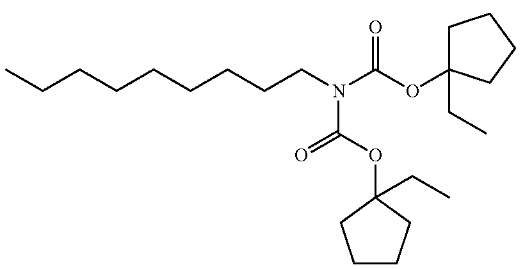
(D-44)
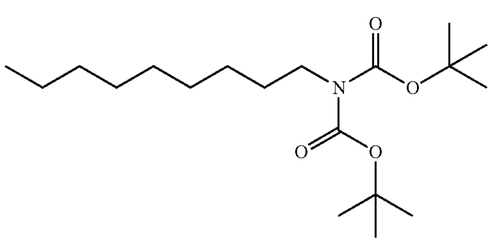
(D-45)
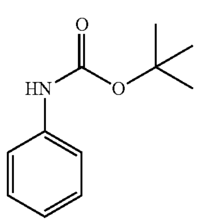
(D-46)
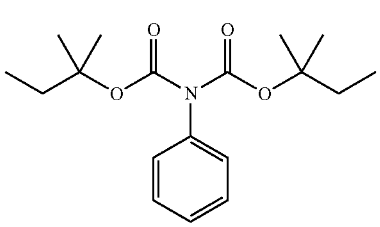
-continued
(D-47)
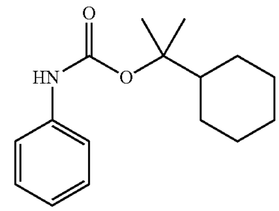
(D-48)
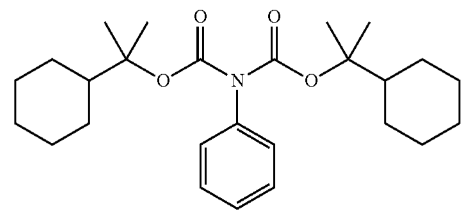
(D-49)
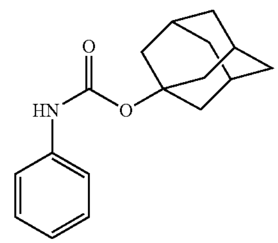
(D-50)
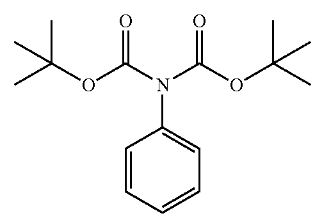
(D-51)
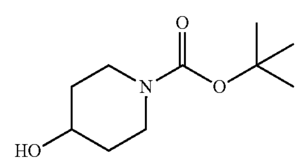
(D-52)
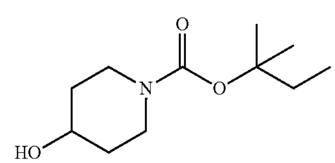
(D-53)
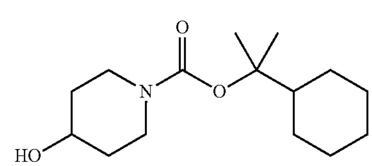
(D-54)
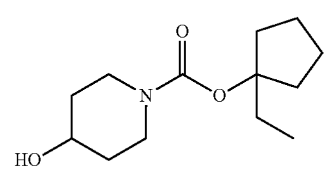

-continued (D-55)

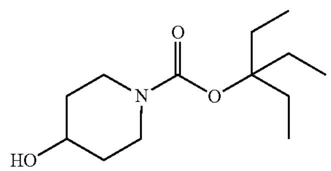

As for the compound represented by formula (F), a commercial product may be used, or the compound may be synthesized from a commercially available amine by the method described, for example, in Protective Groups in Organic Synthesis, 4th edition. The compound can be synthesized by the method described, for example, in JP-A-2009-199021, which is a most general method.

The molecular weight of the basic compound is preferably from 250 to 2,000, more preferably from 400 to 1,000. In view of more reduction of LWR and uniformity of local pattern dimension, the molecular weight of the basic compound is preferably 400 or more, more preferably 500 or more, still more preferably 600 or more.

Such a basic compound (C') may be used in combination with the compound (C), and one basic compound is used alone, or two or more kinds of basic compounds are used together.

The actinic ray-sensitive or radiation-sensitive resin composition for use in the present invention may or may not contain a basic compound, but in the case of containing a basic compound, the amount used thereof is usually from 0.001 to 10 mass %, preferably from 0.01 to 5 mass %, based on the solid content of the actinic ray-sensitive or radiation-sensitive resin composition.

The ratio between the acid generator and the basic compound used in the composition is preferably acid generator/basic compound (molar ratio)=from 2.5 to 300. That is, the molar ratio is preferably 2.5 or more in view of sensitivity and resolution and is preferably 300 or less from the standpoint of suppressing the reduction in resolution due to thickening of the resist pattern with aging after exposure until heat treatment. The acid generator/basic compound (molar ratio) is more preferably from 5.0 to 200, still more preferably from 7.0 to 150.

[5] Solvent (D)

Examples of the solvent which can be used at the time of preparing the actinic ray-sensitive or radiation-sensitive resin composition for use in the present invention include an organic solvent such as alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may have a ring, alkylene carbonate, alkyl alkoxyacetate and alkyl pyruvate.

Specific examples of these solvents include those described in paragraphs [0441] to [0455] of U.S. Patent Application Publication No. 2008/0187860.

In the present invention, a mixed solvent prepared by mixing a solvent containing a hydroxyl group in the structure and a solvent not containing a hydroxyl group may be used as the organic solvent.

The solvent containing a hydroxyl group and the solvent not containing a hydroxyl group may be appropriately selected from the compounds exemplified above, but the solvent containing a hydroxyl group is preferably an alkylene glycol monoalkyl ether, an alkyl lactate or the like, more preferably propylene glycol monomethyl ether (PGME, another name: 1-methoxy-2-propanol) or ethyl lactate. The solvent not containing a hydroxyl group is preferably an alkylene glycol monoalkyl ether acetate, an alkyl alkoxypropionate, a monoketone compound which may contain a ring, a cyclic lactone, an alkyl acetate or the like, more preferably propylene glycol monomethyl ether acetate (PGMEA, another name: 1-methoxy-2-acetoxypropane), ethyl ethoxypropionate, 2-heptanone, γ-butyrolactone, cyclohexanone or butyl acetate, and most preferably propylene glycol monomethyl ether acetate, ethyl ethoxypropionate or 2-heptanone.

The mixing ratio (by mass) of the solvent containing a hydroxyl group to the solvent not containing a hydroxyl group is from 1/99 to 99/1, preferably from 10/90 to 90/10, more preferably from 20/80 to 60/40. A mixed solvent in which the solvent not containing a hydroxyl group is contained in a ratio of 50 mass % or more is particularly preferred in view of coating uniformity.

The solvent preferably contains propylene glycol monomethyl ether acetate and is preferably a solvent composed of propylene glycol monomethyl ether acetate alone or a mixed solvent of two or more kinds of solvents containing propylene glycol monomethyl acetate.

[6] Hydrophobic Resin (E)

The actinic ray-sensitive or radiation-sensitive resin composition of the present invention may contain a hydrophobic resin having at least either a fluorine atom or a silicon atom (hereinafter, sometimes referred to as a "hydrophobic resin (E)" or simply a "resin (E)") particularly when the composition is applied to immersion exposure. The hydrophobic resin (E) is unevenly distributed to the surface layer of the film, whereby when the immersion medium is water, the static/dynamic contact angle on the resist film surface for water as well as the followability of immersion liquid can be enhanced.

The hydrophobic resin (E) is preferably designed to, as described above, be unevenly distributed to the interface but unlike a surfactant, need not have necessarily a hydrophilic group in the molecule and may not contribute to uniform mixing of polar/nonpolar substances.

The hydrophobic resin (E) typically contains a fluorine atom and/or a silicon atom. The fluorine atom and/or silicon atom in the hydrophobic resin (E) may be contained in the main chain of the resin or may be contained in the side chain.

In the case where the hydrophobic resin (E) contains a fluorine atom, the resin preferably contains, as the fluorine atom-containing partial structure, a fluorine atom-containing alkyl group, a fluorine atom-containing cycloalkyl group or a fluorine atom-containing aryl group.

The fluorine atom-containing alkyl group (preferably having a carbon number of 1 to 10, more preferably a carbon number of 1 to 4) is a linear or branched alkyl group with at least one hydrogen atom being replaced by a fluorine atom and may further have a substituent other than fluorine atom.

The fluorine atom-containing cycloalkyl group is a monocyclic or polycyclic cycloalkyl group with at least one hydrogen atom being replaced by a fluorine atom and may further have a substituent other than fluorine atom.

The fluorine atom-containing aryl group is an aryl group such as phenyl group and naphthyl group, with at least one hydrogen atom being replaced by a fluorine atom, and may further have a substituent other than fluorine atom.

Preferred fluorine atom-containing alkyl group, fluorine atom-containing cycloalkyl group and fluorine atom-containing aryl group include groups represented by the following formulae (F2) to (F4), but the present invention is not limited thereto.

(F2)

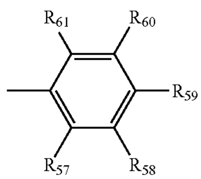

(F3)

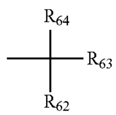

(F4)

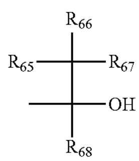

In formulae (F2) to (F4), each of $R_{57}$ to $R_{68}$ independently represents a hydrogen atom, a fluorine atom or an alkyl group (linear or branched), provided that at least one of $R_{57}$ to $R_{61}$, at least one of $R_{62}$ to $R_{64}$, and at least one of $R_{65}$ to $R_{68}$ each independently represents a fluorine atom or an alkyl group (preferably having a carbon number of 1 to 4) with at least one hydrogen atom being replaced by a fluorine atom.

It is preferred that all of $R_{57}$ to $R_{61}$ and $R_{65}$ to $R_{67}$ are a fluorine atom. Each of $R_{62}$, $R_{63}$ and $R_{68}$ is preferably an alkyl group (preferably having a carbon number of 1 to 4) with at least one hydrogen atom being replaced by a fluorine atom, more preferably a perfluoroalkyl group having a carbon number of 1 to 4. $R_{62}$ and $R_{63}$ may combine with each other to form a ring.

Specific examples of the group represented by formula (F2) include p-fluorophenyl group, pentafluorophenyl group and 3,5-di(trifluoromethyl)phenyl group.

Specific examples of the group represented by formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-tert-butyl group, a perfluoroisopentyl group, a perfluorooctyl group, a perfluoro(trimethyl)hexyl group, a 2,2,3,3-tetrafluorocyclobutyl group and a perfluorocyclohexyl group. A hexafluoroisopropyl group, a heptafluoroisopropyl group, a hexafluoro(2-methyl)isopropyl group, an octafluoroisobutyl group, a nonafluoro-tert-butyl group and a perfluoroisopentyl group are preferred, and a hexafluoroisopropyl group and a heptafluoroisopropyl group are more preferred.

Specific examples of the group represented by formula (F4) include —$C(CF_3)_2OH$, —$C(C_2F_5)_2OH$, —$C(CF_3)(CH_3)OH$ and —$CH(CF_3)OH$, with —$C(CF_3)_2OH$ being preferred.

The fluorine atom-containing partial structure may be bonded directly to the main chain or may be bonded to the main chain through a group selected from the group consisting of an alkylene group, a phenylene group, an ether bond, a thioether bond, a carbonyl group, an ester bond, an amide bond, a urethane bond and a ureylene bond, or a group formed by combining two or more of these groups and bonds.

Suitable repeating units having a fluorine atom include the followings.

(C-Ia)

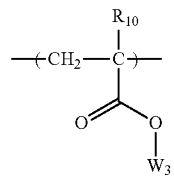

(C-Ib)

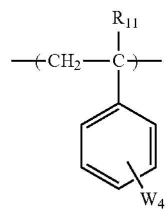

(C-Ic)

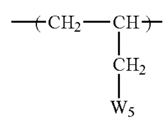

(C-Id)

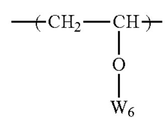

In the formulae, each of $R_{10}$ and $R_{11}$ independently represents a hydrogen atom, a fluorine atom or an alkyl group. The alkyl group is preferably a linear or branched alkyl group having a carbon number of 1 to 4 and may have a substituent, and the alkyl group having a substituent includes, in particular, a fluorinated alkyl group.

Each of $W_3$ to $W_6$ independently represents an organic group having at least one or more fluorine atoms. Specific examples thereof include the atomic groups of (F2) to (F4).

Other than these, the hydrophobic resin (E) may contain a unit shown below as the repeating unit having a fluorine atom.

(C-II)

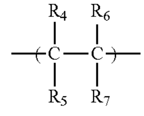

(C-III)

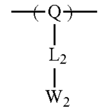

In the formulae, each of $R_4$ to $R_7$ independently represents a hydrogen atom, a fluorine atom or an alkyl group. The alkyl group is preferably a linear or branched alkyl group having a carbon number of 1 to 4 and may have a substituent, and the alkyl group having a substituent includes, in particular, a fluorinated alkyl group.

However, at least one of $R_4$ to $R_7$ represents a fluorine atom. $R_4$ and $R_5$, or $R_6$ and $R_7$ may form a ring.

$W_2$ represents an organic group having at least one fluorine atom. Specific examples thereof includes the atomic groups of (F2) to (F4).

$L_2$ represents a single bond or a divalent linking group. The divalent linking group is a substituted or unsubstituted arylene group, a substituted or unsubstituted alkylene group, a substituted or unsubstituted cycloalkylene group, —O—, —$SO_2$—, —CO—, —N(R)— (wherein R represents a hydrogen atom or an alkyl group), —$NHSO_2$—, or a divalent linking group formed by combining a plurality of these groups.

Q represents an alicyclic structure. The alicyclic structure may have a substituent and may be monocyclic or polycyclic, and in the case of a polycyclic structure, the structure may be a crosslinked structure. The monocyclic structure is preferably a cycloalkyl group having a carbon number of 3 to 8, and examples thereof include a cyclopentyl group, a cyclohexyl group, a cyclobutyl group and a cyclooctyl group. Examples of the polycyclic structure include a group having a bicyclo, tricyclo or tetracyclo structure with a carbon number of 5 or more. A cycloalkyl group having a carbon number of 6 to 20 is preferred, and examples thereof include an adamantyl group, a norbornyl group, a dicyclopentyl group, a tricyclodecanyl group and a tetracyclododecyl group. A part of the carbon atom in the cycloalkyl group may be substituted with a heteroatom such as oxygen atom. Above all, Q is preferably, for example, a norbornyl group, a tricyclodecanyl group or a tetracyclododecyl group.

Specific examples of the repeating unit having a fluorine atom are illustrated below, but the present invention is not limited thereto.

In specific examples, $X_1$ represents a hydrogen atom, —$CH_3$, —F or —$CF_3$, $X_2$ represents —F or —$CF_3$.

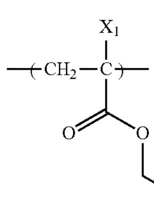
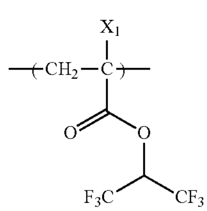
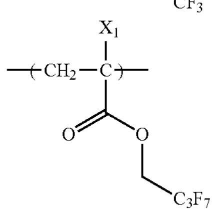
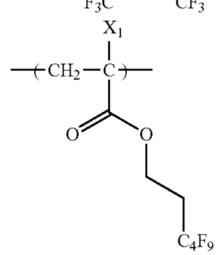
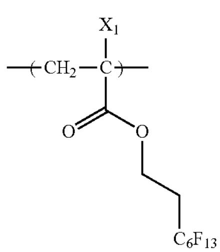
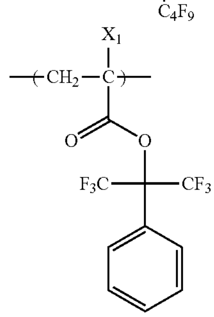

-continued

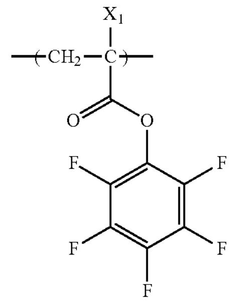
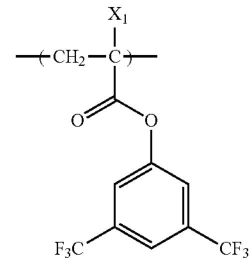
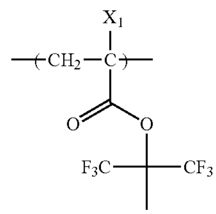
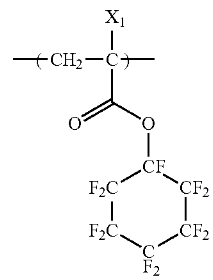
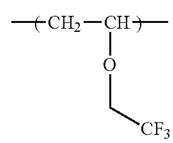
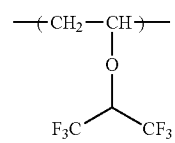
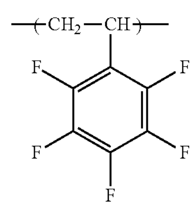
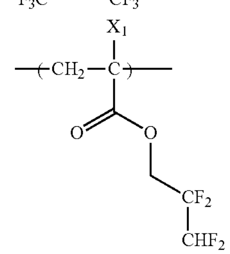
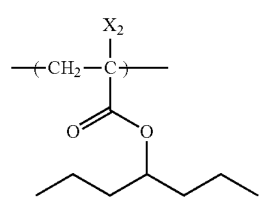
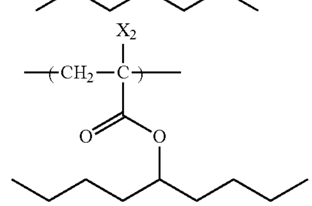
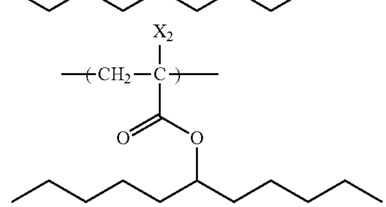
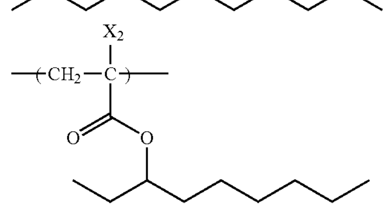

-continued

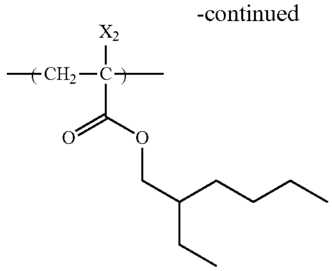

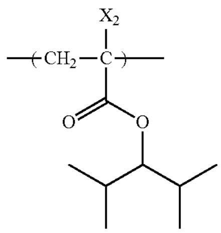

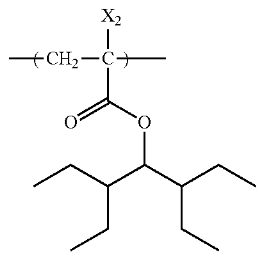

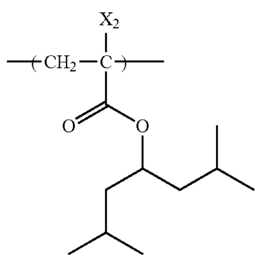

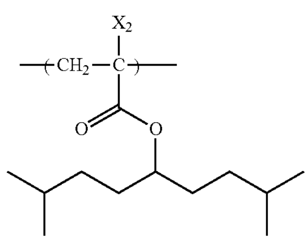

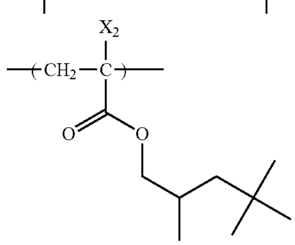

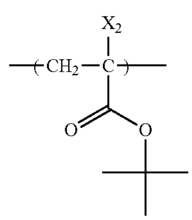

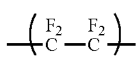

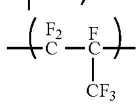

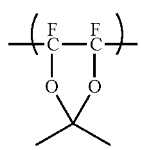

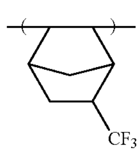

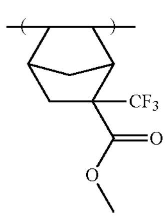

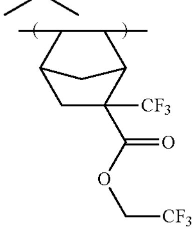

-continued

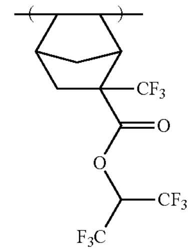

The hydrophobic resin (E) may contain a silicon atom. The resin preferably has, as the silicon atom-containing partial structure, an alkylsilyl structure (preferably a trialkylsilyl group) or a cyclic siloxane structure.

Specific examples of the alkylsilyl structure and cyclic siloxane structure include groups represented by the following formulae (CS-1) to (CS-3):

(CS-1)

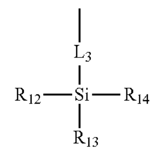

(CS-2)

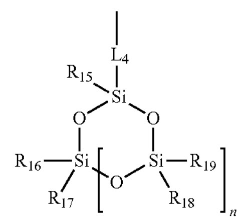

(CS-3)

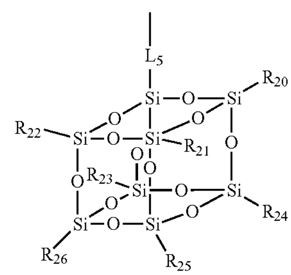

In formulae (CS-1) to (CS-3), each of $R_{12}$ to $R_{26}$ independently represents a linear or branched alkyl group (preferably having a carbon number of 1 to 20) or a cycloalkyl group (preferably having a carbon number of 3 to 20).

Each of $L_3$ to $L_5$ represents a single bond or a divalent linking group. The divalent linking group is a sole member or a combination of two or more members (preferably having a total carbon number of 12 or less), selected from the group consisting of an alkylene group, a phenylene group, an ether bond, a thioether bond, a carbonyl group, an ester bond, an amide bond, a urethane bond and a urea bond.

n represents an integer of 1 to 5. n is preferably an integer of 2 to 4.

Specific examples of the repeating unit having a group represented by formulae (CS-1) to (CS-3) are illustrated below, but the present invention is not limited thereto. In specific examples, $X_1$ represents a hydrogen atom, —$CH_3$, —F or —$CF_3$.

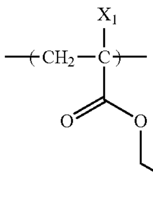
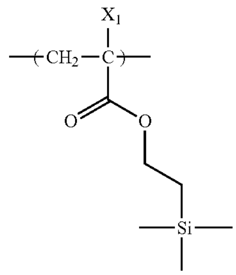
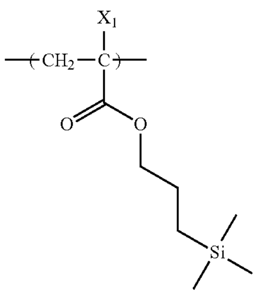
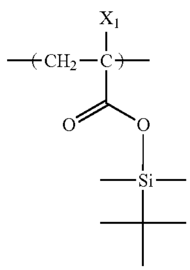
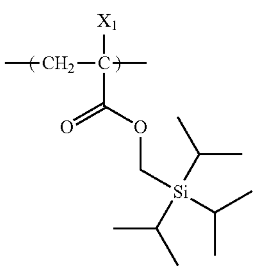
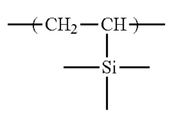
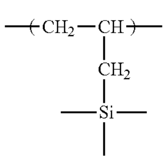
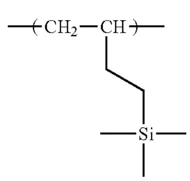
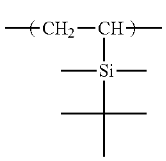
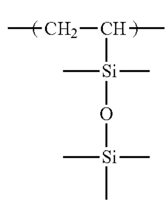
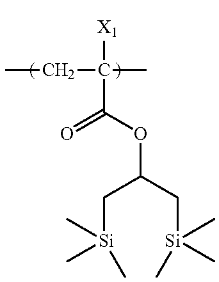
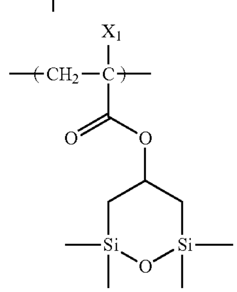
-continued
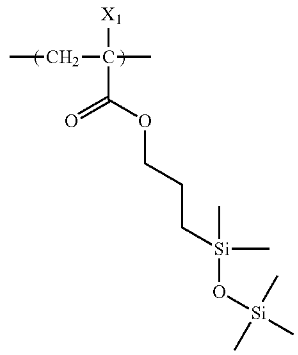
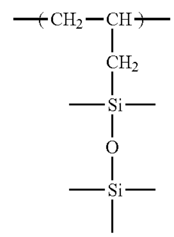
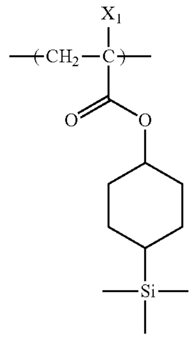
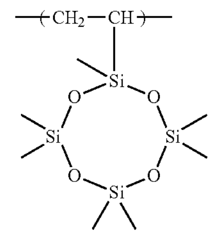
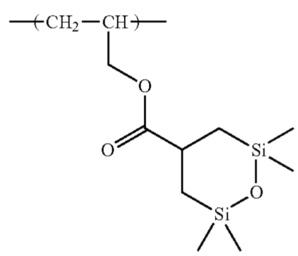
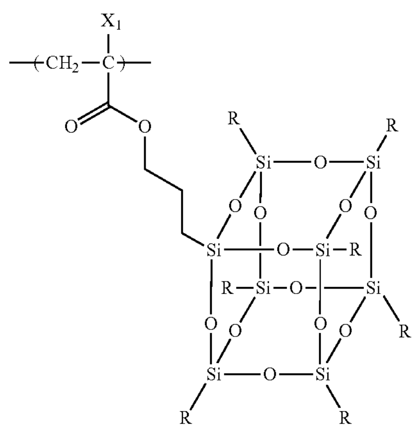
$R = CH_3, C_2H_5, C_3H_7, C_4H_9$
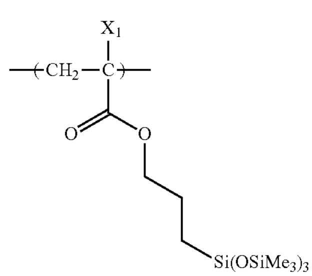

Furthermore, the hydrophobic resin (E) may contain at least one group selected from the group consisting of the following (x) to (z):

(x) an acid group, (y) a lactone structure-containing group, an acid anhydride group or an acid imide group, and (z) a group capable of decomposing by the action of an acid.

Examples of the acid group (x) include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

Preferred acid groups are a fluorinated alcohol group (preferably hexafluoroisopropanol), a sulfonimide group and a bis(alkylcarbonyl)methylene group.

The repeating unit having (x) an acid group includes, for example, a repeating unit where the acid group is directly bonded to the main chain of the resin, such as repeating unit by an acrylic acid or a methacrylic acid, and a repeating unit where the acid group is bonded to the main chain of the resin through a linking group, and the acid group may be also introduced into the terminal of the polymer chain by using an acid group-containing polymerization initiator or chain transfer agent at the polymerization. All of these cases are preferred. The repeating unit having (x) an acid group may have at least either a fluorine atom or a silicon atom.

The content of the repeating unit having (x) an acid group is preferably from 1 to 50 mol %, more preferably from 3 to 35 mol %, still more preferably from 5 to 20 mol %, based on all repeating units in the hydrophobic resin (E).

Specific examples of the repeating unit having (x) an acid group are illustrated below, but the present invention is not limited thereto. In the formulae, Rx represents hydrogen atom, $CH_3$, $CF_3$ or $CH_2OH$.

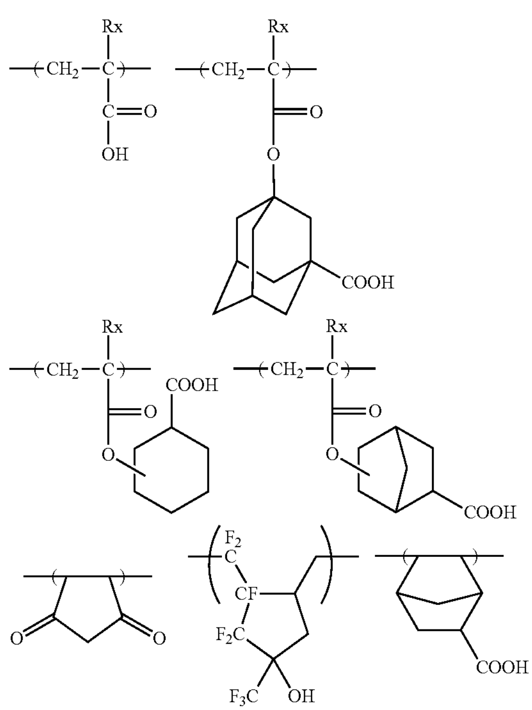

-continued

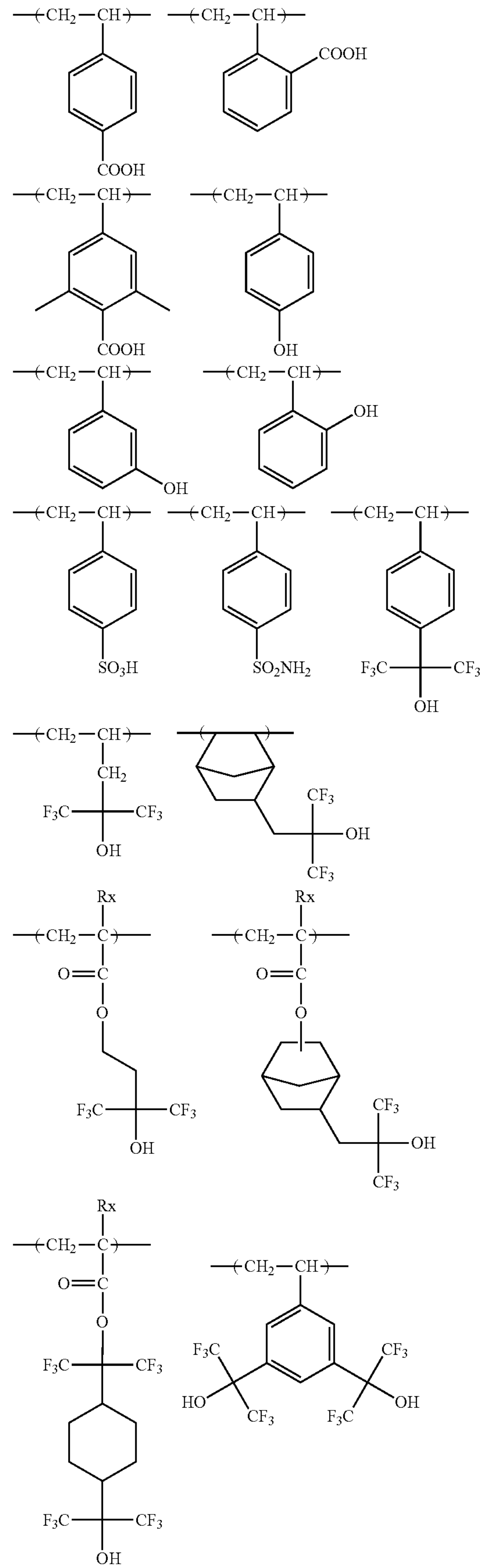

-continued

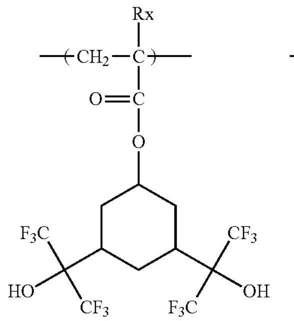

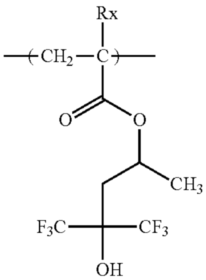

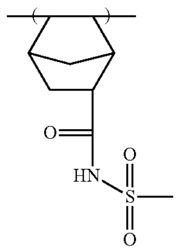

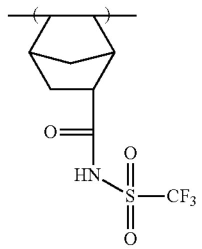

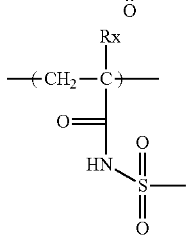

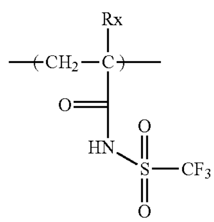

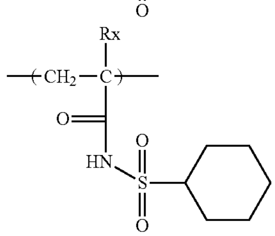

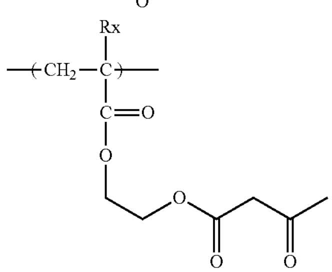

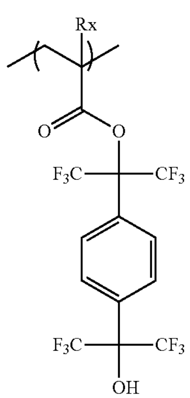

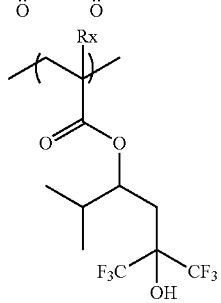

-continued

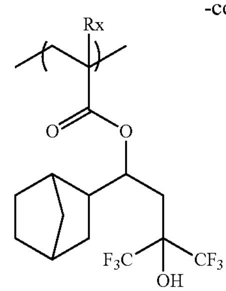

The (y) lactone structure-containing group, acid anhydride group or acid imide group is preferably a lactone structure-containing group.

The repeating unit containing such a group is, for example, a repeating unit where the group is directly bonded to the main chain of the resin, such as repeating unit by an acrylic acid or a methacrylic acid. This repeating unit may be a repeating unit where the group is bonded to the main chain of the resin through a linking group. Alternatively, in this repeating unit, the group may be introduced into the terminal of the resin by using a polymerization initiator or chain transfer agent containing the group at the polymerization.

Examples of the repeating unit having a lactone structure-containing group are the same as those of the repeating unit having a lactone structure described above in the paragraph of acid-decomposable resin (A).

The content of the repeating unit having a lactone structure-containing group, an acid anhydride group or an acid imide group is preferably from 1 to 100 mol %, more preferably from 3 to 98 mol %, still more preferably from 5 to 95 mol %, based on all repeating units in the hydrophobic resin Examples of the repeating unit having (z) a group capable of decomposing by the action of an acid, contained in the hydrophobic resin (E), are the same as those of the repeating unit having an acid-decomposable group described for the resin (A). The repeating unit having (z) a group capable of decomposing by the action of an acid may contain at least either a fluorine atom or a silicon atom. In the hydrophobic resin (E), the content of the repeating unit having (z) a group capable of decomposing by the action of an acid is preferably from 1 to 80 mol %, more preferably from 10 to 80 mol %, still more preferably from 20 to 60 mol %, based on all repeating units in the resin (E).

The hydrophobic resin (E) may further contain a repeating unit represented by the following formula (CIII):

(CIII)

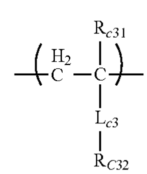

In formula (CIII), $R_{c31}$ represents a hydrogen atom, an alkyl group (which may be substituted with a fluorine atom or the like), a cyano group or a —$CH_2$—O—$R_{ac2}$ group, wherein $R_{ac2}$ represents a hydrogen atom, an alkyl group or an acyl group. $R_{c31}$ is preferably a hydrogen atom, a methyl group, a hydroxymethyl group or a trifluoromethyl group, more preferably a hydrogen atom or a methyl group.

$R_{c32}$ represents a group having an alkyl group, a cycloalkyl group, an alkenyl group, a cycloalkenyl group or an aryl group. These groups may be substituted with a fluorine atom or a silicon atom-containing group.

$L_{c3}$ represents a single bond or a divalent linking group.

In formula (CIII), the alkyl group of $R_{c32}$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The aryl group is preferably an aryl group having a carbon number of 6 to 20, more preferably a phenyl group or a naphthyl group, and these groups may have a substituent.

$R_{c32}$ is preferably an unsubstituted alkyl group or a fluorine atom-substituted alkyl group.

The divalent linking group of $L_{c3}$ is preferably an alkylene group (preferably having a carbon number of 1 to 5), an ether bond, a phenylene group or an ester bond (a group represented by —COO—).

The content of the repeating unit represented by formula (CIII) is preferably from 1 to 100 mol %, more preferably from 10 to 90 mol %, still more preferably from 30 to 70 mol %, based on all repeating units in the hydrophobic resin.

The hydrophobic resin (E) may further contain a repeating unit represented by the following formula (CII-AB):

(CII-AB)

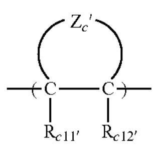

In formula (CII-AB), each of $R_{c11}'$ and $R_{c12}'$ independently represents a hydrogen atom, a cyano group, a halogen atom or an alkyl group.

$Z_c'$ represents an atomic group for forming an alicyclic structure containing two carbon atoms (C—C) to which $Z_c'$ is bonded.

The content of the repeating unit represented by formula (CII-AB) is preferably from 1 to 100 mol %, more preferably from 10 to 90 mol %, still more preferably from 30 to 70 mol %, based on all repeating units in the hydrophobic resin.

Specific examples of the repeating units represented by formulae (III) and (CII-AB) are illustrated below, but the present invention is not limited thereto. In the formulae, Ra represents H, $CH_3$, $CH_2OH$, $CF_3$ or CN.

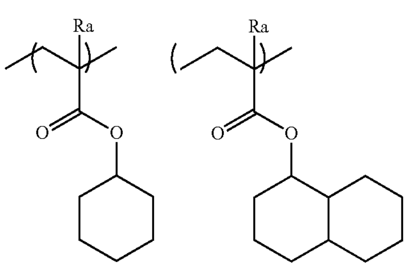

-continued

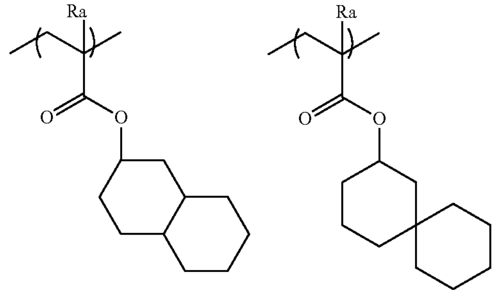

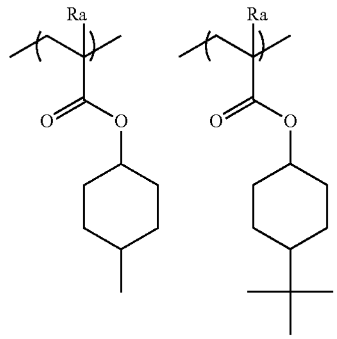

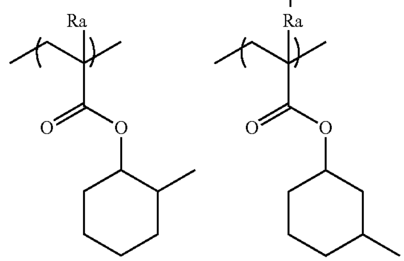

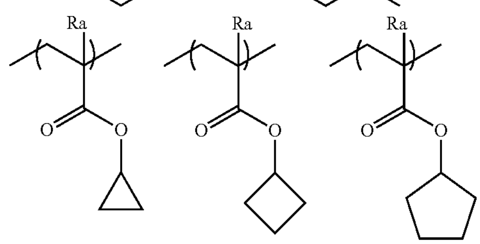

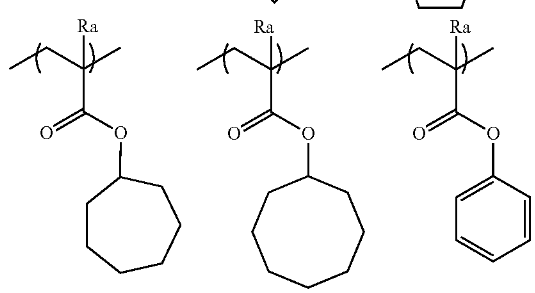

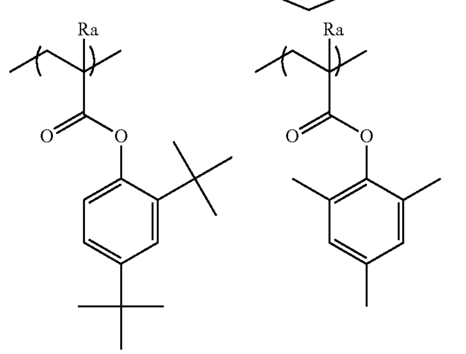

-continued

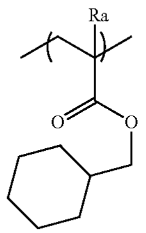
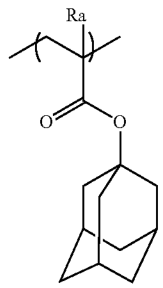
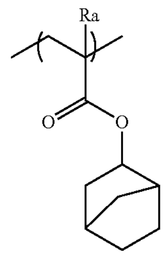
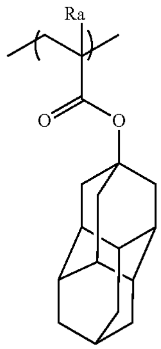
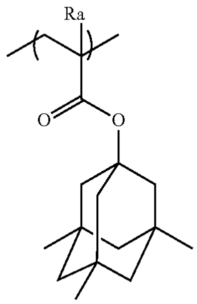
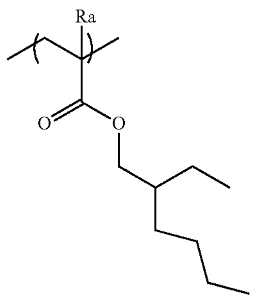
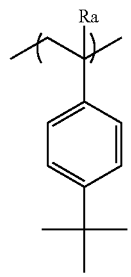
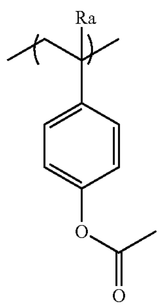
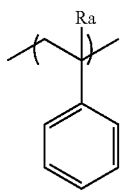
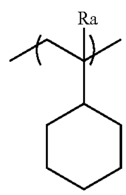
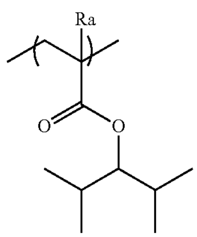
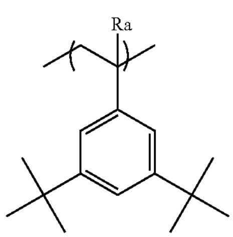
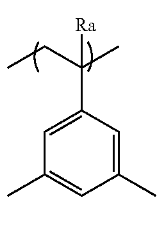
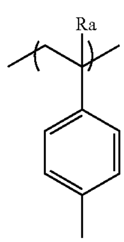
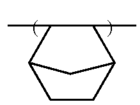

-continued

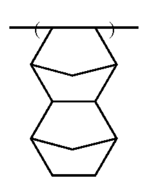
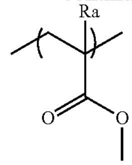
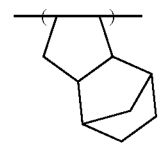

In the case where the hydrophobic resin (E) contains a fluorine atom, the fluorine atom content is preferably from 5 to 80 mass %, more preferably from 10 to 80 mass %, based on the weight average molecular weight of the hydrophobic resin (E). Also, the fluorine atom-containing repeating unit preferably accounts for 10 to 100 mol %, more preferably from 30 to 100 mol %, based on all repeating units contained in the hydrophobic resin (E).

In the case where the hydrophobic resin (E) contains a silicon atom, the silicon atom content is preferably from 2 to 50 mass %, more preferably from 2 to 30 mass %, based on the weight average molecular weight of the hydrophobic resin (E). Also, the silicon atom-containing repeating unit preferably accounts for 10 to 100 mol %, more preferably from 20 to 100 mol %, based on all repeating units contained in the hydrophobic resin (E).

The standard polystyrene-equivalent weight average molecular of the hydrophobic resin (E) is preferably from 1,000 to 100,000, more preferably from 1,000 to 50,000, still more preferably from 2,000 to 15,000.

As for the hydrophobic resin (E), one kind of a resin may be used, or a plurality of kinds of resins may be used in combination.

The content of the hydrophobic resin (E) in the composition is preferably from 0.01 to 10 mass %, more preferably from 0.05 to 8 mass %, still more preferably from 0.1 to 5 mass %, based on the entire solid content in the composition of the present invention.

In the hydrophobic resin (E), similarly to the resin (A), it is of course preferred that the content of impurities such as metal is small, but the content of residual monomers or oligomer components is also preferably from 0.01 to 5 mass %, more preferably from 0.01 to 3 mass %, still more preferably from 0.05 to 1 mass %. When these conditions are satisfied, an actinic ray-sensitive or radiation-sensitive resin composition free of in-liquid extraneous substances and change with aging of sensitivity and the like can be obtained. Furthermore, in view of resolution, resist profile, side wall of resist pattern, roughness and the like, the molecular weight distribution (Mw/Mn, sometimes referred to as "polydispersity") is preferably from 1 to 5, more preferably from 1 to 3, still more preferably from 1 to 2.

As for the hydrophobic resin (E), various commercially products may be used, or the resin may be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred.

The reaction solvent, the polymerization initiator, the reaction conditions (e.g., temperature, concentration) and the purification method after reaction are the same as those described for the resin (A), but in the synthesis of the hydrophobic resin (E), the reaction concentration is preferably from 30 to 50 mass %.

Specific examples of the hydrophobic resin (E) are illustrated below. Also, the molar ratio of repeating units (corresponding to repeating units starting from the left), weight average molecular weight and polydispersity of each resin are shown in the Tables later.
(HR-1)
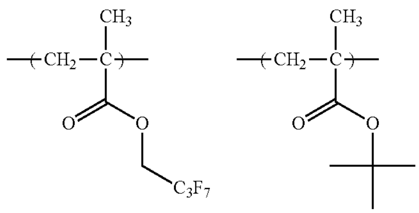
(HR-2)
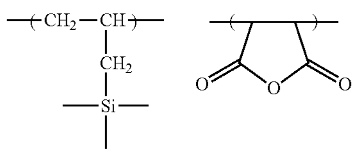
(HR-3)
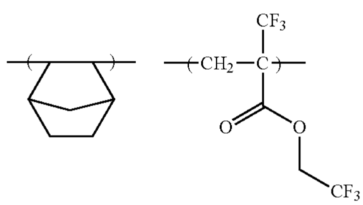
(HR-4)
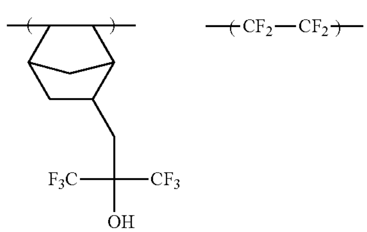
(HR-5)
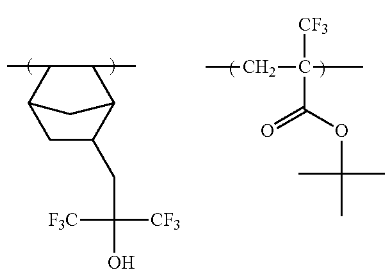
(HR-6)
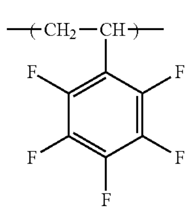
-continued
(HR-7)
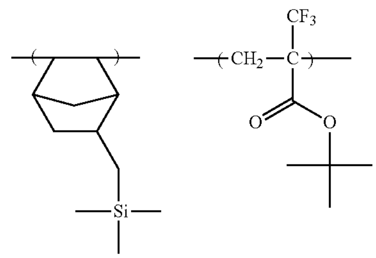
(HR-8)
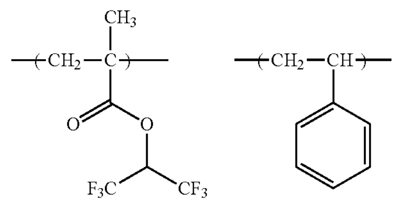
(HR-9)
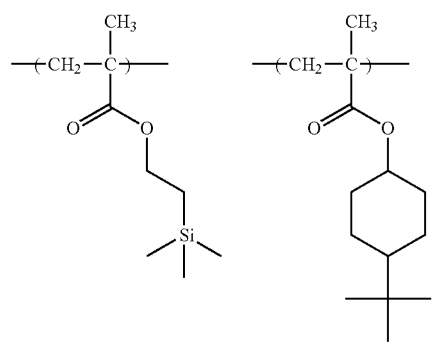
(HR-10)
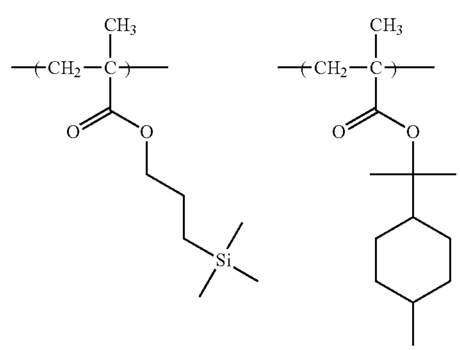
(HR-11)
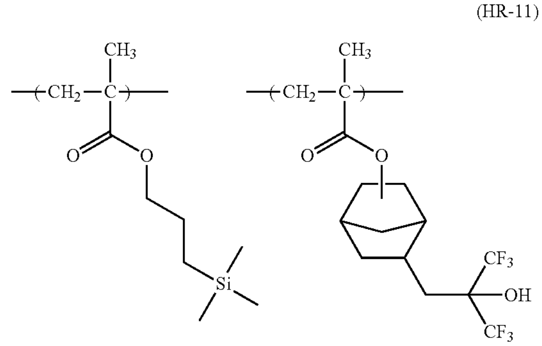

-continued
(HR-12)
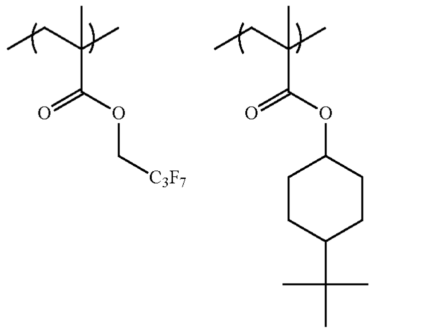
(HR-13)
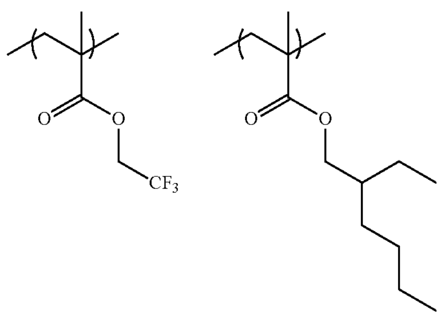
(HR-14)
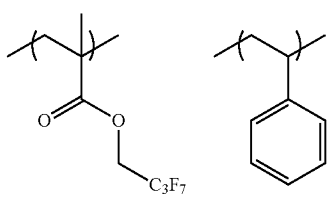
(HR-15)
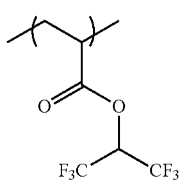
(HR-16)
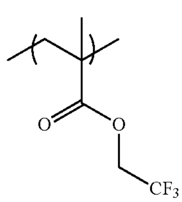
(HR-17)
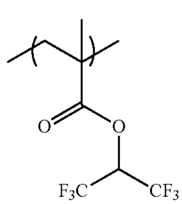
-continued
(HR-18)
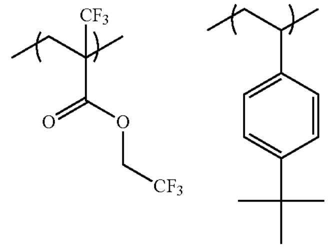
(HR-19)
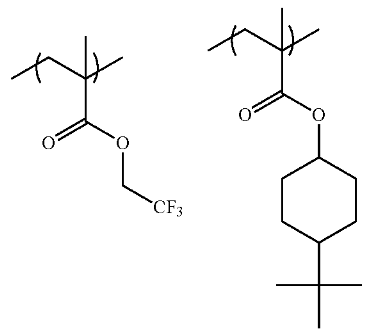
(HR-20)
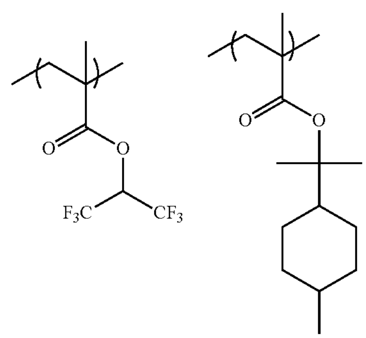
(HR-21)
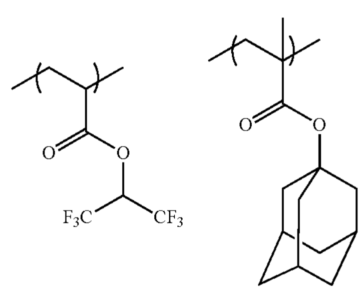
(HR-22)
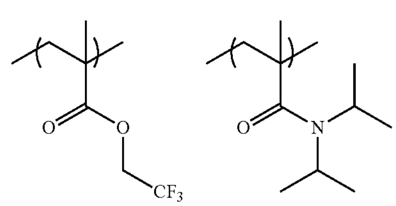

-continued
(HR-23)
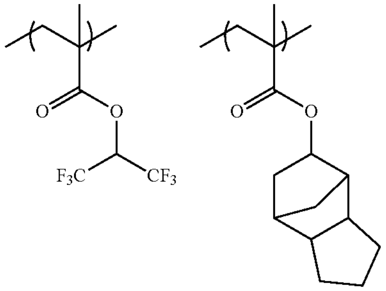
(HR-24)
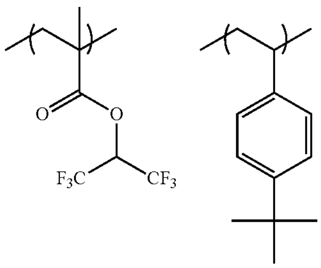
(HR-25)
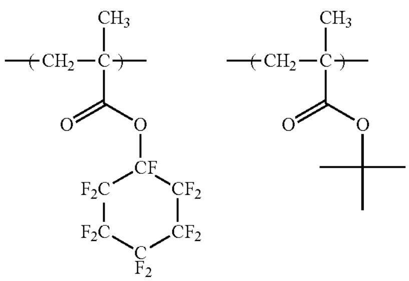
(HR-26)
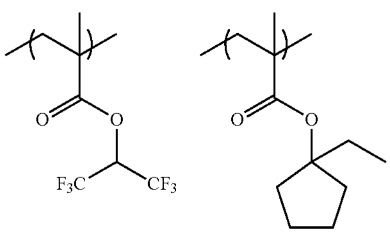
(HR-27)
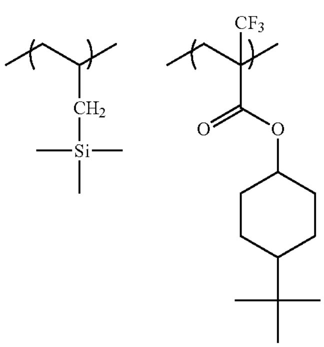
(HR-28)
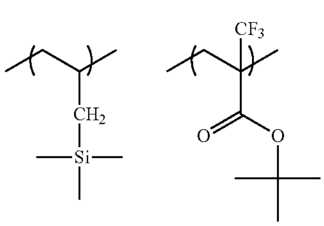
-continued
(HR-29)
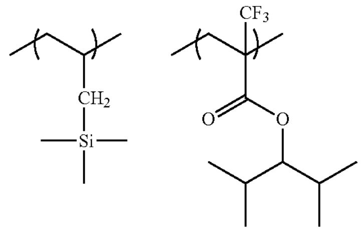
(HR-30)
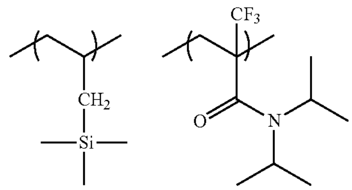
(HR-31)
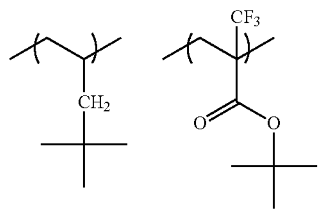
(HR-32)
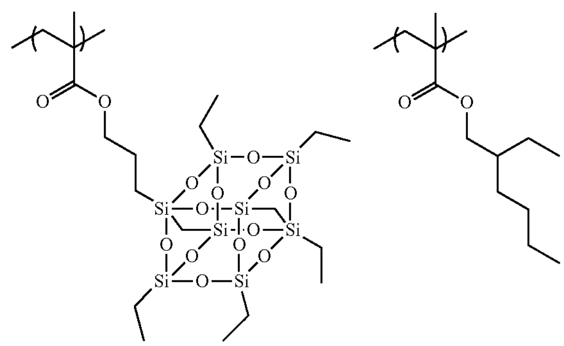
(HR-33)
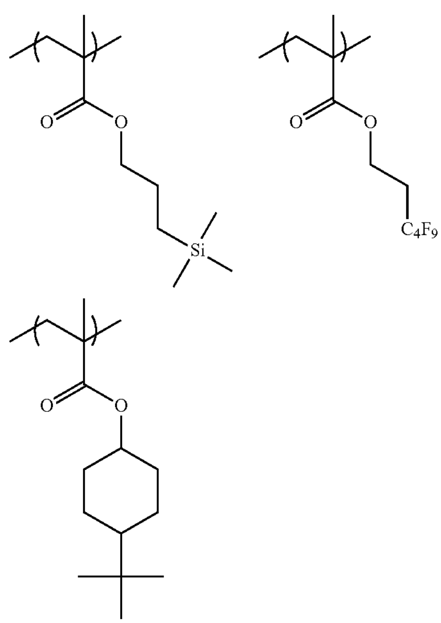

-continued
(HR-34)
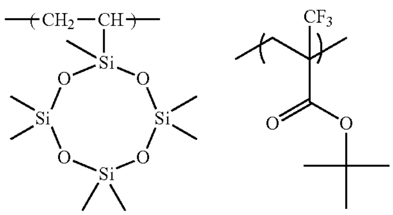
(HR-35)
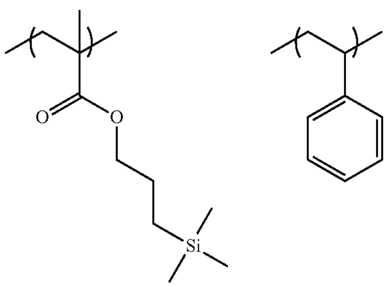
(HR-36)
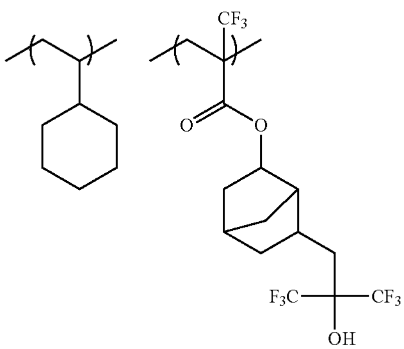
(HR-37)
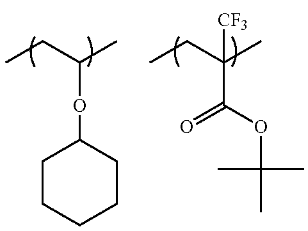
(HR-38)
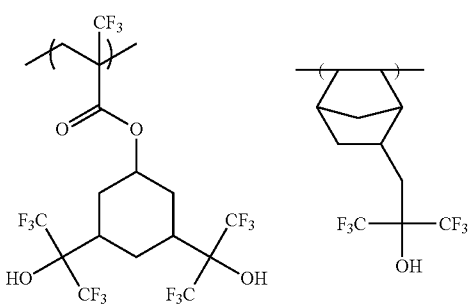
-continued
(HR-39)
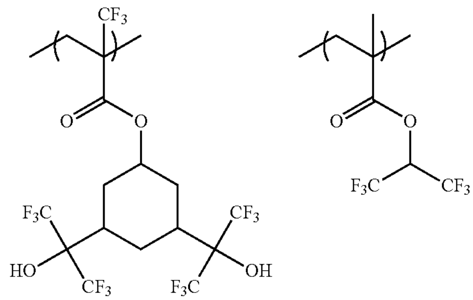
(HR-40)
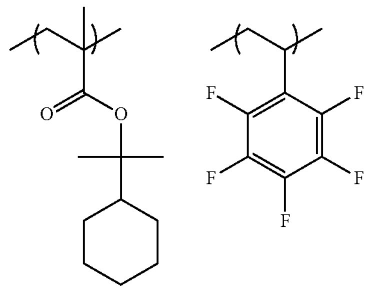
(HR-41)
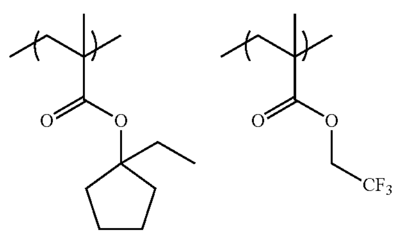
(HR-42)
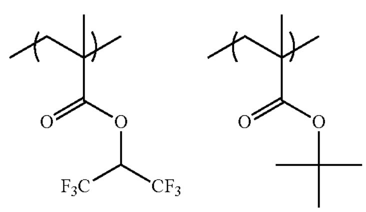
(HR-43)
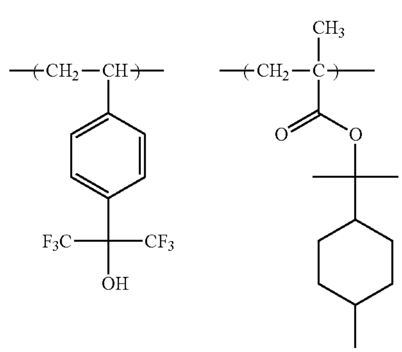

-continued
(HR-44)
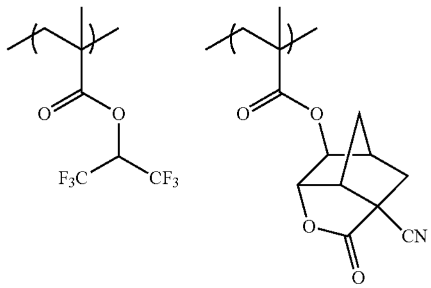
(HR-45)
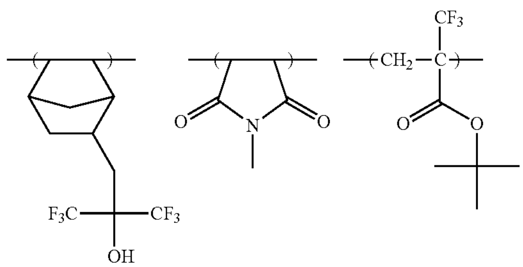
(HR-46)
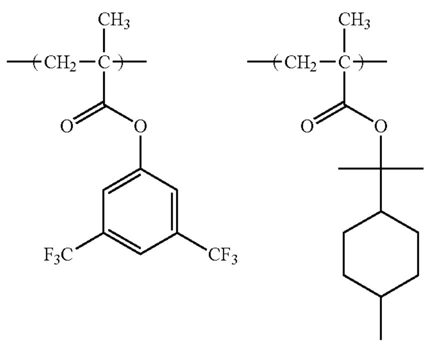
(HR-47)
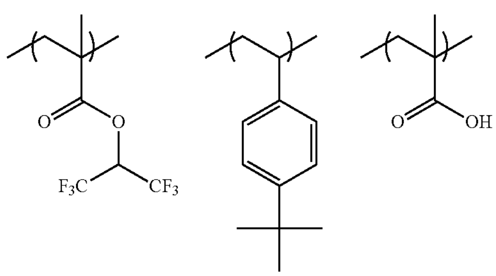
(HR-48)
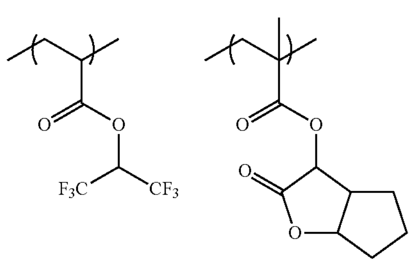
-continued
(HR-49)
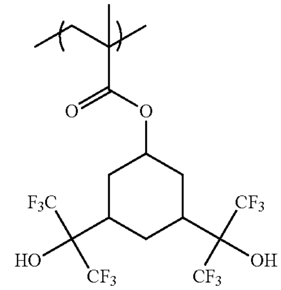
(HR-50)
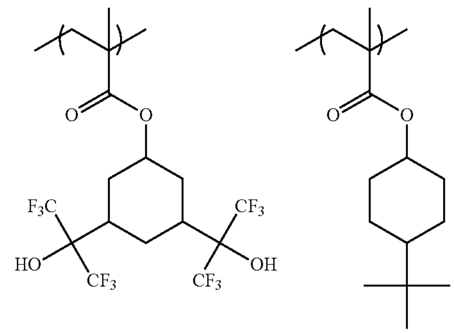
(HR-51)
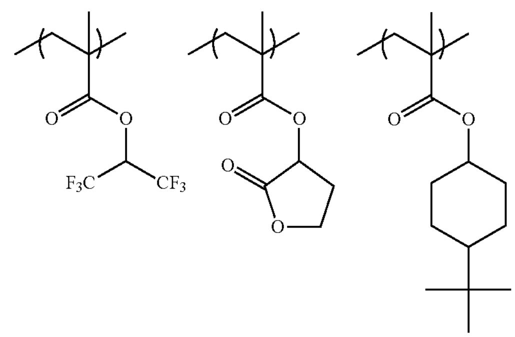
(HR-52)
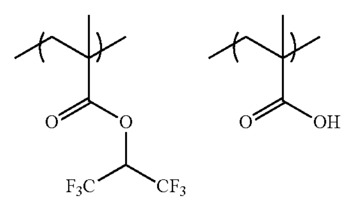
(HR-53)
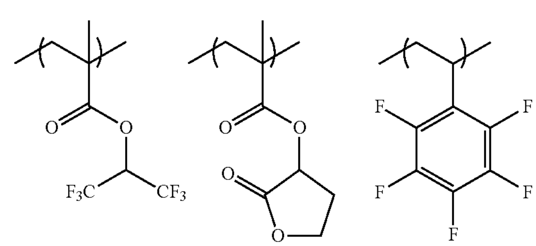

-continued
(HR-54)
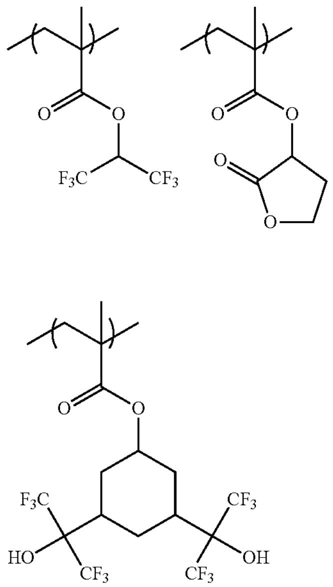
(HR-55)
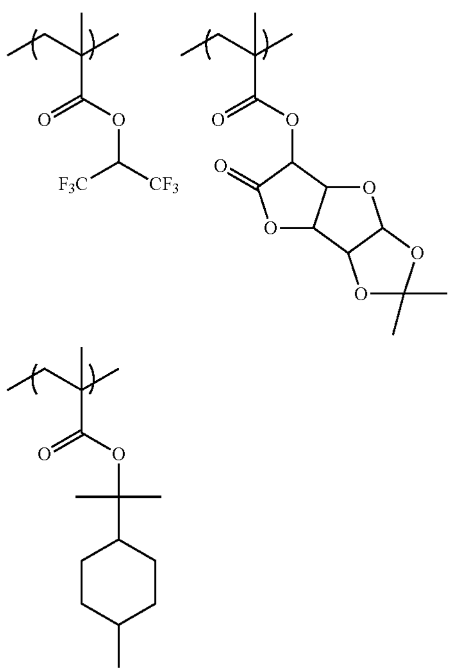
(HR-56)
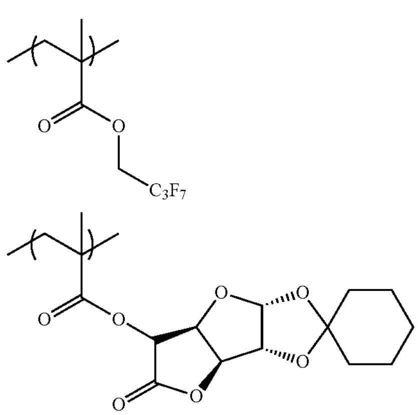
-continued
(HR-57)
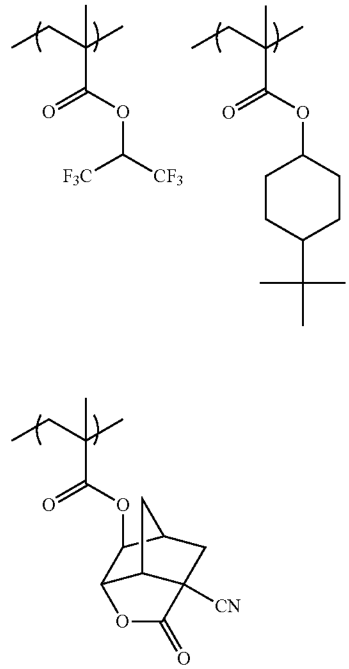
(HR-58)
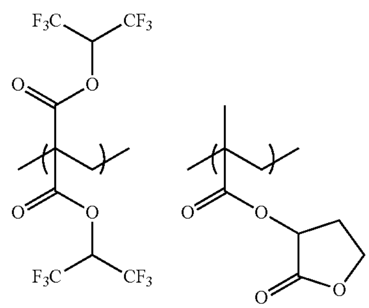
(HR-59)
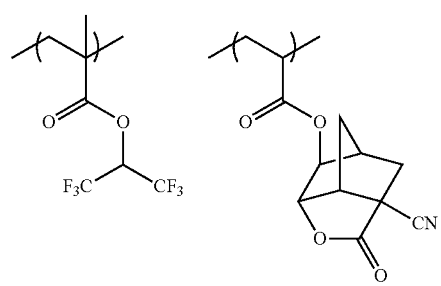
(HR-60)
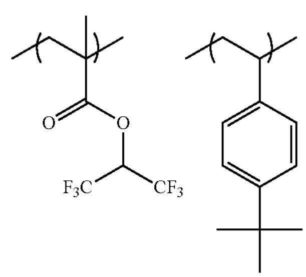

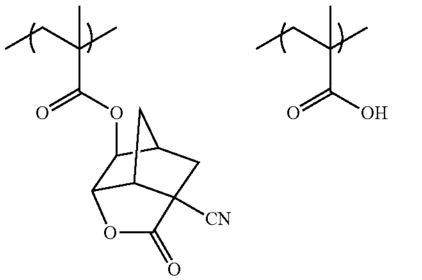
(HR-61)
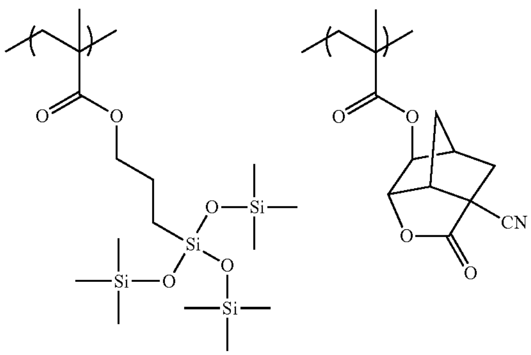
(HR-62)
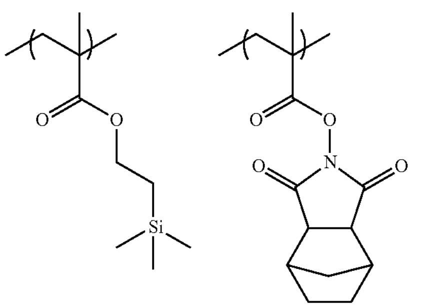
(HR-63)
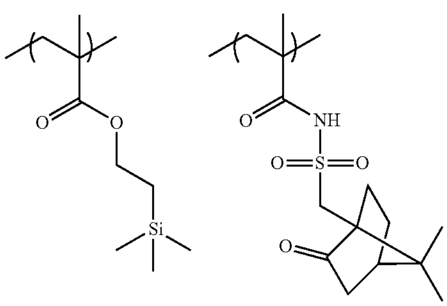
(HR-64)
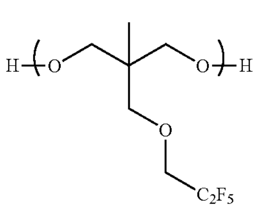
(HR-65)
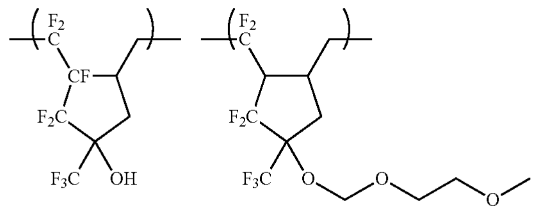
(HR-66)
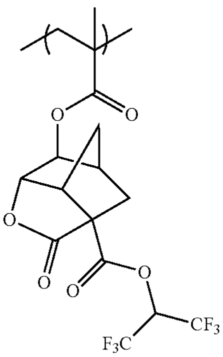
(HR-67)
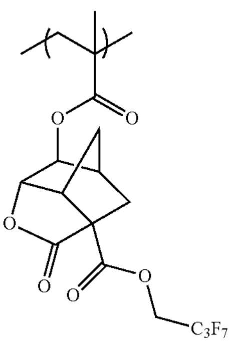
(HR-68)
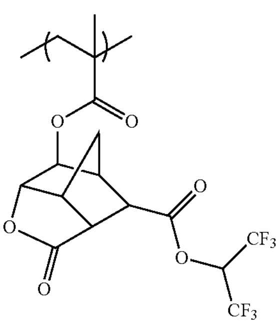
(HR-69)
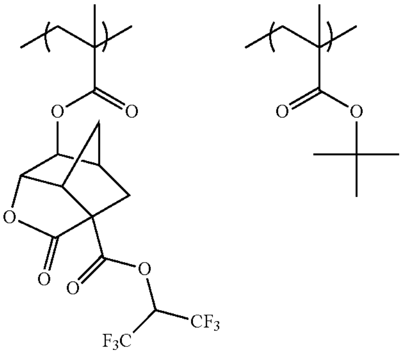

-continued
(HR-70)
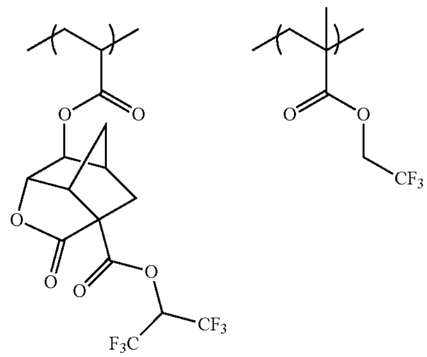
(HR-71)
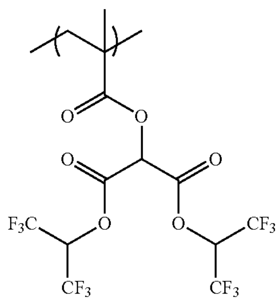
(HR-72)
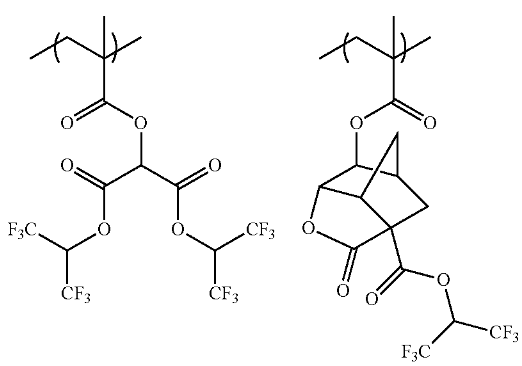
(HR-73)
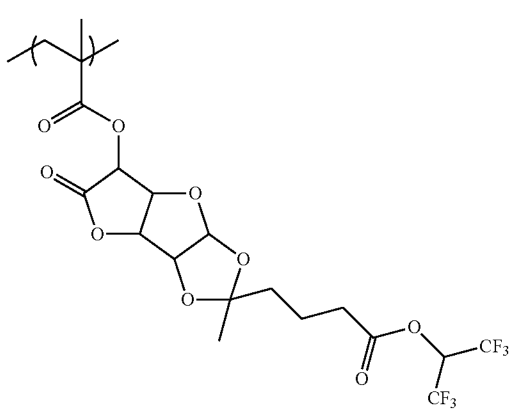
-continued
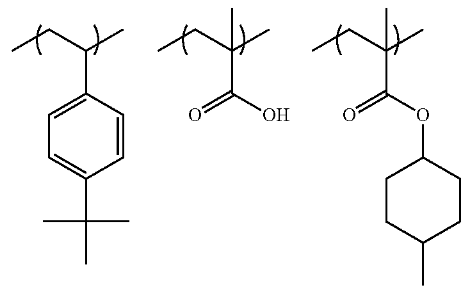
(HR-74)
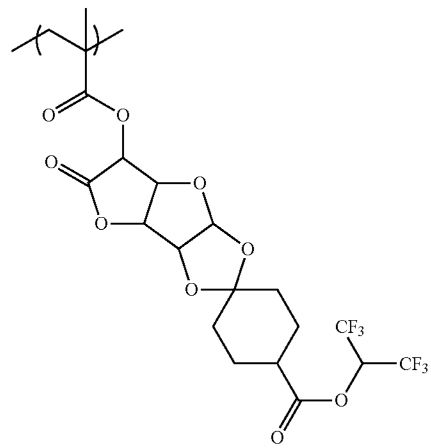
(HR-75)
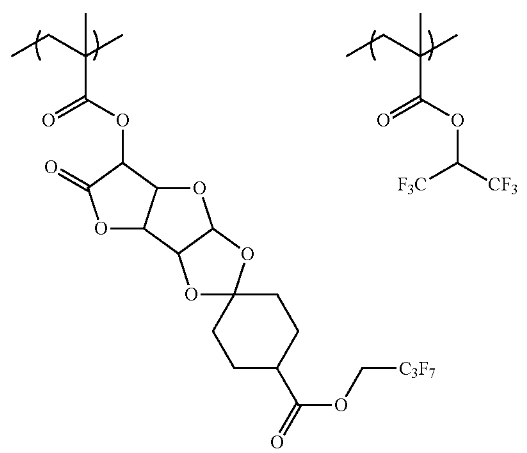
(HR-76)
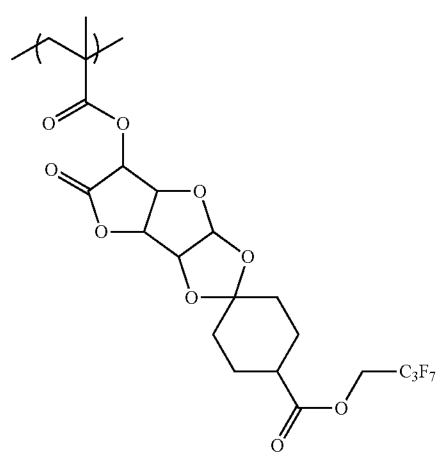

-continued
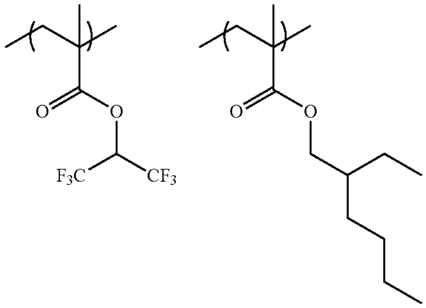
(HR-77)
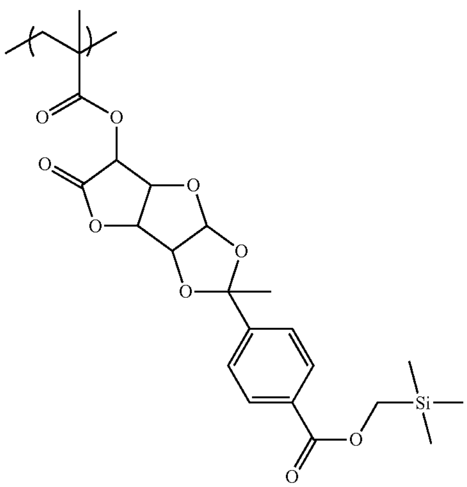
(HR-78)
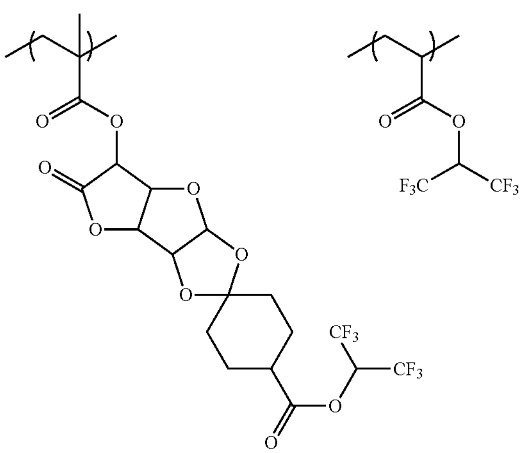
(HR-79)
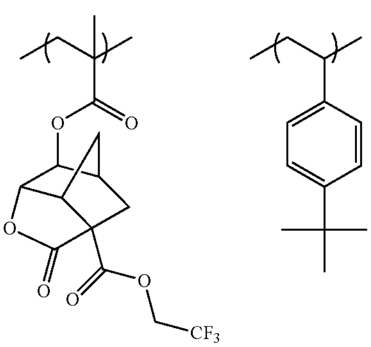
-continued
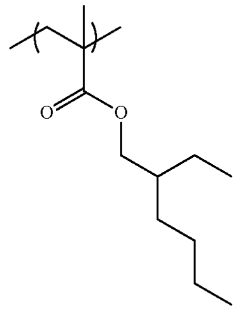
(HR-80)
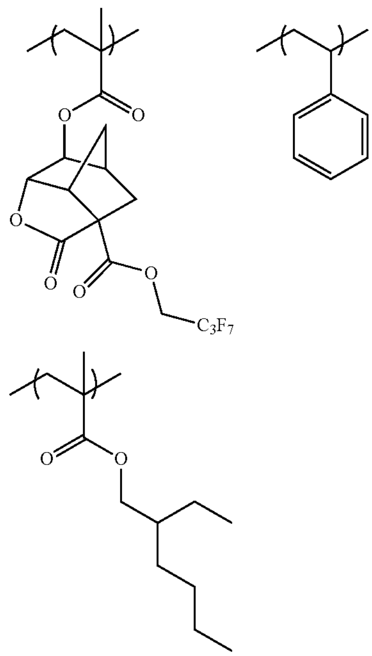
(HR-81)
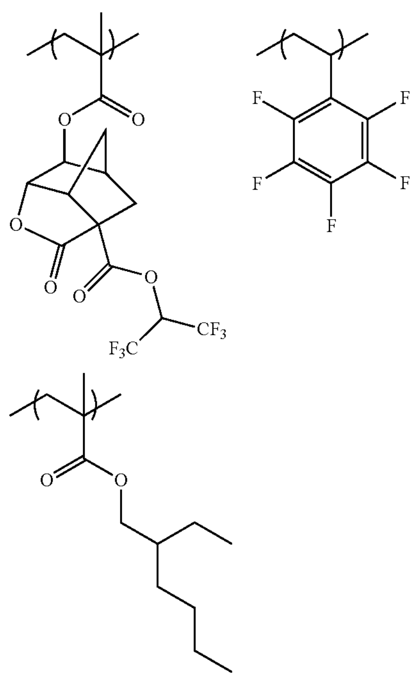

-continued
(HR-82)
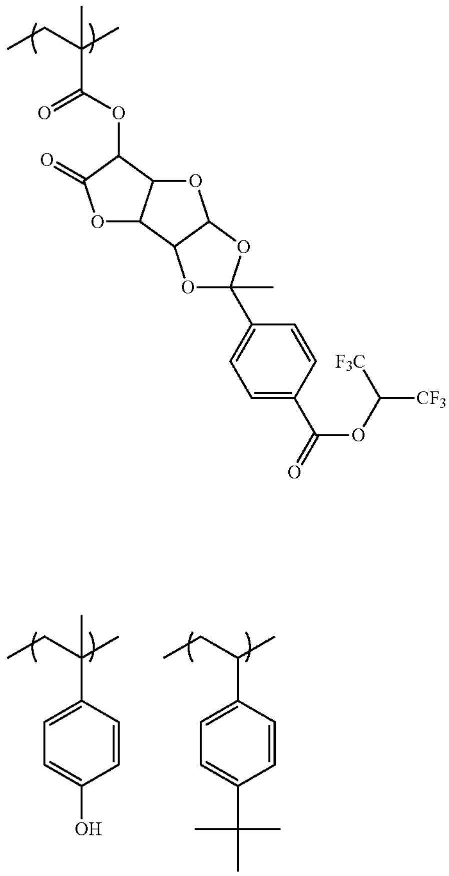
(HR-83)
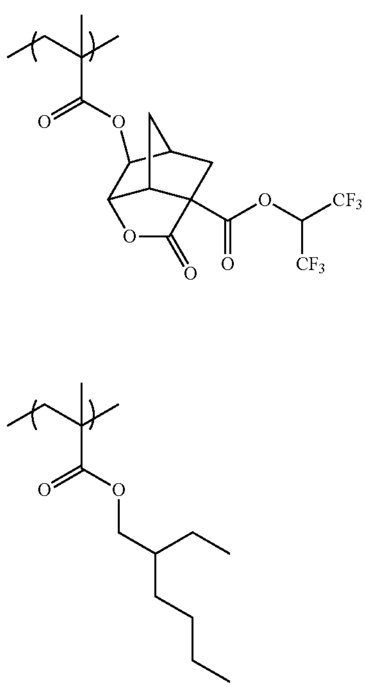
-continued
(HR-84)
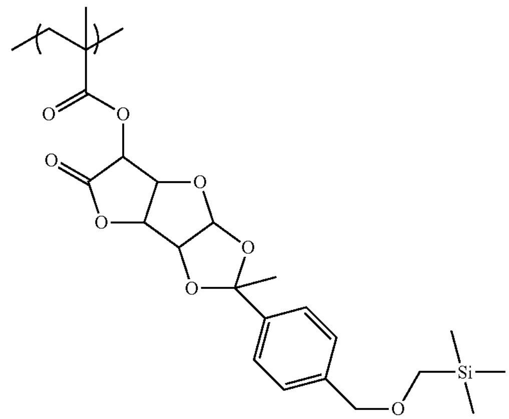
(HR-85)
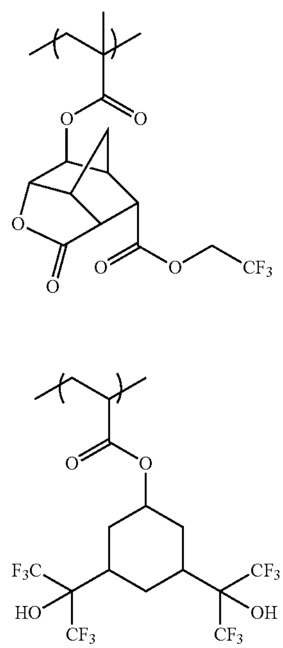
(HR-86)
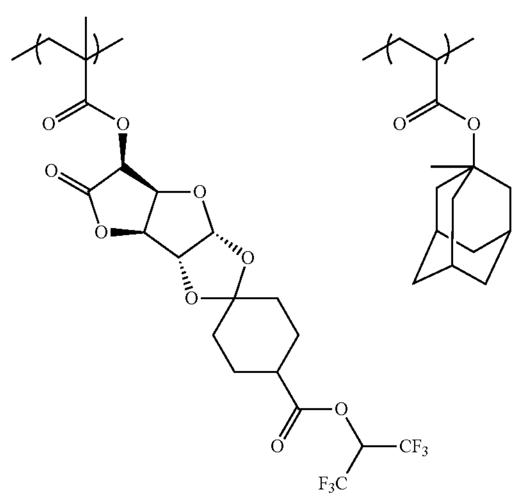

-continued
(HR-87)
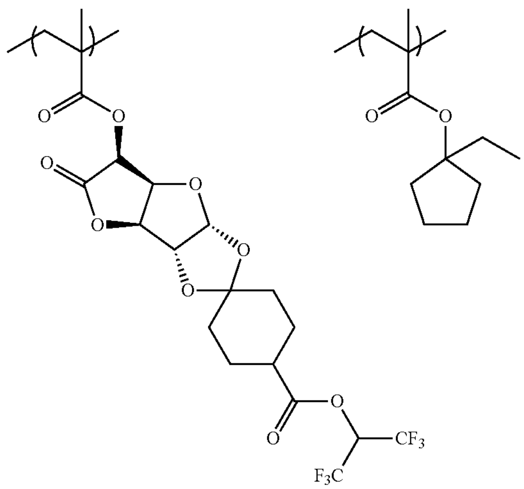
(HR-88)
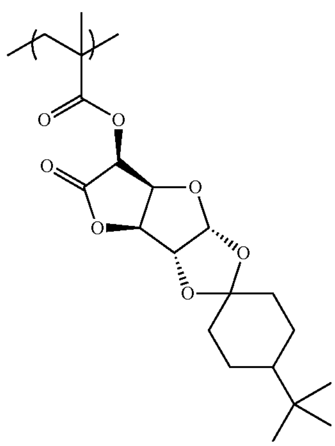
(HR-89)
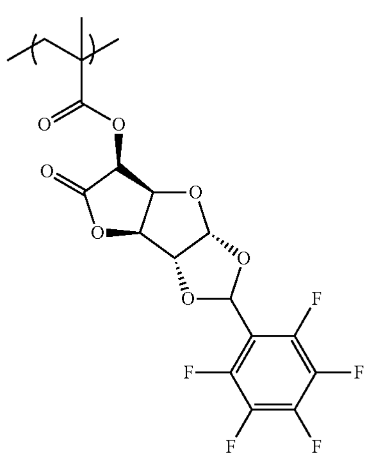
-continued
(HR-90)
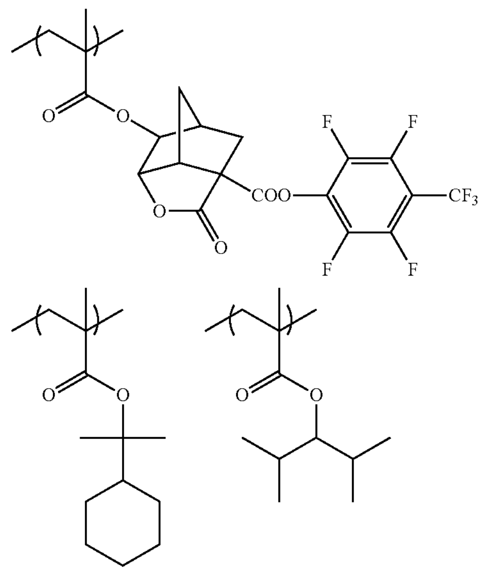
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |

-continued

| Resin | Composition | Mw | Mw/Mn |
|---|---|---|---|
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |
| HR-66 | 100 | 6000 | 1.5 |
| HR-67 | 100 | 6000 | 1.4 |
| HR-68 | 100 | 9000 | 1.5 |
| HR-69 | 60/40 | 8000 | 1.3 |
| HR-70 | 80/20 | 5000 | 1.4 |
| HR-71 | 100 | 9500 | 1.5 |
| HR-72 | 40/60 | 8000 | 1.4 |
| HR-73 | 55/30/5/10 | 8000 | 1.3 |
| HR-74 | 100 | 13000 | 1.4 |
| HR-75 | 70/30 | 8000 | 1.3 |
| HR-76 | 50/40/10 | 9500 | 1.5 |
| HR-77 | 100 | 9000 | 1.6 |
| HR-78 | 80/20 | 3500 | 1.4 |
| HR-79 | 90/8/2 | 13000 | 1.5 |
| HR-80 | 85/10/5 | 5000 | 1.5 |
| HR-81 | 80/18/2 | 6000 | 1.5 |
| HR-82 | 50/20/30 | 5000 | 1.3 |
| HR-83 | 90/10 | 8000 | 1.4 |
| HR-84 | 100 | 9000 | 1.6 |
| HR-85 | 80/20 | 15000 | 1.6 |
| HR-86 | 70/30 | 4000 | 1.42 |
| HR-87 | 60/40 | 8000 | 1.32 |
| HR-88 | 100 | 3800 | 1.29 |
| HR-89 | 100 | 6300 | 1.35 |
| HR-90 | 50/40/10 | 8500 | 1.51 |

[7] Surfactant (F)

The actinic ray-sensitive or radiation-sensitive resin composition for use in the present invention may or may not further contain a surfactant, but in the case of containing a surfactant, it is preferred to contain any one of fluorine-containing and/or silicon-containing surfactants (a fluorine-containing surfactant, a silicon-containing surfactant and a surfactant containing both a fluorine atom and a silicon atom), or two or more thereof.

By containing the surfactant, the actinic ray-sensitive or radiation-sensitive resin composition for use in the present invention can give a resist pattern improved in the sensitivity, resolution and adherence and reduced in the development defect when using an exposure light source with a wavelength of 250 nm or less, particularly 220 nm or less.

Examples of the fluorine-containing and/or silicon-containing surfactants include surfactants described in paragraph [0276] of U.S. Patent Application Publication No. 2008/0248425, such as EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by DIC Corporation); Surflon S-382, SC101, 102, 103, 104, 105 and 106 and KH-20 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, polysiloxane polymer KP-341 (produced by Shin-Etsu Chemical Co., Ltd.) may be also used as the silicon-containing surfactant.

Other than those known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

Examples of the surfactant coming under the surfactant above include Megaface F178, F-470, F-473, F-475, F-476 and F-472 (produced by DIC Corporation); a copolymer of a $C_6F_{13}$ group-containing acrylate (or methacrylate) with a (poly(oxyalkylene)) acrylate (or methacrylate); and a copolymer of a $C_3F_7$ group-containing acrylate (or methacrylate) with a (poly(oxyethylene)) acrylate (or methacrylate) and a (poly(oxypropylene)) acrylate (or methacrylate).

In the present invention, a surfactant other than the fluorine-containing and/or silicon-containing surfactant, described in paragraph [0280] of U.S. Patent Application Publication No. 2008/0248425, may also be used.

One of these surfactants may be used alone, or some of them may be used in combination.

In the case where the actinic ray-sensitive or radiation-sensitive resin composition contains a surfactant, the amount of the surfactant used is preferably from 0.0001 to 2 mass %, more preferably from 0.0005 to 1 mass %, based on the entire amount of the actinic ray-sensitive or radiation-sensitive resin composition (excluding the solvent).

On the other hand, by setting the amount added of the surfactant to 10 ppm or less based on the entire amount of the actinic ray-sensitive or radiation-sensitive resin composition (excluding the solvent), the hydrophobic resin is more unevenly distributed to the surface, so that the resist film surface can be made more hydrophobic and the followability of water at the immersion exposure can be enhanced.

[8] Other Additives (G)

The actinic ray-sensitive or radiation-sensitive resin composition for use in the present invention may or may not contain an onium carboxylate. Examples of the onium carboxylate include those described in paragraphs [0605] to [0606] of U.S. Patent Application Publication No. 2008/0187860.

Such an onium carboxylate can be synthesized by reacting a sulfonium hydroxide, iodonium hydroxide or ammonium hydroxide and a carboxylic acid with silver oxide in an appropriate solvent.

In the case where the actinic ray-sensitive or radiation-sensitive resin composition contains an onium carboxylate, the content thereof is generally from 0.1 to 20 mass %, preferably from 0.5 to 10 mass %, more preferably from 1 to 7 mass %, based on the entire solid content of the composition.

The actinic ray-sensitive or radiation-sensitive resin composition of the present invention may further contain, for example, a dye, a plasticizer, a photosensitizer, a light absorber, an alkali-soluble resin, a dissolution inhibitor, and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art while referring to the method described, for example, in JP-A-4-122938, JP-A-2-28531, U.S. Pat. No. 4,916,210 or European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

From the standpoint of enhancing the resolution, the actinic ray-sensitive or radiation-sensitive resin composition for use in the present invention is preferably used in a film thickness of 30 to 250 nm, more preferably from 30 to 200 nm. Such a film thickness can be obtained by setting the solid content concentration in the composition to an appropriate range, thereby imparting an appropriate viscosity and enhancing the coatability and film-forming property.

The entire solid content concentration in the actinic ray-sensitive or radiation-sensitive resin composition for use in the present invention is usually from 1.0 to 10 mass %, preferably from 2.0 to 5.7 mass %, more preferably from 2.0 to 5.3 mass %. By setting the solid content concentration to the range above, the resist solution can be uniformly applied on a substrate and furthermore, a resist pattern with excellent performance in terms of line width roughness can be formed. The reason therefor is not clearly known, but it is considered that thanks to a solid content concentration of 10 mass % or less, preferably 5.7 mass % or less, aggregation of materials, particularly, a photoacid generator, in the resist solution is suppressed, as a result, a uniform resist film can be formed.

The solid content concentration is a weight percentage of the weight of other resist components excluding the solvent, based on the total weight of the actinic ray-sensitive or radiation-sensitive resin composition.

The actinic ray-sensitive or radiation-sensitive resin composition for use in the present invention is used by dissolving the components above in a predetermined organic solvent, preferably in the above-described mixed solvent, filtering the solution, and applying it on a predetermined support (substrate). The filter used for filtration is preferably a polytetrafluoroethylene-, polyethylene- or nylon-made filter having a pore size of 0.1 μm or less, more preferably 0.05 μm or less, still more preferably 0.03 μm or less. In the filtration through a filter, as described, for example, in JP-A-2002-62667, circulating filtration may be performed, or the filtration may be performed by connecting a plurality of kinds of filters in series or in parallel. Also, the composition may be filtered a plurality of times. Furthermore, a deaeration treatment or the like may be applied to the composition before or after filtration through a filter.

[9] Pattern Forming Method

The pattern forming method (negative pattern forming method) of the present invention comprises at least:

(i) a step of forming a film (resist film) by an actinic ray-sensitive or radiation-sensitive resin composition, (ii) a step of exposing the film, and (iii) a step of forming a negative pattern by performing development using a developer containing an organic solvent.

The exposure in the step (ii) may be immersion exposure.

The pattern forming method of the present invention preferably has (iv) a heating step after the exposure step (ii).

The pattern forming method of the present invention may further have (v) a step of performing development by using an alkali developer.

In the pattern forming method of the present invention, the exposure step (ii) may be performed a plurality of times.

In the pattern forming method of the present invention, the heating step (v) may be performed a plurality of times.

The resist film is formed from the above-described actinic ray-sensitive or radiation-sensitive resin composition according to the present invention and, more specifically, is preferably formed on a substrate. In the pattern forming method of the present invention, the step of forming a film by an actinic ray-sensitive or radiation-sensitive resin composition on a substrate, the step of exposing the film, and the development step can be performed by generally known methods.

It is also preferred to contain, after film formation, a pre-baking step (PB) before entering the exposure step.

Furthermore, it is also preferred to contain a post-exposure baking step (PEB) after the exposure step but before the development step.

As for the heating temperature, both PB and PEB are preferably performed at 70 to 130° C., more preferably at 80 to 120° C.

The heating time is preferably from 30 to 300 seconds, more preferably from 30 to 180 seconds, still more preferably from 30 to 90 seconds.

The heating can be performed using a device attached to an ordinary exposure/developing machine or may be performed using a hot plate or the like.

Thanks to baking, the reaction in the exposed area is accelerated, and the sensitivity and pattern profile are improved.

The light source wavelength of the exposure apparatus for use in the present invention is not limited and includes, for example, infrared light, visible light, ultraviolet light, far ultraviolet light, extreme-ultraviolet light, X-ray and electron beam but is preferably far ultraviolet light at a wavelength of 250 nm or less, more preferably 220 nm or less, still more preferably from 1 to 200 nm. Specific examples thereof include KrF excimer laser (248 nm), ArF excimer laser (193 nm), $F_2$ excimer laser (157 nm), X-ray, EUV (13 nm) and electron beam. Among these, KrF excimer laser, ArF excimer laser, EUV and electron beam are preferred, and ArF excimer laser is more preferred.

In the step of performing exposure of the present invention, an immersion exposure method can be applied.

The immersion exposure method is, as the technique to increase the resolution, a technique of performing the exposure by filling a high refractive-index liquid (hereinafter, sometimes referred to as an "immersion liquid") between the projection lens and the sample.

As for the "effect of immersion", assuming that $\lambda_0$ is the wavelength of exposure light in air, n is the refractive index of the immersion liquid for air, θ is the convergence half-angle of beam and $NA_0=\sin\theta$, the resolution and the depth of focus in immersion can be expressed by the following formulae. Here, $k_1$ and $k_2$ are coefficients related to the process.

$$(\text{Resolution})=k_1\cdot(\lambda_0/n)/NA_0$$

$$(\text{Depth of focus})=\pm k_2\cdot(\lambda_0/n)/NA_0^2$$

That is, the effect of immersion is equal to use of an exposure wavelength of 1/n. In other words, in the case of a projection optical system having the same NA, the depth of focus can be made n times larger by the immersion. This is effective for all pattern profiles and furthermore, can be combined with the super-resolution technology under study at present, such as phase-shift method and modified illumination method.

In the case of performing immersion exposure, a step of washing the film surface with an aqueous chemical solution may be performed (1) after forming the film on a substrate but before the step of performing exposure and/or (2) after the step of exposing the film through an immersion liquid but before the step of heating the film.

The immersion liquid is preferably a liquid being transparent to light at the exposure wavelength and having as small a temperature coefficient of refractive index as possible in order to minimize the distortion of an optical image projected on the film. Particularly, when the exposure light source is ArF excimer laser (wavelength: 193 nm), water is preferably used in view of easy availability and easy handleability in addition to the above-described aspects.

In the case of using water, an additive (liquid) capable of decreasing the surface tension of water and increasing the interfacial activity may be added in a small ratio. This additive preferably does not dissolve the resist layer on the wafer and at the same time, gives only a negligible effect on the optical coat at the undersurface of the lens element.

Such an additive is preferably, for example, an aliphatic alcohol having a refractive index substantially equal to that of water, and specific examples thereof include methyl alcohol, ethyl alcohol and isopropyl alcohol. Thanks to addition of an alcohol having a refractive index substantially equal to that of water, even when the alcohol component in water is evaporated and its content concentration is changed, the change in the refractive index of the liquid as a whole can be advantageously made very small.

On the other hand, if a substance opaque to light at 193 nm or an impurity greatly differing in the refractive index from water is mingled, this incurs distortion of the optical image projected on the resist. Therefore, the water used is preferably distilled water. Furthermore, pure water after filtration through an ion exchange filter or the like may be also used.

The electrical resistance of water used as the immersion liquid is preferably 18.3 MQcm or more, and TOC (total organic carbon) is preferably 20 ppb or less. The water is preferably subjected to a deaeration treatment.

Also, the lithography performance can be enhanced by raising the refractive index of the immersion liquid. From such a standpoint, an additive for raising the refractive index may be added to water, or heavy water ($D_2O$) may be used in place of water.

In the case where the film formed using the composition of the present invention is exposed through an immersion medium, the hydrophobic resin (E) may be further added, if desired. The receding contact angle on the surface is enhanced by the addition of the hydrophobic resin (E). The receding contact angle of the film is preferably from 60 to 90°, more preferably 70° or more.

In the immersion exposure step, the immersion liquid must move on a wafer following the movement of an exposure head that is scanning the wafer at a high speed and forming an exposure pattern. Therefore, the contact angle of the immersion liquid for the resist film in a dynamic state is important, and the resist is required to have a performance of allowing the immersion liquid to follow the high-speed scanning of an exposure head with no remaining of a liquid droplet.

In order to prevent the film from directly contacting with the immersion liquid, a film (hereinafter, sometimes referred to as a "topcoat") sparingly soluble in the immersion liquid may be provided between the film formed using the composition of the present invention and the immersion liquid. The functions required of the topcoat are suitability for coating as a resist overlayer, transparency to radiation, particularly, radiation having a wavelength of 193 nm, and sparing solubility in immersion liquid. The topcoat is preferably unmixable with the resist and capable of being uniformly applied as a resist overlayer.

In view of transparency to light at 193 nm, the topcoat is preferably an aromatic-free polymer.

Specific examples thereof include a hydrocarbon polymer, an acrylic acid ester polymer, a polymethacrylic acid, a polyacrylic acid, a polyvinyl ether, a silicon-containing polymer and a fluorine-containing polymer. The above-described hydrophobic resin (E) is suitable also as the topcoat. If impurities are dissolved out into the immersion liquid from the topcoat, the optical lens is contaminated. For this reason, residual monomer components of the polymer are preferably little contained in the topcoat.

On peeling off the topcoat, a developer may be used or a releasing agent may be separately used. The releasing agent is preferably a solvent less likely to permeate the film. From the standpoint that the peeling step can be performed simultaneously with the development step of the film, the topcoat is preferably peelable with an alkali developer and in view of peeling with an alkali developer, the topcoat is preferably acidic, but in consideration of non-intermixing with the film, the topcoat may be neutral or alkaline.

The difference in the refractive index between the topcoat and the immersion liquid is preferably null or small. In this case, the resolution can be enhanced. In the case where the exposure light source is an ArF excimer laser (wavelength: 193 nm), water is preferably used as the immersion liquid and therefore, the topcoat for ArF immersion exposure preferably has a refractive index close to the refractive index (1.44) of water. Also, in view of transparency and refractive index, the topcoat is preferably a thin film.

The topcoat is preferably unmixable with the film and further unmixable with the immersion liquid. From this standpoint, when the immersion liquid is water, the solvent used for the topcoat is preferably a medium that is sparingly soluble in the solvent used for the composition of the present invention and is insoluble in water. Furthermore, when the immersion liquid is an organic solvent, the topcoat may be either water-soluble or water-insoluble.

In the present invention, the substrate on which the film is formed is not particularly limited, and an inorganic substrate such as silicon, SiN, $SiO_2$ and SiN, a coating-type inorganic substrate such as SOG, or a substrate generally used in the process of producing a semiconductor such as IC or producing a liquid crystal device or a circuit board such as thermal head or in the lithography of other photofabrication processes can be used. If desired, an organic antireflection film may be formed between the film and the substrate.

In the case where the pattern forming method of the present invention further includes a step of performing development by using an alkali developer, examples of the alkali developer which can be used include an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

This alkaline aqueous solution may be also used after adding thereto alcohols and a surfactant each in an appropriate amount.

The alkali concentration of the alkali developer is usually from 0.1 to 20 mass %.

The pH of the alkali developer is usually from 10.0 to 15.0.

In particular, an aqueous solution of 2.38 mass % tetramethylammonium hydroxide is preferred.

As for the rinsing solution in the rinsing treatment performed after the alkali development, pure water is used, and the pure water may be also used after adding thereto an appropriate amount of a surfactant.

After the development treatment or rinsing treatment, a treatment of removing the developer or rinsing solution adhering on the pattern by a supercritical fluid may be performed.

As the developer in the step of forming a negative pattern by performing the development using a developer containing an organic solvent (hereinafter, sometimes referred to as an "organic developer"), a polar solvent such as ketone-based solvent, ester-based solvent, alcohol-based solvent, amide-based solvent and ether-based solvent, or a hydrocarbon-based solvent can be used.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol.

Examples of the ether-based solvent include, in addition to the glycol ether-based solvents above, dioxane and tetrahydrofuran.

Examples of the amide-based solvent which can be used include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aromatic hydrocarbon-based solvent such as toluene and xylene, and an aliphatic hydrocarbon-based solvent such as pentane, hexane, octane and decane.

A plurality of these solvents may be mixed, or the solvent may be used by mixing it with a solvent other than those described above or with water. However, in order to sufficiently bring out the effects of the present invention, the water content ratio of the entire developer is preferably less than 10 mass %, and it is more preferred to contain substantially no water.

That is, the amount of the organic solvent used in the organic developer is preferably from 90 to 100 mass %, more preferably from 95 to 100 mass %, based on the entire amount of the developer.

In particular, the organic developer is preferably a developer containing at least one kind of an organic solvent selected from a ketone-based solvent, an ester-based solvent, an alcohol-based solvent, an amide-based solvent and an ether-based solvent.

The vapor pressure at 20° C. of the organic developer is preferably 5 kPa or less, more preferably 3 kPa or less, still more preferably 2 kPa or less. By setting the vapor pressure of the organic developer to 5 kPa or less, evaporation of the developer on a substrate or in a development cup is suppressed and the temperature uniformity in the wafer plane is enhanced, as a result, the dimensional uniformity in the wafer plane is improved.

Specific examples of the solvent having a vapor pressure of 5 kPa or less include a ketone-based solvent such as 1-octanone, 2-octanone, 1-nonanone, 2-nonanone, 2-heptanone(methyl amyl ketone), 4-heptanone, 2-hexanone, diisobutyl ketone, cyclohexanone, methylcyclohexanone, phenylacetone and methyl isobutyl ketone; an ester-based solvent such as butyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate and propyl lactate; an alcohol-based solvent such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an ether-based solvent such as tetrahydrofuran; an amide-based solvent such as N-methyl-2-pyrrolidone, N,N-dimethylacetamide and N,N-dimethylformamide; an aromatic hydrocarbon-based solvent such as toluene and xylene; and an aliphatic hydrocarbon-based solvent such as octane and decane.

Specific examples of the solvent having a vapor pressure of 2 kPa or less that is a particularly preferred range include a ketone-based solvent such as 1-octanone, 2-octanone, 1-nonanone, 2-nonanone, 4-heptanone, 2-hexanone, diisobutyl ketone, cyclohexanone, methylcyclohexanone and phenylacetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate and propyl lactate; an alcohol-based solvent such as n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an amide-based solvent such as N-methyl-2-pyrrolidone, N,N-dimethylacetamide and N,N-dimethylformamide; an aromatic hydrocarbon-based solvent such as xylene; and an aliphatic hydrocarbon-based solvent such as octane and decane.

In the organic developer, a surfactant may be added in an appropriate amount, if desired.

The surfactant is not particularly limited but, for example, ionic or nonionic fluorine-containing and/or silicon-containing surfactants can be used. Examples of such fluorine-containing and/or silicon-containing surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. A nonionic surfactant is preferred. The nonionic surfactant is not particularly limited, but use of a fluorine-containing surfactant or a silicon-containing surfactant is more preferred.

The amount of the surfactant used is usually from 0.001 to 5 mass %, preferably from 0.005 to 2 mass %, more preferably from 0.01 to 0.5 mass %, based on the entire amount of the developer.

As regards the developing method, for example, a method of dipping the substrate in a bath filled with the developer for a fixed time (dipping method), a method of raising the developer on the substrate surface by the effect of a surface tension and keeping it still for a fixed time, thereby performing development (puddle method), a method of spraying the developer on the substrate surface (spraying method), and a method of continuously ejecting the developer on the substrate spinning at a constant speed while scanning the developer ejecting nozzle at a constant rate (dynamic dispense method) may be applied.

In the case where the above-described various developing methods include a step of ejecting the developer toward the resist film from a development nozzle of a developing apparatus, the ejection pressure of the developer ejected (the flow velocity per unit area of the developer ejected) is preferably 2 mL/sec/mm$^2$ or less, more preferably 1.5 mL/sec/mm$^2$ or less, still more preferably 1 mL/sec/mm$^2$ or less. The flow velocity has no particular lower limit but in view of throughput, is preferably 0.2 mL/sec/mm$^2$ or more.

By setting the ejection pressure of the ejected developer to the range above, pattern defects attributable to the resist scum after development can be greatly reduced.

Details of this mechanism are not clearly known, but it is considered that thanks to the ejection pressure in the above-described range, the pressure imposed on the resist film by the developer becomes small and the resist film or resist pattern is kept from inadvertent chipping or collapse.

Here, the ejection pressure (mL/sec/mm$^2$) of the developer is the value at the outlet of the development nozzle in the developing apparatus.

Examples of the method for adjusting the ejection pressure of the developer include a method of adjusting the ejection pressure by a pump or the like, and a method of supplying the developer from a pressurized tank and adjusting the pressure to change the ejection pressure.

After the step of performing development by using an organic solvent-containing developer, a step of stopping the development by replacing the solvent with another solvent may be practiced.

A step of rinsing the film by using a rinsing solution is preferably provided after the step of performing development by using an organic solvent-containing developer.

The rinsing solution used in the rinsing step after the step of performing development by using an organic solvent-containing developer is not particularly limited as long as it does not dissolve the resist pattern, and a solution containing a general organic solvent may be used. As for the rinsing solution, a rinsing solution containing at least one kind of an organic solvent selected from the group consisting of a hydrocarbon-based solvent, a ketone-based solvent, an ester-based solvent, an alcohol-based solvent, an amide-based solvent and an ether-based solvent is preferably used.

Specific examples of the hydrocarbon-based solvent, ketone-based solvent, ester-based solvent, alcohol-based solvent, amide-based solvent and ether-based solvent are the same as those described above for the organic solvent-containing developer.

After the step of performing development by using an organic solvent-containing developer, more preferably, a step of rinsing the film by using a rinsing solution containing at least one kind of an organic solvent selected from the group consisting of a ketone-based solvent, an ester-based solvent, an alcohol-based solvent and an amide-based solvent is preformed; still more preferably, a step of rinsing the film by using a rinsing solution containing an alcohol-based solvent or an ester-based solvent is performed; yet still more preferably, a step of rinsing the film by using a rinsing solution containing a monohydric alcohol is performed; and most preferably, a step of rinsing the film by using a rinsing solution containing a monohydric alcohol having a carbon number of 5 or more is performed.

The monohydric alcohol used in the rinsing step includes a linear, branched or cyclic monohydric alcohol, and specific examples of the monohydric alcohol which can be used include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol and 4-octanol. As for the particularly preferred monohydric alcohol having a carbon number of 5 or more, 1-hexanol, 2-hexanol, 4-methyl-2-pentanol, 1-pentanol, 3-methyl-1-butanol and the like can be used.

A plurality of these components may be mixed, or the solvent may be used by mixing it with an organic solvent other than those described above.

The water content ratio in the rinsing solution is preferably 10 mass % or less, more preferably 5 mass % or less, still more preferably 3 mass % or less. By setting the water content ratio to 10 mass % or less, good development characteristics can be obtained.

The vapor pressure at 20° C. of the rinsing solution used after the step of performing development by using an organic solvent-containing developer is preferably from 0.05 to 5 kPa, more preferably from 0.1 to 5 kPa, and most preferably from 0.12 to 3 kPa. By setting the vapor pressure of the rinsing solution to the range from 0.05 to 5 kPa, the temperature uniformity in the wafer plane is enhanced and furthermore, swelling due to permeation of the rinsing solution is suppressed, as a result, the dimensional uniformity in the wafer plane is improved.

The rinsing solution may be also used after adding thereto an appropriate amount of a surfactant.

In the rinsing step, the wafer after development using an organic solvent-containing developer is rinsed by using the above-described organic solvent-containing rinsing solution. The method for rinsing treatment is not particularly limited but, for example, a method of continuously ejecting the rinsing solution on the substrate spinning at a constant speed (spin coating method), a method of dipping the substrate in a bath filled with the rinsing solution for a fixed time (dipping method), and a method of spraying the rinsing solution on the substrate surface (spraying method) can be applied. Above all, it is preferred to perform the rinsing treatment by the spin coating method and after the rinsing, remove the rinsing solution from the substrate surface by spinning the substrate at a rotational speed of 2,000 to 4,000 rpm. It is also preferred to include a heating step (Post Bake) after the rinsing step. Thanks to the baking, the developer and rinsing solution remaining between patterns and in the inside of the pattern are removed. The heating step after the rinsing step is performed at usually from 40 to 160° C., preferably from 70 to 95° C., for usually from 10 seconds to 3 minutes, preferably from 30 to 90 seconds.

The present invention also relates to a method for manufacturing an electronic device, comprising the pattern forming method of the present invention, and an electronic device manufactured by this manufacturing method.

The electronic device of the present invention is suitably mounted on electric electronic equipment (such as home electronic device, OA•media-related device, optical device and communication device).

EXAMPLES

The present invention is described in greater detail below by referring to Examples, but the present invention should not be construed as being limited thereto.

Synthesis Example (Synthesis of Monomer 2)

Monomer 2 in the following scheme was synthesized in accordance with the method described in Japanese Patent 3,390,702.

(Synthesis of Resin P-1)

In a nitrogen stream, 289 g of cyclohexanone was charged into a three-neck flask and heated at 80° C. Subsequently, Monomer 1 (33.3 g) and Monomer 2 (112.2 g) shown below were dissolved in cyclohexanone (535 g) to prepare a monomer solution. Furthermore, a solution obtained by adding and dissolving 7.25 g (6.3 mol % based on the total amount of monomers) of polymerization initiator V-601 (produced by Wako Pure Chemical Industries, Ltd.) was added dropwise to the flask over 6 hours. After the completion of dropwise addition, the solution was further reacted at 80° C. for 2 hours. The reaction solution was allowed to cool and then added dropwise to a mixed solvent of 4,750 g of methanol/2,040 g of water, and the precipitated powder was collected by filtration and dried to obtain 104 g of Resin (P-1). The weight average molecular weight of Resin (P-1) obtained 11,000, the polydispersity (Mw/Mn) was 1.72, and the compositional ratio as measured by $^{13}$C-NMR was 30/70.

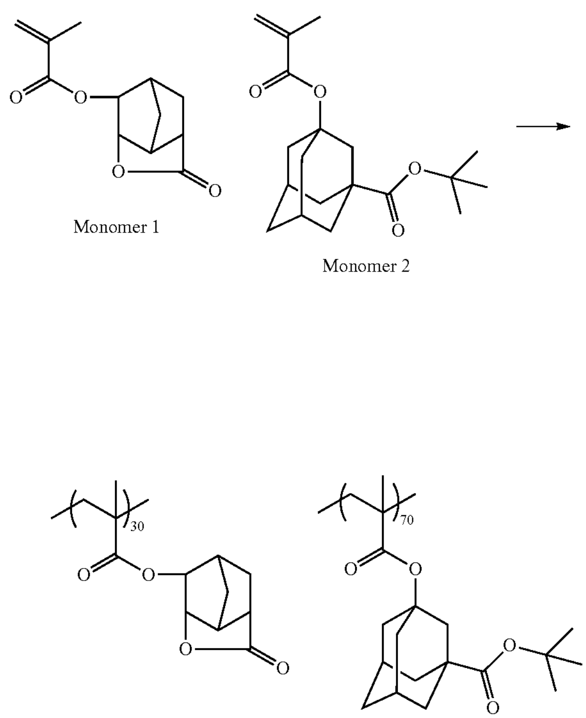

(P-1)

Resins (P-2) to (P-36) were synthesized in the same manner as Resin (P-1).

The structure, compositional ratio (molar ratio) of repeating units, mass average molecular weight and polydispersity of each of the resins synthesized are shown below.

(P-1)

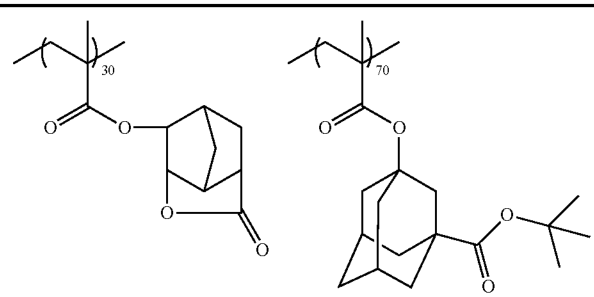

Mw = 11000
Mw/Mn = 1.72

-continued
(P-2)
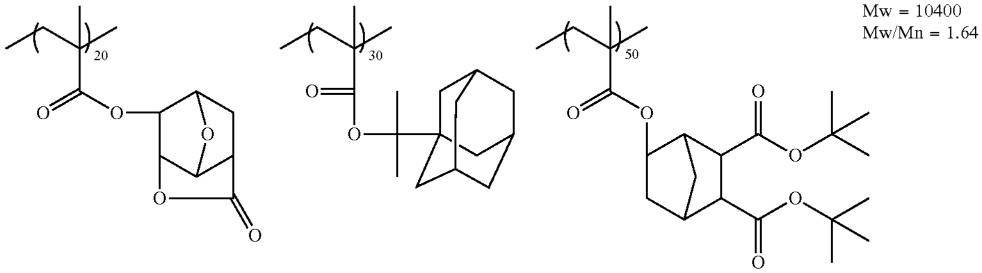
Mw = 10400
Mw/Mn = 1.64
(P-3)
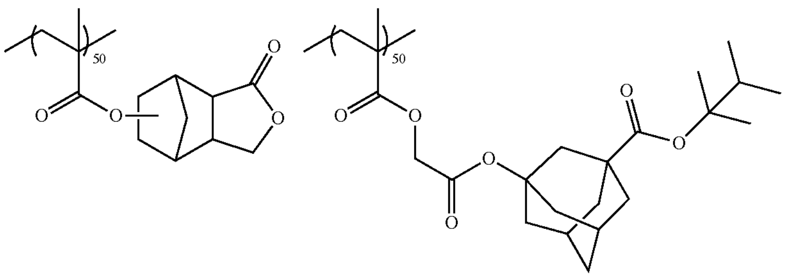
Mw = 10900
Mw/Mn = 1.72
(P-4)
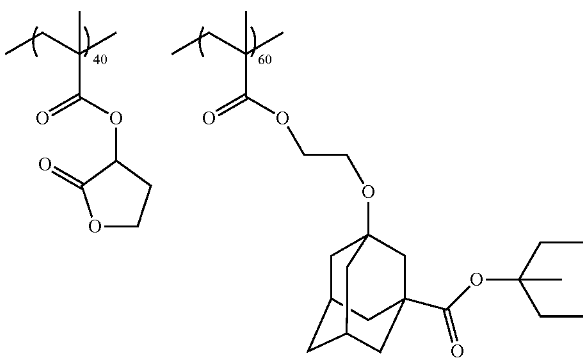
Mw = 9900
Mw/Mn = 1.80
(P-5)
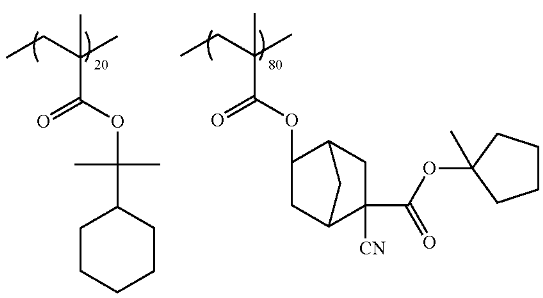
Mw = 10700
Mw/Mn = 1.75
(P-6)
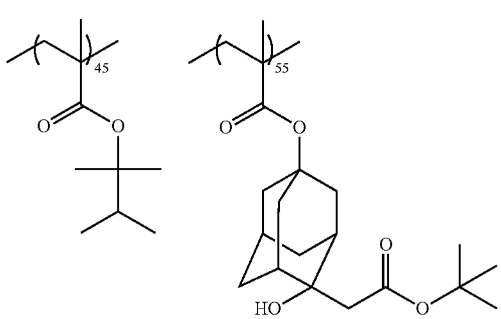
Mw = 10400
Mw/Mn = 1.92

-continued
(P-7)
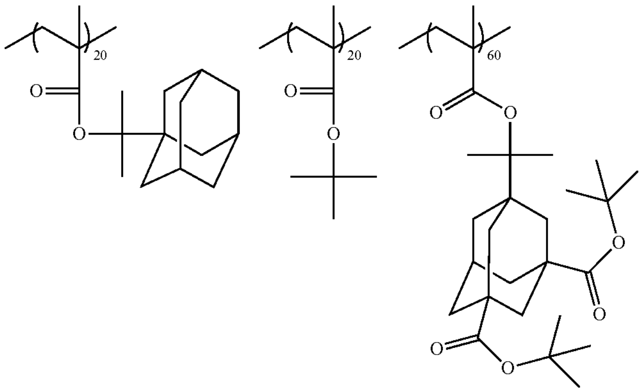
Mw = 10200
Mw/Mn = 1.94
(P-8)
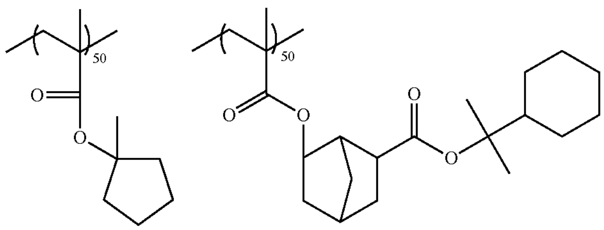
Mw = 20200
Mw/Mn = 1.54
(P-9)
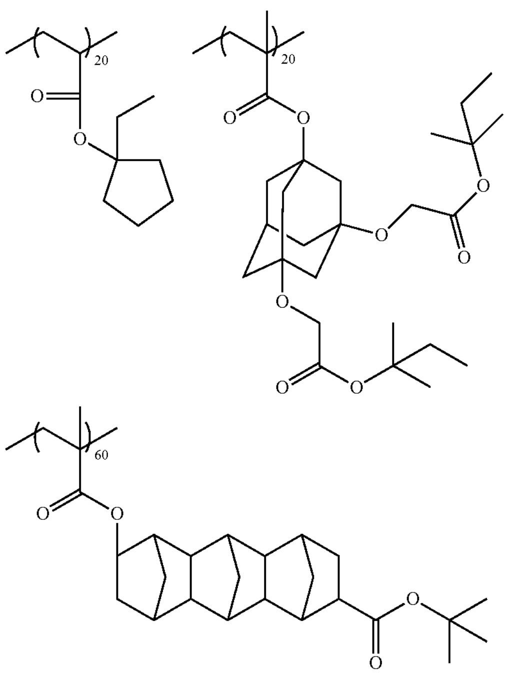
Mw = 10200
Mw/Mn = 1.76
(P-10)
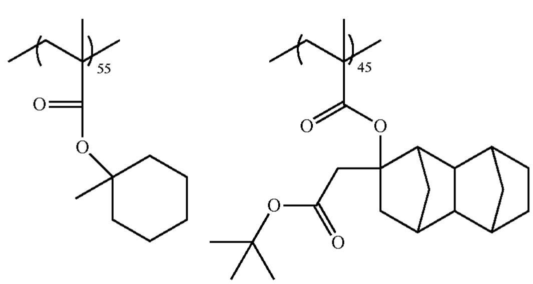
Mw = 10800
Mw/Mn = 1.72

-continued
(P-11)
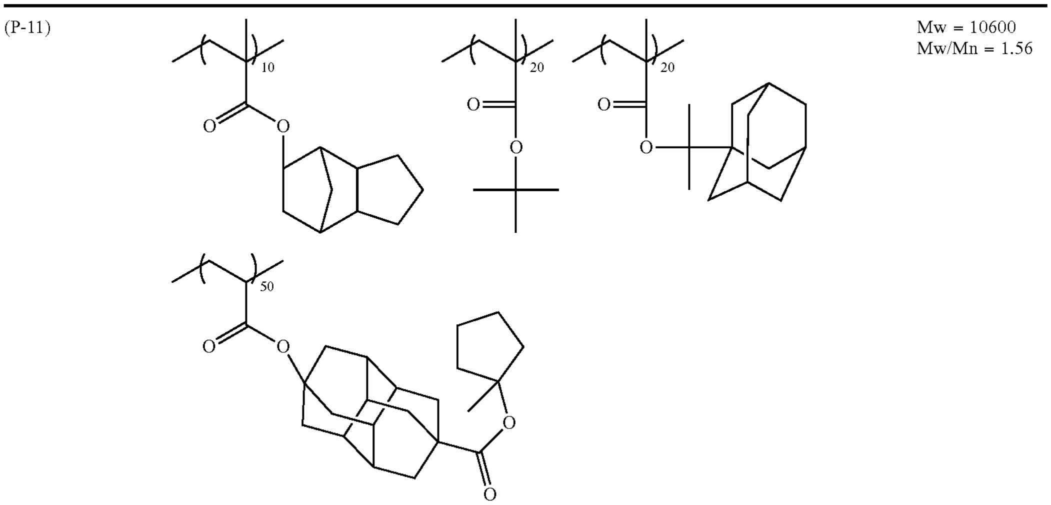
Mw = 10600
Mw/Mn = 1.56
(P-12)
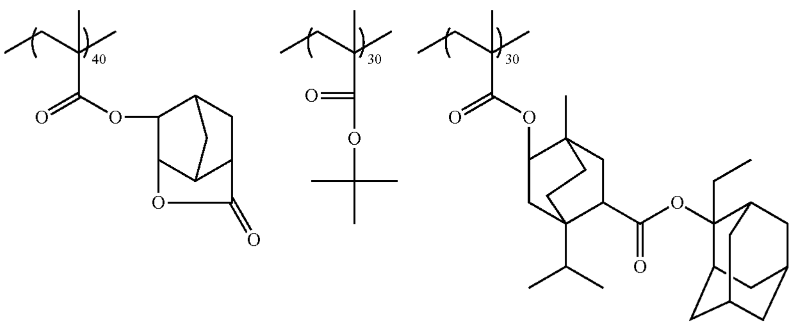
Mw = 10500
Mw/Mn = 1.58
(P-13)
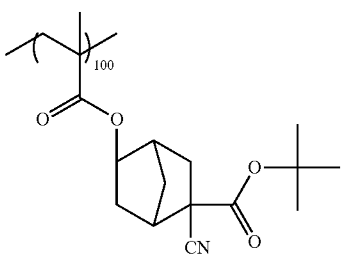
Mw = 20000
Mw/Mn = 1.76
(P-14)
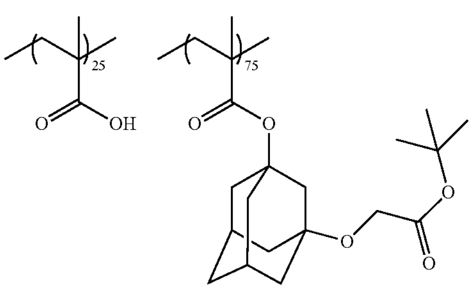
Mw = 10200
Mw/Mn = 1.58
(P-15)
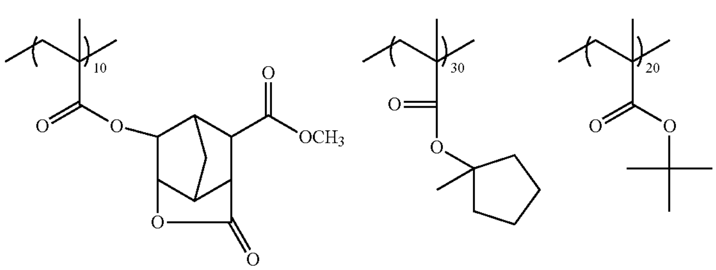
Mw = 20600
Mw/Mn = 1.58

-continued
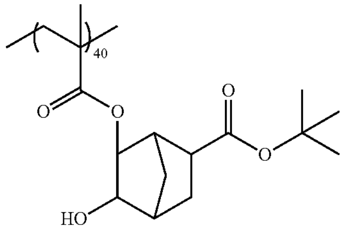
(P-16)
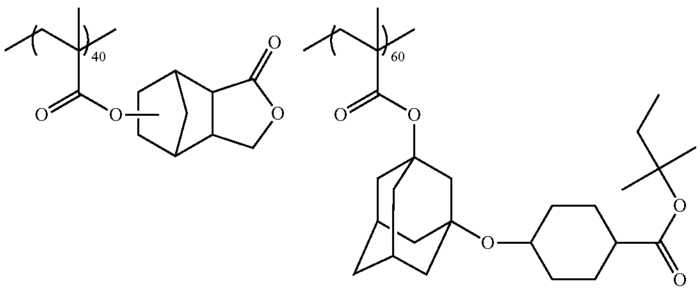
Mw = 10100
Mw/Mn = 1.67
(P-17)
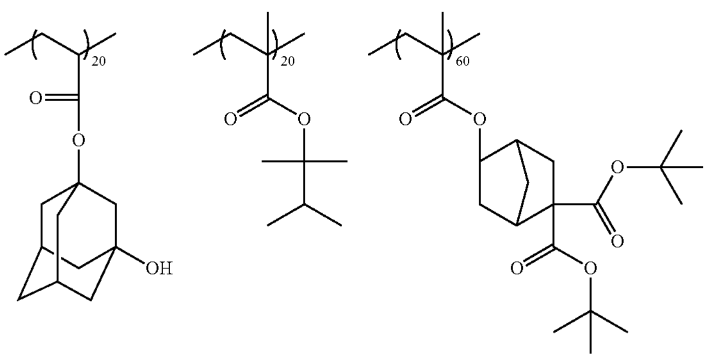
Mw = 30600
Mw/Mn = 1.76
(P-18)
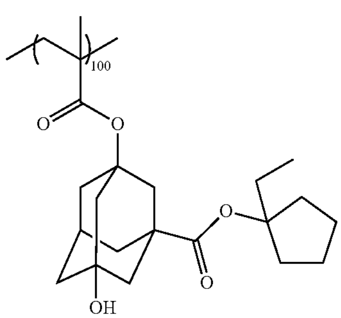
Mw = 29600
Mw/Mn = 1.55
(P-19)
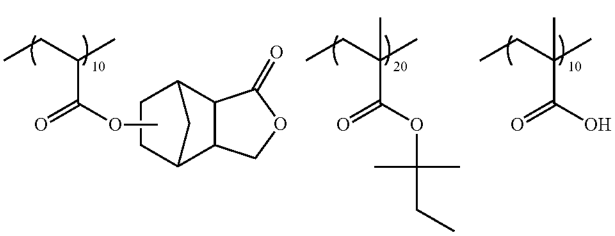
Mw = 10500
Mw/Mn = 1.75

-continued
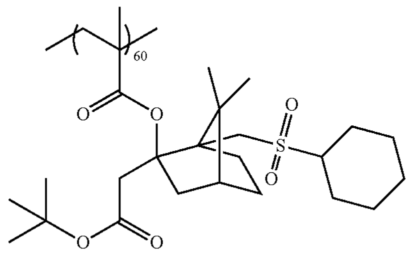
(P-20)
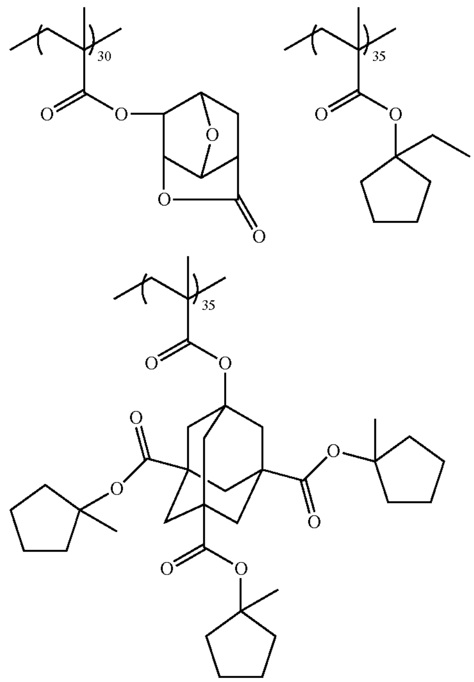
Mw = 30000
Mw/Mn = 1.68
(P-21)
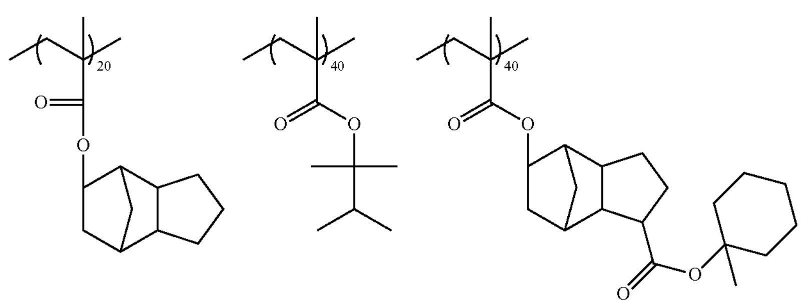
Mw = 10200
Mw/Mn = 1.53
(P-22)
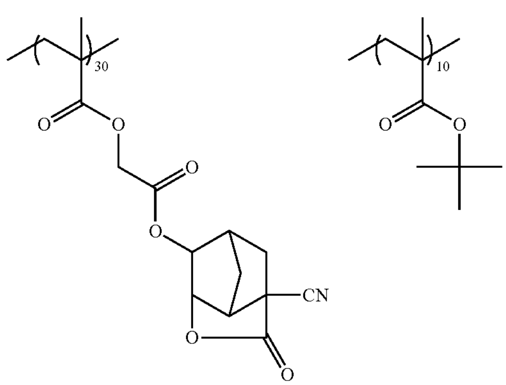
Mw = 10300
Mw/Mn = 1.66

-continued
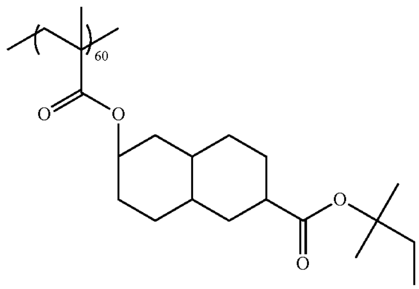
(P-23)
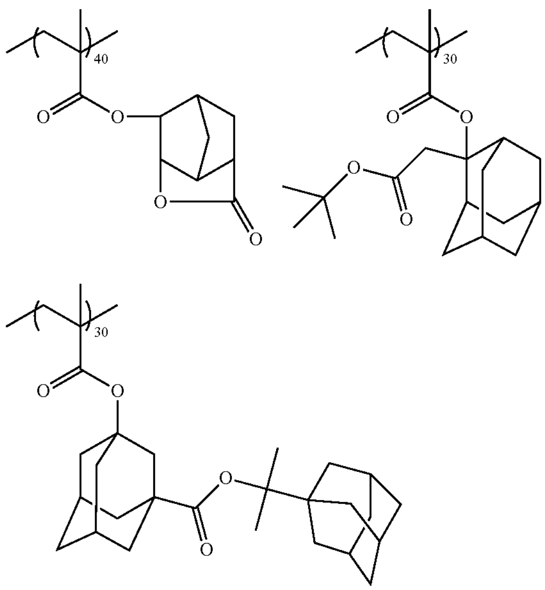
Mw = 10400
Mw/Mn = 1.64
(P-24)
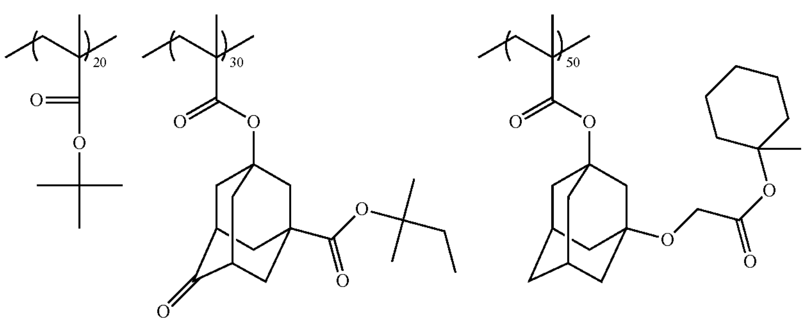
Mw = 10700
Mw/Mn = 1.64
(P-25)
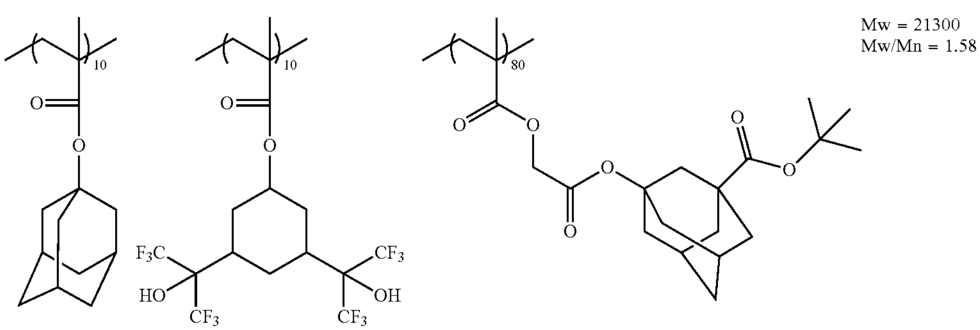
Mw = 21300
Mw/Mn = 1.58

-continued
(P-26)
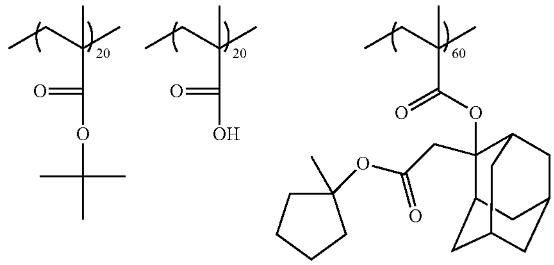
Mw = 20000
Mw/Mn = 1.75
(P-27)
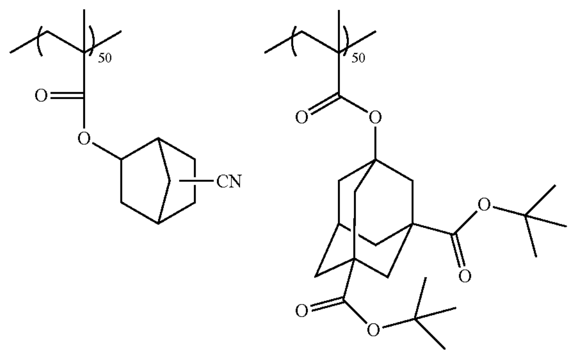
Mw = 20400
Mw/Mn = 1.54
(P-28)
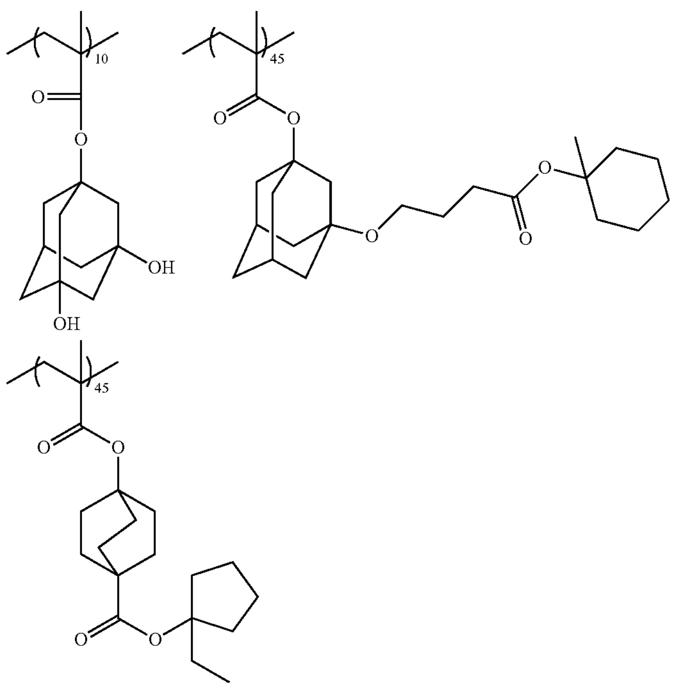
Mw = 11200
Mw/Mn = 1.66
(P-29)
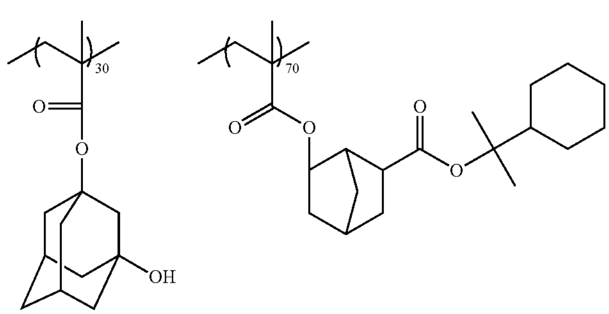
Mw = 10500
Mw/Mn = 1.68

-continued
(P-30)
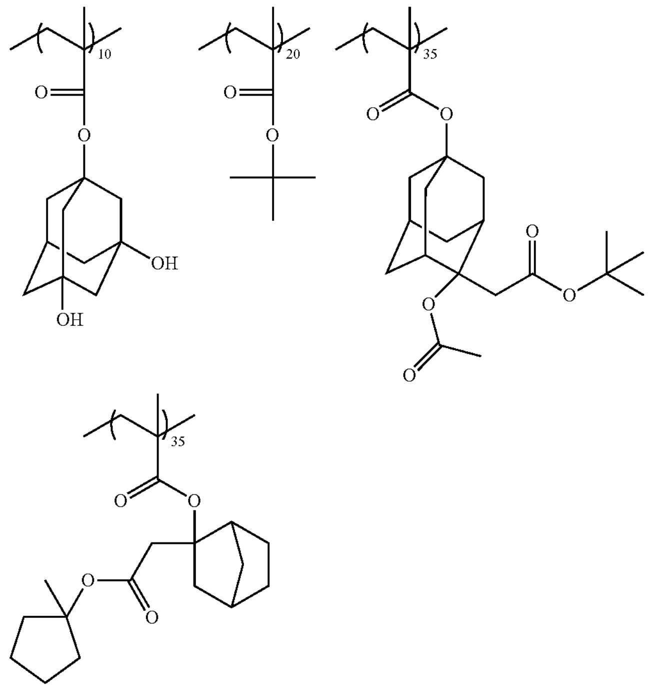
Mw = 11000
Mw/Mn = 1.57
(P-31)
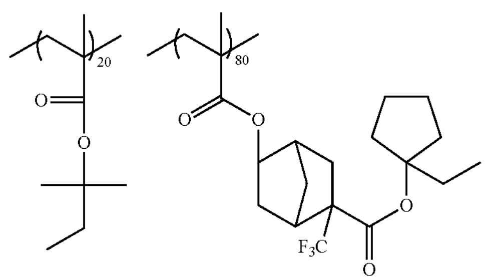
Mw = 10500
Mw/Mn = 1.69
(P-32)
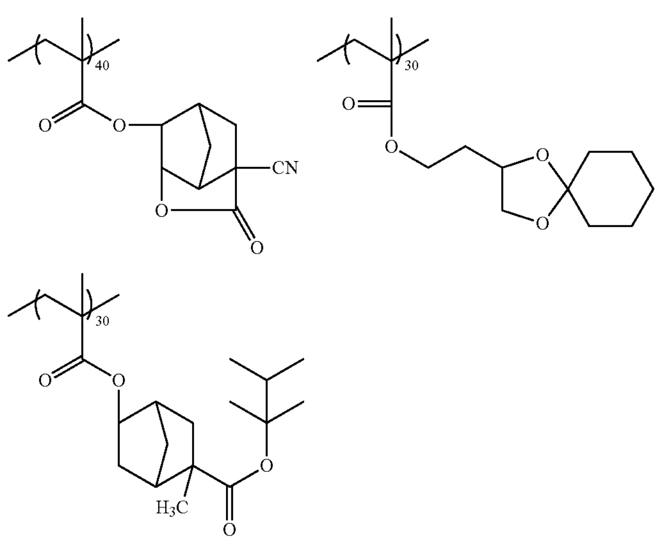
Mw = 10300
Mw/Mn = 1.76

-continued
(P-33)
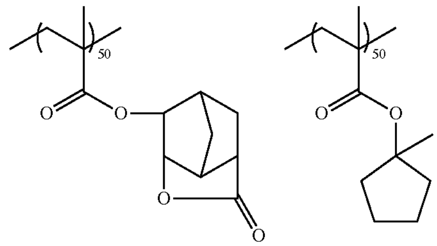
Mw = 11000
Mw/Mn = 1.72
(P-34)
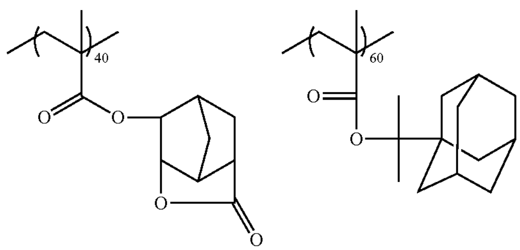
Mw = 28900
Mw/Mn = 1.64
(P-35)
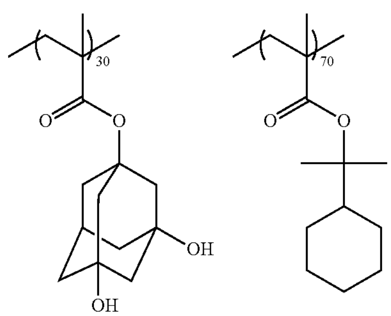
Mw = 17300
Mw/Mn = 1.72
(P-36)
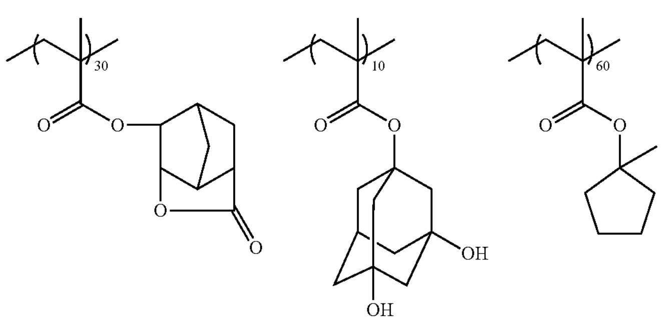
Mw = 13200
Mw/Mn = 1.80

<Acid Generator>
The following compounds were used as the acid generator.
PAG-1
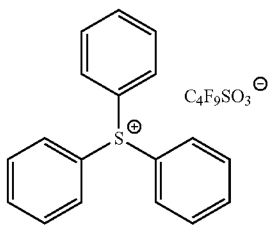
PAG-2
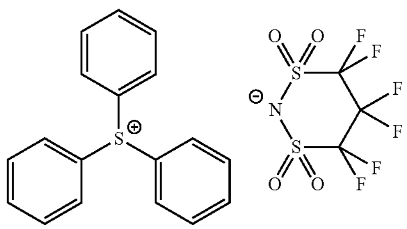
PAG-3
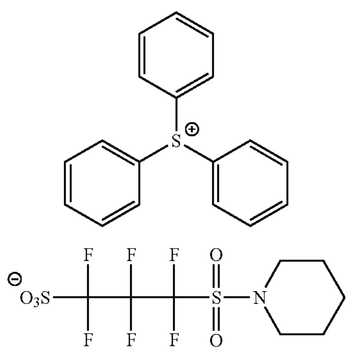
PAG-4
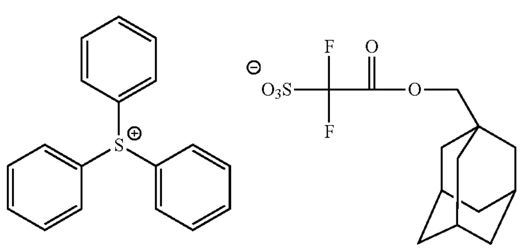
PAG-5
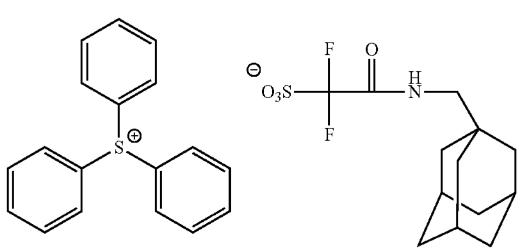
-continued
PAG-6
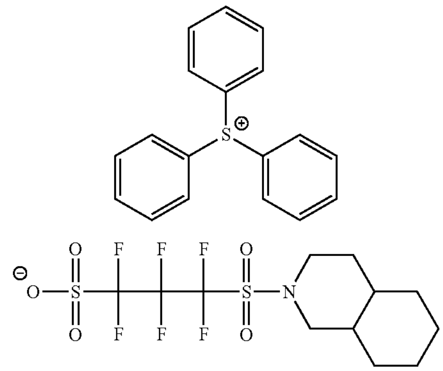
PAG-7
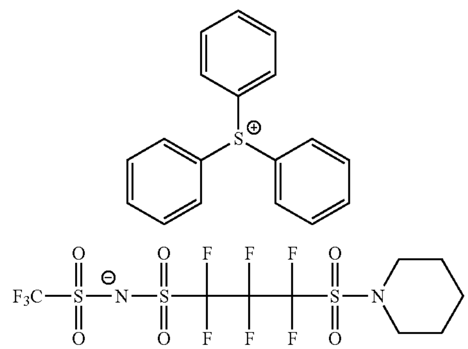
PAG-8
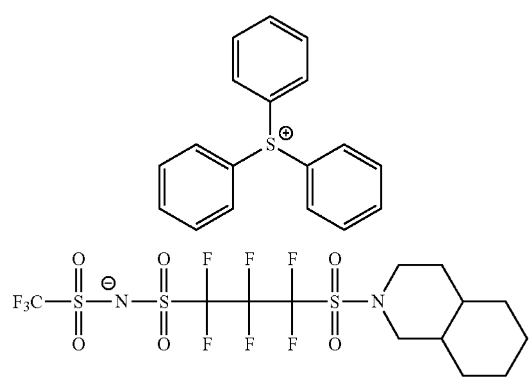
PAG-9
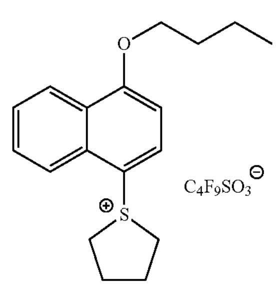

-continued
PAG-10
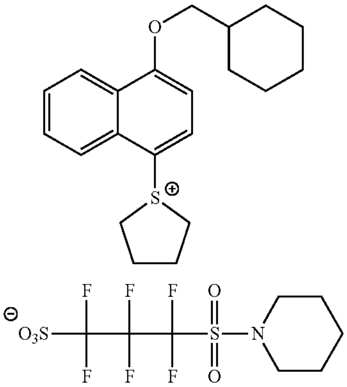
PAG-11
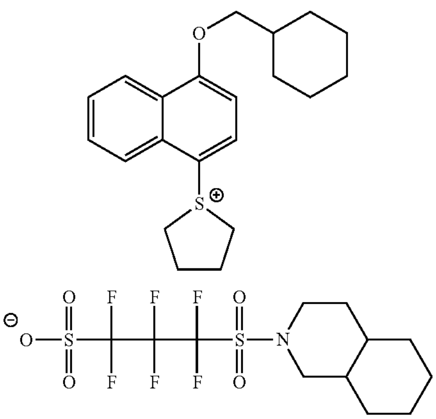
PAG-12
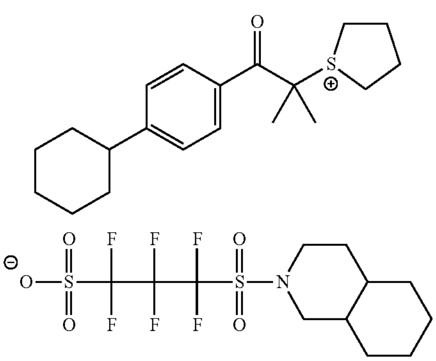
<Basic Compound (C) Whose Basicity Decreases Upon Irradiation with an Actinic Ray or Radiation, and Basic Compound (C)>
The following compounds were used as the basic compound whose basicity decreases upon irradiation with an actinic ray or radiation, or the basic compound.
N-1
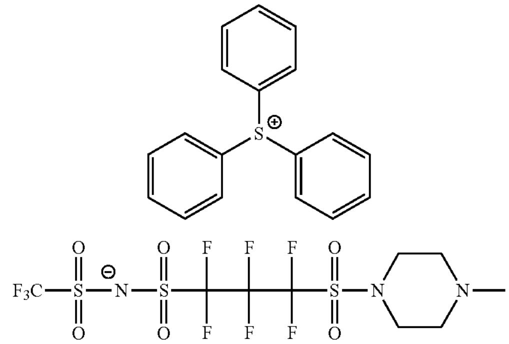
N-2
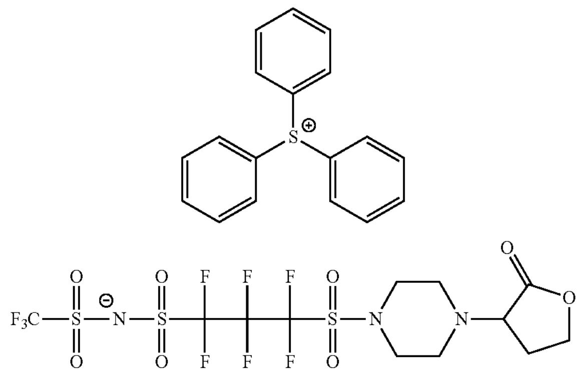
N-3
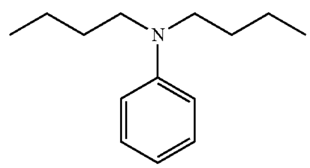
N-4
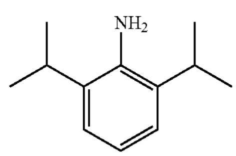
N-5
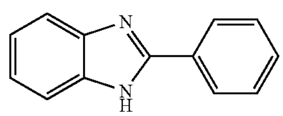
N-6
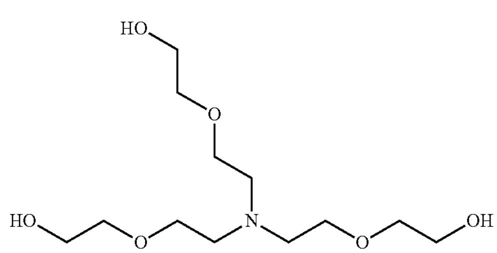

-continued

N-7

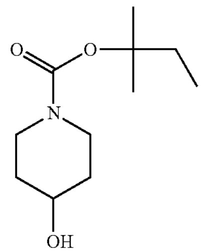

N-8

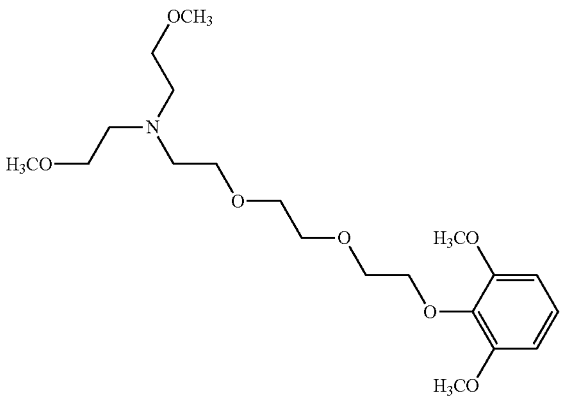

<Hydrophobic Resin>

The hydrophobic resin used was appropriately selected from Resins (HR-1) to (HR-90).

<Surfactant>

The followings were used as the surfactant.

W-1: Megaface F176 (produced by Dainippon Ink and Chemicals, Inc.) (fluorine-containing)

W-2: Megaface R08 (produced by Dainippon Ink and Chemicals, Inc.) (fluorine- and silicon-containing)

W-3: Polysiloxane Polymer KP-341 (produced by Shin-Etsu Chemical Co., Ltd.) (silicon-containing)

W-4: Troysol S-366 (produced by Troy Chemical)

W-5: KH-20 (produced by Asahi Glass Co., Ltd.)

W-6: PolyFox PF-6320 (produced by OMNOVA Solutions Inc., fluorine-containing)

<Solvent>

The followings were used as the solvent.

(Group a)

SL-1: Propylene glycol monomethyl ether acetate (PGMEA)

SL-2: Propylene glycol monomethyl ether propionate

SL-3: 2-Heptanone (Group b)

SL-4: Ethyl lactate

SL-5: Propylene glycol monomethyl ether (PGME)

SL-6: Cyclohexanone (Group c)

SL-7: γ-Butyrolactone

SL-8: Propylene carbonate

<Developer>

The followings were used as the developer.

SG-1: Butyl acetate

SG-2: Methyl amyl ketone

SG-3: Ethyl-3-ethoxypropionate

SG-4: Pentyl acetate

SG-5: Isopentyl acetate

SG-6: Propylene glycol monomethyl ether acetate (PGMEA)

SG-7: Cyclohexane

<Rinsing Solution>

The followings were used as the rinsing solution.

SR-1: 4-Methyl-2-pentanol

SR-2: 1-Hexanol

SR-3: Butyl acetate

SR-4: Methyl amyl ketone

SR-5: Ethyl-3-ethoxypropionate

<ArF Dry Exposure>

(Preparation of Resist)

The components shown in Table 1 below were dissolved in the solvent shown in the same Table to have an entire solid content of 3.8 mass %, and the obtained solution was filtered through a polyethylene filter having a pore size of 0.1 μm to prepare an actinic ray-sensitive or radiation-sensitive resin composition (resist composition). An organic antireflection film, ARC29SR (produced by Nissan Chemical Industries, Ltd.), was applied on a silicon wafer and baked at 205° C. over 60 seconds to form an antireflection film having a thickness of 86 nm, and the actinic ray-sensitive or radiation-sensitive resin composition prepared above was applied thereon and baked (PB: Prebake) at 100° C. over 60 seconds to form a resist film having a thickness of 100 nm The obtained resist film was subjected to pattern exposure by using an ArF excimer laser scanner (PAS5500/1100, manufactured by ASML, NA: 0.75, Dipole, outer sigma: 0.89, inner sigma: 0.65). Here, a 6% halftone mask with line size=75 nm and line:space=1:1 was used as the reticle. Thereafter, the resist film was heated (PEB: Post Exposure Bake) at 105° C. for 60 seconds, subsequently developed by puddling the developer shown in the Table below for 30 seconds and then rinsed by puddling the rinsing solution shown in the Table below for 30 seconds and thereafter, the wafer was spun at a rotation speed of 4,000 rpm for 30 seconds to obtain a line-and-space pattern of 75 nm.

[Exposure Latitude (EL, %)]

The exposure dose for reproducing a line-and-space (line:space=1:1) mask pattern with a line width of 75 nm was determined and taken as the optimal exposure dose $E_{opt}$. Subsequently, the exposure dose when the line width becomes the target value 75 nm±10% (that is, 67.5 nm and 82.5 nm) was determined, and the exposure latitude (EL) defined by the following formula was calculated. As the EL value is larger, the change of performance due to change in the exposure dose is smaller.

$$[\text{EL }(\%)]=[(\text{exposure dose when the line width becomes 82.5 nm})-(\text{exposure dose when the line width becomes 67.5 nm})]/E_{opt}$$

[Line Width Roughness (LWR, m)]

In the observation of a line-and-space resist pattern of 75 nm (1:1) resolved at the optimal exposure dose in the evaluation of exposure latitude, at the time of observing the pattern from the above by a Critical Dimension scanning electron microscope (SEM, S-9380II, manufactured by Hitachi Ltd.), the line width was measured at arbitrary points and the measurement variation was evaluated by 3σ. A smaller value indicates higher performance.

These evaluation results are shown in Table 1 below.

TABLE 1

| Example | Resin | (g) | Compound (B) | (g) | Compound (C) | (g) | Basic Compound | (g) | Solvent | Mass ratio |
|---|---|---|---|---|---|---|---|---|---|---|
| Example 1 | P-7 | 10 | PAG-4 | 1.10 | N-1/N-2 | 0.4/0.4 | | | SL-1/SL-5 | 60/40 |
| Example 2 | P-3 | 10 | PAG-8 | 1.26 | N-2 | 0.54 | | | SL-1/SL-7 | 70/30 |
| Example 3 | P-4 | 10 | PAG-6 | 1.12 | | | N-5 | 0.14 | SL-1/SL-5 | 60/40 |
| Example 4 | P-8 | 10 | PAG-6 | 1.04 | | | N-4/N-7 | 0.04/0.04 | SL-1/SL-4 | 90/10 |
| Example 5 | P-17 | 10 | PAG-3 | 1.32 | | | N-5 | 0.12 | SL-1/SL-5 | 60/40 |
| Example 6 | P-16 | 10 | PAG-3 | 1.18 | N-1 | 0.44 | | | SL-1/SL-5 | 60/40 |
| Example 7 | P-30 | 10 | PAG-3 | 1.24 | | | N-8 | 0.12 | SL-1 | 100 |
| Example 8 | P-15 | 10 | PAG-4 | 1.04 | N-2 | 0.76 | | | SL-1/SL-5 | 60/40 |
| Example 9 | P-6 | 10 | PAG-11 | 2.40 | N-1 | 0.58 | | | SL-1/SL-5 | 60/40 |
| Example 10 | P-26 | 10 | PAG-4 | 1.32 | N-1 | 0.64 | | | SL-5/SL-6 | 30/70 |
| Example 11 | P-4 | 10 | PAG-4 | 1.46 | N-2 | 0.64 | | | SL-1/SL-5 | 60/40 |
| Example 12 | P-5 | 10 | PAG-8 | 1.28 | | | N-5 | 0.08 | SL-1/SL-5 | 70/30 |
| Example 13 | P-11 | 10 | PAG-12 | 2.40 | N-1 | 0.62 | N-5 | 0.04 | SL-1/SL-5 | 60/40 |
| Example 14 | P-12 | 10 | PAG-6 | 1.50 | | | N-3 | 0.14 | SL-1/SL-3 | 80/20 |
| Example 15 | P-7 | 10 | PAG-5 | 1.44 | | | N-8 | 0.14 | SL-1/SL-2 | 90/10 |
| Example 16 | P-12 | 10 | PAG-3 | 1.44 | N-1 | 0.70 | | | SL-1/SL-5 | 60/40 |
| Example 17 | P-13 | 10 | PAG-6 | 1.28 | N-2 | 0.58 | | | SL-1/SL-5 | 80/20 |
| Example 18 | P-29 | 10 | PAG-2 | 0.86 | N-1 | 0.80 | | | SL-1/SL-5 | 60/40 |
| Example 19 | P-9 | 10 | PAG-3 | 1.22 | | | N-5 | 0.16 | SL-1/SL-5 | 80/20 |
| Example 20 | P-2/P-10 | 5/5 | PAG-5 | 1.48 | | | N-6 | 0.14 | SL-1/SL-5 | 60/40 |
| Example 21 | P-18 | 10 | PAG-7 | 1.24 | | | N-5 | 0.10 | SL-1 | 100 |
| Example 22 | P-22 | 10 | PAG-1 | 1.00 | N-1 | 0.44 | | | SL-1/SL-5 | 60/40 |
| Example 23 | P-27 | 10 | PAG-5 | 1.22 | N-1 | 0.70 | | | SL-6/SL-5 | 60/40 |
| Example 24 | P-28 | 10 | PAG-6 | 1.00 | N-2 | 0.70 | | | SL-1/SL-5 | 60/40 |
| Example 25 | P-23 | 10 | PAG-6 | 1.08 | | | N-5 | 0.16 | SL-1/SL-5 | 70/30 |
| Example 26 | P-24 | 10 | PAG-7 | 1.28 | N-1 | 1.04 | | | SL-1/SL-5 | 60/40 |
| Example 27 | P-11 | 10 | PAG-4 | 1.32 | | | N-4 | 0.16 | SL-1/SL-5 | 70/30 |
| Example 28 | P-23 | 10 | PAG-9/PAG-6 | 1.0/1.0 | N-1 | 0.80 | | | SL-1/SL-8 | 90/10 |
| Example 29 | P-9 | 10 | PAG-7 | 1.32 | N-1 | 0.80 | | | SL-1/SL-5 | 60/40 |
| Example 30 | P-25 | 10 | PAG-1/PAG-6 | 0.7/0.5 | | | N-6 | 0.12 | SL-1/SL-5 | 70/30 |
| Example 31 | P-20 | 10 | PAG-6 | 0.84 | | | N-3/N-8 | 0.04/0.04 | SL-1/SL-5 | 60/40 |
| Example 32 | P-17 | 10 | PAG-6 | 1.06 | N-2 | 0.56 | | | SL-1 | 100 |
| Example 33 | P-14 | 10 | PAG-4 | 1.18 | N-1 | 0.84 | | | SL-1/SL-5 | 60/40 |
| Example 34 | P-19 | 10 | PAG-3 | 1.40 | N-1 | 0.64 | | | SL-1/SL-5 | 60/40 |
| Example 35 | P-18 | 10 | PAG-3 | 1.48 | N-1 | 0.46 | | | SL-1 | 100 |
| Example 36 | P-31 | 10 | PAG-3 | 1.04 | N-1 | 0.64 | N-4 | 0.06 | SL-1/SL-5 | 60/40 |
| Example 37 | P-5 | 10 | PAG-3/PAG-10 | 1.0/0.4 | N-2 | 0.64 | | | SL-1/SL-5 | 80/20 |
| Example 38 | P-2 | 10 | PAG-8 | 1.24 | | | N-5 | 0.16 | SL-1/SL-5 | 60/40 |
| Example 39 | P-3 | 10 | PAG-2 | 1.04 | | | N-5 | 0.16 | SL-5/SL-6 | 30/70 |
| Example 40 | P-10 | 10 | PAG-6 | 1.16 | N-1 | 0.64 | | | SL-1/SL-5 | 60/40 |
| Example 41 | P-1/P-36 | 9/1 | PAG-7 | 1.64 | | | N-3 | 0.14 | SL-1/SL-5 | 80/20 |
| Example 42 | P-1 | 10 | PAG-3 | 1.20 | N-1 | 0.86 | | | SL-1/SL-5 | 70/30 |
| Example 43 | P-21 | 10 | PAG-4 | 1.32 | | | N-5 | 0.14 | SL-1/SL-5 | 60/40 |
| Example 44 | P-19 | 10 | PAG-5 | 0.98 | | | N-6 | 0.12 | SL-1/SL-5 | 60/40 |
| Example 45 | P-20 | 10 | PAG-2 | 1.00 | N-2 | 0.44 | | | SL-1/SL-5 | 70/30 |
| Example 46 | P-6 | 10 | PAG-7 | 1.28 | | | N-6 | 0.14 | SL-1/SL-5 | 60/40 |
| Example 47 | P-32 | 10 | PAG-4 | 1.46 | | | N-5 | 0.14 | SL-6/SL-5 | 60/40 |
| Example 48 | P-27 | 10 | PAG-8 | 1.48 | | | N-5 | 0.12 | SL-1/SL-5 | 60/40 |
| Example 49 | P-24 | 10 | PAG-2 | 1.00 | | | N-8 | 0.10 | SL-1/SL-5 | 80/20 |
| Example 50 | P-21 | 10 | PAG-8 | 1.46 | N-1 | 1.04 | | | SL-1/SL-5 | 60/40 |
| Comparative Example 1 | P-33 | 10 | PAG-3 | 1.50 | | | N-5 | 0.14 | SL-1/SL-5 | 60/40 |
| Comparative Example 2 | P-34 | 10 | PAG-3 | 1.44 | | | N-5 | 0.14 | SL-1/SL-5 | 60/40 |
| Comparative Example 3 | P-35 | 10 | PAG-3 | 1.48 | | | N-5 | 0.12 | SL-1/SL-5 | 60/40 |
| Comparative Example 4 | P-36 | 10 | PAG-3 | 1.38 | | | N-5 | 0.12 | SL-1/SL-5 | 60/40 |

| Example | Surfactant | (g) | Developer | Mass Ratio | Rinsing Solution | Mass Ratio | EL (%) | LWR (nm) |
|---|---|---|---|---|---|---|---|---|
| Example 1 | W-1 | 0.003 | SG-1 | 100 | SR-1 | 100 | 18.1 | 4.7 |
| Example 2 | W-3 | 0.003 | SG-1 | 100 | SR-1 | 100 | 17.5 | 4.9 |
| Example 3 | W-1 | 0.003 | SG-1 | 100 | SR-1/SR-2 | 90/10 | 18.4 | 4.9 |
| Example 4 | W-1 | 0.003 | SG-1 | 100 | SR-1 | 100 | 14.3 | 6.8 |
| Example 5 | W-2 | 0.003 | SG-1 | 100 | SR-1 | 100 | 18.3 | 4.8 |
| Example 6 | W-1 | 0.003 | SG-1 | 100 | SR-1 | 100 | 18.7 | 4.6 |
| Example 7 | none | none | SG-1 | 100 | SR-1 | 100 | 17.1 | 5.0 |
| Example 8 | W-1 | 0.003 | SG-1 | 100 | SR-1 | 100 | 17.3 | 4.9 |
| Example 9 | W-5 | 0.003 | SG-1 | 100 | SR-1 | 100 | 17.4 | 4.7 |
| Example 10 | W-4 | 0.003 | SG-1 | 100 | SR-1/SR-3 | 90/10 | 17.1 | 5.1 |
| Example 11 | W-1 | 0.003 | SG-1 | 100 | SR-1 | 100 | 18.2 | 4.7 |
| Example 12 | W-2 | 0.003 | SG-1 | 100 | SR-1 | 100 | 16.2 | 5.4 |
| Example 13 | W-3 | 0.001 | SG-1/SG-4 | 50/50 | SR-1 | 100 | 18.1 | 4.8 |
| Example 14 | none | none | SG-1 | 100 | SR-1 | 100 | 15.9 | 5.7 |
| Example 15 | W-1 | 0.003 | SG-1 | 100 | SR-1 | 100 | 17.1 | 4.7 |

TABLE 1-continued

| | | | | | | | | |
|---|---|---|---|---|---|---|---|---|
| Example 16 | W-6 | 0.003 | SG-2 | 100 | SR-1 | 100 | 17.2 | 4.9 |
| Example 17 | W-1 | 0.003 | SG-1 | 100 | SR-1 | 100 | 18.5 | 4.4 |
| Example 18 | None | none | SG-1 | 100 | SR-1 | 100 | 17.1 | 4.7 |
| Example 19 | W-1 | 0.003 | SG-1 | 100 | SR-1 | 100 | 18.1 | 4.7 |
| Example 20 | W-4 | 0.003 | SG-1 | 100 | SR-1 | 100 | 16.2 | 5.5 |
| Example 21 | W-5 | 0.003 | SG-1 | 100 | SR-1 | 100 | 16.1 | 5.4 |
| Example 22 | W-2 | 0.003 | SG-1 | 100 | SR-1 | 100 | 18.3 | 4.7 |
| Example 23 | W-1 | 0.003 | SG-1 | 100 | SR-1 | 100 | 16.2 | 5.9 |
| Example 24 | W-6 | 0.003 | SG-1 | 100 | SR-1 | 100 | 16.9 | 5.5 |
| Example 25 | W-3 | 0.003 | SG-1 | 100 | SR-1/SR-4 | 80/20 | 16.4 | 5.6 |
| Example 26 | W-1/W-6 | 0.002/0.001 | SG-1 | 100 | SR-1 | 100 | 18.1 | 4.8 |
| Example 27 | W-1 | 0.003 | SG-1 | 100 | SR-1 | 100 | 15.9 | 5.6 |
| Example 28 | W-1 | 0.003 | SG-1/SG-3 | 90/10 | SR-1 | 100 | 16.9 | 4.8 |
| Example 29 | W-2 | 0.003 | SG-1 | 100 | SR-1 | 100 | 18.6 | 4.2 |
| Example 30 | none | none | SG-1/SG-2 | 80/20 | SR-1 | 100 | 18.4 | 4.8 |
| Example 31 | W-1 | 0.003 | SG-1 | 100 | SR-1 | 100 | 16.3 | 5.7 |
| Example 32 | W-6 | 0.002 | SG-5 | 100 | SR-1 | 100 | 18.7 | 4.3 |
| Example 33 | W-4 | 0.003 | SG-1 | 100 | SR-1 | 100 | 18.1 | 4.7 |
| Example 34 | W-5 | 0.003 | SG-1 | 100 | SR-1 | 100 | 18.5 | 4.4 |
| Example 35 | W-1 | 0.003 | SG-1 | 100 | SR-1 | 100 | 17.4 | 4.8 |
| Example 36 | W-2 | 0.003 | SG-1 | 100 | SR-1 | 100 | 18.3 | 4.8 |
| Example 37 | W-1 | 0.003 | SG-1 | 100 | SR-1 | 100 | 17.1 | 5.1 |
| Example 38 | W-1 | 0.003 | SG-1 | 100 | SR-1 | 100 | 17.7 | 5.0 |
| Example 39 | W-6 | 0.003 | SG-1 | 100 | SR-1 | 100 | 16.4 | 5.6 |
| Example 40 | W-2/W-3 | 0.001/0.002 | SG-1 | 100 | SR-1/SR-5 | 90/10 | 16.5 | 5.5 |
| Example 41 | W-1 | 0.003 | SG-1 | 100 | SR-1 | 100 | 16.7 | 5.4 |
| Example 42 | none | none | SG-1/SG-7 | 90/10 | SR-1 | 100 | 18.6 | 4.4 |
| Example 43 | W-3 | 0.001 | SG-1 | 100 | SR-1 | 100 | 13.9 | 6.2 |
| Example 44 | W-5 | 0.003 | SG-1 | 100 | SR-1 | 100 | 18.3 | 4.7 |
| Example 45 | W-1 | 0.003 | SG-1 | 100 | SR-1 | 100 | 17.3 | 5.3 |
| Example 46 | W-6 | 0.003 | SG-1/SG-6 | 90/10 | SR-1 | 100 | 16.2 | 5.7 |
| Example 47 | W-2 | 0.003 | SG-1 | 100 | SR-1 | 100 | 15.8 | 6.1 |
| Example 48 | W-4 | 0.003 | SG-1 | 100 | SR-1 | 100 | 16.7 | 5.6 |
| Example 49 | W-1 | 0.002 | SG-1 | 100 | SR-1 | 100 | 17.0 | 5.2 |
| Example 50 | none | none | SG-1 | 100 | SR-1 | 100 | 17.5 | 5.1 |
| Comparative Example 1 | W-1 | 0.003 | SG-1 | 100 | SR-1 | 100 | 8.4 | 9.2 |
| Comparative Example 2 | W-1 | 0.003 | SG-1 | 100 | SR-1 | 100 | 9.8 | 8.5 |
| Comparative Example 3 | W-1 | 0.003 | SG-1 | 100 | SR-1 | 100 | 8.2 | 9.4 |
| Comparative Example 4 | W-1 | 0.003 | SG-1 | 100 | SR-1 | 100 | 7.8 | 8.9 |

As apparent from the results in Table 1, in Comparative Examples 1 to 4 where the acid-decomposable resin does not contain the repeating unit represented by formula (I), the line width roughness (LWR) is large and the exposure latitude (EL) is narrow, revealing that both LWR and EL are bad.

On the other hand, in Examples 1 to 50 using the resin (P) containing the repeating unit represented by formula (I), LWR is small and EL is wide, revealing that the performance is excellent in terms of both LWR and EL.

<ArF Immersion Exposure>

(Preparation of Resist>

The components shown in Table 2 below were dissolved in the solvent shown in the same Table to have an entire solid content of 3.8 mass %, and the obtained solution was filtered through a polyethylene filter having a pore size of 0.03 μm to prepare an actinic ray-sensitive or radiation-sensitive resin composition (resist composition). An organic antireflection film, ARC29SR (produced by Nissan Chemical Industries, Ltd.), was applied on a silicon wafer and baked at 205° C. for 60 seconds to form an antireflection film having a thickness of 95 nm, and the actinic ray-sensitive or radiation-sensitive resin composition prepared above was applied thereon and baked (PB: Prebake) at 100° C. over 60 seconds to form a resist film having a thickness of 100 nm.

The obtained wafer was subjected to pattern exposure by using an ArF excimer laser immersion scanner (XT1700i, manufactured by ASML, NA: 1.20, C-Quad, outer sigma: 0.900, inner sigma: 0.812, XY deflection) through a halftone mask having a square array where the hole size is 60 nm and the pitch between holes is 90 nm. As the immersion liquid, ultrapure water was used. Thereafter, the wafer was heated (PEB: Post Exposure Bake) at 105° C. for 60 seconds, subsequently developed by puddling the developer shown in the Table below for 30 seconds, then rinsed by puddling the rinsing solution shown in the Table below for 30 seconds, and thereafter spun at a rotation speed of 4,000 rpm for 30 seconds to obtain a contact hole pattern of 45 nm.

[Exposure Latitude (EL, %)]

The hole size was observed by a Critical Dimension scanning electron microscope (SEM: S-9380II, manufactured by Hitachi Ltd.), and the optimal exposure dose for resolving a contact hole pattern having a hole size of 45 nm was taken as the sensitivity ($E_{opt}$) (mJ/cm$^2$). On the basis of the determined optimal exposure dose ($E_{opt}$), the exposure dose when the hole size becomes the target value 45 nm±10% (that is, 40.5 nm and 49.5 nm) was determined, and the exposure latitude (EL, %) defined by the following formula was calculated. As the EL value is larger, the change of performance due to change in the exposure dose is smaller and this is better.

$$[\text{EL } (\%)] = [(\text{exposure dose when the pattern size becomes 40.5 nm}) - (\text{exposure dose when the pattern size becomes 49.5 nm})]/E_{opt}$$

[Uniformity of Local Pattern Dimension (Local CDU, m)]

In 20 regions separated from each other by a spacing of 1 μm within one shot exposed at the optimal exposure dose in the evaluation of exposure latitude, arbitrary 25 holes in each region, that is, 500 holes in total, were measured for the hole size and after determining the standard deviation thereof, 3σ was computed. A smaller value indicates smaller dimensional variation and higher performance.

[Film Thickness (nm) of Pattern Part]

The cross-sectional profile of each pattern at the optimal exposure dose above was observed by using a scanning electron microscope (S-4800, manufactured by Hitachi Ltd.). With respect to the resist remaining part in the hole pattern, the pattern height was measured. As the value is larger, the film loss is smaller and this is better.

These evaluation results are shown in Table 2 below.

TABLE 2

| Example | Resin | (g) | Compound (B) | (g) | Compound (C) | (g) | Basic Compound | (g) | Hydrophobic Compound (E) | (g) | Solvent | Mass Ratio |
|---|---|---|---|---|---|---|---|---|---|---|---|---|
| Example 51 | P-7 | 10 | PAG-4 | 1.10 | N-1/N-2 | 0.4/0.4 | | | HR-24 | 0.06 | SL-1/SL-5 | 60/40 |
| Example 52 | P-3 | 10 | PAG-8 | 1.26 | N-2 | 0.54 | | | HR-24 | 0.06 | SL-1/SL-7 | 70/30 |
| Example 53 | P-4 | 10 | PAG-6 | 1.12 | | | N-5 | 0.14 | HR-9 | 0.06 | SL-1/SL-5 | 60/40 |
| Example 54 | P-8 | 10 | PAG-6 | 1.04 | | | N-4/N-7 | 0.04/0.04 | HR-47 | 0.06 | SL-1/SL-4 | 90/10 |
| Example 55 | P-17 | 10 | PAG-3 | 1.32 | | | N-5 | 0.12 | HR-24 | 0.06 | SL-1/SL-5 | 60/40 |
| Example 56 | P-16 | 10 | PAG-3 | 1.18 | N-1 | 0.44 | | | HR-26 | 0.06 | SL-1/SL-5 | 60/40 |
| Example 57 | P-30 | 10 | PAG-3 | 1.24 | | | N-8 | 0.12 | HR-24/ HR-79 | 0.04/0.02 | SL-1 | 100 |
| Example 58 | P-15 | 10 | PAG-4 | 1.04 | N-2 | 0.76 | | | HR-24 | 0.06 | SL-1/SL-5 | 60/40 |
| Example 59 | P-6 | 10 | PAG-11 | 2.40 | N-1 | 0.58 | | | HR-24 | 0.06 | SL-1/SL-5 | 60/40 |
| Example 60 | P-26 | 10 | PAG-4 | 1.32 | N-1 | 0.64 | | | HR-3 | 0.06 | SL-5/SL-6 | 30/70 |
| Example 61 | P-4 | 10 | PAG-4 | 1.46 | N-2 | 0.64 | | | HR-24 | 0.06 | SL-1/SL-5 | 60/40 |
| Example 62 | P-5 | 10 | PAG-8 | 1.28 | | | N-5 | 0.08 | HR-26 | 0.06 | SL-1/SL-5 | 70/30 |
| Example 63 | P-11 | 10 | PAG-12 | 2.40 | N-1 | 0.62 | N-5 | 0.04 | HR-47 | 0.06 | SL-1/SL-5 | 60/40 |
| Example 64 | P-12 | 10 | PAG-6 | 1.50 | | | N-3 | 0.14 | HR-24 | 0.06 | SL-1/SL-3 | 80/20 |
| Example 65 | P-7 | 10 | PAG-5 | 1.44 | | | N-8 | 0.14 | HR-24 | 0.06 | SL-1/SL-2 | 90/10 |
| Example 66 | P-12 | 10 | PAG-3 | 1.44 | N-1 | 0.70 | | | HR-9 | 0.06 | SL-1/SL-5 | 60/40 |
| Example 67 | P-13 | 10 | PAG-6 | 1.28 | N-2 | 0.58 | | | HR-47 | 0.06 | SL-1/SL-5 | 80/20 |
| Example 68 | P-29 | 10 | PAG-2 | 0.86 | N-1 | 0.80 | | | HR-24 | 0.06 | SL-1/SL-5 | 60/40 |
| Example 69 | P-9 | 10 | PAG-3 | 1.22 | | | N-5 | 0.16 | HR-24 | 0.06 | SL-1/SL-5 | 80/20 |
| Example 70 | P-2/P-10 | 5/5 | PAG-5 | 1.48 | | | N-6 | 0.14 | HR-9 | 0.06 | SL-1/SL-5 | 60/40 |
| Example 71 | P-18 | 10 | PAG-7 | 1.24 | | | N-5 | 0.10 | HR-47 | 0.06 | SL-1 | 100 |
| Example 72 | P-22 | 10 | PAG-1 | 1.00 | N-1 | 0.44 | | | HR-47 | 0.06 | SL-1/SL-5 | 60/40 |
| Example 73 | P-27 | 10 | PAG-5 | 1.22 | N-1 | 0.70 | | | HR-24 | 0.06 | SL-6/SL-5 | 60/40 |
| Example 74 | P-28 | 10 | PAG-6 | 1.00 | N-2 | 0.70 | | | HR-47 | 0.06 | SL-1/SL-5 | 60/40 |
| Example 75 | P-23 | 10 | PAG-6 | 1.08 | | | N-5 | 0.16 | HR-24 | 0.06 | SL-1/SL-5 | 70/30 |
| Example 76 | P-24 | 10 | PAG-7 | 1.28 | N-1 | 1.04 | | | HR-47 | 0.06 | SL-1/SL-5 | 60/40 |
| Example 77 | P-11 | 10 | PAG-4 | 1.32 | | | N-4 | 0.16 | HR-3 | 0.06 | SL-1/SL-5 | 70/30 |
| Example 78 | P-23 | 10 | PAG-9/ PAG-6 | 1.0/1.0 | N-1 | 0.80 | | | HR-26 | 0.06 | SL-1/SL-8 | 90/10 |
| Example 79 | P-9 | 10 | PAG-7 | 1.32 | N-1 | 0.80 | | | HR-24 | 0.06 | SL-1/SL-5 | 60/40 |
| Example 80 | P-25 | 10 | PAG-1/ PAG-6 | 0.7/0.5 | | | N-6 | 0.12 | HR-24 | 0.06 | SL-1/SL-5 | 70/30 |
| Example 81 | P-20 | 10 | PAG-6 | 0.84 | | | N-3/N-8 | 0.04/0.04 | HR-24 | 0.06 | SL-1/SL-5 | 60/40 |
| Example 82 | P-17 | 10 | PAG-6 | 1.06 | N-2 | 0.56 | | | HR-3 | 0.06 | SL-1 | 100 |
| Example 83 | P-14 | 10 | PAG-4 | 1.18 | N-1 | 0.84 | | | HR-26 | 0.06 | SL-1/SL-5 | 60/40 |
| Example 84 | P-19 | 10 | PAG-3 | 1.40 | N-1 | 0.64 | | | HR-47 | 0.06 | SL-1/SL-5 | 60/40 |
| Example 85 | P-18 | 10 | PAG-3 | 1.48 | N-1 | 0.46 | | | HR-24 | 0.06 | SL-1 | 100 |
| Example 86 | P-31 | 10 | PAG-3 | 1.04 | N-1 | 0.64 | N-4 | 0.06 | HR-47 | 0.06 | SL-1/SL-5 | 60/40 |
| Example 87 | P-5 | 10 | PAG-3/ PAG-10 | 1.0/0.4 | N-2 | 0.64 | | | HR-24 | 0.06 | SL-1/SL-5 | 80/20 |
| Example 88 | P-2 | 10 | PAG-8 | 1.24 | | | N-5 | 0.16 | HR-3 | 0.06 | SL-1/SL-5 | 60/40 |
| Example 89 | P-3 | 10 | PAG-2 | 1.04 | | | N-5 | 0.16 | HR-24 | 0.06 | SL-5/SL-6 | 30/70 |
| Example 90 | P-10 | 10 | PAG-6 | 1.16 | N-1 | 0.64 | | | HR-47 | 0.06 | SL-1/SL-5 | 60/40 |
| Example 91 | P-1/P-36 | 9/1 | PAG-7 | 1.64 | | | N-3 | 0.14 | HR-24 | 0.06 | SL-1/SL-5 | 80/20 |
| Example 92 | P-1 | 10 | PAG-3 | 1.20 | N-1 | 0.86 | | | HR-47 | 0.06 | SL-1/SL-5 | 70/30 |
| Example 93 | P-21 | 10 | PAG-4 | 1.32 | | | N-5 | 0.14 | HR-47 | 0.06 | SL-1/SL-5 | 60/40 |
| Example 94 | P-19 | 10 | PAG-5 | 0.98 | | | N-6 | 0.12 | HR-24 | 0.06 | SL-1/SL-5 | 60/40 |
| Example 95 | P-20 | 10 | PAG-2 | 1.00 | N-2 | 0.44 | | | HR-24 | 0.06 | SL-1/SL-5 | 70/30 |
| Example 96 | P-6 | 10 | PAG-7 | 1.28 | | | N-6 | 0.14 | HR-47 | 0.06 | SL-1/SL-5 | 60/40 |
| Example 97 | P-32 | 10 | PAG-4 | 1.46 | | | N-5 | 0.14 | HR-47 | 0.06 | SL-6/SL-5 | 60/40 |
| Example 98 | P-27 | 10 | PAG-8 | 1.48 | | | N-5 | 0.12 | HR-9 | 0.06 | SL-1/SL-5 | 60/40 |
| Example 99 | P-24 | 10 | PAG-2 | 1.00 | | | N-8 | 0.10 | HR-24 | 0.06 | SL-1/SL-5 | 80/20 |
| Example 100 | P-21 | 10 | PAG-8 | 1.46 | N-1 | 1.04 | | | HR-3 | 0.06 | SL-1/SL-5 | 60/40 |
| Example 101 | P-1 | 10 | PAG-1 | 1.05 | N-1 | 0.86 | | | HR-47 | 0.06 | SL-1/SL-5 | 70/30 |
| Example 102 | P-1 | 10 | PAG-3 | 1.20 | | | N-3 | 0.14 | HR-47 | 0.06 | SL-1/SL-5 | 70/30 |
| Example 103 | P-1 | 10 | PAG-1 | 1.05 | | | N-3 | 0.14 | HR-47 | 0.06 | SL-1/SL-5 | 70/30 |
| Comparative Example 5 | P-33 | 10 | PAG-3 | 1.50 | | | N-5 | 0.14 | HR-24 | 0.06 | SL-1/SL-5 | 60/40 |
| Comparative Example 6 | P-34 | 10 | PAG-3 | 1.44 | | | N-5 | 0.14 | HR-24 | 0.06 | SL-1/SL-5 | 60/40 |
| Comparative Example 7 | P-35 | 10 | PAG-3 | 1.48 | | | N-5 | 0.12 | HR-24 | 0.06 | SL-1/SL-5 | 60/40 |
| Comparative Example 8 | P-36 | 10 | PAG-3 | 1.38 | | | N-5 | 0.12 | HR-24 | 0.06 | SL-1/SL-5 | 60/40 |

TABLE 2-continued

| Example | Surfactant | (g) | Developer | Mass Ratio | Rinsing Solution | Mass Ratio | Local CDU (nm) | EL (%) | Film Thickness of Pattern Part (nm) |
|---|---|---|---|---|---|---|---|---|---|
| Example 51 | W-1 | 0.003 | SG-1 | 100 | SR-1 | 100 | 4.3 | 19.0 | 86 |
| Example 52 | W-3 | 0.003 | SG-1 | 100 | SR-1 | 100 | 4.8 | 18.2 | 80 |
| Example 53 | W-1 | 0.003 | SG-1 | 100 | SR-1 | 100 | 4.4 | 19.3 | 85 |
| Example 54 | W-1 | 0.003 | SG-1 | 100 | SR-1 | 100 | 6.4 | 13.8 | 80 |
| Example 55 | W-2 | 0.003 | SG-1 | 100 | SR-1 | 100 | 4.3 | 19.3 | 84 |
| Example 56 | W-1 | 0.003 | SG-1 | 100 | SR-1 | 100 | 4.2 | 19.4 | 84 |
| Example 57 | none | none | SG-1 | 100 | SR-1 | 100 | 4.4 | 18.2 | 83 |
| Example 58 | W-1 | 0.003 | SG-1 | 100 | SR-1 | 100 | 4.9 | 18.3 | 83 |
| Example 59 | W-5 | 0.003 | SG-1 | 100 | SR-1 | 100 | 5.3 | 18.3 | 82 |
| Example 60 | W-4 | 0.003 | SG-1 | 100 | SR-1/SR-3 | 90/10 | 5.2 | 18.4 | 83 |
| Example 61 | W-1 | 0.003 | SG-1 | 100 | SR-1 | 100 | 4.3 | 18.0 | 84 |
| Example 62 | W-2 | 0.003 | SG-1 | 100 | SR-1 | 100 | 5.2 | 17.1 | 81 |
| Example 63 | W-3 | 0.001 | SG-1/SG-4 | 50/50 | SR-1 | 100 | 4.3 | 19.1 | 83 |
| Example 64 | none | none | SG-1 | 100 | SR-1 | 100 | 5.8 | 17.4 | 81 |
| Example 65 | W-1 | 0.003 | SG-1 | 100 | SR-1 | 100 | 5.2 | 17.7 | 84 |
| Example 66 | W-6 | 0.003 | SG-2 | 100 | SR-1 | 100 | 4.9 | 17.9 | 81 |
| Example 67 | W-1 | 0.003 | SG-1 | 100 | SR-1 | 100 | 4.3 | 19.5 | 84 |
| Example 68 | None | none | SG-1 | 100 | SR-1 | 100 | 5.3 | 17.8 | 81 |
| Example 69 | W-1 | 0.003 | SG-1 | 100 | SR-1 | 100 | 4.4 | 19.2 | 84 |
| Example 70 | W-4 | 0.003 | SG-1 | 100 | SR-1 | 100 | 5.4 | 17.8 | 82 |
| Example 71 | W-5 | 0.003 | SG-1 | 100 | SR-1 | 100 | 5.3 | 17.3 | 80 |
| Example 72 | W-2 | 0.003 | SG-1 | 100 | SR-1 | 100 | 4.4 | 19.0 | 84 |
| Example 73 | W-1 | 0.003 | SG-1 | 100 | SR-1 | 100 | 5.7 | 17.1 | 82 |
| Example 74 | W-6 | 0.003 | SG-1 | 100 | SR-1 | 100 | 4.9 | 18.2 | 81 |
| Example 75 | W-3 | 0.003 | SG-1 | 100 | SR-1/SR-4 | 80/20 | 5.7 | 16.8 | 80 |
| Example 76 | W-1/W-6 | 0.002/0.001 | SG-1 | 100 | SR-1 | 100 | 4.3 | 18.2 | 83 |
| Example 77 | W-1 | 0.003 | SG-1 | 100 | SR-1 | 100 | 5.2 | 17.8 | 83 |
| Example 78 | W-1 | 0.003 | SG-1/SG-3 | 90/10 | SR-1 | 100 | 5.2 | 18.2 | 81 |
| Example 79 | W-2 | 0.003 | SG-1 | 100 | SR-1 | 100 | 4.3 | 19.3 | 84 |
| Example 80 | none | none | SG-1/SG-2 | 80/20 | SR-1 | 100 | 4.4 | 19.1 | 84 |
| Example 81 | W-1 | 0.003 | SG-1 | 100 | SR-1 | 100 | 5.2 | 17.6 | 80 |
| Example 82 | W-6 | 0.002 | SG-5 | 100 | SR-1 | 100 | 4.3 | 19.4 | 84 |
| Example 83 | W-4 | 0.003 | SG-1 | 100 | SR-1 | 100 | 4.3 | 18.8 | 85 |
| Example 84 | W-5 | 0.003 | SG-1 | 100 | SR-1 | 100 | 4.2 | 19.5 | 84 |
| Example 85 | W-1 | 0.003 | SG-1 | 100 | SR-1 | 100 | 5.1 | 18.1 | 80 |
| Example 86 | W-2 | 0.003 | SG-1 | 100 | SR-1 | 100 | 4.4 | 19.3 | 83 |
| Example 87 | W-1 | 0.003 | SG-1 | 100 | SR-1 | 100 | 5.2 | 17.8 | 81 |
| Example 88 | W-1 | 0.003 | SG-1 | 100 | SR-1 | 100 | 5.2 | 18.2 | 83 |
| Example 89 | W-6 | 0.003 | SG-1 | 100 | SR-1 | 100 | 5.5 | 17.2 | 81 |
| Example 90 | W-2/W-3 | 0.001/0.002 | SG-1 | 100 | SR-1/SR-5 | 90/10 | 5.4 | 17.4 | 80 |
| Example 91 | W-1 | 0.003 | SG-1 | 100 | SR-1 | 100 | 5.3 | 17.4 | 82 |
| Example 92 | none | none | SG-1/SG-7 | 90/10 | SR-1 | 100 | 4.3 | 19.5 | 84 |
| Example 93 | W-3 | 0.001 | SG-1 | 100 | SR-1 | 100 | 6.1 | 13.7 | 80 |
| Example 94 | W-5 | 0.003 | SG-1 | 100 | SR-1 | 100 | 4.4 | 19.2 | 84 |
| Example 95 | W-1 | 0.003 | SG-1 | 100 | SR-1 | 100 | 4.8 | 18.9 | 80 |
| Example 96 | W-6 | 0.003 | SG-1/SG-6 | 90/10 | SR-1 | 100 | 5.2 | 16.8 | 80 |
| Example 97 | W-2 | 0.003 | SG-1 | 100 | SR-1 | 100 | 5.7 | 16.2 | 80 |
| Example 98 | W-4 | 0.003 | SG-1 | 100 | SR-1 | 100 | 5.2 | 17.6 | 80 |
| Example 99 | W-1 | 0.002 | SG-1 | 100 | SR-1 | 100 | 5.2 | 17.8 | 83 |
| Example 100 | none | none | SG-1 | 100 | SR-1 | 100 | 5.2 | 18.3 | 80 |
| Example 101 | none | none | SG-1/SG-7 | 90/10 | SR-1 | 100 | 5.3 | 19.1 | 82 |
| Example 102 | none | none | SG-1/SG-7 | 90/10 | SR-1 | 100 | 4.7 | 17.4 | 82 |
| Example 103 | none | none | SG-1/SG-7 | 90/10 | SR-1 | 100 | 5.4 | 17.3 | 82 |
| Comparative Example 5 | W-1 | 0.003 | SG-1 | 100 | SR-1 | 100 | 10.3 | 8.4 | 75 |
| Comparative Example 6 | W-1 | 0.003 | SG-1 | 100 | SR-1 | 100 | 8.8 | 9.7 | 68 |
| Comparative Example 7 | W-1 | 0.003 | SG-1 | 100 | SR-1 | 100 | 7.3 | 8.3 | 70 |
| Comparative Example 8 | W-1 | 0.003 | SG-1 | 100 | SR-1 | 100 | 7.4 | 6.3 | 72 |

As apparent from the results in Table 2, in Comparative Examples 5 to 8 where the acid-decomposable resin does not contain the repeating unit represented by formula (I), the exposure latitude (EL) is narrow, the local CDU is large, revealing that both EL and local CDU are bad, and the film thickness of the pattern part is small.

On the other hand, in Examples 51 to 100 using the resin (P) containing the repeating unit represented by formula (I), EL is wide, local CDU is small, revealing that the performance is excellent in terms of both EL and local CDU, and the film thickness of the pattern part is large.

Also, as seen from comparison, for example, between Example 92 and Example 101, when a compound capable of generating an acid represented by formula (III) upon irradiation with an actinic ray or radiation is used as the compound (B), local CDU is smaller.

Furthermore, as seen from comparison, for example, between Example 92 and Example 102, when the compound (C) is used, EL is wider.

INDUSTRIAL APPLICABILITY

According to the present invention, a pattern forming method, ensuring that the roughness performance such as line width roughness, the uniformity of local pattern dimension and the exposure latitude are excellent and reduction in the film thickness, so-called film loss, in the pattern part formed by development can be suppressed, an actinic ray-sensitive or radiation-sensitive resin composition used therefor, a resist film, a manufacturing method of an electronic device, and an electronic device can be provided.

This application is based on Japanese patent application No. JP 2011-075855 filed on Mar. 30, 2011 and U.S. Provisional Application No. 61/469,161 filed on Mar. 30, 2011, the entire contents of which are hereby incorporated by reference, the same as if set forth at length.

The invention claimed is:

1. A pattern forming method, comprising:

(i) a step of forming a film from an actinic ray-sensitive or radiation-sensitive resin composition containing (P) a resin having (a1) a repeating unit capable of decomposing by an action of an acid to produce a carboxyl group, represented by the following formula (I) and (B) a compound capable of generating an acid upon irradiation with an actinic ray or radiation;

(ii) a step of exposing the film; and (iii) a step of performing a development by using a developer containing an organic solvent to form a negative pattern:

(I)

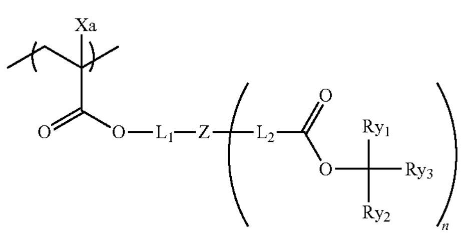

wherein Xa represents a hydrogen atom, an alkyl group, a cyano group or a halogen atom;

each of $Ry_1$ to $Ry_3$ independently represents an alkyl group or a cycloalkyl group, and two members out of $Ry_1$ to $Ry_3$ may combine to form a ring;

Z represents a (n+1)-valent linking group having a polycyclic hydrocarbon structure which may have a heteroatom as a ring member, provided that Z does not contain an ester bond as an atomic group constituting the polycyclic ring;

$L_1$ represents a single bond or a divalent linking group;

$L_2$ represents a single bond;

n represents an integer of 1 to 3;

when n is 2 or 3, a plurality of $L_2$'s, a plurality of $Ry_1$'s, a plurality of $Ry_2$'s and a plurality of $Ry_3$'s may be the same as or different, respectively;

the content of the repeating unit (a1) is 60 mol % or more based on all repeating units in the resin (P);

the number of carboxyl groups remaining in a polymer generated by decomposition of the repeating unit (a1) represented by formula (I) due to action of an acid is 1; and the step of performing the development includes only development performed by using the developer containing the organic solvent.

2. The pattern forming method according to claim 1, wherein in the repeating unit (a1), each of $Ry_1$ to $Ry_3$ is independently an alkyl group.

3. The pattern forming method according to claim 1, wherein the resin (P) further contains (a2) a repeating unit represented by the following formula (II):

(II)

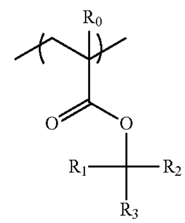

wherein $R_0$ represents a hydrogen atom, an alkyl group, a cyano group or a halogen atom; and each of $R_1$ to $R_3$ independently represents an alkyl group or a cycloalkyl group, and two members out of $R_1$ to $R_3$ may combine with each other to form a ring.

4. The pattern forming method according to claim 3, wherein in the repeating unit (a2), each of $R_1$ to $R_3$ is independently an alkyl group.

5. The pattern forming method according to claim 1, wherein the compound (B) is a compound capable of generating an organic acid represented by the following formula (III) or (IV) upon irradiation with an actinic ray or radiation:

(III)

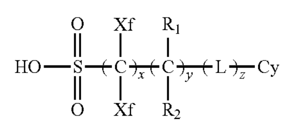

(IV)

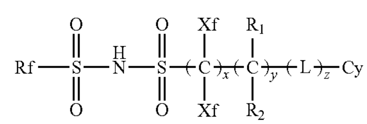

wherein each Xf independently represents a fluorine atom or an alkyl group substituted with at least one fluorine atom;

each of $R_1$ and $R_2$ independently represents a hydrogen atom, a fluorine atom or an alkyl group;

each L independently represents a divalent linking group;

Cy represents a cyclic organic group;

Rf represents a group containing a fluorine atom;

x represents an integer of 1 to 20;

y represents an integer of 0 to 10; and z represents an integer of 0 to 10.

6. The pattern forming method according to claim 1, wherein the actinic ray-sensitive or radiation-sensitive resin composition further contains a hydrophobic resin having at least either a fluorine atom or a silicon atom.

7. The pattern forming method according to claim 1, wherein the developer is a developer containing at least one kind of an organic solvent selected from the group consisting of a ketone-based solvent, an ester-based solvent, an alcohol-based solvent, an amide-based solvent and an ether-based solvent.

8. The pattern forming method according to claim 1, further comprising:

(iv) a step of performing a rinsing by using a rinsing solution containing an organic solvent.

9. The pattern forming method according to claim 1, wherein the exposure in the step (ii) is immersion exposure.

10. A manufacturing method of an electronic device, comprising:

the pattern forming method according to claim 1.

11. An actinic ray-sensitive or radiation-sensitive resin composition comprising (P) a resin having (a1) a repeating unit capable of decomposing by an action of an acid to produce a carboxyl group, represented by the following formula (I), (B) a compound capable of generating an acid upon irradiation with an actinic ray or radiation, and (C) a basic compound or ammonium salt compound whose basicity is reduced upon irradiation with an actinic ray or radiation:

(I)

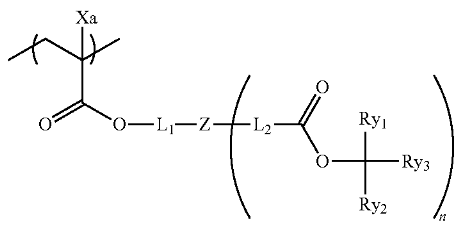

wherein Xa represents a hydrogen atom, an alkyl group, a cyano group or a halogen atom;

each of $Ry_1$ to $Ry_3$ independently represents an alkyl group or a cycloalkyl group, and two members out of $Ry_1$ to $Ry_3$ may combine to form a ring;

Z represents a (n+1)-valent linking group having a polycyclic hydrocarbon structure which may have a heteroatom as a ring member, provided that Z does not contain an ester bond as an atomic group constituting the polycyclic ring;

$L_1$ represents a single bond or a divalent linking group;

$L_2$ represents a single bond;

n represents an integer of 1 to 3;

when n is 2 or 3, a plurality of $L_2$'s, a plurality of $Ry_1$'s, a plurality of $Ry_2$'s and a plurality of $Ry_3$'s may be the same as or different, respectively; and the content of the repeating unit (a1) is 60 mol % or more based on all repeating units in the resin (P).

12. A resist film, which is formed from the actinic ray-sensitive or radiation-sensitive resin composition according to claim 11.

13. A pattern forming method, comprising:

(i) a step of forming a film from an actinic ray-sensitive or radiation-sensitive resin composition containing (P) a resin having (a1) a repeating unit capable of decomposing by an action of an acid to produce a carboxyl group, represented by the following formula (I) and (B) a compound capable of generating an acid upon irradiation with an actinic ray or radiation;

(ii) a step of exposing the film; and (iii) a step of performing a development by using a developer containing an organic solvent to form a negative pattern:

(I)

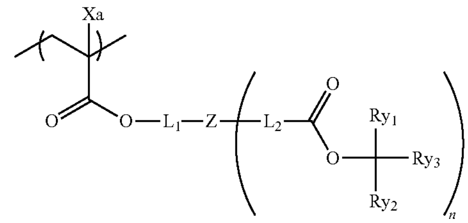

wherein Xa represents a hydrogen atom, an alkyl group, a cyano group or a halogen atom;

each of $Ry_1$ to $Ry_3$ independently represents an alkyl group or a cycloalkyl group, and two members out of $Ry_1$ to $Ry_3$ may combine to form a ring;

Z represents a (n+1)-valent linking group having a polycyclic hydrocarbon structure which may have a heteroatom as a ring member, provided that Z does not contain an ester bond as an atomic group constituting the polycyclic ring;

$L_1$ represents a divalent linking group;

$L_2$ represents a single bond, a —COO-alkylene group-, a —O-alkylene group- or a —O-cycloalkylene group-;

n represents an integer of 1 to 3;

when n is 2 or 3, a plurality of $L_2$'s, a plurality of $Ry_1$'s, a plurality of $Ry_2$'s and a plurality of $Ry_3$'s may be the same as or different, respectively;

the number of carboxyl groups remaining in a polymer generated by decomposition of the repeating unit (a1) represented by formula (I) due to action of an acid is 1; and the step of performing the development includes only development performed by using the developer containing the organic solvent.

14. The pattern forming method according to claim 13, wherein $L_1$ is selected from the group consisting of —COO—, —OCO—, —CONH—, —NHCO—, —CO—, —O—, —S—, —SO—, —$SO_2$—, an alkylene group, a cycloalkylene group, an alkenylene group, and a linking group formed by combining a plurality of these members.

15. The pattern forming method according to claim 14, wherein $L_1$ is an alkylene group or -alkylene-COO— group.

16. The pattern forming method according to claim 13, wherein the content of the repeating unit (a1) is 60 mol % or more based on all repeating units in the resin (P).

17. The pattern forming method according to claim 13, wherein the compound (B) is a compound capable of generating an organic acid represented by the following formula (III) or (IV) upon irradiation with an actinic ray or radiation:

(III)

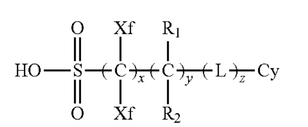

(IV)

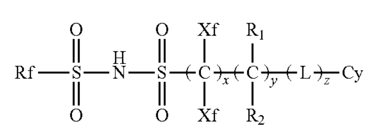

wherein each Xf independently represents a fluorine atom or an alkyl group substituted with at least one fluorine atom;

each of $R_1$ and $R_2$ independently represents a hydrogen atom, a fluorine atom or an alkyl group;

each L independently represents a divalent linking group;

Cy represents a cyclic organic group;

Rf represents a group containing a fluorine atom;

x represents an integer of 1 to 20;

y represents an integer of 0 to 10; and z represents an integer of 0 to 10.

18. The pattern forming method according to claim 13, wherein the actinic ray-sensitive or radiation-sensitive resin composition further contains (C) a basic compound or ammonium salt compound whose basicity is reduced upon irradiation with an actinic ray or radiation.

19. The pattern forming method according to claim 13, wherein the actinic ray-sensitive or radiation-sensitive resin composition further contains a hydrophobic resin having at least either a fluorine atom or a silicon atom.

20. The pattern forming method according to claim 13, wherein the developer is a developer containing at least one kind of an organic solvent selected from the group consisting of a ketone-based solvent, an ester-based solvent, an alcohol-based solvent, an amide-based solvent and an ether-based solvent.

21. A manufacturing method of an electronic device, comprising:

the pattern forming method according to claim 13.

22. An actinic ray-sensitive or radiation-sensitive resin composition comprising (P) a resin having (a1) a repeating unit capable of decomposing by an action of an acid to produce a carboxyl group, represented by the following formula (I) and (B) a compound capable of generating an acid upon irradiation with an actinic ray or radiation:

(I)

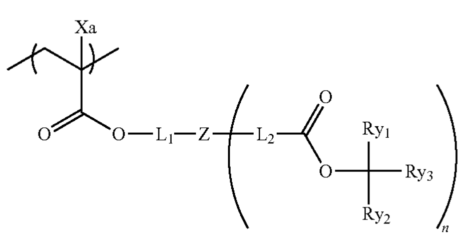

wherein Xa represents a hydrogen atom, an alkyl group, a cyano group or a halogen atom;

each of $Ry_1$ to $Ry_3$ independently represents an alkyl group or a cycloalkyl group, and two members out of $Ry_1$ to $Ry_3$ may combine to form a ring;

Z represents a (n+1)-valent linking group having a polycyclic hydrocarbon structure which may have a heteroatom as a ring member, provided that Z does not contain an ester bond as an atomic group constituting the polycyclic ring;

$L_1$ represents a divalent linking group;

$L_2$ represents a single bond, a —COO-alkylene group-, a —O-alkylene group- or a —O-cycloalkylene group-;

n represents an integer of 1 to 3; and when n is 2 or 3, a plurality of $L_2$'s, a plurality of $Ry_1$'s, a plurality of $Ry_2$'s and a plurality of $Ry_3$'s may be the same as or different, respectively.

23. The actinic ray-sensitive or radiation-sensitive resin composition according to claim 22, wherein $L_1$ is selected from the group consisting of —COO—, —OCO—, —CONH—, —NHCO—, —CO—, —O—, —S—, —SO—, —$SO_2$—, an alkylene group, a cycloalkylene group, an alkenylene group, and a linking group formed by combining a plurality of these members.

24. The actinic ray-sensitive or radiation-sensitive resin composition according to claim 23, wherein $L_1$ is an alkylene group or -alkylene-COO— group.

25. The actinic ray-sensitive or radiation-sensitive resin composition according to claim 22, wherein the content of the repeating unit (a1) is 60 mol % or more based on all repeating units in the resin (P).

26. The actinic ray-sensitive or radiation-sensitive resin composition according to claim 22, wherein the compound (B) is a compound capable of generating an organic acid represented by the following formula (III) or (IV) upon irradiation with an actinic ray or radiation:

(III)

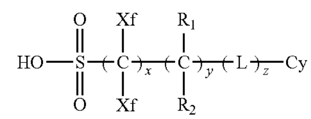

(IV)

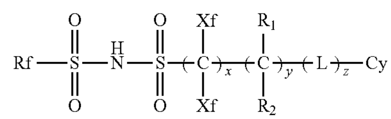

wherein each Xf independently represents a fluorine atom or an alkyl group substituted with at least one fluorine atom;

each of $R_1$ and $R_2$ independently represents a hydrogen atom, a fluorine atom or an alkyl group;

each L independently represents a divalent linking group;

Cy represents a cyclic organic group;

Rf represents a group containing a fluorine atom;

x represents an integer of 1 to 20;

y represents an integer of 0 to 10; and z represents an integer of 0 to 10.

27. The actinic ray-sensitive or radiation-sensitive resin composition according to claim 22, wherein the actinic ray-sensitive or radiation-sensitive resin composition further contains (C) a basic compound or ammonium salt compound whose basicity is reduced upon irradiation with an actinic ray or radiation.

28. The actinic ray-sensitive or radiation-sensitive resin composition according to claim 22, wherein the actinic ray-sensitive or radiation-sensitive resin composition further contains a hydrophobic resin having at least either a fluorine atom or a silicon atom.

29. A pattern forming method, comprising:

(i) a step of forming a film from an actinic ray-sensitive or radiation-sensitive resin composition containing (P) a resin having (a1) a repeating unit capable of decomposing by an action of an acid to produce a carboxyl group, represented by the following formula (I) and (B) a compound capable of generating an acid upon irradiation with an actinic ray or radiation;

(ii) a step of exposing the film; and (iii) a step of performing a development by using a developer containing an organic solvent to form a negative pattern:

(I)

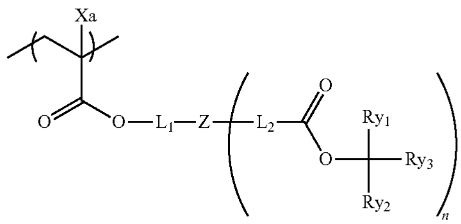

wherein Xa represents a hydrogen atom, an alkyl group, a cyano group or a halogen atom;

each of $Ry_1$ to $Ry_3$ independently represents an alkyl group or a cycloalkyl group, and two members out of $Ry_1$ to $Ry_3$ may combine to form a ring;

Z represents a (n+1)-valent linking group having a polycyclic hydrocarbon structure which may have a heteroatom as a ring member, provided that Z does not contain an ester bond as an atomic group constituting the polycyclic ring;

$L_1$ represents a single bond or a divalent linking group, and $L_2$ represents a single bond, a —COO-alkylene group-, a —O-alkylene group- or a —O-cycloalkylene group-, provided that $L_1$ and $L_2$ bond to one and the same carbon atom in Z;

n represents an integer of 1 to 3;

when n is 2 or 3, a plurality of $L_2$'s, a plurality of $Ry_1$'s, a plurality of $Ry_1$'s and a plurality of $Ry_3$'s may be the same as or different, respectively;

the number of carboxyl groups remaining in a polymer generated by decomposition of the repeating unit (a1) represented by formula (I) due to action of an acid is 1; and the step of performing the development includes only development performed by using the developer containing the organic solvent.

30. The pattern forming method according to claim 29, wherein the content of the repeating unit (a1) is 60 mol % or more based on all repeating units in the resin (P).

31. The pattern forming method according to claim 29, wherein the compound (B) is a compound capable of generating an organic acid represented by the following formula (III) or (IV) upon irradiation with an actinic ray or radiation:

(III)

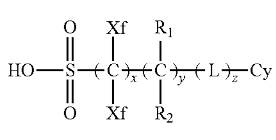

(IV)

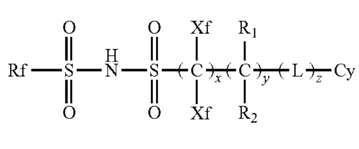

wherein each Xf independently represents a fluorine atom or an alkyl group substituted with at least one fluorine atom;

each of $R_1$ and $R_2$ independently represents a hydrogen atom, a fluorine atom or an alkyl group;

each L independently represents a divalent linking group;

Cy represents a cyclic organic group;

Rf represents a group containing a fluorine atom;

x represents an integer of 1 to 20;

y represents an integer of 0 to 10; and z represents an integer of 0 to 10.

32. The pattern forming method according to claim 29, wherein the actinic ray-sensitive or radiation-sensitive resin composition further contains (C) a basic compound or ammonium salt compound whose basicity is reduced upon irradiation with an actinic ray or radiation.

33. The pattern forming method according to claim 29, wherein the actinic ray-sensitive or radiation-sensitive resin composition further contains a hydrophobic resin having at least either a fluorine atom or a silicon atom.

34. The pattern forming method according to claim 29, wherein the developer is a developer containing at least one kind of an organic solvent selected from the group consisting of a ketone-based solvent, an ester-based solvent, an alcohol-based solvent, an amide-based solvent and an ether-based solvent.

35. A manufacturing method of an electronic device, comprising:

the pattern forming method according to claim 29.

36. An actinic ray-sensitive or radiation-sensitive resin composition comprising (P) a resin having (a1) a repeating unit capable of decomposing by an action of an acid to produce a carboxyl group, represented by the following formula (I) and (B) a compound capable of generating an acid upon irradiation with an actinic ray or radiation:

(I)

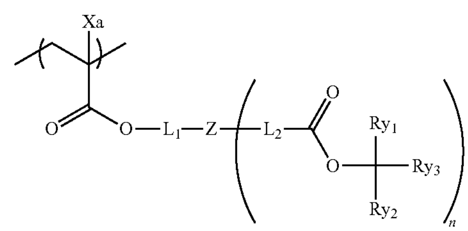

wherein Xa represents a hydrogen atom, an alkyl group, a cyano group or a halogen atom;

each of $Ry_1$ to $Ry_3$ independently represents an alkyl group or a cycloalkyl group, and two members out of $Ry_1$ to $Ry_3$ may combine to form a ring;

Z represents a (n+1)-valent linking group having a polycyclic hydrocarbon structure which may have a heteroatom as a ring member, provided that Z does not contain an ester bond as an atomic group constituting the polycyclic ring;

$L_1$ represents a single bond or a divalent linking group, and $L_2$ represents a single bond, a —COO-alkylene group-, a —O-alkylene group- or a —O-cycloalkylene group-, provided that $L_1$ and $L_2$ bond to one and the same carbon atom in Z;

n represents an integer of 1 to 3; and when n is 2 or 3, a plurality of $L_2$'s, a plurality of $Ry_1$'s, a plurality of $Ry_2$'s and a plurality of $Ry_3$'s may be the same as or different, respectively.

37. The composition according to claim 36, wherein the content of the repeating unit (a1) is 60 mol % or more based on all repeating units in the resin (P).

38. The composition according to claim 36, wherein the compound (B) is a compound capable of generating an organic acid represented by the following formula (III) or (IV) upon irradiation with an actinic ray or radiation:

(III)

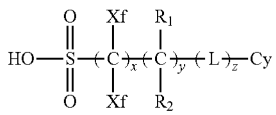

(IV)

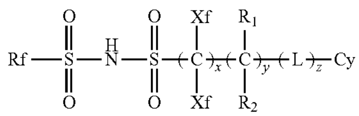

wherein each Xf independently represents a fluorine atom or an alkyl group substituted with at least one fluorine atom;

each of $R_1$ and $R_2$ independently represents a hydrogen atom, a fluorine atom or an alkyl group;

each L independently represents a divalent linking group;

Cy represents a cyclic organic group;

Rf represents a group containing a fluorine atom;

x represents an integer of 1 to 20;

y represents an integer of 0 to 10; and z represents an integer of 0 to 10.

39. The composition according to claim 36, wherein the actinic ray-sensitive or radiation-sensitive resin composition further contains (C) a basic compound or ammonium salt compound whose basicity is reduced upon irradiation with an actinic ray or radiation.

40. The composition according to claim 36, wherein the actinic ray-sensitive or radiation-sensitive resin composition further contains a hydrophobic resin having at least either a fluorine atom or a silicon atom.

* * * * *